US012595277B2

(12) United States Patent
Dai et al.

(10) Patent No.: US 12,595,277 B2
(45) Date of Patent: *Apr. 7, 2026

(54) LIGHT-EMITTING MATERIAL WITH A POLYCYCLIC LIGAND

(71) Applicant: BEIJING SUMMER SPROUT TECHNOLOGY CO., LTD., Beijing (CN)

(72) Inventors: Zhihong Dai, Beijing (CN); Cuifang Zhang, Beijing (CN); Qi Zhang, Beijing (CN); Nannan Lu, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 944 days.

This patent is subject to a terminal disclaimer.

(21) Appl. No.: 17/720,515

(22) Filed: Apr. 14, 2022

(65) Prior Publication Data

US 2022/0363700 A1 Nov. 17, 2022

(30) Foreign Application Priority Data

Apr. 16, 2021 (CN) ......................... 202110405260.7
Mar. 4, 2022 (CN) ......................... 202210196742.0

(51) Int. Cl.
*C07F 15/00* (2006.01)
*H10K 50/11* (2023.01)
(Continued)

(52) U.S. Cl.
CPC ....... *C07F 15/0033* (2013.01); *H10K 85/342* (2023.02); *H10K 50/11* (2023.02); *H10K 2101/10* (2023.02)

(58) Field of Classification Search
CPC ........ C07F 15/0033; C07F 5/00; C07F 5/003; C07F 5/06–069; C07F 7/00; C07F 7/003;
(Continued)

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 103003290 A 3/2013
CN 107474075 A * 12/2017 .......... C07F 15/0086
(Continued)

OTHER PUBLICATIONS

English translation of CN 110698518 A obtained from Global Dossier (Year: 2020).*
(Continued)

*Primary Examiner* — Jennifer A Boyd
*Assistant Examiner* — Braelyn R Watson
(74) *Attorney, Agent, or Firm* — Workman Nydegger

(57) ABSTRACT

Provided is a luminescent material having a polycyclic ligand. The luminescent material is a new metal complex having a polycyclic ligand and may be used as luminescent materials in electroluminescent devices. These new metal complexes achieve red light emission, have a very narrow full width at half maximum, and can achieve high saturation luminescence. In addition, these new metal complexes, when used as luminescent materials in electroluminescent devices, can achieve red light emission, have a very narrow full width at half maximum, achieve high saturation luminescence, reduce or maintain a low voltage, greatly improve device efficiency and lifetime, and provide better device performance. Further provided are an electroluminescent device and a compound composition.

28 Claims, 2 Drawing Sheets

(51) Int. Cl.
*H10K 85/30* (2023.01)
*H10K 101/10* (2023.01)

(58) Field of Classification Search
CPC ........ C07F 7/22-28; C07F 9/00; C07F 9/005; H10K 85/342; H10K 50/11; H10K 2101/10; H10K 85/40; H10K 50/12; H10K 85/30-351; H10K 85/371; H10K 85/381; Y02E 10/549; C09K 11/06; C09K 2211/1044; C09K 2211/1059; C09K 2211/185; C09K 2211/182-188; H01L 51/0077; H01L 51/0078; H01L 51/0079; H01L 51/008; H01L 51/0081; H01L 51/0082; H01L 51/0083; H01L 51/0084; H01L 51/0085; H01L 51/0086; H01L 51/0087; H01L 51/0088; H01L 51/0089; H01L 51/0091; H01L 51/0092
See application file for complete search history.

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 2003/0230980 | A1 | 12/2003 | Forrest et al. | |
| 2004/0174116 | A1 | 9/2004 | Lu et al. | |
| 2006/0134462 | A1* | 6/2006 | Yeh | C07F 15/0033 428/917 |
| 2008/0214818 | A1 | 9/2008 | Chin et al. | |
| 2009/0134784 | A1* | 5/2009 | Lin | C09K 11/06 546/276.7 |
| 2010/0244004 | A1* | 9/2010 | Xia | H05B 33/10 546/4 |
| 2013/0320318 | A1* | 12/2013 | Xia | C09K 11/025 546/4 |
| 2015/0349273 | A1 | 12/2015 | Hung et al. | |
| 2016/0359122 | A1 | 12/2016 | Boudreault et al. | |
| 2023/0055630 | A1* | 2/2023 | Kwong | H10K 85/342 |

FOREIGN PATENT DOCUMENTS

| | | | | |
|---|---|---|---|---|
| CN | 107501335 A | | 12/2017 | |
| CN | 110698518 A | * | 1/2020 | C07F 15/0033 |
| CN | 111518139 A | | 8/2020 | |
| CN | 111620910 A | | 9/2020 | |
| CN | 114478650 A | | 5/2022 | |
| CN | 114516890 A | | 5/2022 | |
| KR | 20180005128 A | | 1/2018 | |
| KR | 20190012063 A | | 2/2019 | |
| KR | 20200096423 A | | 8/2020 | |

OTHER PUBLICATIONS

Ossila, Ir(piq)2(acac), 2025. https://www.ossila.com/products/irpiq2acac. (Year: 2025).*

English translation of CN 107474075 A obtained from Global Dossier (Year: 2017).*

Uoyama et al., "Highly efficient organic light-emitting diodes from delayed fluorescence", Nature, vol. 492, Dec. 13, 2012, pp. 234-238.

Tang et al., "Organic electroluminescent diodes", Applied Physics Letters, vol. 51, Sep. 21, 1987, pp. 913-915.

* cited by examiner

LIGHT-EMITTING MATERIAL WITH A POLYCYCLIC LIGAND

CROSS-REFERENCE TO RELATED APPLICATION(S)

This application claims priority to Chinese Patent Application No. CN 202110405260.7 filed on Apr. 16, 2021 and Chinese Patent Application No. CN 202210196742.0 filed on Mar. 4, 2022, the disclosure of which are incorporated herein by reference in their entireties.

TECHNICAL FIELD

The present disclosure relates to compounds for organic electronic devices, for example, an organic light-emitting device. More particularly, the present disclosure relates to a metal complex having a polycyclic ligand, an organic electroluminescent device comprising the metal complex, and a compound composition.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

CN110698518A discloses a phosphorescent light-emitting material that has a general structural formula of

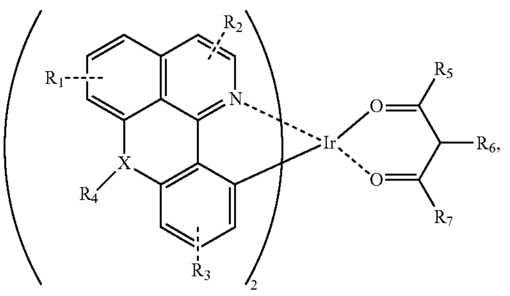

wherein X is N or P. Specific examples are

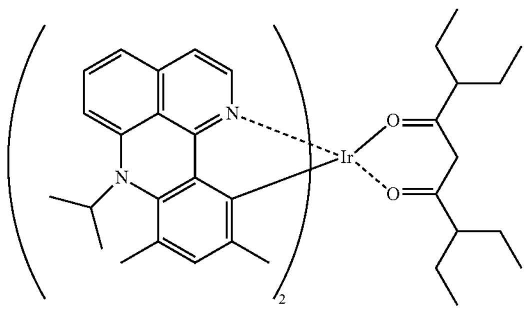

and

-continued

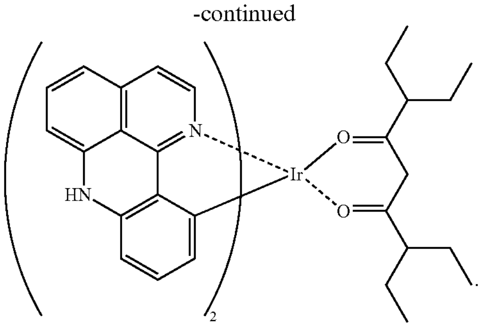

This patent does not pay attention to the great influence brought by the further introduction of a fused ring structure.

The phosphorescent luminescent materials have been reported in the existing art, but the further research and development are still needed to meet the increasing requirements of the industry for device performance such as device emitting color, luminous saturation, voltage, device efficiency, device lifetime and so on.

SUMMARY

The present disclosure aims to provide a series of metal complexes having a polycyclic ligand to solve at least part of the above-mentioned problems. The metal complexes can be used as luminescent materials in organic electroluminescent devices. These new metal complexes can achieve red light emission, have a very narrow full width at half maximum, and can achieve high saturation luminescence. In addition, these new metal complexes, when used as luminescent materials in electroluminescent devices, can achieve red light emission, have a very narrow full width at half maximum, achieve high saturation luminescence, reduce or maintain a low voltage, greatly improve device efficiency and lifetime, and provide better device performance.

According to an embodiment of the present disclosure, a metal complex is disclosed. The metal complex comprises a metal M and a ligand $L_a$ coordinated to the metal M, wherein the metal M is selected from metals having a relative atomic mass greater than 40, and the ligand $L_a$ has a structure represented by Formula 1:

Formula 1

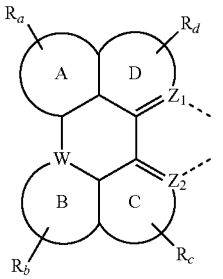

wherein, $Z_1$ and $Z_2$ are each independently selected from C or N, and $Z_1$ and $Z_2$ are different;

W is, at each occurrence identically or differently, selected from B, N or P; ring A, ring C, and ring D are, at each occurrence identically or differently, selected from a five-membered unsaturated carbocyclic ring, an aromatic ring having 6 to 30 carbon atoms or a heteroaromatic ring having 3 to 30 carbon atoms;

ring B is selected from a heterocyclic ring having 2 to 30 carbon atoms or a heteroaromatic ring having 2 to 30 carbon atoms;

$R_a$, $R_b$, $R_c$, and $R_d$ represent, at each occurrence identically or differently, mono-substitution, multiple substitutions or non-substitution;

$R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, and $R_d$ can be optionally joined to form a ring.

According to another embodiment of the present disclosure, an electroluminescent device is further disclosed. The electroluminescent device comprises an anode, a cathode, and an organic layer disposed between the anode and the cathode, wherein the organic layer comprises the metal complex described in the embodiment described above.

According to another embodiment of the present disclosure, a compound composition is further disclosed. The compound composition comprises the metal complex described in the embodiment described above.

The novel metal complexes with polycyclic ligands, as disclosed by the present disclosure, may be used as light-emitting materials in electroluminescent devices. These new metal complexes can achieve red light emission, have a very narrow full width at half maximum, and can achieve high saturation luminescence. In addition, these new metal complexes, when used as luminescent materials in electroluminescent devices, can achieve red light emission, have a very narrow full width at half maximum, achieve high saturation luminescence, reduce or maintain a low voltage, greatly improve device efficiency and lifetime, and provide better device performance.

DETAILED DESCRIPTION

Figure 1:
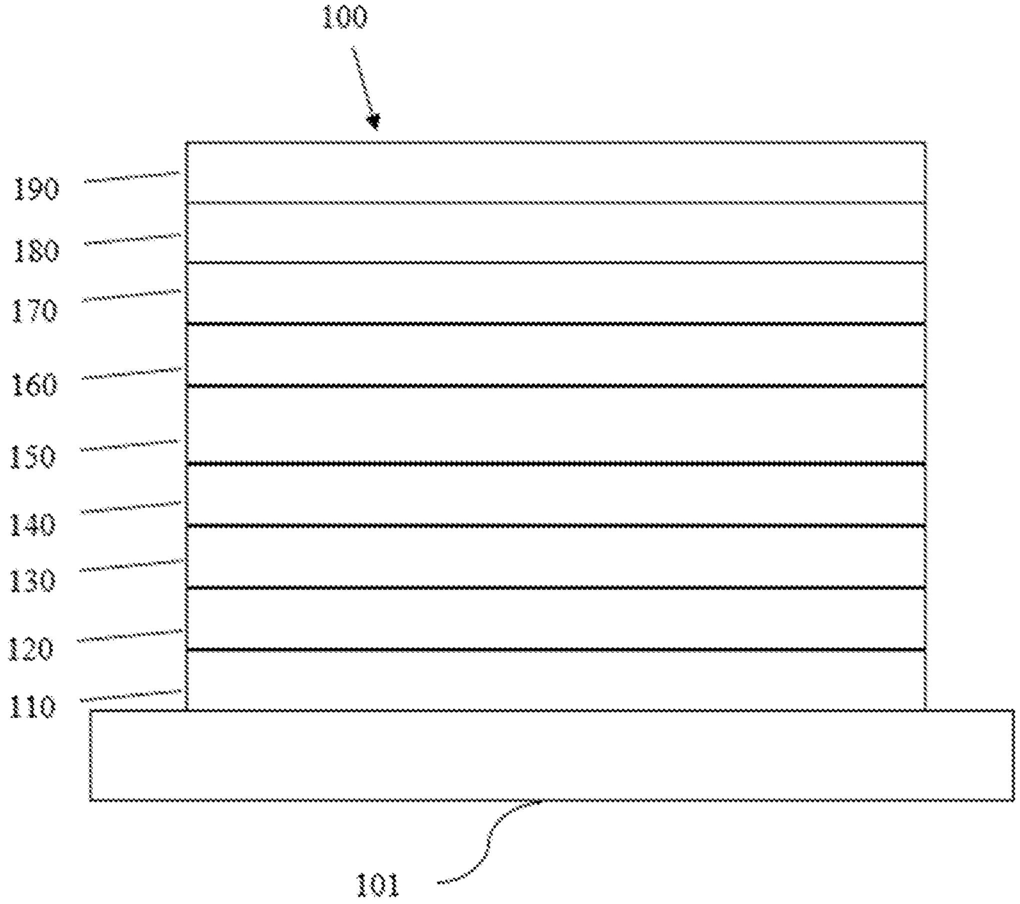
FIG. 1 is a schematic diagram of an organic light-emitting device that may comprise a metal complex and a compound composition disclosed herein.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
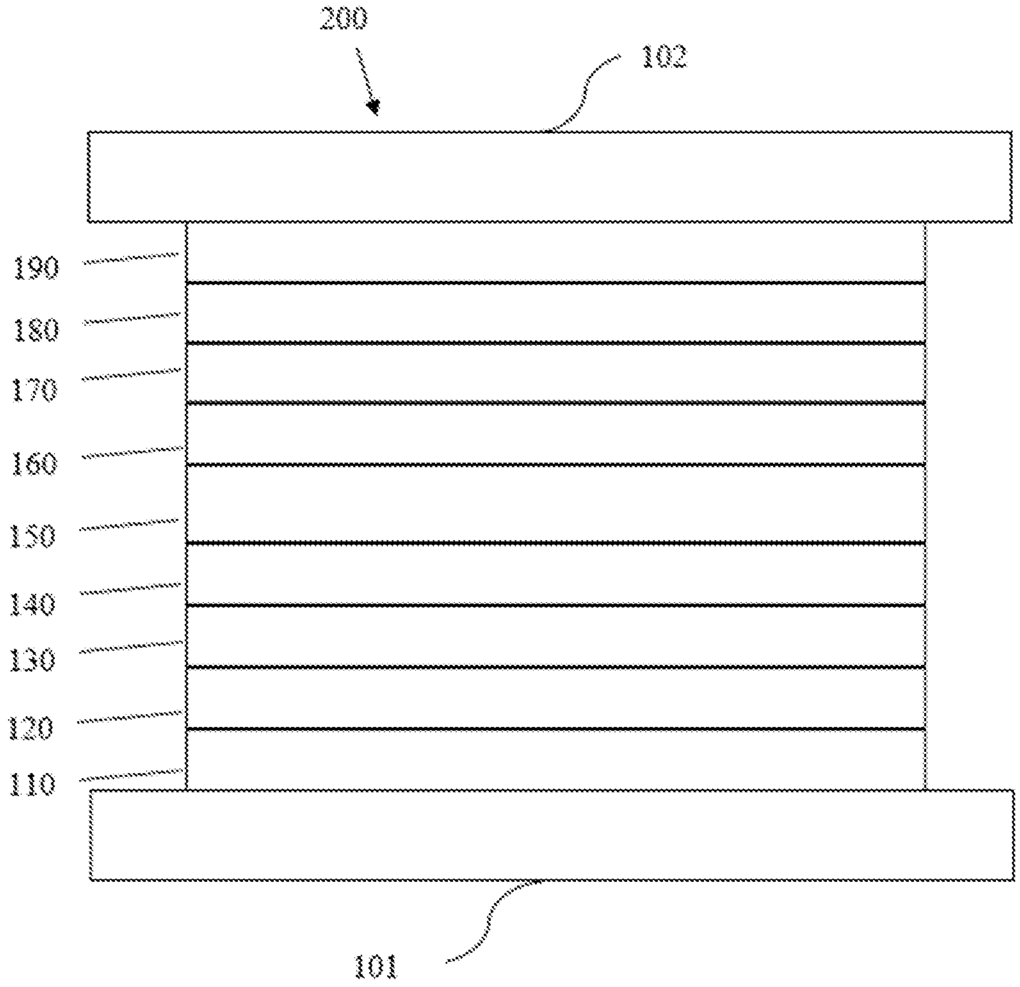
FIG. 2 is a schematic diagram of another organic light-emitting device that may comprise a metal complex and a compound composition disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AEs-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta E_{S-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butyldimethylgermanylmethyl, triethylgermanylmethyl, triethylgermanylethyl, triisopropylgermanylmethyl, triisopropylgermanylethyl, trimethylsilylmethyl, trimethylsilylethyl, trimethylsilylisopropyl, triisopropylsilylmethyl, and triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups include saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A heteroaromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates a germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more groups selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted alkylgermanyl group having 3 to 20 carbon atoms, unsubstituted arylgermanyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitutions refer to a range that includes di-substitutions, up to the maximum available substitutions. When substitution in the compounds mentioned in the present disclosure represents multiple substitutions (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fusedcyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

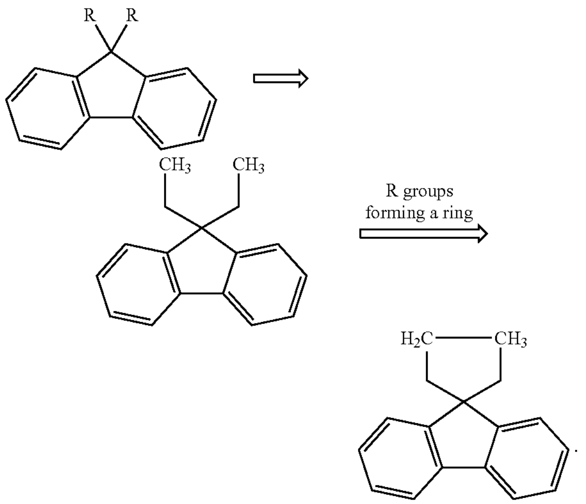

The expression that adjacent substituents can be optionally joined to form a ring is also intended to mean that two substituents bonded to carbon atoms which are directly bonded to each other are joined to each other via a chemical bond to form a ring, which can be exemplified by the following formula:

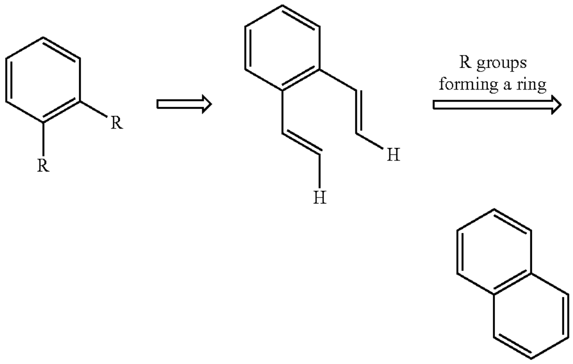

The expression that adjacent substituents can be optionally joined to form a ring is also intended to mean that two substituents bonded to further distant carbon atoms are joined to each other via a chemical bond to form a ring, which can be exemplified by the following formula:

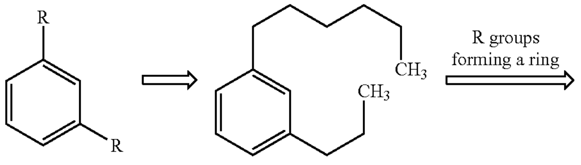

-continued

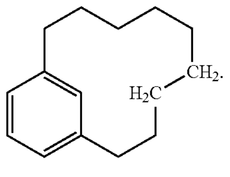

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

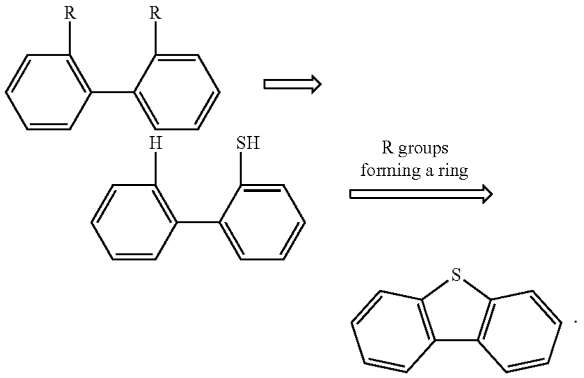

According to an embodiment of the present disclosure, a metal complex is disclosed, the metal complex comprises a metal M and a ligand $L_a$ coordinated to the metal M, wherein the metal M is selected from metals having a relative atomic mass greater than 40, and the ligand $L_a$ has a structure represented by Formula 1:

Formula 1

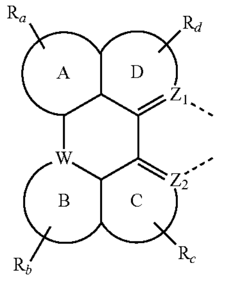

wherein, $Z_1$ and $Z_2$ are each independently selected from C or N, and $Z_1$ and $Z_2$ are different;

W is, at each occurrence identically or differently, selected from B, N or P;

ring A, ring C, and ring D are, at each occurrence identically or differently, selected from a five-membered unsaturated carbocyclic ring, an aromatic ring having 6 to 30 carbon atoms or a heteroaromatic ring having 3 to 30 carbon atoms;

ring B is selected from a heterocyclic ring having 2 to 30 carbon atoms or a heteroaromatic ring having 2 to 30 carbon atoms;

$R_a$, $R_b$, $R_c$, and $R_d$ represent, at each occurrence identically or differently, mono-substitution, multiple substitutions or non-substitution;

$R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, and $R_d$ can be optionally joined to form a ring.

In the present disclosure, the expression that adjacent substituents $R_a$, $R_b$, $R_c$, and $R_d$ can be optionally joined to form a ring is intended to mean that any one or more of groups of adjacent substituents, such as adjacent substituents $R_a$, adjacent substituents $R_b$, adjacent substituents $R_c$, adjacent substituents $R_d$, adjacent substituents $R_a$ and $R_b$, adjacent substituents $R_a$ and $R_d$, and adjacent substituents $R_b$ and $R_c$, can be joined to form a ring. Obviously, it is possible that none of these groups of adjacent substituents are joined to form a ring.

According to an embodiment of the present disclosure, wherein, in the $L_a$, ring A, ring C, and ring D are, at each occurrence identically or differently, selected from an aromatic ring having 6 to 18 carbon atoms or a heteroaromatic ring having 3 to 18 carbon atoms; and ring B is selected form a heteroaromatic ring having 2 to 18 carbon atoms.

According to an embodiment of the present disclosure, wherein, in the $L_a$, ring A, ring C, and ring D are, at each occurrence identically or differently, selected from an aromatic ring having 6 to 10 carbon atoms or a heteroaromatic ring having 5 to 10 ring atoms; and ring B is selected form a heteroaromatic ring having 5 to 10 ring atoms.

According to an embodiment of the present disclosure, wherein, in the $L_a$, ring A, ring C, and ring D are, at each occurrence identically or differently, selected from a benzene ring, a naphthalene ring, a pyridine ring, a pyrimidine ring, a pyrazine ring, an aza-naphthalene ring, a furan ring, a thiophene ring, an isoxazole ring, an isothiazole ring, a pyrrole ring, a pyrazole ring, a benzofuran ring, a benzothiophene ring, an azabenzofuran ring or an azabenzothiophene ring; and ring B is selected from a pyrrole ring, an indole ring, an imidazole ring, a pyrazole ring, a triazole ring or an azaindole ring.

According to an embodiment of the present disclosure, wherein, in the $L_a$, ring A, ring C, and ring D are, at each occurrence identically or differently, selected from a benzene ring, a naphthalene ring, a pyridine ring or a pyrimidine ring; and ring B is selected from a pyrrole ring, an indole ring or an azaindole ring.

According to an embodiment of the present disclosure, wherein, the $L_a$ is selected from a structure represented by any one of Formula 2 to Formula 19:

Formula 2

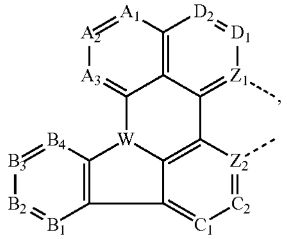

Formula 3

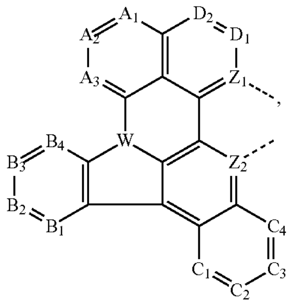

Formula 4

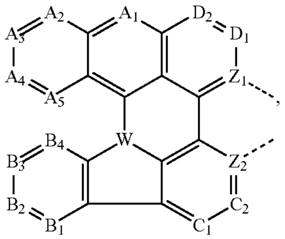

Formula 5

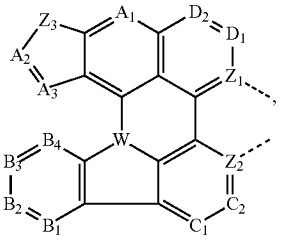

Formula 6

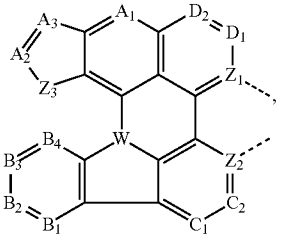

-continued

Formula 7

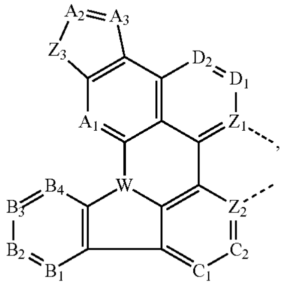

Formula 8

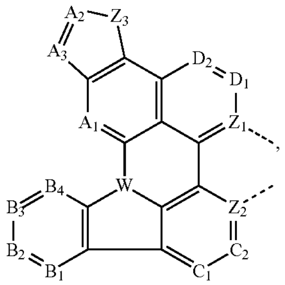

Formula 9

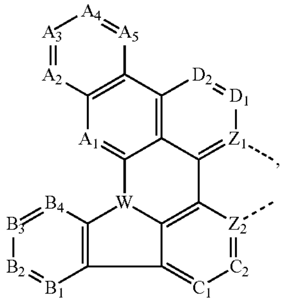

Formula 10

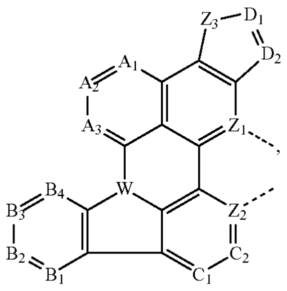

Formula 11

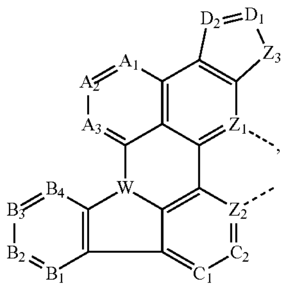

-continued

Formula 12

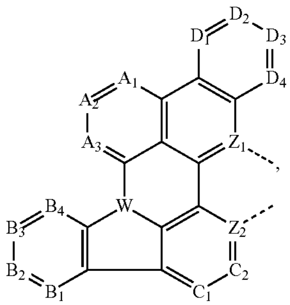

Formula 13

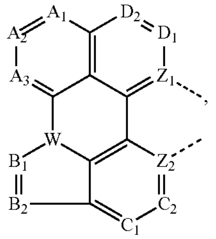

Formula 14

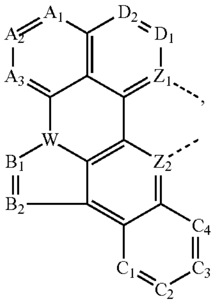

Formula 15

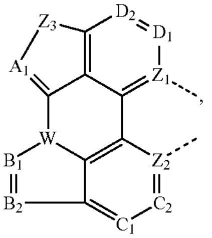

Formula 16

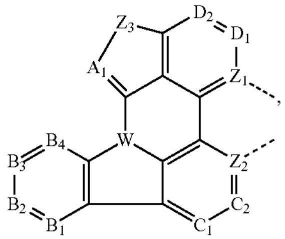

-continued

Formula 17

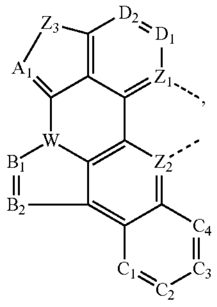

Formula 18

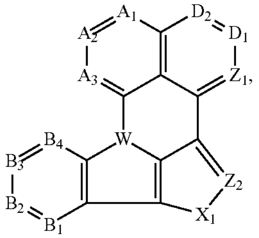

and

Formula 19

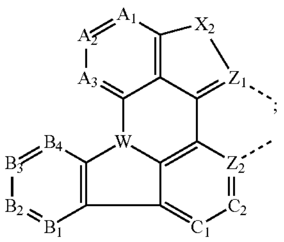

wherein, $Z_1$ and $Z_2$ are each independently selected from C or N, and $Z_1$ and $Z_2$ are different;

W is, at each occurrence identically or differently, selected from B, N or P;

$A_1$ to $A_5$ are, at each occurrence identically or differently, selected from N or $CR_a$;

$B_1$ to $B_4$ are, at each occurrence identically or differently, selected from N or $CR_b$;

$C_1$ to $C_4$ are, at each occurrence identically or differently, selected from N or $CR_c$;

$D_1$ to $D_4$ are, at each occurrence identically or differently, selected from N or $CR_d$;

$X_1$ is, at each occurrence identically or differently, selected from O, S, Se, $NR_c$, $CR_cR_c$, $SiR_cR_c$ or $PR_c$;

$X_2$ is, at each occurrence identically or differently, selected from O, S, Se, $NR_d$, $CR_dR_d$, $SiR_dR_d$ or $PR_d$;

$Z_3$ is, at each occurrence identically or differently, selected from O, S, Se, $NR_z$, $CR_zR_z$, $SiR_zR_z$ or $PR_z$;

$R_a$, $R_b$, $R_c$, $R_d$, and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, $R_d$, and $R_z$ can be optionally joined to form a ring.

In this embodiment, the expression that adjacent substituents $R_a$, $R_b$, $R_c$, $R_d$, and $R_z$ can be optionally joined to form a ring is intended to mean that any one or more of groups of adjacent substituents, such as adjacent substituents $R_a$, adjacent substituents $R_b$, adjacent substituents $R_c$, adjacent substituents $R_d$, adjacent substituents $R_a$ and $R_b$, adjacent substituents $R_a$ and $R_d$, and adjacent substituents $R_b$ and $R_c$, adjacent substituents $R_a$ and $R_z$, adjacent substituents $R_d$ and $R_z$, and adjacent substituents $R_z$, can be joined to form a ring. Obviously, it is possible that none of these groups of adjacent substituents are joined to form a ring.

According to an embodiment of the present disclosure, wherein, $L_a$ is selected from a structure represented by Formula 2, Formula 3, Formula 7, Formula 8, Formula 9 or Formula 12.

According to an embodiment of the present disclosure, wherein, $L_a$ is selected from a structure represented by Formula 2, Formula 3, Formula 9 or Formula 12.

According to an embodiment of the present disclosure, wherein, $L_a$ is selected from a structure represented by Formula 2, Formula 3 or Formula 12.

According to an embodiment of the present disclosure, wherein, in Formula 1 to Formula 19, $Z_1$ is N, and $Z_2$ is C.

According to an embodiment of the present disclosure, wherein, in Formula 1 to Formula 19, $Z_1$ is C, and $Z_2$ is N.

According to an embodiment of the present disclosure, wherein, in Formula 1 to Formula 19, W is N.

According to an embodiment of the present disclosure, wherein, in Formula 2 to Formula 18, $Z_1$ is N, and at least one of $D_1$ and $D_2$ is N; or in Formula 2 to Formula 17 and Formula 19, $Z_2$ is N, and at least one of $C_1$ and $C_2$ is N.

According to an embodiment of the present disclosure, wherein, in Formula 2 to Formula 18, $Z_1$ is N, and one of $D_1$ and $D_2$ is N; or in Formula 2 to Formula 17 and Formula 19, $Z_2$ is N, and one of $C_1$ and $C_2$ is N.

According to an embodiment of the present disclosure, wherein, in Formula 2 to Formula 18, $Z_1$ is N, and $D_2$ is N; or in Formula 2 to Formula 17 and Formula 19, $Z_2$ is N, and $C_1$ is N.

According to an embodiment of the present disclosure, wherein, in Formula 2 to Formula 19, $A_1$ to $A_5$ are each independently selected from $CR_a$, and $B_1$ to $B_4$ are each independently selected from $CR_b$; in Formula 2 to Formula 17 and Formula 19, $C_1$ to $C_4$ are each independently selected from $CR_c$; in Formula 2 to Formula 18, $D_1$ to $D_4$ are each independently selected from $CR_d$; and the $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, and $R_d$ can be optionally joined to form a ring.

According to an embodiment of the present disclosure, wherein, in Formula 2 to Formula 19, $A_1$ to $A_5$ are each independently selected from $CR_a$, and $B_1$ to $B_4$ are each independently selected from $CR_b$; in Formula 2 to Formula 17 and Formula 19, $C_1$ to $C_4$ are each independently selected from $CR_c$; in Formula 2 to Formula 18, $D_1$ to $D_4$ are each independently selected from $CR_d$; and the $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkoxy having 1 to 20 carbon atoms, substituted or unsubstituted aryloxy having 6 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, and combinations thereof;

adjacent substituents $R_a$, $R_b$, $R_c$, and $R_d$ can be optionally joined to form a ring.

According to an embodiment of the present disclosure, wherein, in Formula 2 to Formula 19, $A_1$ to $A_5$ are each independently selected from $CR_a$, and $B_1$ to $B_4$ are each independently selected from $CR_b$; in Formula 2 to Formula 17 and Formula 19, $C_1$ to $C_4$ are each independently selected from $CR_c$; in Formula 2 to Formula 18, $D_1$ to $D_4$ are each independently selected from $CR_d$; and the $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, a cyano group, and combinations thereof;

adjacent substituents $R_a$, $R_b$, $R_c$, and $R_d$ can be optionally joined to form a ring.

According to an embodiment of the present disclosure, wherein, in Formula 2 to Formula 19, at least one of $A_1$ to $A_n$ is, at each occurrence identically or differently, selected from $CR_a$, and the $A_n$ corresponds to one having the largest serial number of $A_1$ to $A_5$ in any one of Formula 2 to Formula 19; and the $R_a$ is, at each occurrence identically or differently, selected from the group consisting of: deuterium, halogen, a cyano group, a hydroxyl group, a sulfanyl group, substituted or unsubstituted alkyl having 1 to 20 carbon atoms, substituted or unsubstituted cycloalkyl having 3 to 20 ring carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, and combinations thereof;

adjacent substituents $R_a$ can be optionally joined to form a ring.

In the present disclosure, the expression that adjacent substituents $R_a$ can be optionally joined to form a ring is intended to mean that any adjacent substituents $R_a$ can be joined to form a ring. Obviously, it is possible that none of adjacent substituents $R_a$ are joined to form a ring.

In this embodiment, in Formula 2 to Formula 19, at least one of $A_1$ to $A_n$ is, at each occurrence identically or differently, selected from $CR_a$, and the $A_n$ corresponds to one having the largest serial number of $A_1$ to $A_5$ in any one of Formula 2 to Formula 19. For example, for Formula 2, the $A_n$ corresponds to $A_3$ whose serial number is the largest in $A_1$ to $A_5$ in Formula 2, that is, in Formula 2, at least one of $A_1$ to $A_3$ is, at each occurrence identically or differently, selected from $CR_a$. For another example, for Formula 4, the $A_n$ corresponds to $A_5$ whose serial number is the largest in $A_1$ to $A_5$ in Formula 4, that is, in Formula 4, at least one of $A_1$ to $A_5$ is, at each occurrence identically or differently, selected from $CR_a$. For another example, for Formula 15, the $A_n$ corresponds to $A_1$ whose serial number is the largest in $A_1$ to $A_5$ in Formula 15, that is, in Formula 15, $A_1$ is, at each occurrence identically or differently, selected from $CR_a$.

According to an embodiment of the present disclosure, wherein, in Formula 2 to Formula 14, Formula 18 and Formula 19, at least one of $A_1$ to $A_3$ is, at each occurrence identically or differently, selected from $CR_a$; and in Formula 15 to Formula 17, $A_1$ is selected from $CR_a$.

According to an embodiment of the present disclosure, wherein, in Formula 2 to Formula 14, Formula 18 and Formula 19, at least one of $A_1$ to $A_3$ is, at each occurrence identically or differently, selected from $CR_a$; in Formula 15 to Formula 17, $A_1$ is selected from $CR_a$; and the $R_a$ is, at each occurrence identically or differently, selected from the group consisting of: deuterium, fluorine, a cyano group, a hydroxyl group, a sulfanyl group, an amino group, a methoxy group, a phenoxy group, methylthio, phenylthio, dimethylamino, diphenylamino, phenylmethylamino, vinyl, tetrahydrofuranyl, tetrahydropyranyl, tetrahydrothienyl, piperidyl, morpholinyl, benzyl, methyl, ethyl, isopropyl, isobutyl, t-butyl, neopentyl, cyclopentyl, cyclopentylmethyl, cyclohexyl, norbornyl, adamantly, trimethylsilyl, triethylsilyl, phenyldimethylsilyl, trimethylgermanyl, triethylgermanyl, phenyl, pyridyl, triazinyl, and combinations thereof.

According to an embodiment of the present disclosure, wherein, in Formula 2 to Formula 17 and Formula 19, $C_2$ is, at each occurrence identically or differently, selected from $CR_c$, and the $R_c$ is, at each occurrence identically or differently, selected from the group consisting of: deuterium, halogen, a cyano group, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, and combinations thereof.

According to an embodiment of the present disclosure, wherein, in Formula 2 to Formula 17 and Formula 19, $C_2$ is, at each occurrence identically or differently, selected from $CR_c$, and the $R_c$ is, at each occurrence identically or differently, selected from the group consisting of: deuterium, a cyano group, fluorine, methyl, ethyl, isopropyl, isobutyl, t-butyl, neopentyl, cyclopentyl, cyclopentylmethyl, cyclohexyl, trimethylsilyl, triethylsilyl, trimethylgermanyl, triethylgermanyl, phenyl, pyridyl, triazinyl, deuterated methyl, deuterated ethyl, deuterated isopropyl, deuterated isobutyl, deuterated t-butyl, deuterated cyclopentyl, deuterated cyclopentylmethyl, deuterated cyclohexyl, deuterated neopentyl, and combinations thereof.

According to an embodiment of the present disclosure, wherein, in Formula 2 to Formula 19, at least one of $B_1$ to $B_n$ is selected from $CR_b$, and the $B_n$ corresponds to one having the largest serial number of $B_1$ to $B_4$ in any one of Formula 2 to Formula 19; and/or in Formula 2 to Formula 18, at least one of $D_1$ to $D_n$ is selected from $CR_d$, and the $D_n$ corresponds to one having the largest serial number of $D_1$ to $D_4$ in any one of Formula 2 to Formula 18; and the $R_b$ and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, a hydroxyl group, a sulfanyl group, and combinations thereof.

In this embodiment, in Formula 2 to Formula 19, at least one of $B_1$ to $B_1$ is, at each occurrence identically or differently, selected from $CR_b$, and the $B_n$ corresponds to one having the largest serial number of $B_1$ to $B_4$ in any one of Formula 2 to Formula 19. For example, for Formula 2, the $B_1$ corresponds to $B_4$ whose serial number is the largest in $B_1$ to $B_4$ in Formula 2, that is, in Formula 2, at least one of $B_1$ to $B_4$ is, at each occurrence identically or differently, selected from $CR_b$. For another example, for Formula 13, the $B_1$ corresponds to $B_2$ whose serial number is the largest in $B_1$ to $B_4$ in Formula 13, that is, in Formula 13, at least one of $B_1$ to $B_2$ is, at each occurrence identically or differently, selected from $CR_b$.

In this embodiment, in Formula 2 to Formula 18, at least one of $D_1$ to $D_n$ is, at each occurrence identically or differently, selected from $CR_d$, and the $D_n$ corresponds to one having the largest serial number of $D_1$ to $D_4$ in any one of Formula 2 to Formula 18. For example, for Formula 2, the $D_n$ corresponds to $D_2$ whose serial number is the largest in $D_1$ to $D_4$ in Formula 2, that is, in Formula 2, at least one of $D_1$ to $D_2$ is, at each occurrence identically or differently, selected from $CR_d$. For another example, for Formula 12, the $D_n$ corresponds to $D_4$ whose serial number is the largest in $D_1$ to $D_4$ in Formula 12, that is, in Formula 12, at least one of $D_1$ to $D_4$ is, at each occurrence identically or differently, selected from $CR_d$.

According to an embodiment of the present disclosure, wherein, in Formula 2 to Formula 12, Formula 16, Formula 18 and Formula 19, $B_2$ and/or $B_3$ are selected from $CR_b$; in Formula 13 to Formula 15 and Formula 17, $B_1$ and/or $B_2$ are selected from $CR_b$; and in Formula 2 to Formula 18, $D_1$ and/or $D_2$ are selected from $CR_d$.

According to an embodiment of the present disclosure, wherein, in Formula 2 to Formula 12, Formula 16, Formula 18 and Formula 19, $B_2$ and/or $B_3$ are selected from $CR_b$; in Formula 13 to Formula 15 and Formula 17, $B_1$ and/or $B_2$ are selected from $CR_b$; in Formula 2 to Formula 18, $D_1$ and/or $D_2$ are selected from $CR_d$; and the $R_b$ and $R_d$ are, at each occurrence identically or differently, selected from the group consisting of: hydrogen, deuterium, fluorine, a cyano group, a hydroxyl group, a sulfanyl group, an amino group, a methoxy group, a phenoxy group, methylthio, phenylthio, dimethylamino, diphenylamino, phenylmethylamino, vinyl, tetrahydrofuranyl, tetrahydropyranyl, tetrahydrothienyl, piperidyl, morpholinyl, benzyl, methyl, ethyl, isopropyl, isobutyl, t-butyl, neopentyl, cyclopentyl, cyclopentylmethyl, cyclohexyl, trimethylsilyl, triethylsilyl, trimethylgermanyl, triethylgermanyl, phenyl, pyridyl, triazinyl, deuterated methyl, deuterated ethyl, deuterated isopropyl, deuterated isobutyl, deuterated t-butyl, deuterated cyclopentyl, deuterated cyclopentylmethyl, deuterated cyclohexyl, deuterated neopentyl, and combinations thereof.

According to an embodiment of the present disclosure, wherein, in Formula 5 to Formula 8, Formula 10, Formula 11 and Formula 15 to Formula 17, $Z_3$ is, at each occurrence identically or differently, selected from O, S or Se; in Formula 18, $X_1$ is, at each occurrence identically or differently, selected from O, S or Se; and in Formula 19, $X_2$ is, at each occurrence identically or differently, selected from O, S or Se.

According to an embodiment of the present disclosure, wherein, in Formula 5 to Formula 8, Formula 10, Formula 11 and Formula 15 to Formula 17, $Z_3$ is, at each occurrence identically or differently, selected from O or S; in Formula 18, $X_1$ is, at each occurrence identically or differently, selected from O or S; and in Formula 19, $X_2$ is, at each occurrence identically or differently, selected from O or S.

According to an embodiment of the present disclosure, wherein, $L_a$ is, at each occurrence identically or differently, selected from the group consisting of $L_{a1}$ to $L_{a1297}$, wherein for the specific structures of $L_{a1}$ to $L_{a1297}$, reference is made to claim 11.

According to an embodiment of the present disclosure, wherein, $L_a$ is, at each occurrence identically or differently, selected from the group consisting of $L_{a1}$ to $L_{a1342}$, wherein for the specific structures of $L_{a1}$ to $L_{a1342}$, reference is made to claim 11.

According to an embodiment of the present disclosure, wherein, hydrogen in the structures of $L_{a1}$ to $L_{a1297}$ can be partially or completely substituted with deuterium.

According to an embodiment of the present disclosure, wherein, hydrogen in the structures of $L_{a1}$ to $L_{a1342}$ can be partially or completely substituted with deuterium.

According to an embodiment of the present disclosure, wherein, the metal complex has a general formula of $M(L_a)_m(L_b)_n(L_c)_q$;

wherein the metal M is selected from Ir, Rh, Re, Os, Pt, Au or Cu; $L_a$, $L_b$ and $L_c$ are a first ligand, a second ligand and a third ligand coordinated to the metal M, respectively; m is selected from 1, 2 or 3, n is selected from 0, 1 or 2, q is selected from 0, 1 or 2, and m+n+q is equal to an oxidation state of the metal M; when m is equal to 2 or 3, a plurality of $L_a$ can be identical or different; when n is equal to 2, two $L_b$ can be identical or different; and when q is equal to 2, two $L_c$ can be identical or different;

$L_a$, $L_b$, and $L_c$ can be optionally joined to form a multi-dentate ligand;

$L_b$ and $L_c$ are, at each occurrence identically or differently, selected from the group consisting of the following structures:

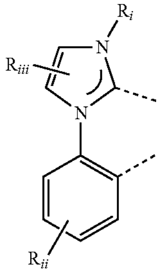
,
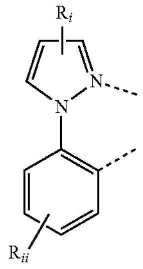
,
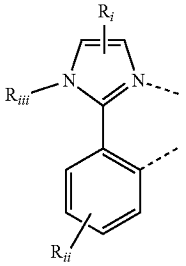
,
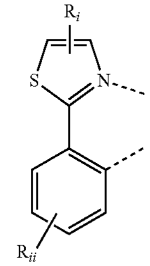
,
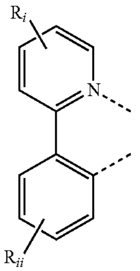
,
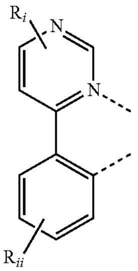
,
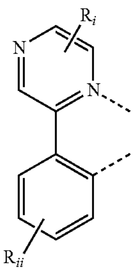
, -continued

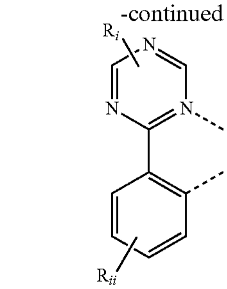

,

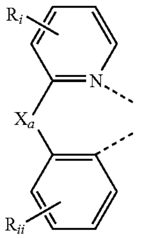

,

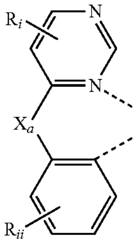

,

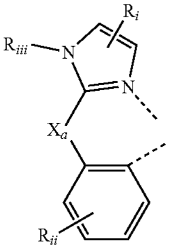

, or

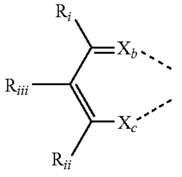

;

wherein, $R_i$, $R_{ii}$, and $R_{iii}$ represent, at each occurrence identically or differently, mono-substitution, multiple substitutions or non-substitution;

$X_a$ is, at each occurrence identically or differently, selected from the group consisting of: O, S, Se, $NR_{N1}$, and $CR_{C1}R_{C2}$;

$X_b$ and $X_c$ are, at each occurrence identically or differently, selected from the group consisting of: O, S, Se, and $NR_{N2}$;

$R_i$, $R_{ii}$, $R_{iii}$, $R_{N1}$, $R_{N2}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_i$, $R_{ii}$, $R_{iii}$, $R_{N1}$, $R_{N2}$, $R_{C1}$, and $R_{C2}$ can be optionally joined to form a ring.

In this embodiment, the expression that adjacent substituents $R_i$, $R_{ii}$, $R_{iii}$, $R_{N1}$, $R_{N2}$, $R_{C1}$, and $R_{C2}$ can be optionally joined to form a ring is intended to mean that any one or more of groups of adjacent substituents in the structures of $L_b$ and $L_c$, such as adjacent substituents $R_i$, adjacent substituents $R_{iii}$, adjacent substituents $R_{iii}$, adjacent substituents $R_i$ and $R_{ii}$, adjacent substituents $R_{ii}$ and $R_{iii}$, adjacent substituents $R_i$ and $R_{iii}$, adjacent substituents $R_i$ and $R_{N1}$, adjacent substituents $R_i$ and $R_{C1}$, adjacent substituents $R_i$ and $R_{C2}$, adjacent substituents $R_{ii}$ and $R_{N1}$, adjacent substituents $R_{iii}$ and $R_{N1}$, adjacent substituents $R_{ii}$ and $R_{C1}$, adjacent substituents $R_{ii}$ and $R_{C2}$, adjacent substituents $R_{iii}$ and $R_{C1}$, adjacent substituents $R_{iii}$ and $R_{C2}$, adjacent substituents $R_i$ and $R_{N2}$, adjacent substituents $R_{ii}$ and $R_{N2}$, and adjacent substituents $R_{C1}$ and $R_{C2}$, may be joined to form a ring. Obviously, it is possible that none of these substituents are joined to form a ring.

In this embodiment, $L_a$, $L_b$, and $L_c$ can be optionally joined to form a multi-dentate ligand, for example, any two or three of $L_a$, $L_b$, and $L_c$ can be joined to form a tetradentate ligand or a hexadentate ligand. Obviously, it is possible that none of $L_a$, $L_b$, and $L_c$ are joined so that no multi-dentate ligand is formed.

According to an embodiment of the present disclosure, wherein, the metal M is selected from Ir, Pt or Os.

According to an embodiment of the present disclosure, wherein, the metal M is Ir.

According to an embodiment of the present disclosure, wherein, $L_b$ is, at each occurrence identically or differently, selected from the following structure:

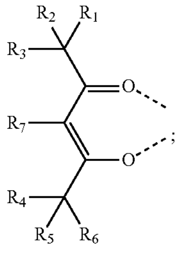

;

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to an embodiment of the present disclosure, wherein, $L_b$ is, at each occurrence identically or differently, selected from the following structure:

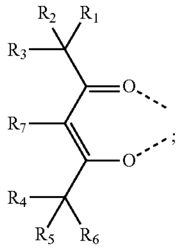

wherein at least one or two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof; and/or at least one or two of $R_4$ to $R_6$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof.

According to an embodiment of the present disclosure, wherein, $L_b$ is, at each occurrence identically or differently, selected from the following structure:

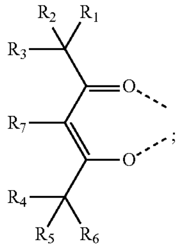

wherein at least two of $R_1$ to $R_3$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or combinations thereof; and/or at least two of $R_4$ to $R_6$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or combinations thereof.

According to an embodiment of the present disclosure, wherein, $L_b$ is, at each occurrence identically or differently, selected from the group consisting of $L_{b1}$ to $L_{b322}$, wherein for the specific structures of $L_{b1}$ to $L_{b322}$, reference is made to claim 14.

According to an embodiment of the present disclosure, wherein, $L_c$ is, at each occurrence identically or differently, selected from the group consisting of $L_{c1}$ to $L_{c231}$, wherein for the specific structures of $L_{c1}$ to $L_{c231}$, reference is made to claim 14.

According to an embodiment of the present disclosure, wherein, the metal complex is an Ir complex and has a structure represented by any one of $Ir(L_a)(L_b)(L_c)$, $Ir(L_a)_2(L_b)$, $Ir(L_a)_2(L_c)$ and $Ir(L_a)(L_c)_2$; when the metal complex has a structure of $Ir(L_a)(L_b)(L_c)$, $L_a$ is selected from any one of the group consisting of $L_{a1}$ to $L_{a1297}$, $L_b$ is selected from any one of the group consisting of $L_{b1}$ to $L_{b322}$, and $L_c$ is selected from any one of the group consisting of $L_{c1}$ to $L_{c231}$; when the metal complex has a structure of $Ir(L_a)_2(L_b)$, $L_a$ is, at each occurrence identically or differently, selected from any one or any two of the group consisting of $L_{a1}$ to $L_{a1297}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a1297}$, and $L_c$ is selected from any one of the group consisting of $L_{c1}$ to $L_{c231}$; and when the metal complex has a structure of $Ir(L_a)(L_c)_2$, $L_a$ is selected from any one of the group consisting of $L_{a1}$ to $L_{a1297}$, and $L_c$ is, at each occurrence identically or differently, selected from any one or any two of the group consisting of $L_{c1}$ to $L_{c231}$.

According to an embodiment of the present disclosure, wherein, the metal complex is an Ir complex and has a structure represented by any one of $Ir(L_a)(L_b)(L_c)$, $Ir(L_a)_2(L_b)$, $Ir(L_a)_2(L_c)$ and $Ir(L_a)(L_c)_2$; when the metal complex has a structure of $Ir(L_a)(L_b)(L_c)$, $L_a$ is selected from any one of the group consisting of $L_{a1}$ to $L_{a1342}$, $L_b$ is selected from any one of the group consisting of $L_{b1}$ to $L_{b322}$, and $L_c$ is selected from any one of the group consisting of $L_{c1}$ to $L_{c231}$; when the metal complex has a structure of $Ir(L_a)_2(L_b)$, $L_a$ is, at each occurrence identically or differently, selected from any one or any two of the group consisting of $L_{a1}$ to $L_{a1342}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a1342}$, and $L_c$ is selected from any one of the group consisting of $L_{c1}$ to $L_{c231}$; and when the metal complex has a structure of $Ir(L_a)(L_c)_2$, $L_a$ is selected from any one of the group consisting of $L_{a1}$ to $L_{a1342}$, and $L_c$ is, at each occurrence identically or differently, selected from any one or any two of the group consisting of $L_{c1}$ to $L_{c231}$.

According to an embodiment of the present disclosure, wherein, the metal complex is selected from the group consisting of Compound 1 to Compound 406, wherein for the specific structures of Compound 1 to Compound 406, reference is made to claim 15.

According to an embodiment of the present disclosure, wherein, the metal complex is selected from the group consisting of Compound 1 to Compound 530, wherein for the specific structures of Compound 1 to Compound 530, reference is made to claim 15.

According to an embodiment of the present disclosure, an electroluminescent device is further disclosed, the electroluminescent device comprises:

an anode, a cathode, and an organic layer disposed between the anode and the cathode, wherein the organic layer comprises a metal complex, and the specific structure of the metal complex is shown in any of the embodiments described above.

According to an embodiment of the present disclosure, in the device, the organic layer is an emissive layer, and the compound is a luminescent material.

According to an embodiment of the present disclosure, the electroluminescent device emits red light.

According to an embodiment of the present disclosure, the electroluminescent device emits white light.

According to an embodiment of the present disclosure, in the device, the organic layer further comprises at least one host material.

According to an embodiment of the present disclosure, in the device, the at least one host material comprises at least one chemical group selected from the group consisting of: benzene, pyridine, pyrimidine, triazine, carbazole, azacarbazole, indolocarbazole, dibenzothiophene, azadibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to an embodiment of the present disclosure, in the device, the host material may be a conventional host material in the existing art, for example, may typically comprises the following host materials without limitation:

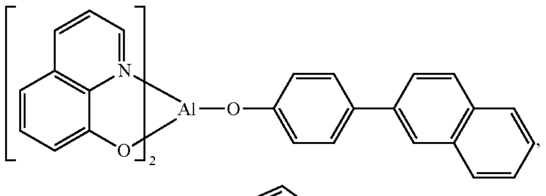

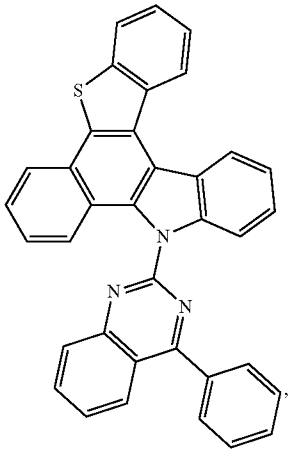

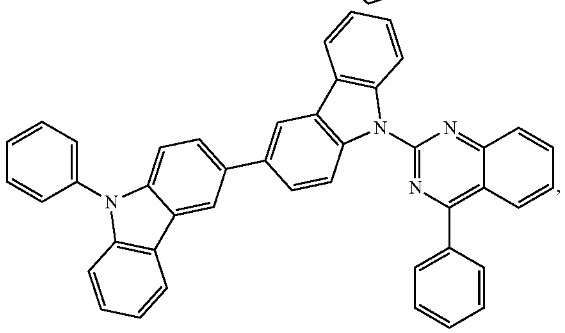

-continued

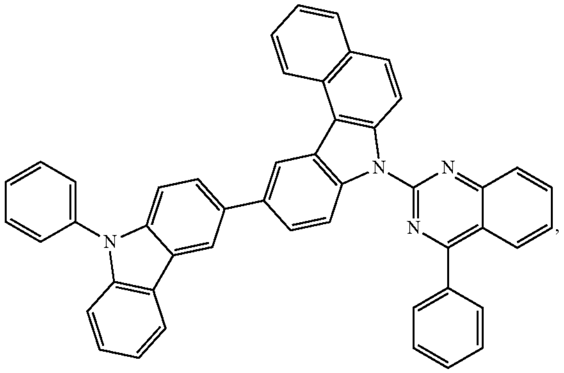

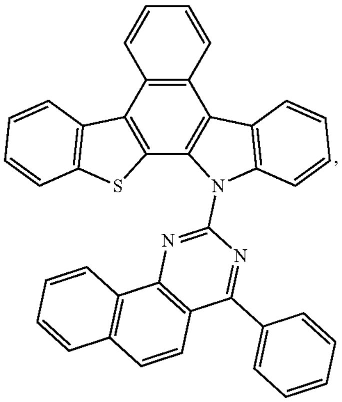

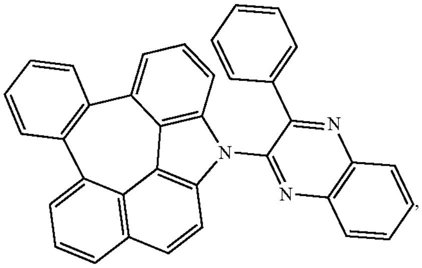

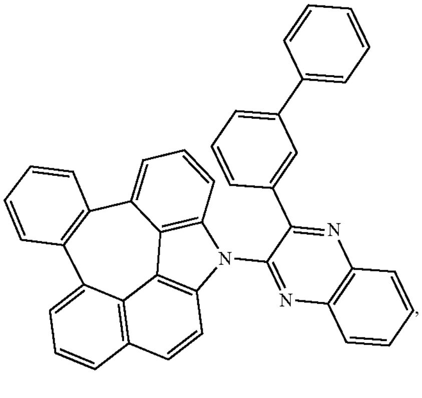

-continued

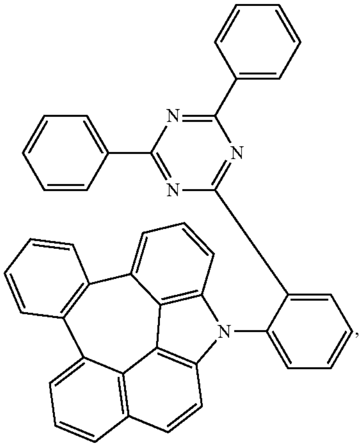

,

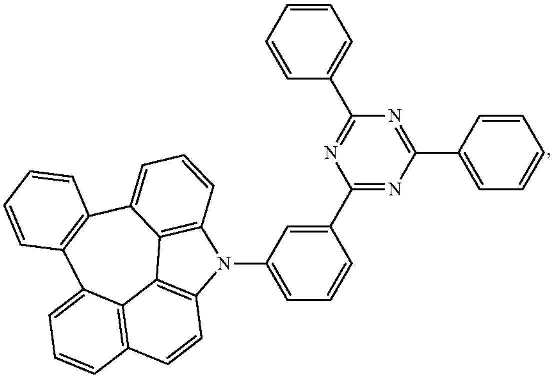

,

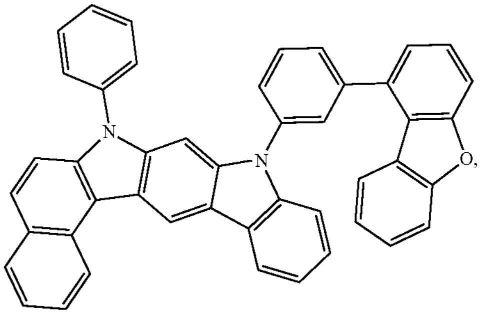

, and

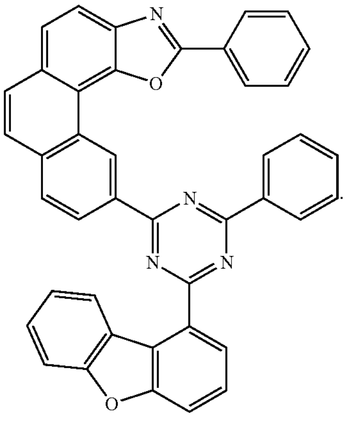

.

According to another embodiment of the present disclosure, a compound composition is further disclosed. The compound composition comprises a metal complex whose specific structure is as shown in any of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, compound disclosed herein may be used in combination with a wide variety of emissive dopants, hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

MATERIAL SYNTHESIS EXAMPLE

The method for preparing a compound of the present disclosure is not limited herein. Typically, the following compounds are taken as examples without limitations, and synthesis routes and preparation methods thereof are described below.

Synthesis Example 1: Synthesis of Compound 63

Step 1: Synthesis of Intermediate 3

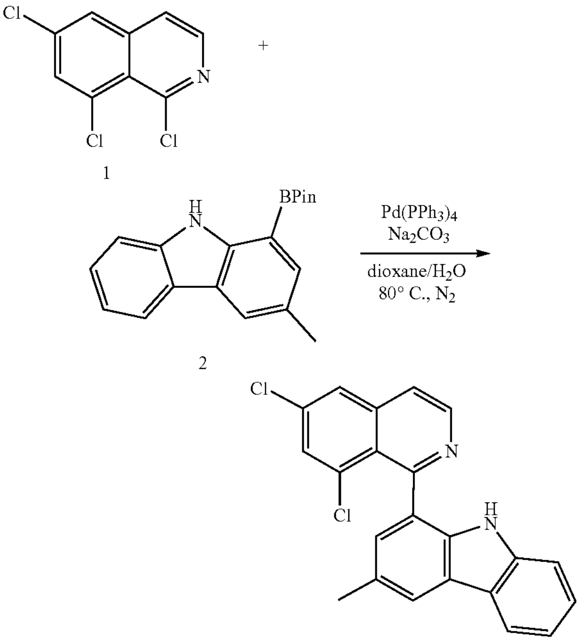

1

2

3

1,6,7-trichloroisoquinoline (Intermediate 1, 4.3 g, 14.2 mmol), Intermediate 2 (3.3 g, 14.2 mmol), $Pd(PPh_3)_4$ (809 mg, 0.7 mmol) and $Na_2CO_3$ (2.3 g, 21.3 mmol) were mixed in dioxane/$H_2O$ (56 mL/14 mL), purged with nitrogen, and reacted overnight at 80° C. After TLC detected that the reaction was completed, the reaction solution was cooled to room temperature, diluted with ethyl acetate and extracted, and the organic phase was concentrated and purified by column chromatography to give Intermediate 3 (3.4 g).

Step 2: Synthesis of Intermediate 4

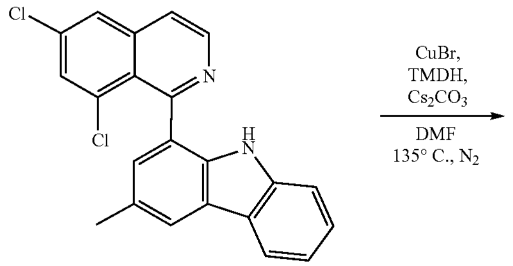

3

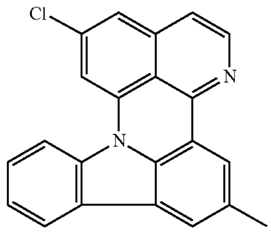

4

Intermediate 3 (3.4 g, 9 mmol), CuBr (129 mg, 0.9 mmol), 2,2,6,6-tetramethyl-3,5-heptanedione (TMDH, 1.33 g, 7.2 mmol) and $Cs_2CO_3$ (7.33 g, 22.5 mmol) were mixed in DMF (90 mL), purged with nitrogen, and reacted at 135° C. for 5 hours. The reaction solution was cooled to room temperature, and water was added to the reaction solution. The product was precipitated and filtered. The filter cake was washed with an appropriate amount of water and PE, dried, then refluxed in EtOH for 3 hours and filtered to give Intermediate 4 (2.6 g).

Step 3: Synthesis of Intermediate 5

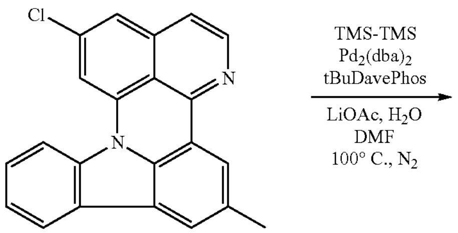

4

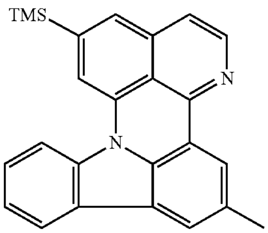

5

Intermediate 4 (2.6 g, 7.63 mmol), $Pd_2(dba)_3$ (137.4 mg, 0.15 mmol), tBuDavePhos (307.3 mg, 0.9 mmol, 6 mol %) and LiOAc (2.52 g, 38.2 mmol) were mixed in DMF (24 mL) and purged with nitrogen, TMS-TMS (2.22 g, 15.2 mmol) and $H_2O$ (275 mg, 15.3 mmol) were added, and the mixture reacted overnight at 100° C. The reaction solution was cooled, added with water, and extracted by EA. The organic phase was collected, and the residue was concentrated and purified by column chromatography to give Intermediate 5 (2.4 g).

Step 4: Synthesis of Iridium Dimer 6

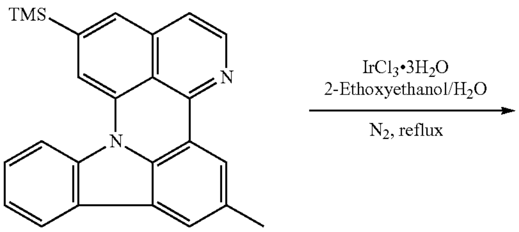

5

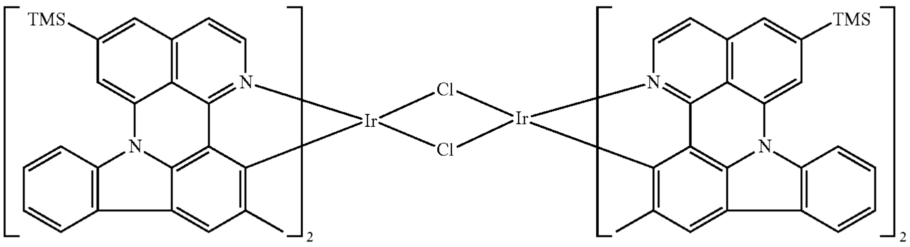

6

Intermediate 5 (1.8 g, 4.75 mmol) and $IrCl_3 \cdot 3H_2O$ (465 mg, 1.32 mmol) were mixed in ethoxyethanol (27 mL) and water (9 mL), purged with nitrogen, and refluxed at 130° C. for 24 hours. After the reaction was cooled to room temperature, the reaction solution was concentrated to remove the solvent to give iridium dimer 6 which can be directly used in the next step without further purification.

Step 5: Synthesis of Compound 63

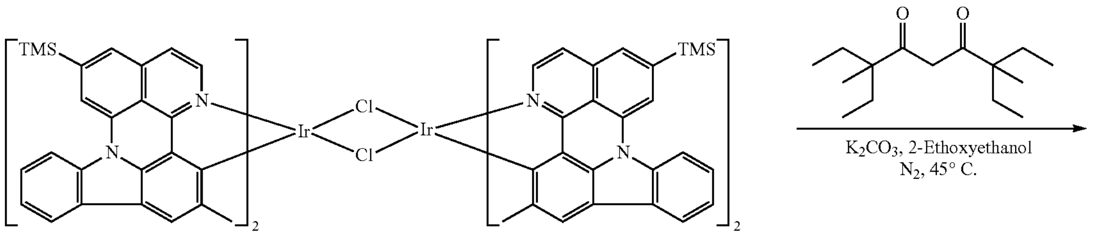

6

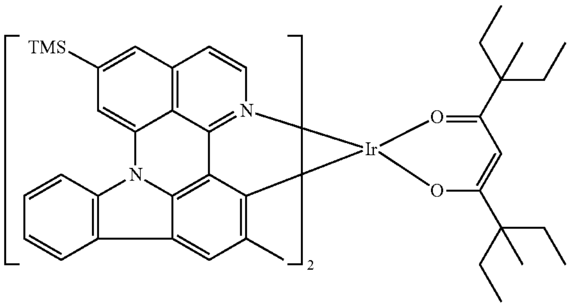

Compound 63

Iridium dimer 6 prepared in step 4, 3,7-diethyl-3,7-dimethyl-4,6-nonanedione (476 mg, 1.98 mmol), $K_2CO_3$ (912 mg, 6.6 mmol) and ethoxyethanol (36 mL) were mixed in a 100 mL single-necked flask, purged with nitrogen, and reacted overnight at 45° C. After TLC detected that the reaction was completed, the reaction solution was cooled to room temperature. The reaction solution was filtered through Celite, the filter cake was washed with an appropriate amount of EtOH, and the crude product was washed with DCM and placed into a 250 mL flask. EtOH (about 10 mL) was added to the flask, and DCM was removed through rotary evaporation at room temperature. Then solids were precipitated, filtered and washed with an appropriate amount of EtOH to give the crude product. The crude product was purified by column chromatography to give Compound 63 (300 mg). The product was confirmed as the target product with a molecular weight of 1186.5.

Synthesis Example 2: Synthesis of Compound 38

Step 1: Synthesis of Iridium Dimer 8

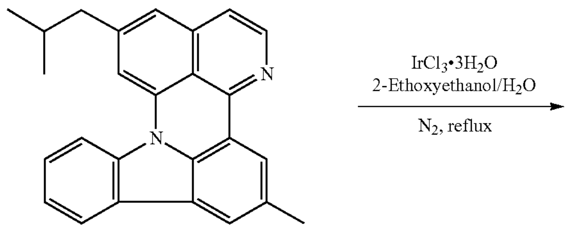

7

-continued

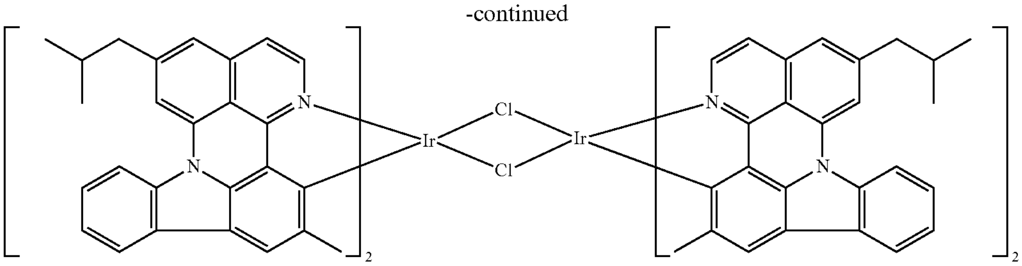

8

Intermediate 7 (400 mg, 1.1 mmol) and $IrCl_3 \cdot 3H_2O$ (113 mg, 0.32 mmol) were mixed in ethoxyethanol (6 mL) and water (2 mL), purged with nitrogen, and refluxed at 130° C. for 24 hours. After the reaction was cooled to room temperature, the reaction solution was concentrated to remove the solvent to give iridium dimer 8 which can be directly used in the next step without further purification.

Step 2: Synthesis of Compound 38

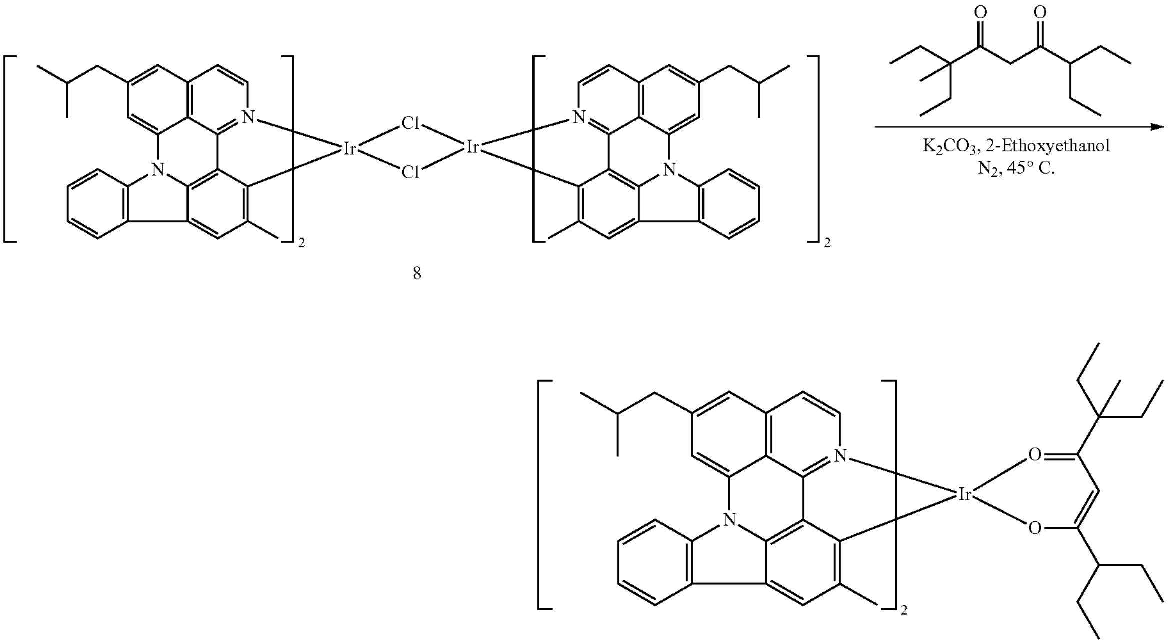

8

Compound 38

Iridium dimer 8 prepared in step 1, 3,7-diethyl-3-methylnonane-4,6-dione (289 mg, 1.28 mmol), $K_2CO_3$ (442 mg, 3.2 mmol) and ethoxyethanol (6 mL) were mixed in a 100 mL single-necked flask, purged with nitrogen, and reacted overnight at 45° C. After TLC detected that the reaction was completed, the reaction solution was cooled to room temperature. The reaction solution was filtered through Celite, the filter cake was washed with an appropriate amount of EtOH, and the crude product was washed with DCM and placed into a 250 mL flask. EtOH (about 10 mL) was added to the flask, and DCM was removed through rotary evaporation at room temperature. Then solids were precipitated, filtered and washed with an appropriate amount of EtOH to give the crude product. The crude product was purified by column chromatography to give Compound 38 (100 mg). The product was confirmed as the target product with a molecular weight of 1140.5.

Synthesis Example 3: Synthesis of Compound 260

Step 1: Synthesis of Iridium Dimer 10

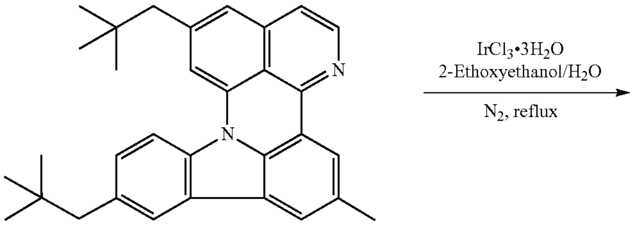

9

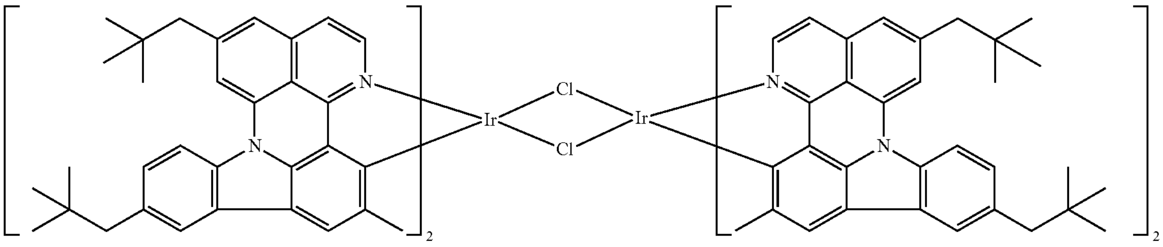

10

Intermediate 9 (156 mg, 0.35 mmol) and $IrCl_3·3H_2O$ (41 mg, 0.11 mmol) were mixed in ethoxyethanol (3 mL) and water (1 mL), purged with nitrogen, and refluxed at 130° C. for 24 hours. After the reaction was cooled to room temperature, the reaction solution was concentrated to remove the solvent to give iridium dimer 10 which can be directly used in the next step without further purification.

Step 2: Synthesis of Compound 260

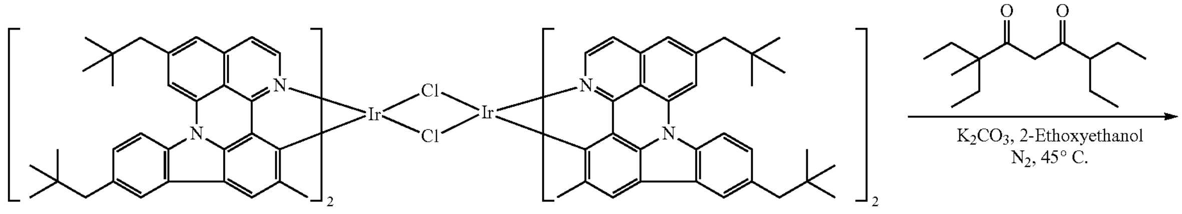

10

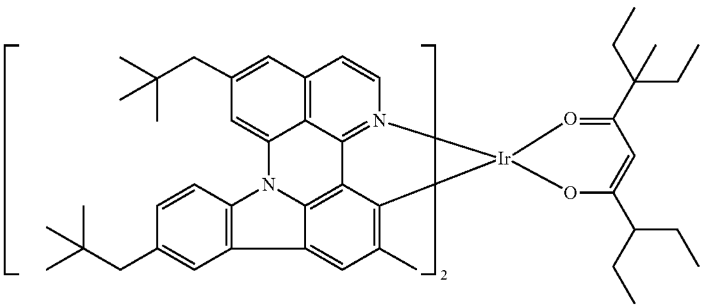

Compound 260

Iridium dimer 10 prepared in step 1, 3,7-diethyl-3-methylnonane-4,6-dione (37.4 mg, 0.17 mmol), $K_2CO_3$ (76 mg, 0.55 mmol) and ethoxyethanol (5 mL) were mixed in a 100 mL single-necked flask, purged with nitrogen, and reacted overnight at 45° C. After TLC detected that the reaction was completed, the reaction solution was cooled to room temperature. The reaction solution was filtered through Celite, the filter cake was washed with an appropriate amount of EtOH, and the crude product was washed with DCM and placed into a 250 mL flask. EtOH (about 10 mL) was added to the flask, and DCM was removed through rotary evaporation at room temperature. Then solids were precipitated, filtered and washed with an appropriate amount of EtOH to give the crude product. The crude product was purified by column chromatography to give Compound 260 (40 mg). The product was confirmed as the target product with a molecular weight of 1308.7.

Synthesis Example 4: Synthesis of Compound 192

Step 1: Synthesis of Iridium Dimer 12

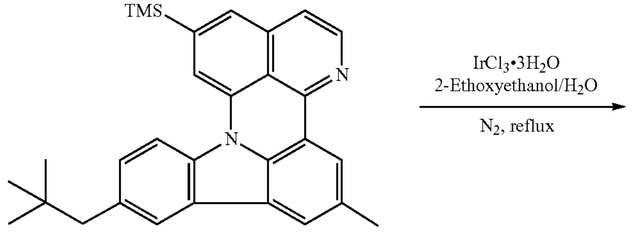

11

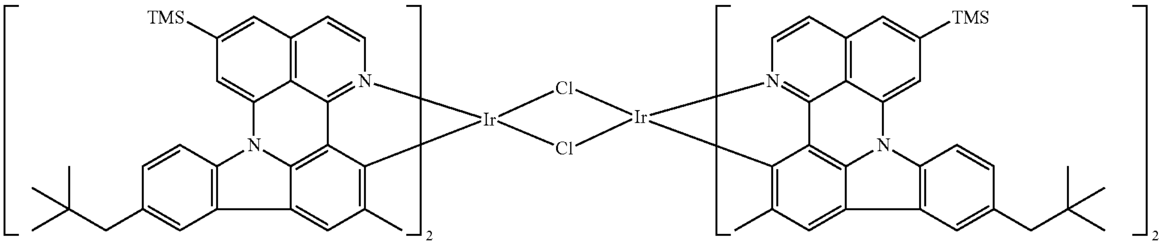

12

Intermediate 11 (1.4 g, 3.12 mmol) and $IrCl_3 \cdot 3H_2O$ (400 mg, 1.13 mmol) were mixed in ethoxyethanol (27 mL) and water (9 mL), purged with nitrogen, and refluxed at 130° C. for 24 hours. After the reaction was cooled to room temperature, the reaction solution was concentrated to remove the solvent to give iridium dimer 12 which can be directly used in the next step without further purification.

Step 2: Synthesis of Compound 192

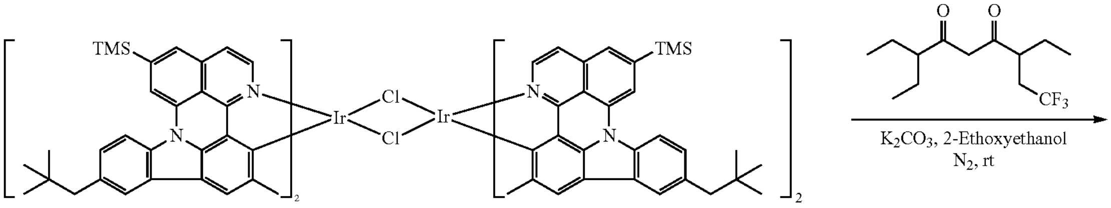

12

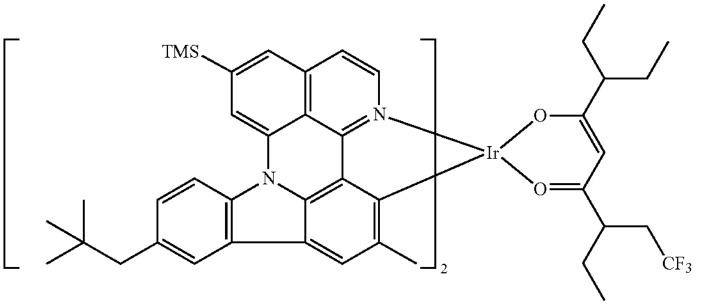

Compound 192

Iridium dimer 12 prepared in step 1, 3,7-diethyl-1,1,1-trifluorononane-4,6-dione (452 mg, 1.7 mmol), $K_2CO_3$ (781 mg, 5.65 mmol) and ethoxyethanol (25 mL) were mixed in a 100 mL single-necked flask, purged with nitrogen, and reacted overnight at room temperature. After TLC detected that the reaction was completed, the reaction solution was cooled to room temperature. The reaction solution was filtered through Celite, the filter cake was washed with an appropriate amount of EtOH, and the crude product was washed with DCM and placed into a 250 mL flask. EtOH (about 10 mL) was added to the flask, and DCM was removed through rotary evaporation at room temperature. Then solids were precipitated, filtered and washed with an appropriate amount of EtOH to give the crude product. The crude product was purified by column chromatography to give Compound 192 (167 mg). The product was confirmed as the target product with a molecular weight of 1352.6.

Synthesis Example 5: Synthesis of Compound 278

Step 1: Synthesis of Iridium Dimer 14

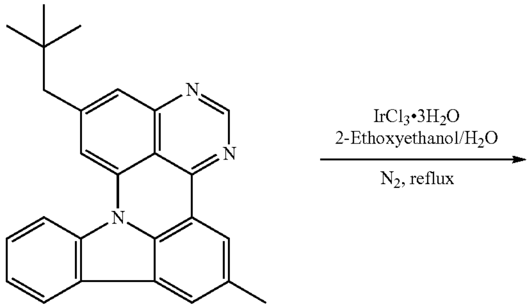

13

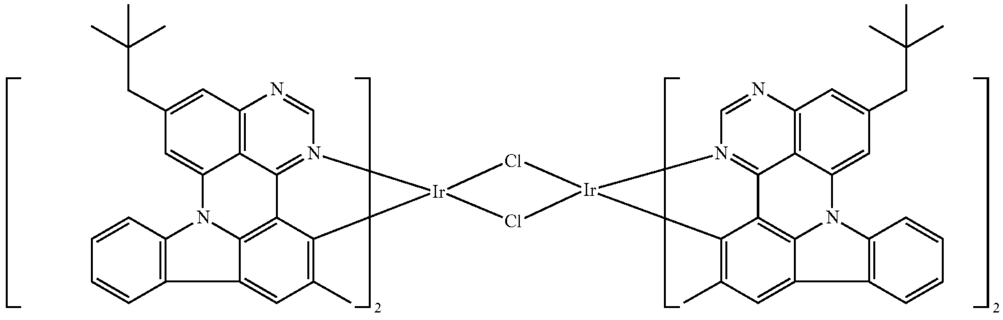

14

Intermediate 13 (100 mg, 0.26 mmol) and $IrCl_3{\cdot}3H_2O$ (35 mg, 0.1 mmol) were mixed in ethoxyethanol (3 mL) and water (1 mL), purged with nitrogen, and refluxed at 130° C. for 24 hours. After the reaction was cooled to room temperature, the reaction solution was concentrated to remove the solvent to give iridium dimer 14 which can be directly used in the next step without further purification.

Step 2: Synthesis of Compound 278

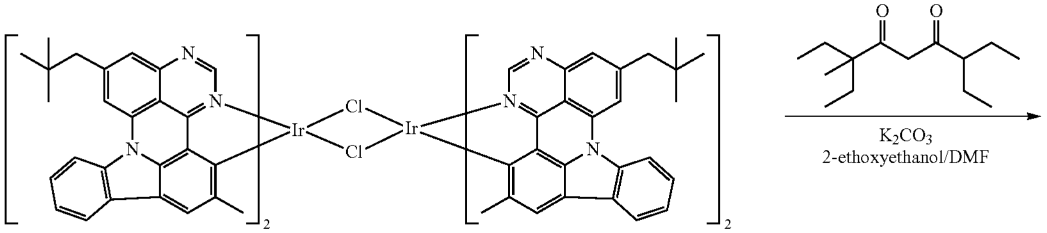

14

-continued

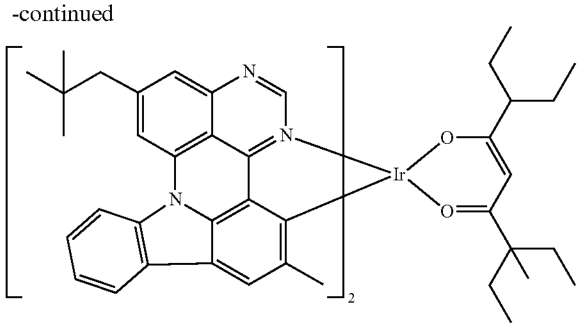

Compound 278

Iridium dimer 14 prepared in step 1, 3,7-diethyl-3-methylnonane-4,6-dione (50 mg, 0.22 mmol), $K_2CO_3$ (70 mg, 0.5 mmol), ethoxyethanol (2 mL) and DMF (2 mL) were mixed in a 100 mL single-necked flask, purged with nitrogen, and reacted overnight at 50° C. After TLC detected that the reaction was completed, the reaction solution was cooled to room temperature. The reaction solution was filtered through Celite, the filter cake was washed with an appropriate amount of EtOH, and the crude product was washed with DCM and placed into a 50 mL flask. EtOH (about 2 mL) was added to the flask, and DCM was removed through rotary evaporation at room temperature. Then solids were precipitated, filtered and washed with an appropriate amount of EtOH to give the crude product. The crude product was purified by column chromatography to give Compound 278 (3 mg). The product was confirmed as the target product with a molecular weight of 1170.5.

Synthesis Example 6: Synthesis of Compound 256

Step 1: Synthesis of Intermediate 16

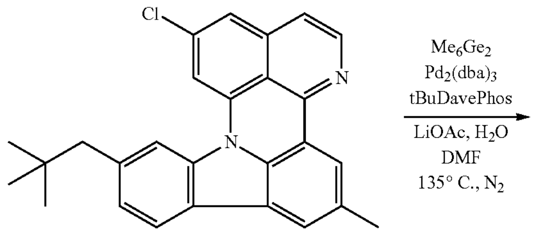

15

-continued

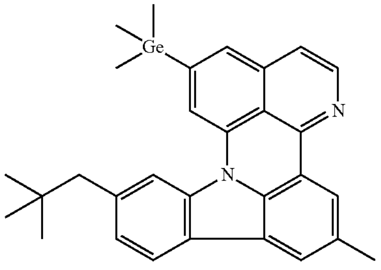

16

Intermediate 15 (2.33 g, 5.67 mmol), $Pd_2(dba)_3$ (201 mg, 0.22 mmol), tBuDavePhos (450 mg, 1.32 mmol) and LiOAc (1.88 g, 28.4 mmol) were mixed in DMF (19 mL) and purged with nitrogen, hexamethyldigermane (2.4 g, 10.2 mmol) and $H_2O$ (205 mg, 11.4 mmol) were added, and the mixture reacted overnight at 135° C. The reaction solution was cooled, and water was added to the reaction solution. The precipitated product was filtered and dissolved with EA. The crude product was concentrated and purified by column chromatography to give Intermediate 16 (1.4 g).

Step 2: Synthesis of Iridium Dimer 17

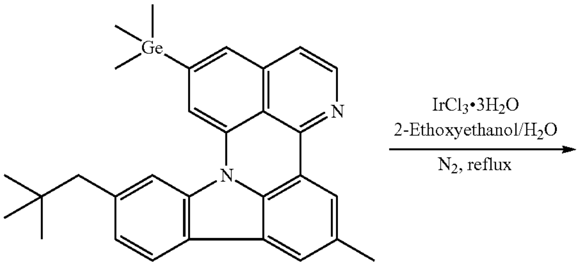

16

-continued

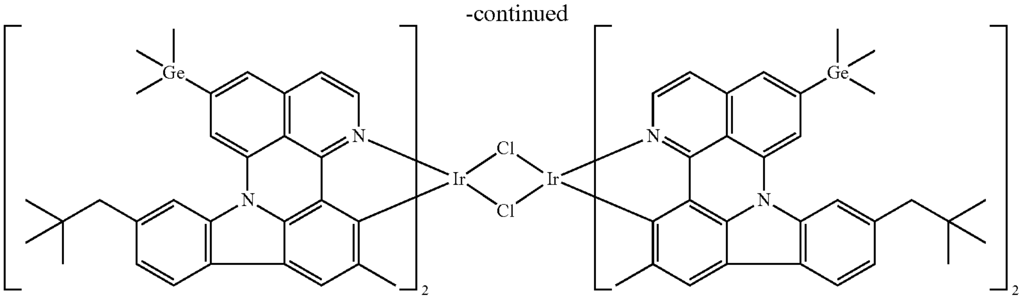

17

Intermediate 16 (1.4 g, 2.8 mmol) and $IrCl_3{\cdot}3H_2O$ (395 mg, 1.12 mmol) were mixed in ethoxyethanol (27 mL) and water (9 mL), purged with nitrogen, and refluxed at 130° C. for 24 hours. After the reaction was cooled to room temperature, the reaction solution was concentrated to remove the solvent to give iridium dimer 17 which can be directly used in the next step without further purification.

Step 3: Synthesis of Compound 256

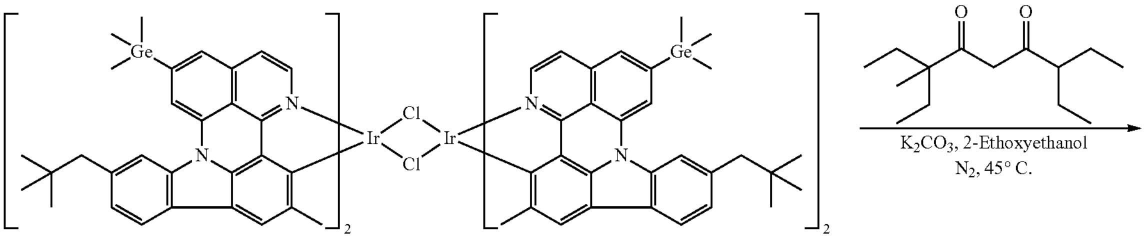

17

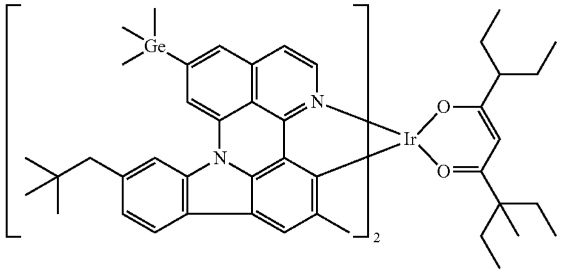

Compound 256

Iridium dimer 17 prepared in step 2, 3,7-diethyl-3-methylnonane-4,6-dione (380 mg, 1.68 mmol), $K_2CO_3$ (774 mg, 5.6 mmol) and ethoxyethanol (25 mL) were mixed in a 100 mL single-necked flask, purged with nitrogen, and reacted overnight at 45° C. After TLC detected that the reaction was completed, the reaction solution was cooled to room temperature. The reaction solution was filtered through Celite, the filter cake was washed with an appropriate amount of EtOH, and the crude product was dissolved with DCM. EtOH (about 10 mL) was added to the solution, and DCM was removed through rotary evaporation at room temperature. Then solids were precipitated, filtered and washed with an appropriate amount of EtOH. The crude product was subjected to column chromatography to give Compound 256 (150 mg). The product was confirmed as the target product with a molecular weight of 1404.5.

Synthesis Example 7: Synthesis of Compound 321

Step 1: Synthesis of Iridium Dimer 19

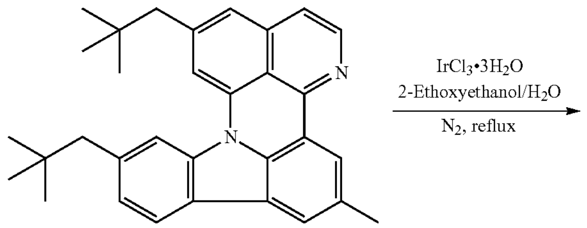

18

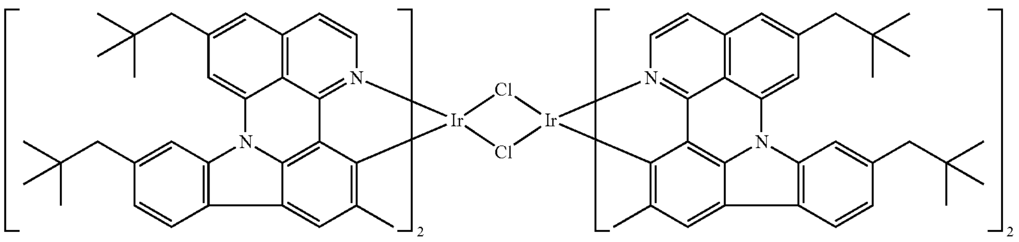

19

Intermediate 18 (210 mg, 0.47 mmol) and $IrCl_3 \cdot 3H_2O$ (56 mg, 0.16 mmol) were mixed in ethoxyethanol (3.9 mL) and water (1.3 mL), purged with nitrogen, and refluxed at 130° C. for 24 hours. After the reaction was cooled to room temperature, the reaction solution was concentrated to remove the solvent to give iridium dimer 19 which can be directly used in the next step without further purification.

Step 2: Synthesis of Compound 321

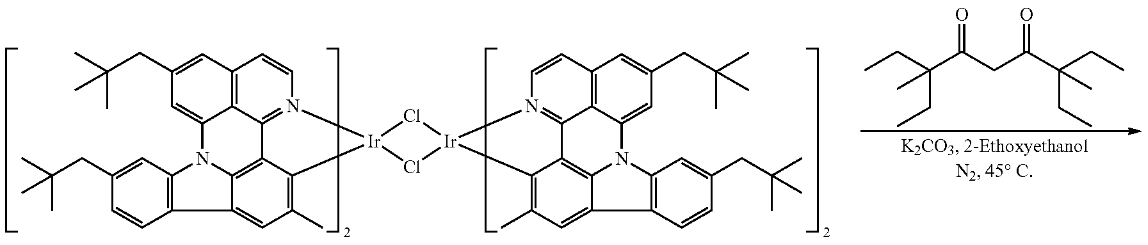

19

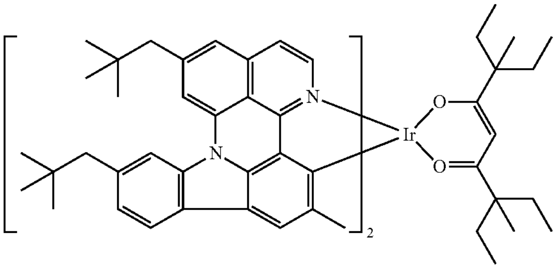

Compound 321

Iridium dimer 19 prepared in step 1, 3,7-diethyl-3,7-dimethylnonane-4,6-dione (56 mg, 0.23 mmol), $K_2CO_3$ (110 mg, 0.8 mmol) and ethoxyethanol (5 mL) were mixed in a 100 mL single-necked flask, purged with nitrogen, and reacted overnight at 45° C. After TLC detected that the reaction was completed, the reaction solution was cooled to room temperature. The reaction solution was filtered through Celite, the filter cake was washed with an appropriate amount of EtOH, and the crude product was dissolved with DCM. EtOH (about 2 mL) was added to the solution, and DCM was removed through rotary evaporation at room temperature. Then solids were precipitated, filtered and washed with an appropriate amount of EtOH. The crude product was subjected to column chromatography to give Compound 321 (50 mg). The product was confirmed as the target product with a molecular weight of 1322.7.

Synthesis Example 8: Synthesis of Compound 28

Step 1: Synthesis of Compound 28

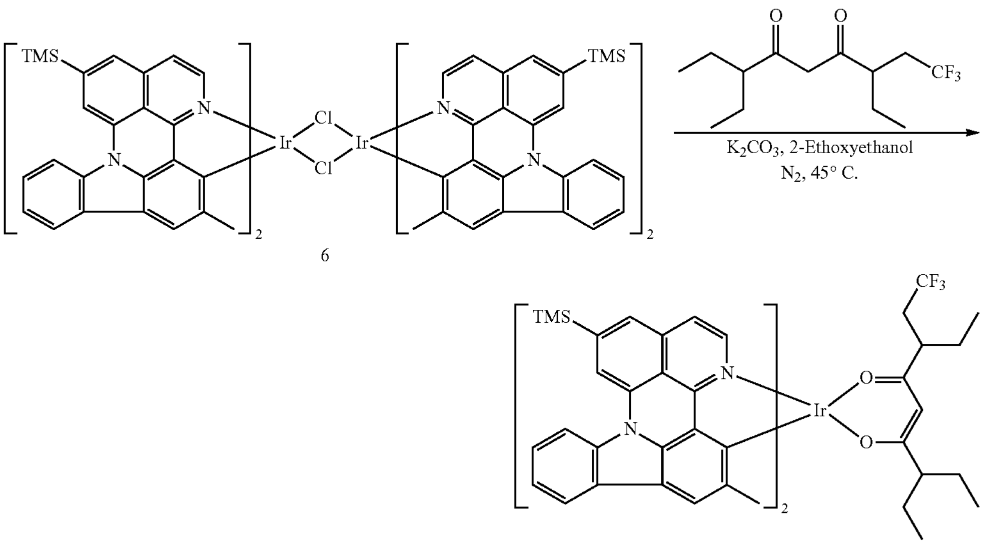

Compound 28

Iridium dimer 6 (0.67 mmol), 3,7-diethyl-1,1,1-trifluorononane-4,6-dione (535 mg, 2 mmol), $K_2CO_3$ (926 mg, 6.7 mmol) and ethoxyethanol (36 mL) were mixed in a 100 mL single-necked flask, purged with nitrogen, and reacted overnight at 45° C. After TLC detected that the reaction was completed, the reaction solution was cooled to room temperature. The reaction solution was filtered through Celite, the filter cake was washed with an appropriate amount of EtOH, and the crude product was washed with DCM until the crude product was dissolved. EtOH (about 5 mL) was added to the solution, and DCM was removed through rotary evaporation at room temperature. Then solids were precipitated, filtered and washed with an appropriate amount of EtOH to give the crude product. The crude product was purified by column chromatography to give Compound 28 (240 mg). The product was confirmed as the target product with a molecular weight of 1212.4.

Synthesis Example 9: Synthesis of Compound 416

Step 1: Synthesis of Intermediate 21

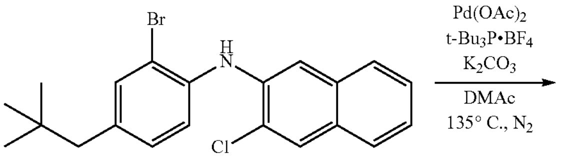

20

-continued

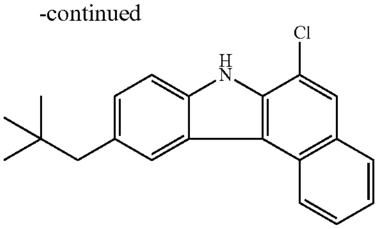

21

Intermediate 20 (8.38 g, 20.8 mmol), $Pd(OAc)_2$ (234 mg, 1.04 mmol), $tBu_3P{\cdot}BF_4$ (603 mg, 2.08 mmol), $K_2CO_3$ (5.75 g, 41.58 mmol) and DMAc were added to a reaction flask, purged with nitrogen, and reacted overnight at 135° C. After TLC detected that the reaction was completed, the reaction solution was cooled to room temperature, diluted with water, and extracted three times with EA, and the organic phase was combined, dried, concentrated and separated by column chromatography to give Intermediate 21 (2.67 g).

Step 2: Synthesis of Intermediate 22

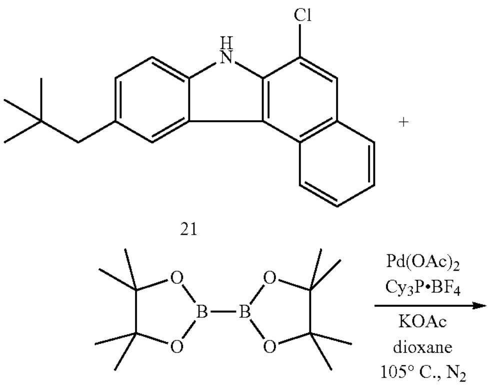

-continued

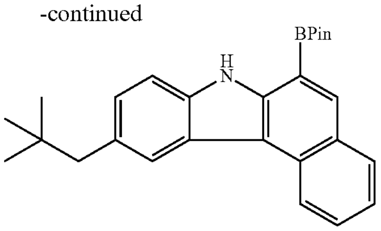

22

Intermediate 21 (2.18 g, 6.8 mmol), bis(pinacolato)diboron (3.45 g, 13.6 mmol), $Pd(OAc)_2$ (76 mg, 0.36 mmol), $Cy_3P{\cdot}BF_4$ (250 mg, 0.27 mmol), KOAc (2.0 g, 20.4 mmol) and 1,4-dioxane (13 mL) were added to a reaction flask, purged with nitrogen, and reacted overnight at 105° C. After TLC detected that the reaction was completed, the reaction solution was cooled to room temperature, water was added to the reaction system, and the aqueous phase was extracted with EA, and the organic phase was combined, dried, subjected to rotary evaporation to remove the solvent and purified by column chromatography to give Intermediate 22 (1.68 g).

Step 3: Synthesis of Intermediate 23

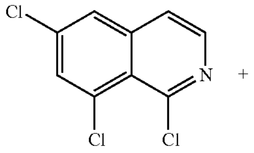

1

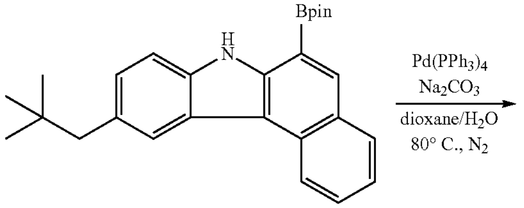

22

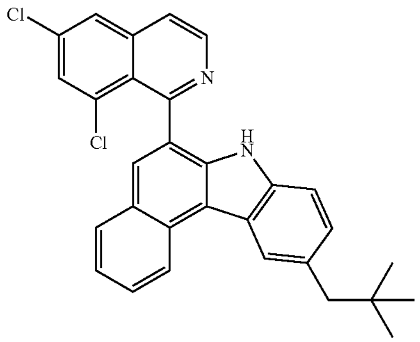

23

Intermediate 1 (780 mg, 3.31 mmol), Intermediate 22 (1.37 g, 3.31 mmol), $Pd(PPh_3)_4$ (192 mg, 0.16 mmol) and $Na_2CO_3$ (0.53 g, 4.97 mmol) were mixed in 1,4-dioxane/$H_2O$ (28 mL/7 mL), purged with nitrogen, and reacted overnight at 80° C. After TLC detected that the reaction was completed, the reaction solution was cooled to room temperature, diluted with EA and extracted by adding water, and the organic phase was collected, concentrated and subjected to column chromatography to give Intermediate 23 (0.72 g).

Step 4: Synthesis of Intermediate 24

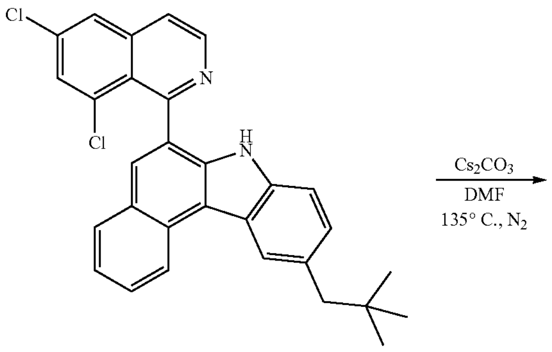

23

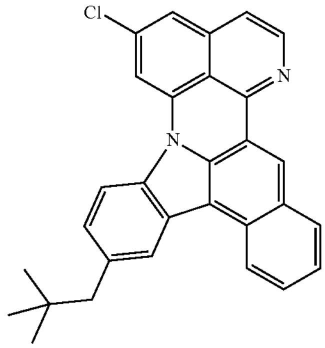

24

Intermediate 23 (0.95 g, 1.97 mmol) and $Cs_2CO_3$ (1.6 g, 4.91 mmol) were mixed in DMF (20 mL), purged with nitrogen, and reacted at 135° C. for 1 hour. After the reaction was completed, the reaction solution was cooled to room temperature, and water was added to the reaction solution. The product was precipitated and filtered. The filter cake was washed with an appropriate amount of water and petroleum ether and dried to give Intermediate 24 (0.86 g).

Step 5: Synthesis of Intermediate 25

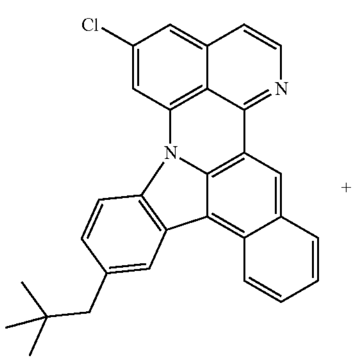

24

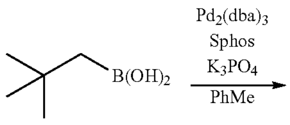

-continued

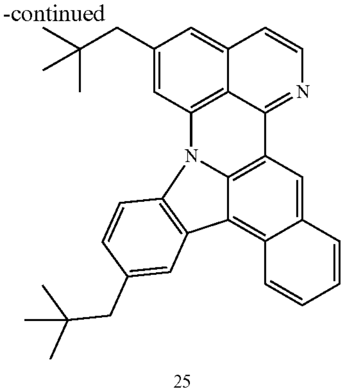

25

Intermediate 24 (0.94 g, 2.1 mmol), neopentylboronic acid (0.49 g, 4.2 mmol), $Pd_2(dba)_3$ (48 mg, 0.05 mmol), SPhos (86 mg, 0.21 mmol) and $K_3PO_4$ (1.68 mg, 6.3 mmol) were mixed in toluene (25 mL), purged with nitrogen, and reacted overnight at 110° C. After TLC detected that the reaction was completed, the reaction solution was cooled to room temperature, concentrated and purified by column chromatography to give Intermediate 25 (0.7 g).

Step 6: Synthesis of Iridium Dimer 26

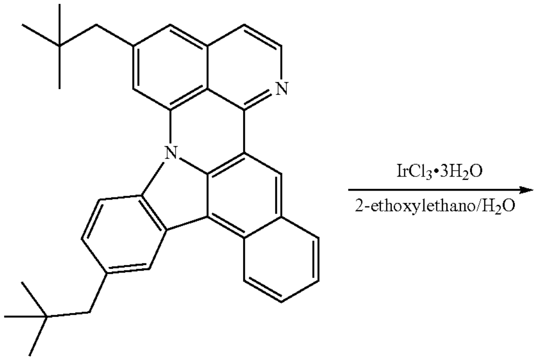

25

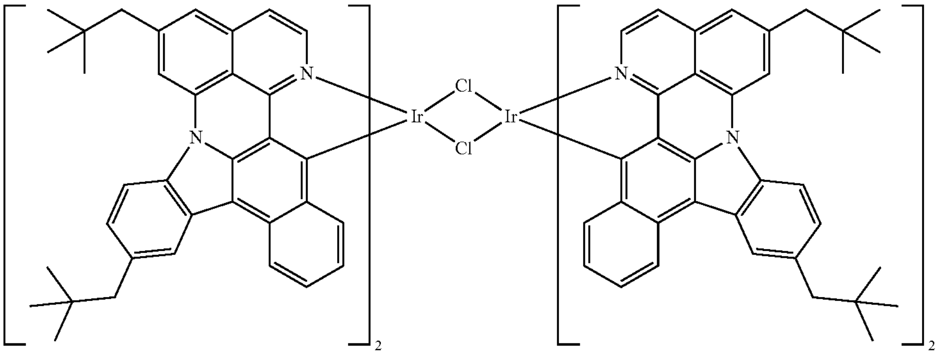

26

The mixture of Intermediate 25 (1.0 g, 2.07 mmol), iridium trichloride trihydrate (240 mg, 0.68 mmol), 2-ethoxyethanol (12 mL) and water (4 mL) was placed in a high-pressure reaction kettle and reacted at 160° C. for 24 hours. After the reaction was cooled to room temperature, the mixture was filtered to give iridium dimer 26 as red solids which can be directly used in the next step without further purification.

Step 7: Synthesis of Compound 416

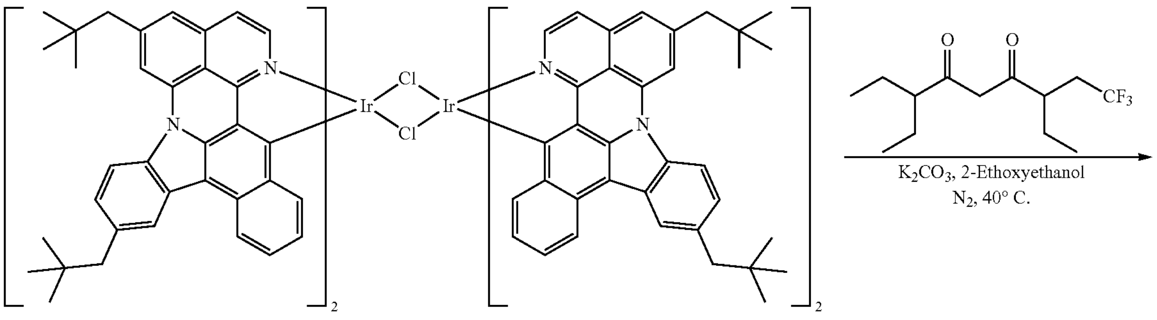

26

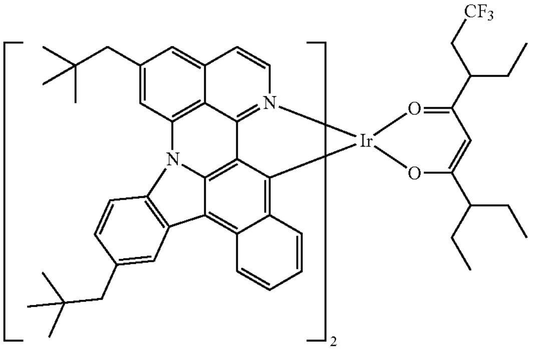

Compound 416

The iridium dimer 26 prepared step 6, 3,7-diethyl-1,1,1-trifluorononane-4,6-dione (0.26 g, 1.0 mmol) and potassium carbonate (0.47 g, 3.4 mmol) were mixed in ethoxyethanol (15 mL), purged with nitrogen, and reacted at 40° C. for 24 hours. The reaction solution was filtered through Celite, and the filter cake was washed with ethanol. The crude product was dissolved in DCM, ethanol (about 5 mL) was added to the solution, and DCM was removed through rotary evaporation at room temperature. Then solids were precipitated, filtered and washed with an appropriate amount of EtOH. The crude product was purified by column chromatography to give Compound 416 (80 mg). The product was confirmed as the target product with a molecular weight of 1420.6.

Synthesis Example 10: Synthesis of Compound 470

Step 1: Synthesis of Iridium Dimer 28

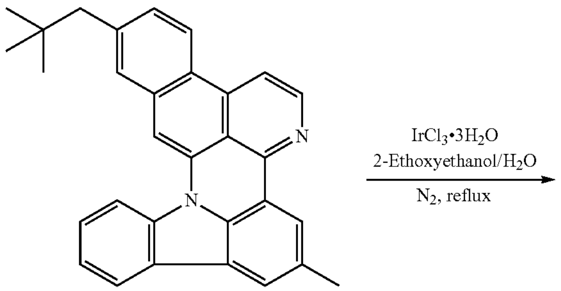

27

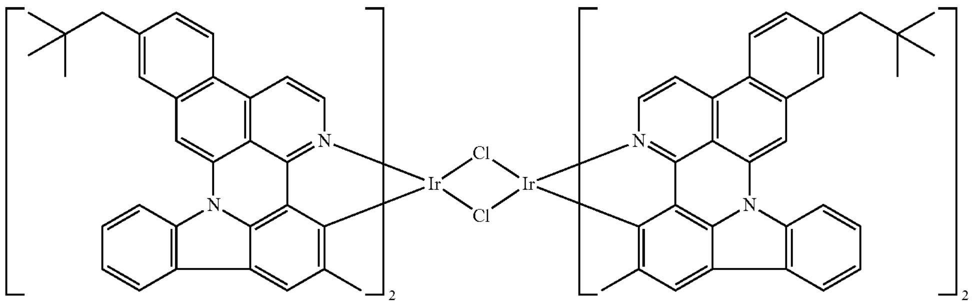

28

Intermediate 27 (110 mg, 0.25 mmol) and $IrCl_3 \cdot 3H_2O$ (35 mg, 0.1 mmol) were mixed in ethoxyethanol (6 mL) and water (2 mL), purged with nitrogen, and refluxed at 130° C. for 24 hours. After the reaction was cooled to room temperature, the reaction solution was concentrated to remove the solvent to give iridium dimer 28 which can be directly used in the next step without further purification.

Step 2: Synthesis of Compound 470

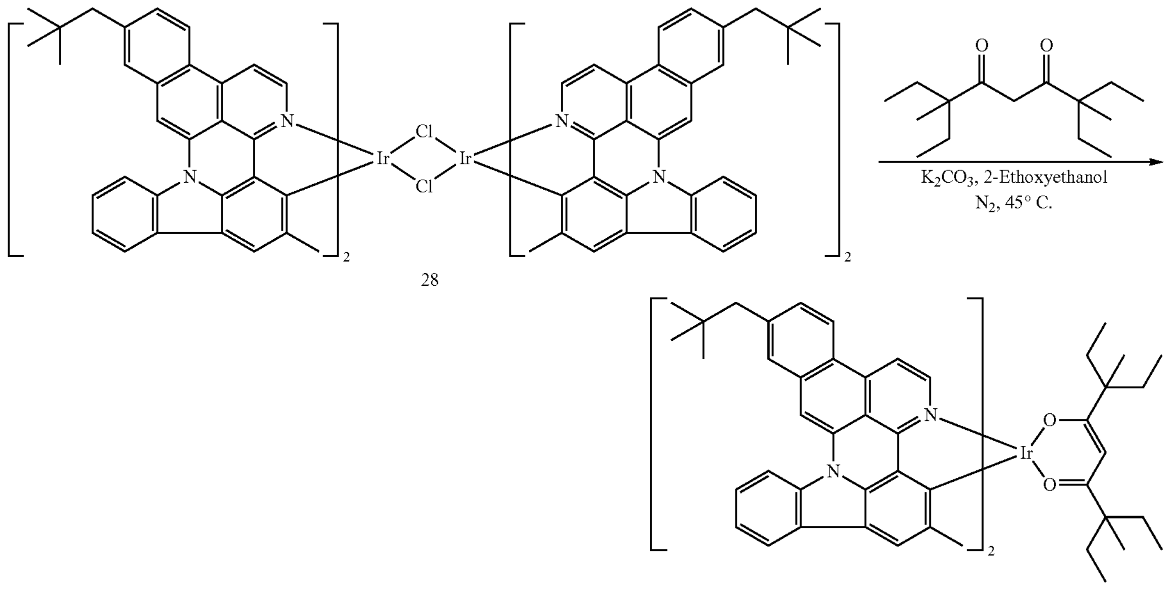

28

Compound 470

Iridium dimer 28 prepared in step 1, 3,7-diethyl-3,7-dimethylnonane-4,6-dione (36 mg, 0.15 mmol), $K_2CO_3$ (69 mg, 0.5 mmol) and ethoxyethanol (5 mL) were mixed in a 100 mL single-necked flask, purged with nitrogen, and reacted overnight at 45° C. After TLC detected that the reaction was completed, the reaction solution was cooled to room temperature. The reaction solution was filtered through Celite, the filter cake was washed with an appropriate amount of EtOH, and the crude product was dissolved with DCM. EtOH (about 2 mL) was added to the solution, and DCM was removed through rotary evaporation at room temperature. Then solids were precipitated, filtered and washed with an appropriate amount of EtOH. The crude product was subjected to column chromatography to give Compound 470 (30 mg). The product was confirmed as the target product with a molecular weight of 1282.6.

The persons skilled in the art will appreciate that the above preparation methods are merely examples. The persons skilled in the art can obtain other compound structures of the present disclosure through the modifications of the preparation methods.

Device Example

Device Example 1

First, a glass substrate having an indium tin oxide (ITO) anode with a thickness of 120 nm was cleaned and then treated with oxygen plasma and UV ozone. After the treatment, the substrate was dried in a glovebox to remove moisture. Next, the substrate was mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was used as a hole injection layer (HIL) with a thickness of 100 Å. Compound HT was used as a hole transporting layer (HTL) with a thickness of 400 Å. Compound EB was used as an electron blocking layer (EBL) with a thickness of 50 Å. Compound 63 of the present disclosure was doped in a host compound RH to be used as an emissive layer (EML, at a weight ratio of 2:98) with a thickness of 400 Å. Compound HB was used as a hole blocking layer (HBL) with a thickness of 50 Å. On the HBL, a compound ET and 8-hydroxyquinolinolato-lithium (Liq) were co-deposited as an electron transport layer (ETL) with a thickness of 350 Å. Finally, Liq with a thickness of 1 nm was deposited as an electron injection layer, and Al with a thickness of 120 nm was deposited as a cathode. The device was transferred back to the glovebox and encapsulated with a glass lid and a moisture absorbent to complete the device.

Device Comparative Example 1

The preparation method in Device Comparative Example 1 was the same as that in Device Example 1, except that Compound 63 of the present disclosure was replaced with Compound RD-A in the emissive layer (EML).

Device Comparative Example 2

The preparation method in Device Comparative Example 2 was the same as that in Device Example 1, except that Compound 63 of the present disclosure was replaced with Compound RD-B in the emissive layer (EML).

Device Example 2

The preparation method in Device Example 2 was the same as that in Device Example 1, except that Compound 63 of the present disclosure was replaced with Compound 28 in the emissive layer (EML).

Device Example 3

The preparation method in Device Example 3 was the same as that in Device Example 1, except that Compound HT was doped with Compound HT2 (at a weight ratio of 97:3) to replace Compound HI in the hole injection layer (HIL) and Compound 63 of the present disclosure was replaced with Compound 256 in the emissive layer (EML).

Device Example 4

The preparation method in Device Example 4 was the same as that in Device Example 3, except that Compound 256 of the present disclosure was replaced with Compound 416 in the emissive layer (EML).

The structures and thicknesses of some layers of the devices are shown in the following table. The layer using more than one material was obtained by doping different compounds at their weight ratios as recorded.

TABLE 1

Part structures of devices in Device Examples and Device Comparative Examples

| Device No. | HIL | HTL | EBL | EML | HBL | ETL |
|---|---|---|---|---|---|---|
| Example 1 | Compound HI (100 Å) | Compound HT (400 Å) | Compound EB (50 Å) | Compound RH:Compound 63 (98:2) (400 Å) | Compound HB (50 Å) | Compound ET:Liq (40:60) (350 Å) |
| Comparative Example 1 | Compound HI (100 Å) | Compound HT (400 Å) | Compound EB (50 Å) | Compound RH:Compound RD-A (98:2) (400 Å) | Compound HB (50 Å) | Compound ET:Liq (40:60) (350 Å) |
| Comparative Example 2 | Compound HI (100 Å) | Compound HT (400 Å) | Compound EB (50 Å) | Compound RH:Compound RD-B (98:2) (400 Å) | Compound HB (50 Å) | Compound ET:Liq (40:60) (350 Å) |
| Example 2 | Compound HI (100 Å) | Compound HT (400 Å) | Compound EB (50 Å) | Compound RH:Compound 28 (98:2) (400 Å) | Compound HB (50 Å) | Compound ET:Liq (40:60) (350 Å) |
| Example 3 | Compound HT:Compound HT2 (97:3) (100 Å) | Compound HT (400 Å) | Compound EB (50 Å) | Compound RH:Compound 256 (98:2) (400 Å) | Compound HB (50 Å) | Compound ET:Liq (40:60) (350 Å) |
| Example 4 | Compound HT:Compound HT2 (97:3) (100 Å) | Compound HT (400 Å) | Compound EB (50 Å) | Compound RH:Compound 416 (98:2) (400 Å) | Compound HB (50 Å) | Compound ET:Liq (40:60) (350 Å) |

The structures of the materials used in the devices are shown as follows:

Compound HI

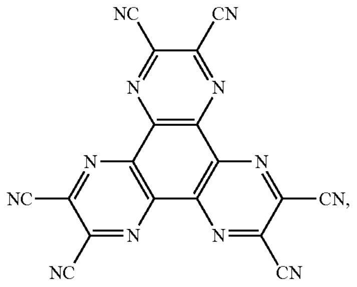

-continued

Compound HT2

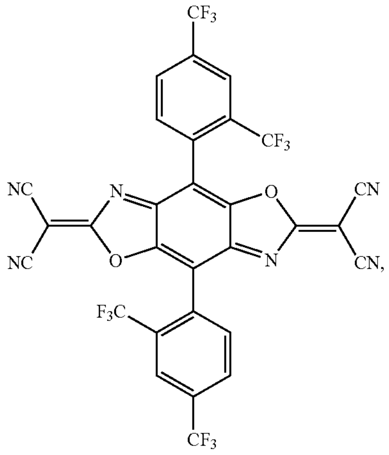

-continued
Compound HT
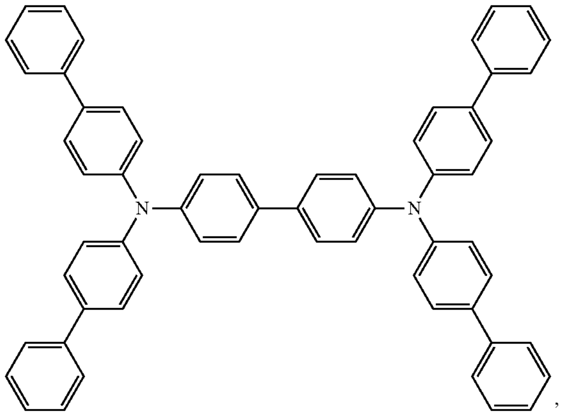
,
Compound EB
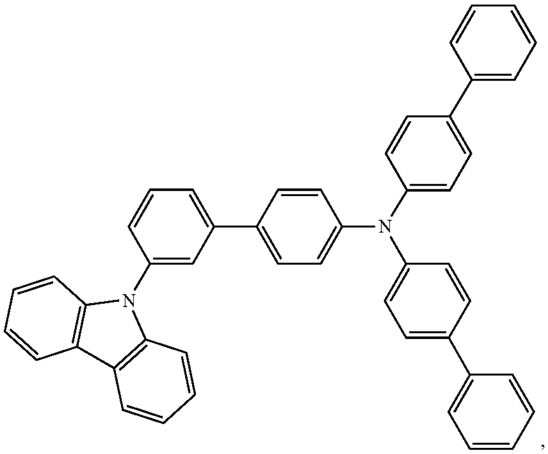
,
Compound ET
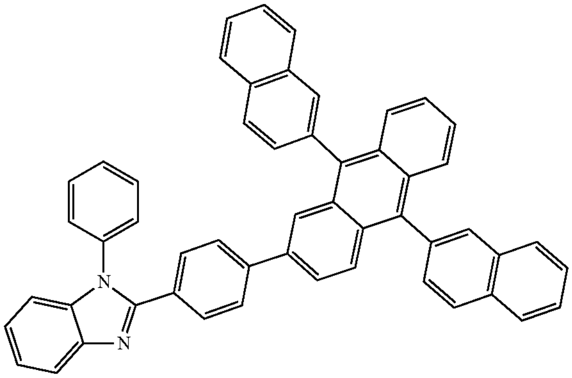
,
Compound HB
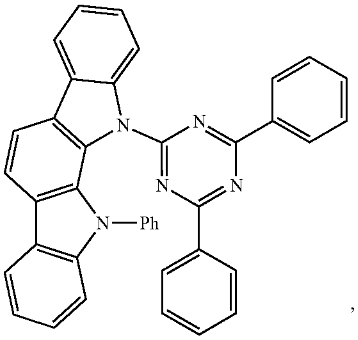
,
-continued
Compound RH
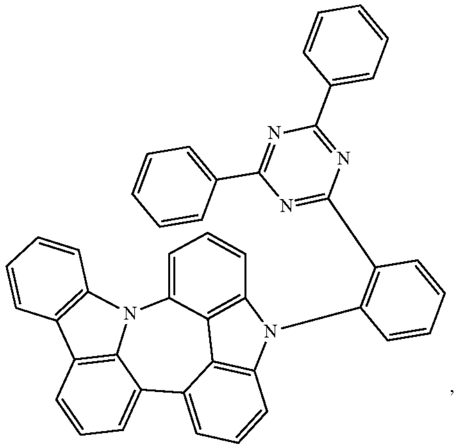
,
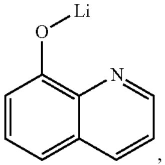
,
Liq
Compound 63
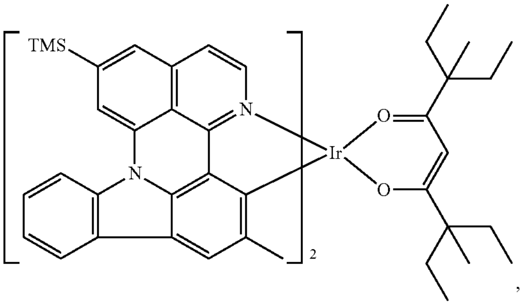
,
Compound RD-A
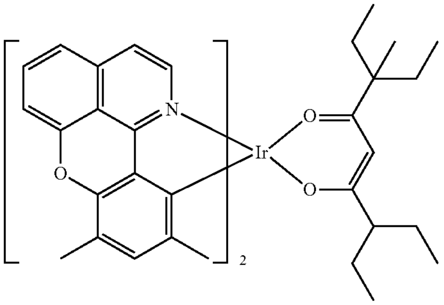
,
Compound RD-B
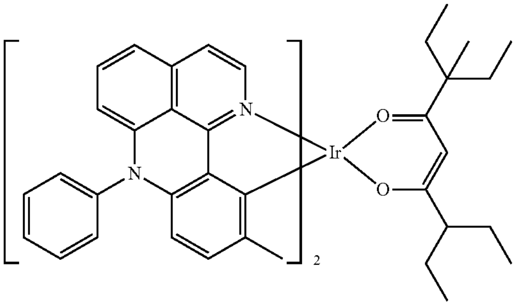
, -continued Compound 28

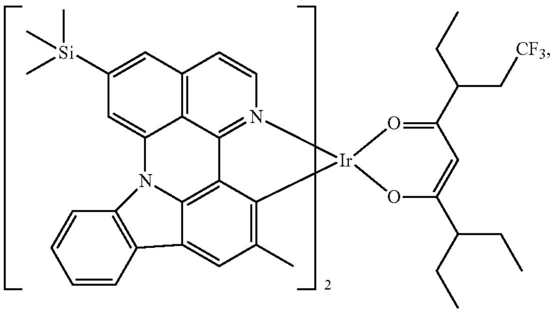

Compound 256

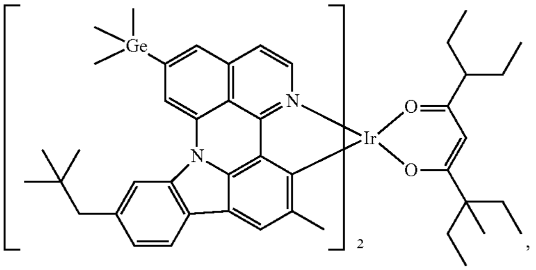

, and

Compound 416

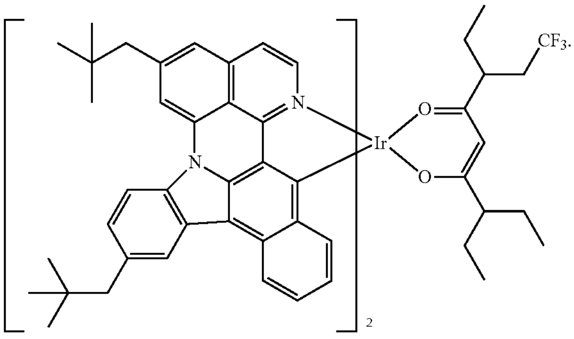

The IVL characteristics of the devices were measured. Table 2 shows the data of maximum emission wavelength (?$_{max}$), full width at half maximum (FWHM), driving voltage (V) and external quantum efficiency (EQE) measured at a current density of 15 mA/cm$^2$ and lifetime (LT97) data measured at a current density of 80 mA/cm$^2$.

TABLE 2

| Device data | | | | | |
|---|---|---|---|---|---|
| Device No. | $\lambda_{max}$ (nm) | FWHM (nm) | Voltage (V) | EQE (%) | LT97 (h) |
| Example 1 | 623 | 21.4 | 3.64 | 24.8 | 67.00 |
| Comparative Example 1 | 568 | 31.5 | 3.64 | 5.64 | 3.30 |
| Comparative Example 2 | 578 | 17.7 | 3.84 | 6.73 | 1.85 |
| Example 2 | 622 | 20.2 | 3.58 | 22.2 | 54 |
| Example 3 | 619 | 21.3 | 3.65 | 25.3 | 43 |
| Example 4 | 669 | 33.2 | 3.66 | 18.22 | 362 |

As can be clearly seen from the data in Table 2, the Examples of the present disclosure had extremely significant performance advantages over the Comparative Examples. Specifically, although the full width at half maximum of Examples 1, 2 and 3 was slightly wider than that of Comparative Example 2, it is to be noted that the full width at half maximum of Comparative Example 2 was extremely narrow, and thus the full width at half maximum of Examples 1, 2 and 3 was also extremely narrow. In addition, the full width at half maximum of Examples 1 to 3 was further surprisingly narrowed by up to 10 nm on the basis of the very high level of the full width at half maximum of Comparative Example 1, which is very rare, indicating that the compound disclosed in the present disclosure can achieve luminescence of very high saturation. Furthermore, the driving voltages of Examples 1 to 3 were maintained at a low voltage level equivalent to that in Comparative Example 1 and reduced by about 5% (3.64 V vs 3.84 V, 3.58 V vs 3.84 V and 3.65 V vs 3.84 V) compared with the driving voltage of Comparative Example 2. More importantly, other device performances of Examples 1 to 3, such as efficiency and lifetime, had achieved overall improvement compared with Comparative Examples 1 and 2. The external quantum efficiency of Example 1 was nearly 3.7 times that of Comparative Example 2 (24.8% vs 6.73%) and 4.4 times that of Comparative Example 1 (24.8% vs 5.64%), the external quantum efficiency of Example 2 was nearly 3.3 times that of Comparative Example 2 (22.2% vs 6.73%) and more than 3.9 times that of Comparative Example 1 (22.2% vs 5.64%), and the external quantum efficiency of Example 3 was nearly 3.8 times that of Comparative Example 2 (25.3% vs 6.73%) and 4.5 times that of Comparative Example 1 (25.3% vs 5.64%), indicating that the device efficiency had been greatly improved. The advantages of Examples 1 to 3 in terms of lifetime were even greater. The lifetime of Example 1 was more than 36 times that of Comparative Example 2 (67.00 hours vs 1.85 hours) and 20 times that of Comparative Example 1 (67.00 hours vs 3.30 hours), the lifetime of Example 2 was more than 29 times that of Comparative Example 2 (54 hours vs. 1.85 hours) and more than 16 times that of Comparative Example 1 (54 hours vs. 3.30 hours), and the lifetime pf Example 3 was more than 23 times that of Comparative Example 2 (43 hours vs. 1.85 hours) and 13 times that of Comparative Example 1 (43 hours vs. 3.30 hours). In addition, the colors of Examples 1, 2 and 3 were more deep red (623 nm, 622 nm and 619 nm), which can better meet the requirements of red luminescence. What's more, in Example 4 in the case where the emitting color was a very deep red (669 nm), the full width at half maximum was still at a level close to that of Comparative Example 1, and the driving voltage was also maintained at a low voltage level equivalent to that of Comparative Example 1. Moreover, the device efficiency of Example 4 was more than 3 times that of Comparative Example 1 (18.22% vs 5.64%) and 2.7 times that of Comparative Example 2 (18.22% vs 6.73%), and it is very rare to have such a high device efficiency even when the emission wavelength was greatly redshifted by more than 90 nm. It is particularly worth mentioning that Example 4 had great advantages in terms of lifetime, astonishingly reaching 362 hours, which was more than 109 times that of Comparative Example 1 and more than 195 times that of Comparative Example 2. The deep red light with such a wavelength in Example 4 has important applications in some special fields such as medicine and agricultural production, and its long device lifetime is very beneficial to its application prospect. Through the above comparison, it can be clearly seen that the metal complexes disclosed by the present disclosure have excellent performance and excellent application prospect.

Spectra Data

The photoluminescence (PL) spectra data of the compounds of the present disclosure and comparative compounds was measured using a fluorescence spectrophotometer F98 produced by SHANGHAI LENGGUANG TECHNOLOGY CO., LTD. Example samples and comparative example samples were prepared into solutions each with a concentration of $3\times10^{-5}$ mol/L by using HPLC-grade dichloromethane and then excited at room temperature (298 K) using light with a wavelength of 500 nm, and their emission spectra were measured. Measurement results are shown in Table 3.

TABLE 3

| PL data | | |
|---|---|---|
| Compound No. | $\lambda_{max}$ (nm) | FWHM (nm) |
| Compound 63 | 620 | 20.8 |
| Compound 38 | 606 | 21.5 |
| Compound 192 | 620 | 20.5 |
| Compound 260 | 608 | 20.4 |
| Compound 278 | 597 | 34.2 |
| Compound 256 | 616 | 20.93 |
| Compound 28 | 618 | 20.5 |
| Compound 321 | 608 | 22.1 |
| Compound 416 | 665 | 31.7 |
| Compound 470 | 597 | 20.6 |
| Compound RD-A | 564 | 26.7 |
| Compound RD-B | 575 | 18.0 |

As can be seen from the data in Table 3, the compounds of the present disclosure had a redder color than comparison compounds, and their maximum emission wavelengths of PL were generally greatly redshifted, indicating that the compounds of the present disclosure can better meet the requirements of red luminescence in various wavelength ranges from light red to deep red. Meanwhile, the compounds of the present disclosure had very narrow full width at half maximum, indicating that the compounds of the present disclosure can achieve very saturated red light emission in electroluminescent devices.

In conclusion, the compounds disclosed in the present disclosure can achieve red light emission, have a very narrow full width at half maximum, and can achieve high saturation luminescence. In addition, these new metal complexes, when used as luminescent materials in electroluminescent devices, can enable the device to emit red light, have a very narrow full width at half maximum, achieve high saturation luminescence, reduce or maintain a low voltage, greatly improve device efficiency and lifetime, and provide better device performance, proving that the metal complexes disclosed in the present disclosure have excellent performance and excellent application prospect.

It is to be understood that various embodiments described herein are merely examples and not intended to limit the scope of the present disclosure. Therefore, it is apparent to the persons skilled in the art that the present disclosure as claimed may comprise variations from specific embodiments and preferred embodiments described herein. Many of materials and structures described herein may be substituted with other materials and structures without departing from the spirit of the present disclosure. It is to be understood that various theories as to why the present disclosure works are not intended to be limitative.

What is claimed is:

1. A metal complex, having a general formula of $M(L_a)_m(L_b)_n(L_c)_q$; wherein the metal M is selected from metals having a relative atomic mass greater than 40, $L_a$, $L_b$ and $L_c$ are a first ligand, a second ligand and a third ligand coordinated to the metal M, respectively; m is selected from 1, 2 or 3, n is selected from 0, 1 or 2, q is selected from 0, 1 or 2, and m+n+q is equal to an oxidation state of the metal M; when m is equal to 2 or 3, a plurality of $L_a$ can be identical or different; when n is equal to 2, two $L_b$ can be identical or different; and when q is equal to 2, two $L_c$ can be identical or different; and $L_a$ has a structure represented by Formula 1:

Formula 1

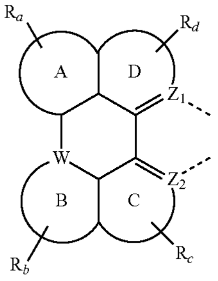

wherein, $Z_1$ and $Z_2$ are each independently selected from C or N, and $Z_1$ and $Z_2$ are different;

W is, at each occurrence identically or differently, selected from B, N or P;

ring A, and ring C are, at each occurrence identically or differently, selected from a five-membered unsaturated carbocyclic ring, an aromatic ring having 6 to 30 carbon atoms or a heteroaromatic ring having 3 to 30 carbon atoms;

ring D is selected from a benzene ring, a naphthalene ring, an aza-naphthalene ring, a pyridine ring or a pyrimidine ring;

ring B is selected from a heterocyclic ring having 2 to 30 carbon atoms or a heteroaromatic ring having 2 to 30 carbon atoms;

$R_a$, $R_b$, $R_c$, and $R_d$ represent, at each occurrence identically or differently, mono-substitution, multiple substitutions or non-substitution;

$R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, and $R_d$ can be optionally joined to form a ring;

$L_a$, $L_b$, and $L_c$ can be optionally joined to form a multidentate ligand;

$L_b$ and $L_c$ are, at each occurrence identically or differently, selected from the group consisting of the following structures:

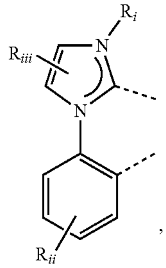,
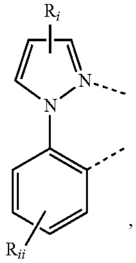,
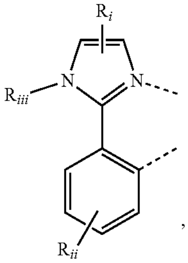,
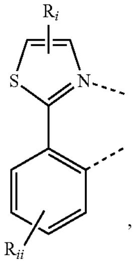,
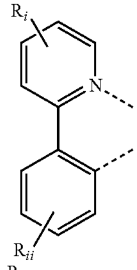,
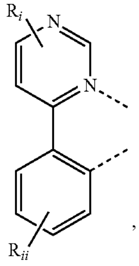,
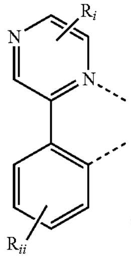,
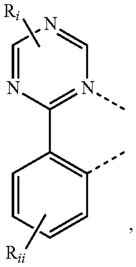,
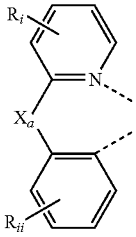,
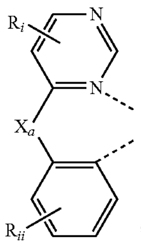,
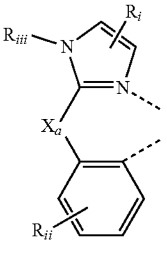, and
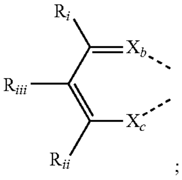;

wherein, $R_i$, $R_{ii}$, and $R_{iii}$ represent, at each occurrence identically or differently, mono-substitution, multiple substitutions or non-substitution;

$X_a$ is, at each occurrence identically or differently, selected from the group consisting of: O, S, Se, $NR_{N1}$, and $CR_{C1}R_{C2}$;

$X_b$ and $X_c$ are, at each occurrence identically or differently, selected from the group consisting of: O, S, Se, and $NR_{N2}$;

$R_i$, $R_{ii}$, $R_{iii}$, $R_{N1}$, $R_{N2}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_i$, $R_{ii}$, $R_{iii}$, $R_{N1}$, $R_{N2}$, $R_{C1}$, and $R_{C2}$ can be optionally joined to form a ring.

2. The metal complex of claim 1, wherein in the $L_a$, ring A, and ring C are, at each occurrence identically or differently, selected from an aromatic ring having 6 to 18 carbon atoms or a heteroaromatic ring having 3 to 18 carbon atoms; and ring B is selected form a heteroaromatic ring having 2 to 18 carbon atoms.

3. The metal complex of claim 1, wherein the $L_a$ is selected from a structure represented by any one of Formula 2 to Formula 18:

Formula 2

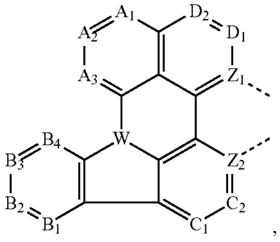,

Formula 3

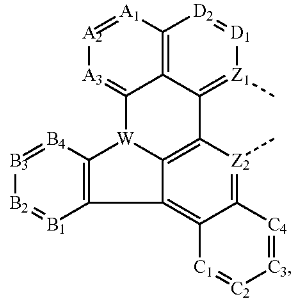

-continued
Formula 4
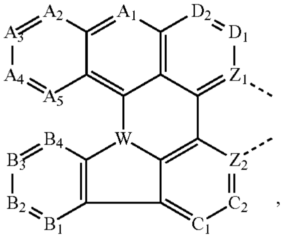
,
Formula 5
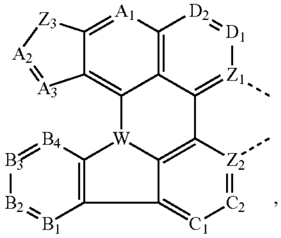
,
Formula 6
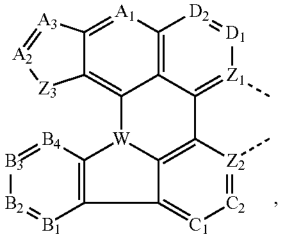
,
Formula 7
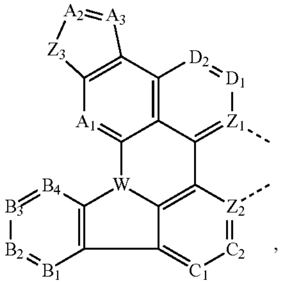
,
Formula 8
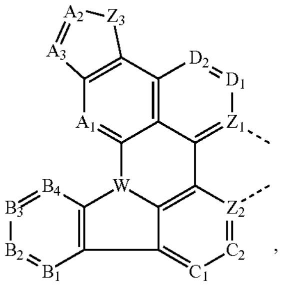
,
Formula 9
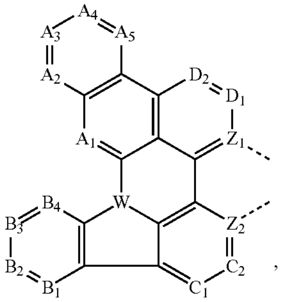
,
-continued
Formula 10
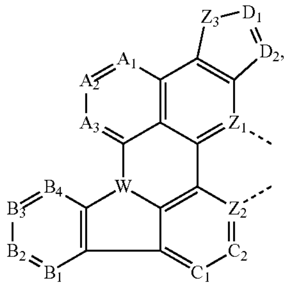
Formula 11
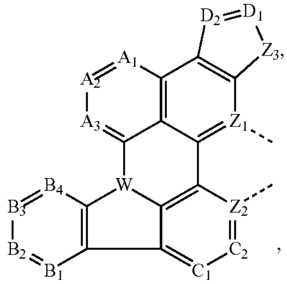
,
Formula 12
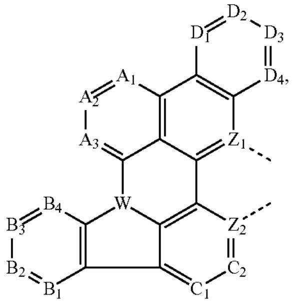
Formula 13
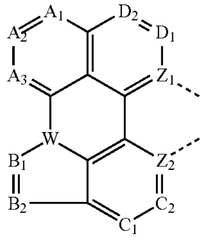
,
Formula 14
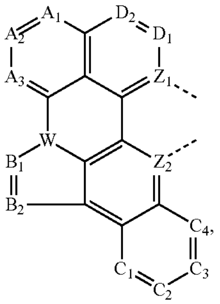

-continued

Formula 15

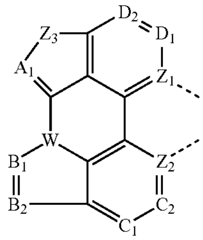

,

Formula 16

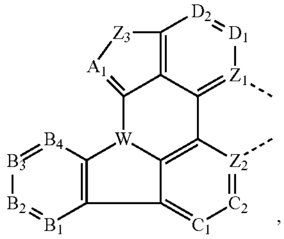

,

Formula 17

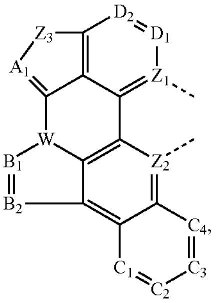

Formula 18

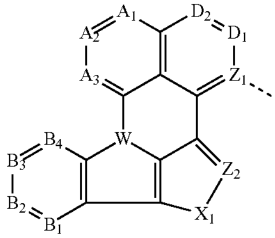

;

wherein, $Z_1$ and $Z_2$ are each independently selected from C or N, and $Z_1$ and $Z_2$ are different;

W is, at each occurrence identically or differently, selected from B, N or P;

$A_1$ to As are, at each occurrence identically or differently, selected from N or $CR_a$;

$B_1$ to $B_4$ are, at each occurrence identically or differently, selected from N or $CR_b$;

$C_1$ to $C_4$ are, at each occurrence identically or differently, selected from N or $CR_c$;

in Formula 2 to Formula 9, and Formula 13 to Formula 18, $D_1$ is selected from $CR_d$, $D_2$ is selected from N or $CR_a$; in Formula 10 to Formula 12, $D_1$ to $D_4$ are, at each occurrence identically or differently, selected from N or $CR_d$;

$X_1$ is, at each occurrence identically or differently, selected from O, S, Se, $NR_c$, $CR_cR_c$, $SiR_cR_c$ or $PR_c$;

$Z_3$ is, at each occurrence identically or differently, selected from O, S, Se, $NR_z$, $CR_zR_z$, $SiR_zR_z$ or $PR_z$;

$R_a$, $R_b$, $R_c$, $R_a$, and Rz are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, Rd, and Rz can be optionally joined to form a ring.

4. The metal complex of claim 3, wherein in Formula 1 to Formula 18, $Z_1$ is N, and $Z_2$ is C.

5. The metal complex of claim 3, wherein in Formula 1 to Formula 18, W is N.

6. The metal complex of claim 3, wherein in Formula 2 to Formula 9, Formula 13 to Formula 18, $Z_1$ is N, and $D_2$ is N; in Formula 10 to Formula 12, $Z_1$ is N, and at least one of $D_1$ and $D_2$ is N; or in Formula 2 to Formula 17, $Z_2$ is N, and at least one of $C_1$ and $C_2$ is N.

7. The metal complex of claim 3, wherein in Formula 2 to Formula 18, $A_1$ to As are each independently selected from $CR_a$, and $B_1$ to $B_4$ are each independently selected from $CR_b$; in Formula 2 to Formula 17, $C_1$ to $C_4$ are each independently selected from $CR_c$; in Formula 2 to Formula 18, $D_1$ to $D_4$ are each independently selected from $CR_a$; and the $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, and $R_d$ can be optionally joined to form a ring.

8. The metal complex of claim 3, wherein in Formula 2 to Formula 18, at least one of $A_1$ to An is, at each occurrence identically or differently, selected from $CR_a$, and the An corresponds to one having the largest serial number of $A_1$ to As in any one of Formula 2 to Formula 18; and the at least one $R_a$ is, at each occurrence identically or differently, selected from the group consisting of: deuterium, halogen, a cyano group, a hydroxyl group, a sulfanyl group, substituted or unsubstituted alkyl having 1 to 20 carbon atoms, substituted or unsubstituted cycloalkyl having 3 to 20 ring carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, and combinations thereof;

adjacent substituents $R_a$ can be optionally joined to form a ring.

9. The metal complex of claim 8, wherein in Formula 2 to Formula 14 and Formula 18, at least one of $A_1$ to $A_3$ is, at each occurrence identically or differently, selected from $CR_a$.

10. The metal complex of claim 3, wherein in Formula 2 to Formula 17, $C_2$ is selected from $CR_c$, and the $R_c$ is selected from the group consisting of: deuterium, halogen, a cyano group, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, and combinations thereof.

11. The metal complex of claim 3, wherein in Formula 2 to Formula 18, at least one of $B_1$ to $B_n$ is selected from $CR_b$, and the $B_n$ corresponds to one having the largest serial number of $B_1$ to $B_4$ in any one of Formula 2 to Formula 18; and/or in Formula 2 to Formula 18, at least one of $D_1$ to $D_n$ is selected from $CR_a$, and the $D_n$ corresponds to one having the largest serial number of $D_1$ to $D_4$ in any one of Formula 2 to Formula 18; and the $R_b$ and $R_a$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, a hydroxyl group, a sulfanyl group, and combinations thereof.

12. The metal complex of claim 11, wherein in Formula 2 to Formula 12, Formula 16 and Formula 18, $B_2$ and/or $B_3$ are selected from $CR_b$; in Formula 13 to Formula 15 and Formula 17, $B_1$ and/or $B_2$ are selected from $CR_b$; and in Formula 2 to Formula 18, $D_1$ and/or $D_2$ are selected from $CR_d$.

13. The metal complex of claim 3, wherein $L_a$ is selected from a structure represented by Formula 2, Formula 3, Formula 7, Formula 8, Formula 9 or Formula 12.

14. The metal complex of claim 3, wherein in Formula 2 to Formula 18, $Z_1$ is C, and $Z_2$ is N.

15. The metal complex of claim 3, wherein in Formula 2 to Formula 18, $A_1$ to As are each independently selected from $CR_a$, and $B_1$ to $B_4$ are each independently selected from $CR_b$; in Formula 2 to Formula 17, $C_1$ to $C_4$ are each independently selected from $CR_c$; in Formula 2 to Formula 18, $D_1$ to $D_4$ are each independently selected from $CR_d$; and the $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkoxy having 1 to 20 carbon atoms, substituted or unsubstituted aryloxy having 6 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, and combinations thereof.

16. The metal complex of claim 1, wherein $L_a$ is, at each occurrence identically or differently, selected from the group consisting of the following structures:

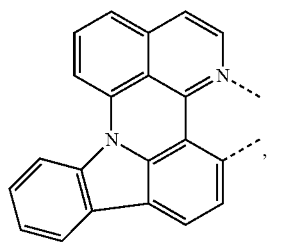

$L_{a1}$

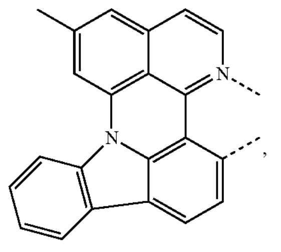

$L_{a2}$

-continued
$L_{a3}$
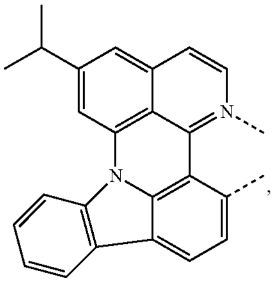
$L_{a4}$
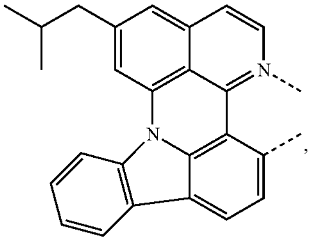
$L_{a5}$
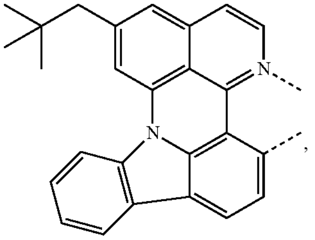
$L_{a6}$
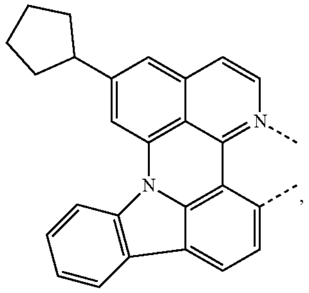
$L_{a7}$
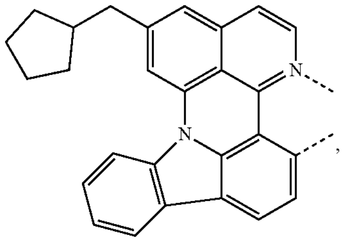
-continued
$L_{a8}$
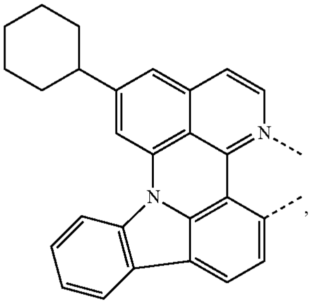
$L_{a9}$
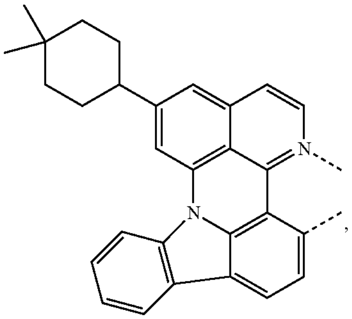
$L_{a10}$
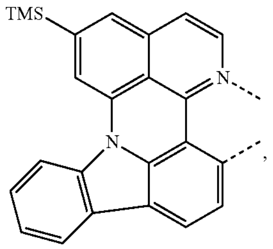
$L_{a11}$
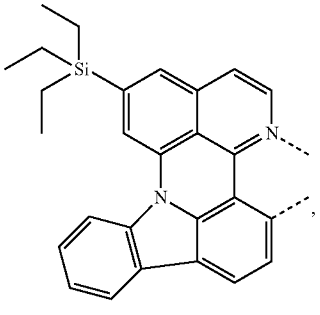
$L_{a12}$
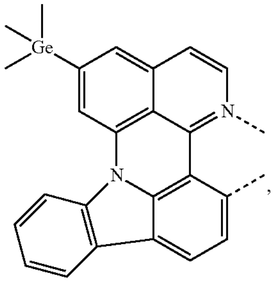

-continued
$L_{a13}$
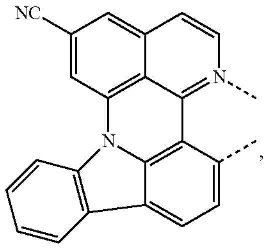
$L_{a14}$
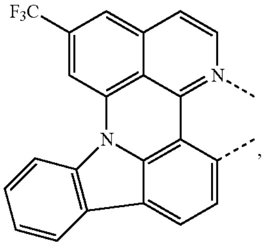
$L_{a15}$
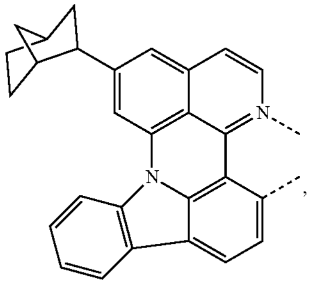
$L_{a16}$
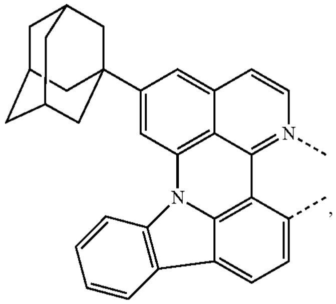
$L_{a17}$
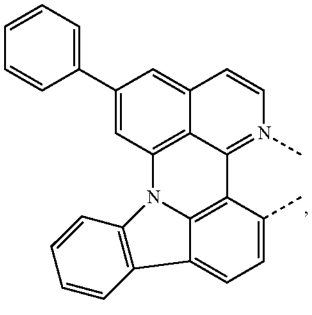
-continued
$L_{a18}$
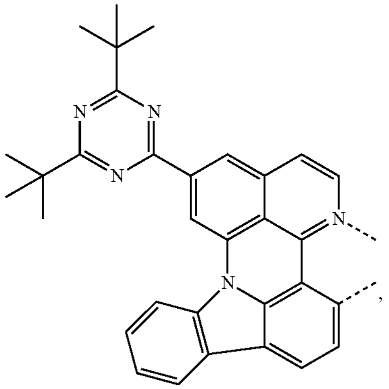
$L_{a19}$
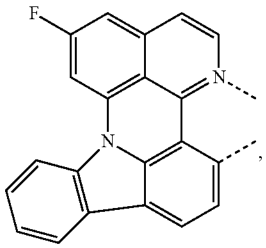
$L_{a20}$
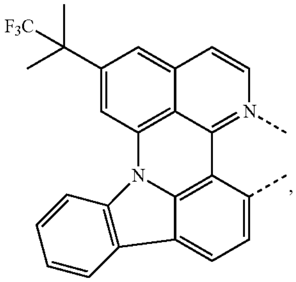
$L_{a21}$
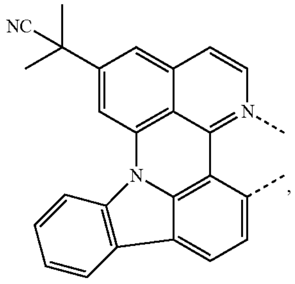
$L_{a22}$
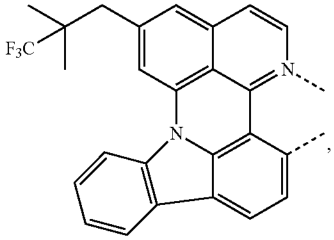

-continued
$L_{a23}$
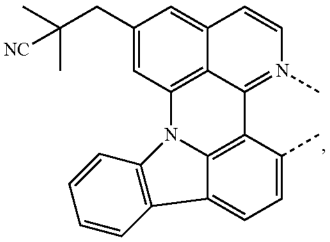
$L_{a24}$
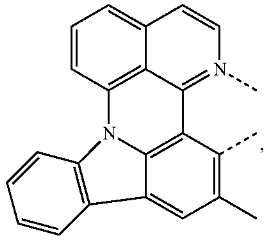
$L_{a25}$
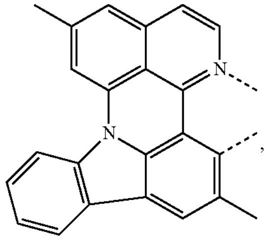
$L_{a26}$
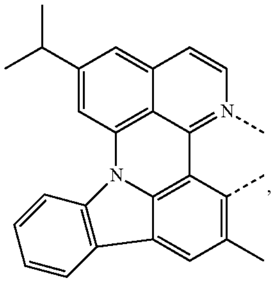
$L_{a27}$
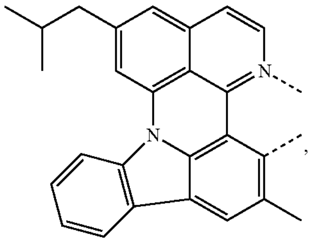
$L_{a28}$
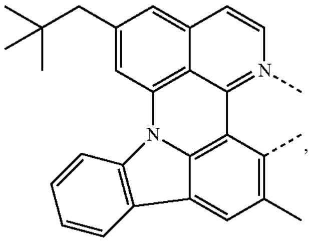
-continued
$L_{a29}$
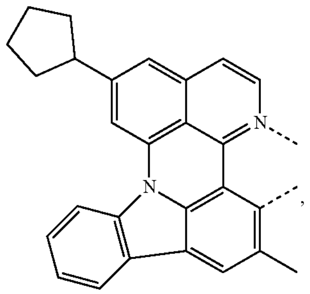
$L_{a30}$
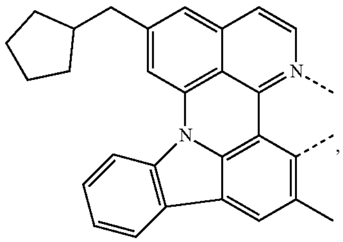
$L_{a31}$
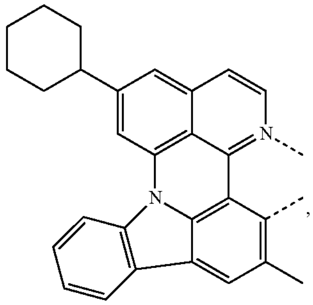
$L_{a32}$
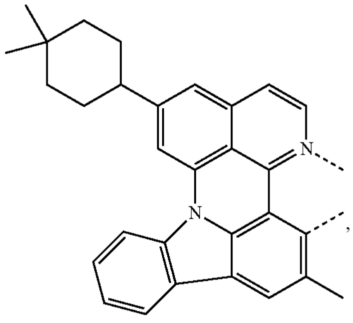
$L_{a33}$
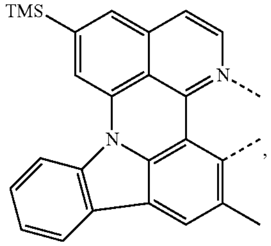

-continued
$L_{a34}$
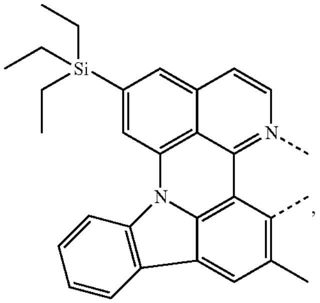
$L_{a35}$
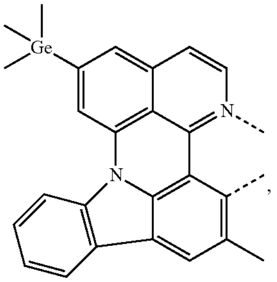
$L_{a36}$
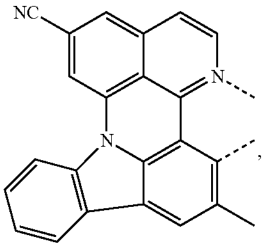
$L_{a37}$
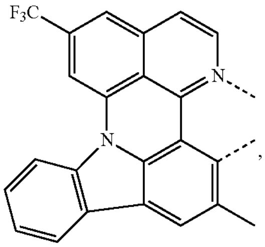
$L_{a38}$
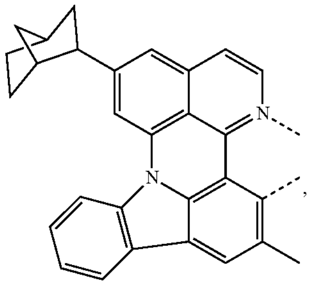
-continued
$L_{a39}$
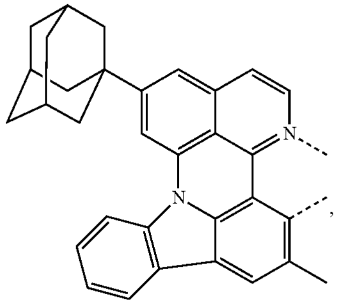
$L_{a40}$
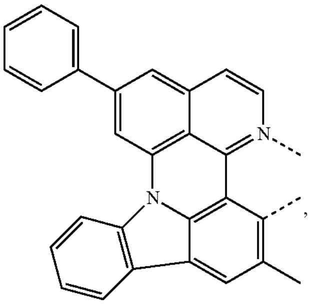
$L_{a41}$
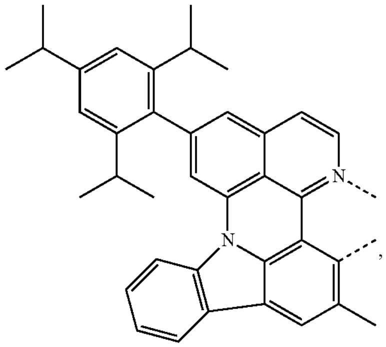
$L_{a42}$
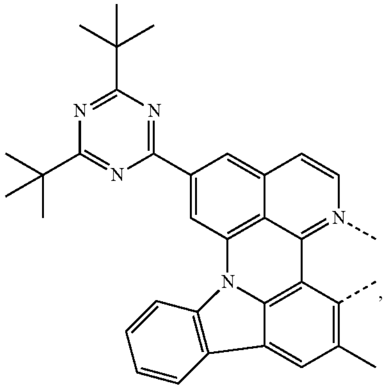
$L_{a43}$
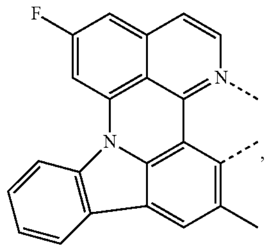

-continued
$L_{a44}$
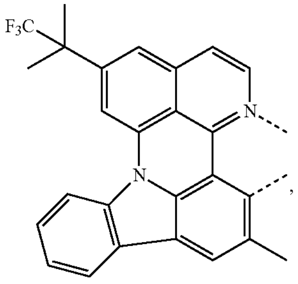
$L_{a45}$
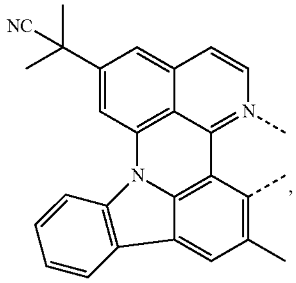
$L_{a46}$
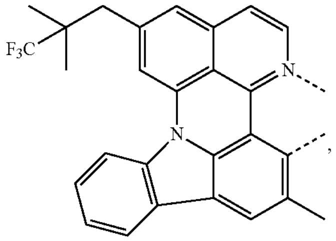
$L_{a47}$
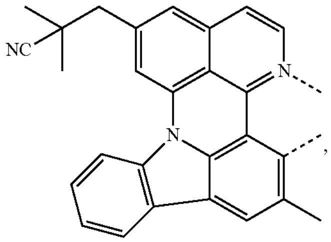
$L_{a48}$
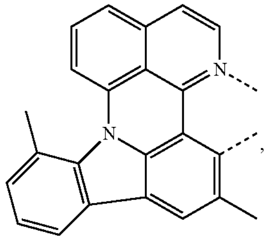
$L_{a49}$
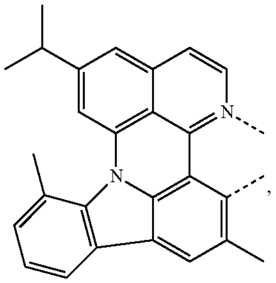
-continued
$L_{a50}$
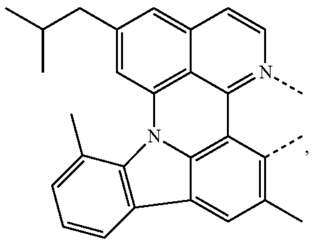
$L_{a51}$
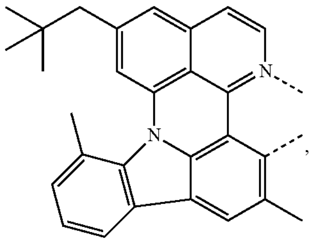
$L_{a52}$
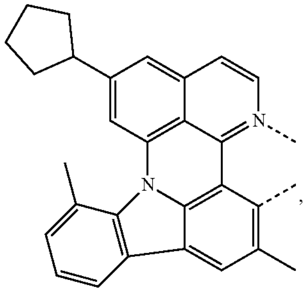
$L_{a53}$
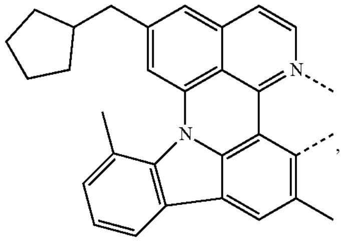
$L_{a54}$
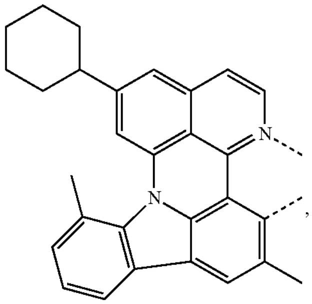

-continued
$L_{a55}$
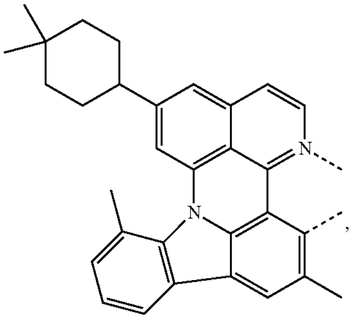
$L_{a56}$
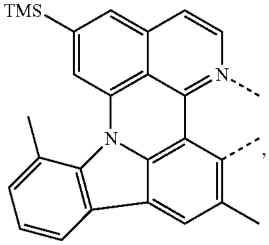
$L_{a57}$
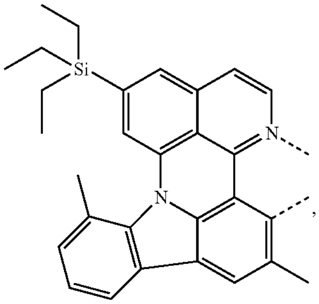
$L_{a58}$
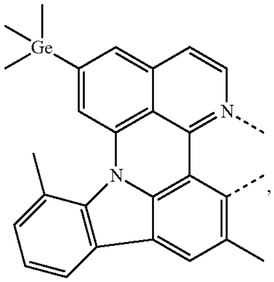
$L_{a59}$
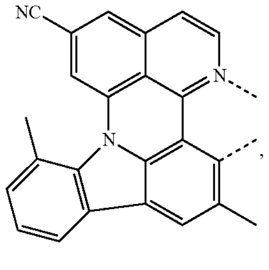
-continued
$L_{a60}$
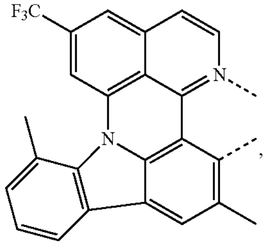
$L_{a61}$
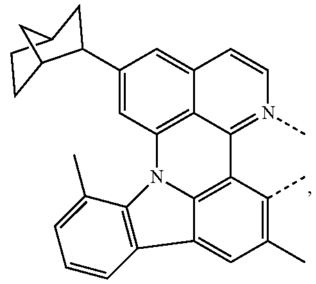
$L_{a62}$
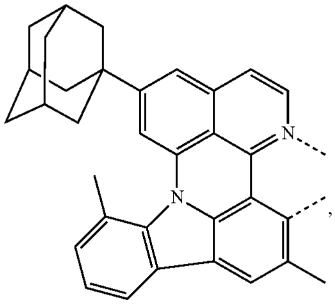
$L_{a63}$
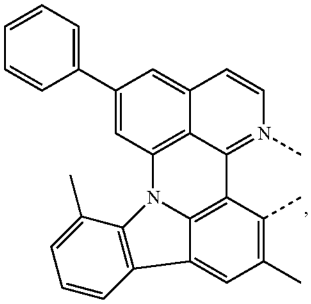
$L_{a64}$
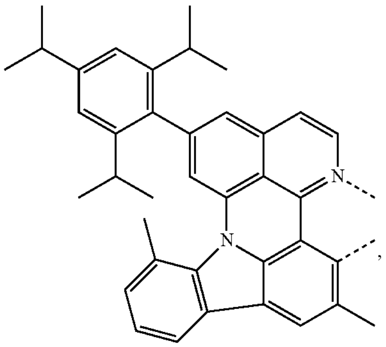

-continued
$L_{a65}$
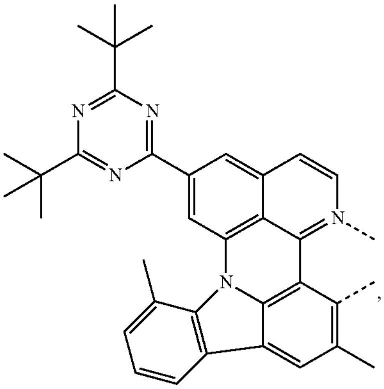
$L_{a66}$
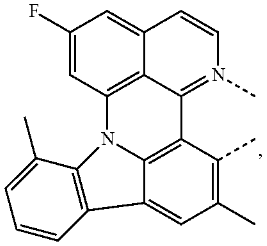
$L_{a67}$
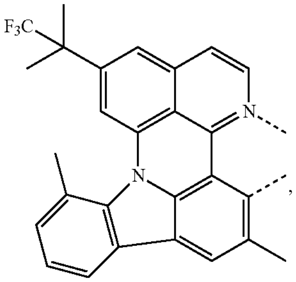
$L_{a68}$
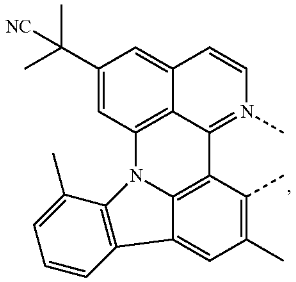
$L_{a69}$
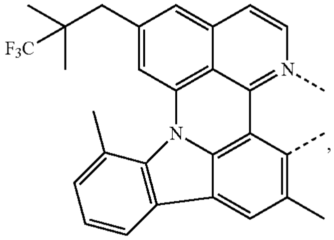
-continued
$L_{a70}$
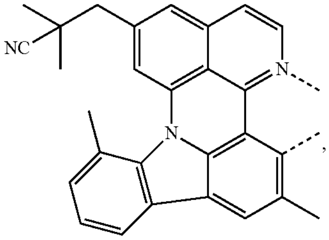
$L_{a71}$
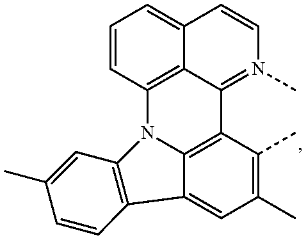
$L_{a72}$
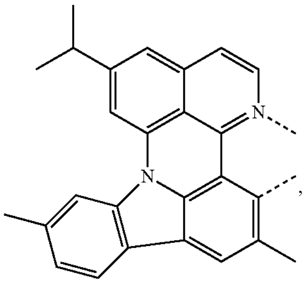
$L_{a73}$
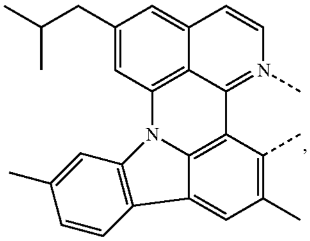
$L_{a74}$
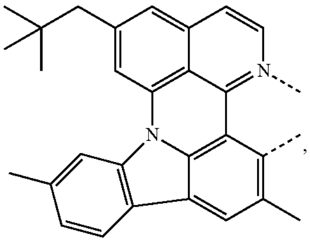
$L_{a75}$
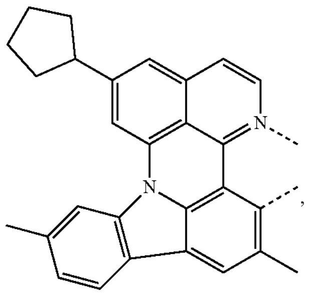

-continued
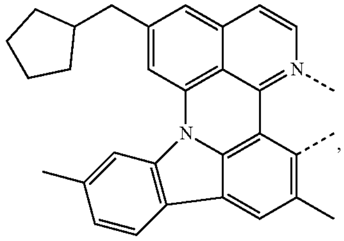
$L_{a76}$
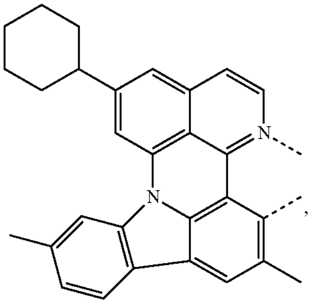
$L_{a77}$
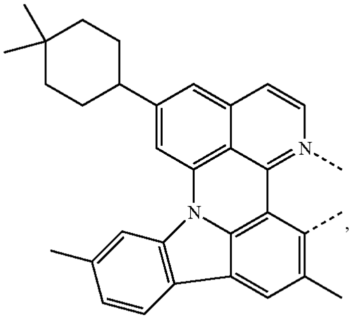
$L_{a78}$
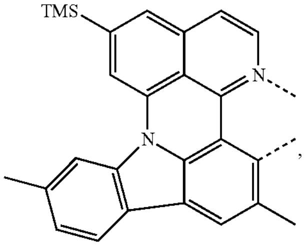
$L_{a79}$
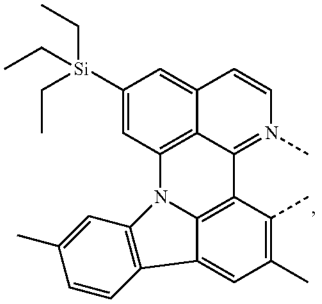
$L_{a80}$
-continued
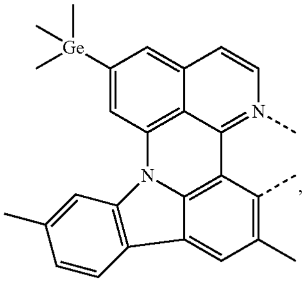
$L_{a81}$
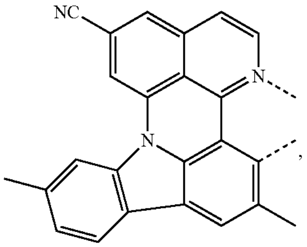
$L_{a82}$
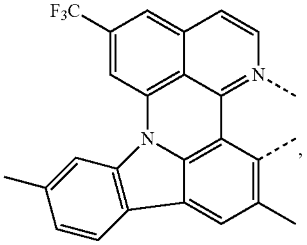
$L_{a83}$
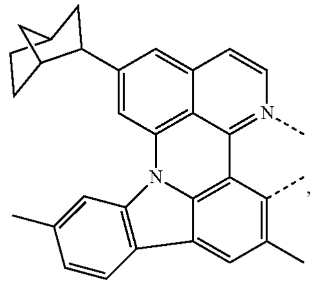
$L_{a84}$
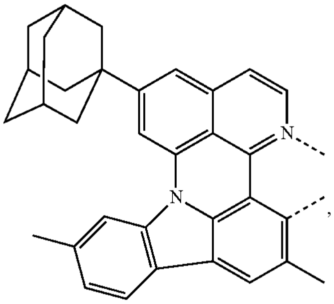
$L_{a85}$ -continued
$L_{a86}$
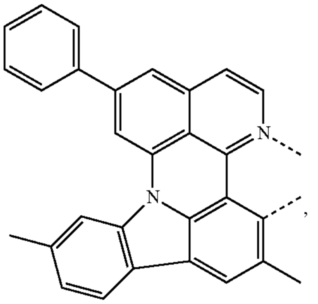
$L_{a87}$
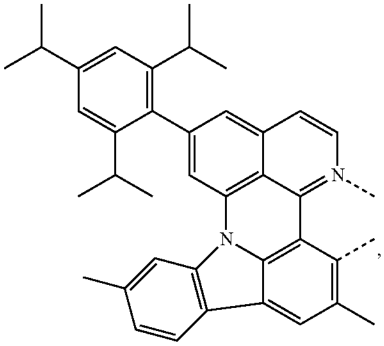
$L_{a88}$
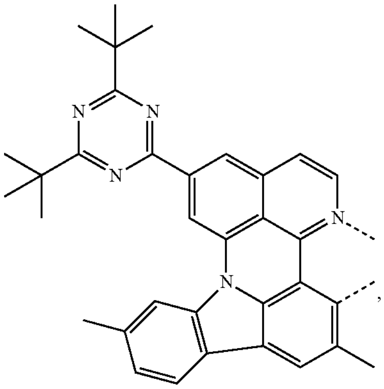
$L_{a89}$
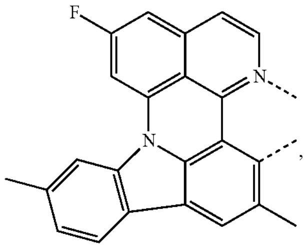
$L_{a90}$
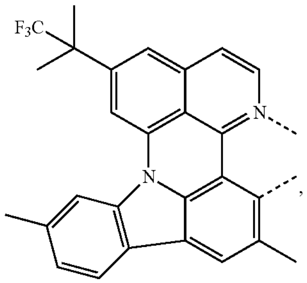
-continued
$L_{a91}$
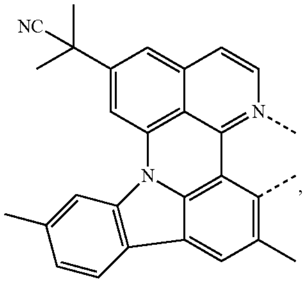
$L_{a92}$
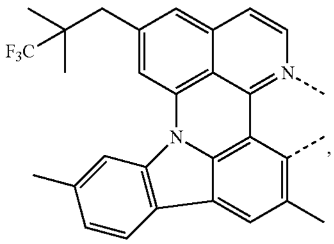
$L_{a93}$
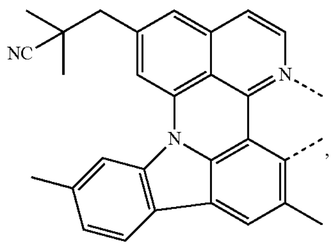
$L_{a94}$
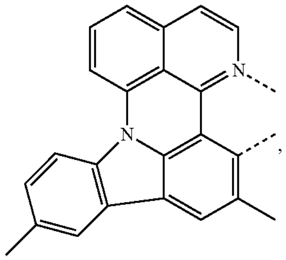
$L_{a95}$
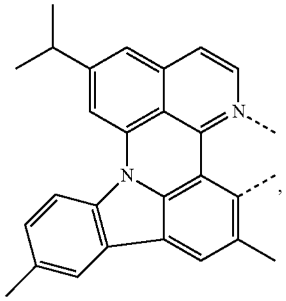
$L_{a96}$
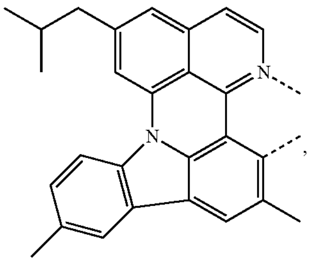

-continued
$L_{a97}$
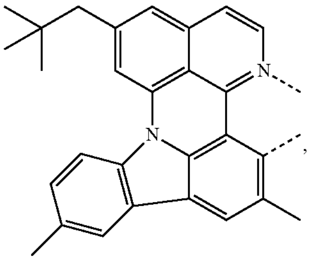
$L_{a98}$
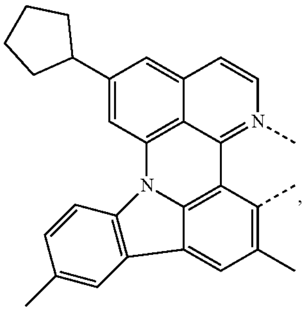
$L_{a99}$
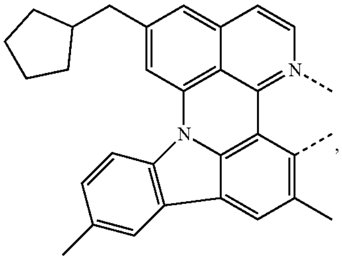
$L_{a100}$
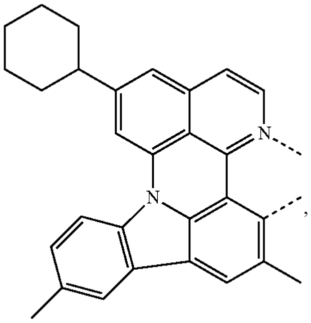
$L_{a101}$
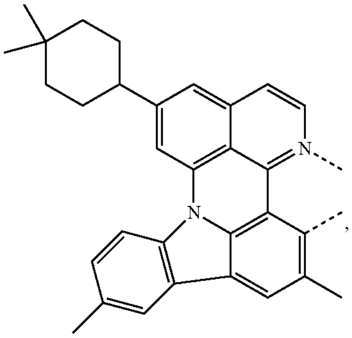
-continued
$L_{a102}$
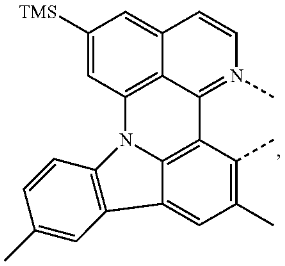
$L_{a103}$
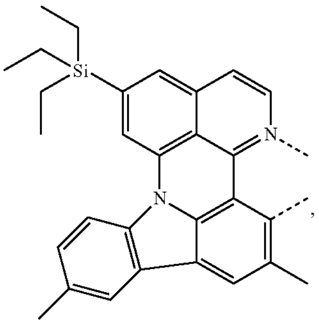
$L_{a104}$
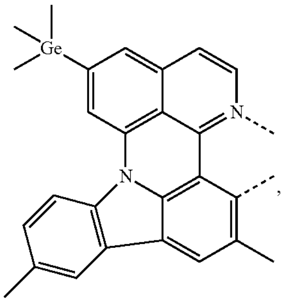
$L_{a105}$
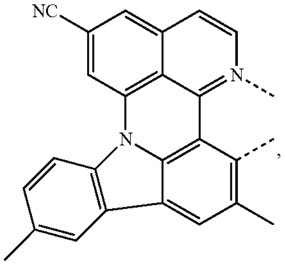
$L_{a106}$
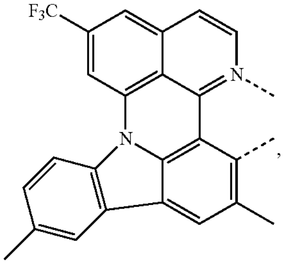

-continued
$L_{a107}$
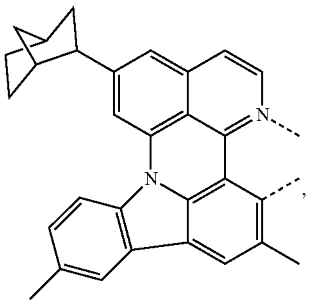
$L_{a108}$
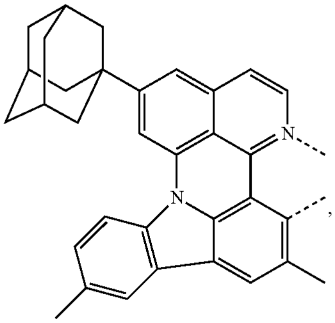
$L_{a109}$
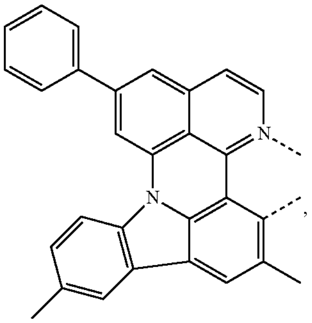
$L_{a110}$
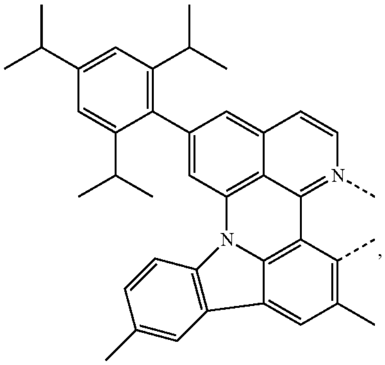
-continued
$L_{a111}$
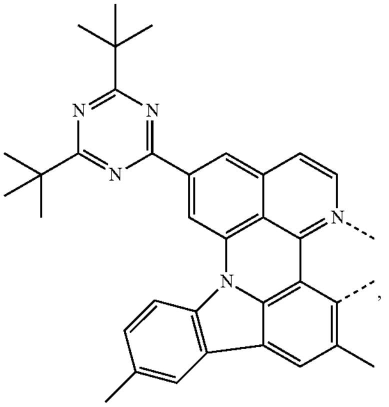
$L_{a112}$
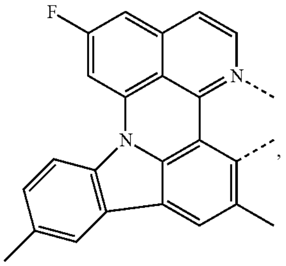
$L_{a113}$
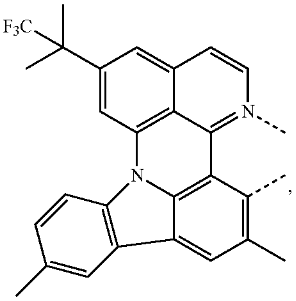
$L_{a114}$
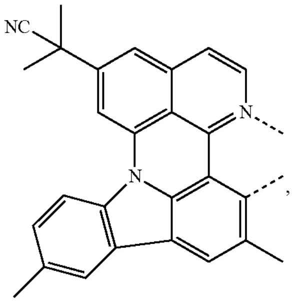
$L_{a115}$
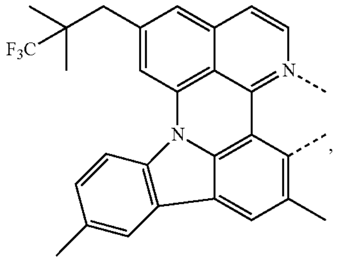

$L_{a116}$
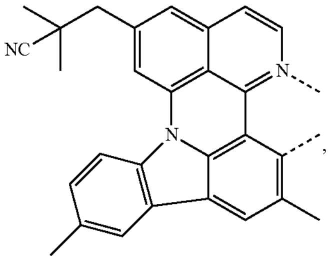
$L_{a117}$
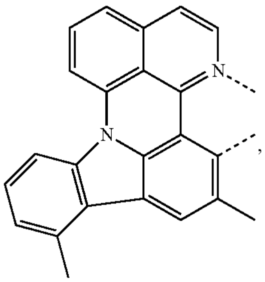
$L_{a118}$
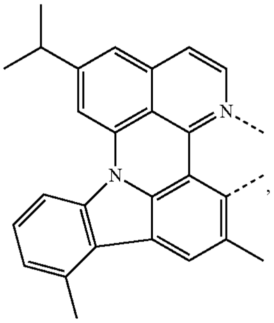
$L_{a119}$
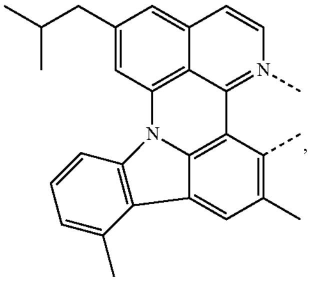
$L_{a120}$
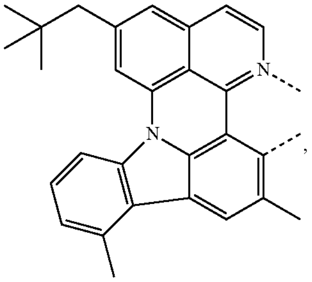
$L_{a121}$
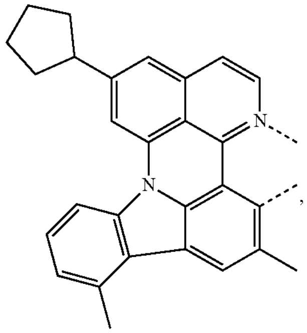
$L_{a122}$
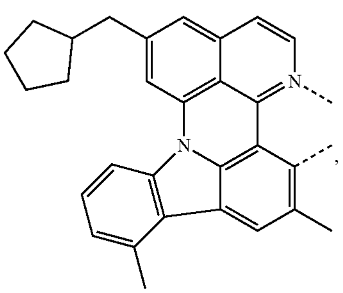
$L_{a123}$
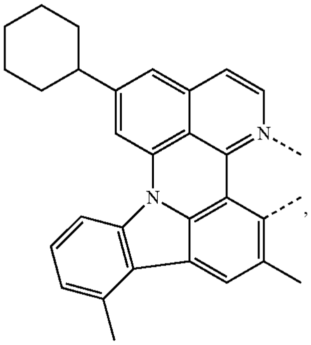
$L_{a124}$
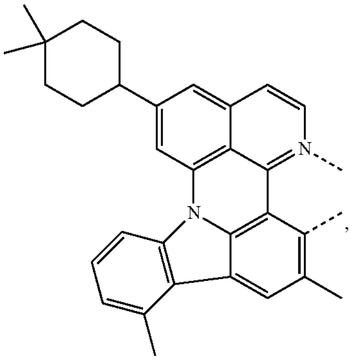
$L_{a125}$
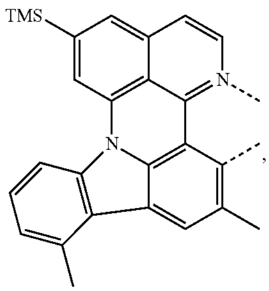

$L_{a126}$
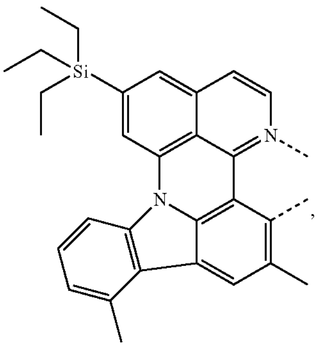
$L_{a127}$
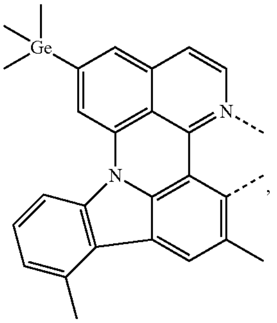
$L_{a128}$
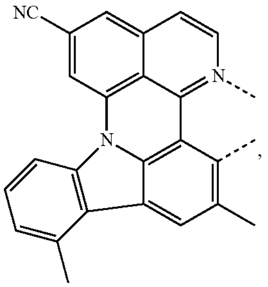
$L_{a129}$
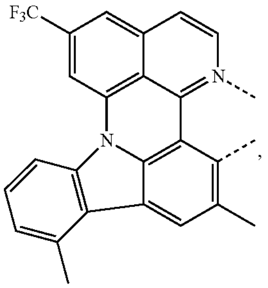
$L_{a130}$
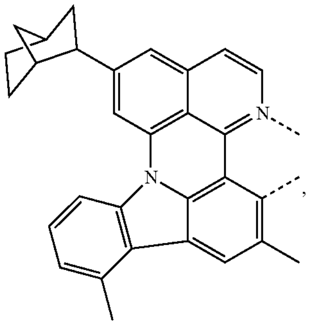
$L_{a131}$
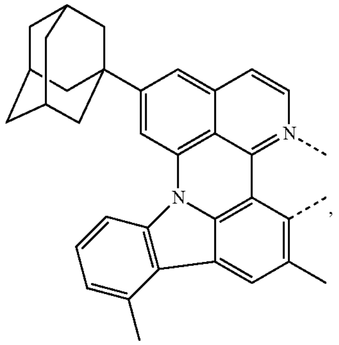
$L_{a132}$
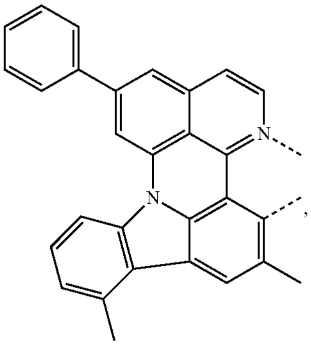
$L_{a133}$
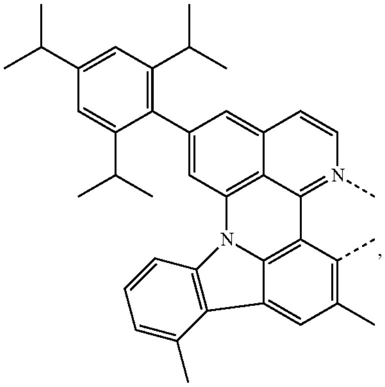
$L_{a134}$
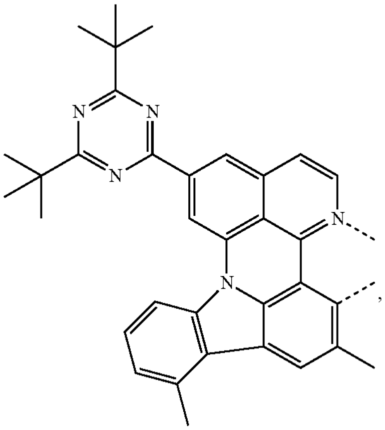

-continued
$L_{a135}$
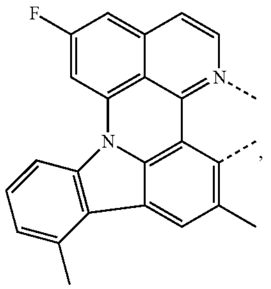
$L_{a136}$
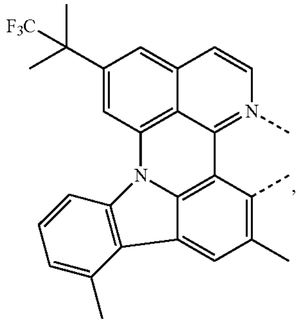
$L_{a137}$
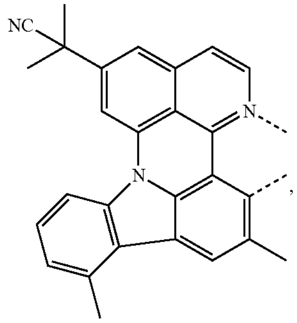
$L_{a138}$
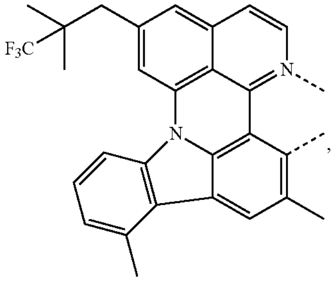
$L_{a139}$
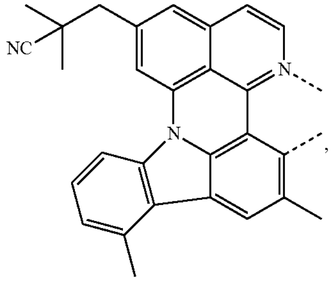
-continued
$L_{a140}$
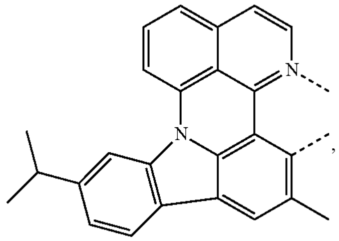
$L_{a141}$
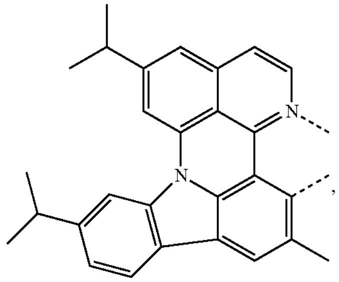
$L_{a142}$
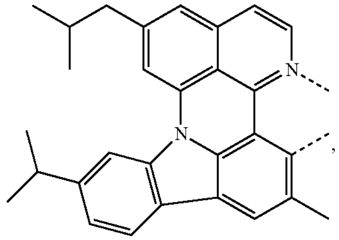
$L_{a143}$
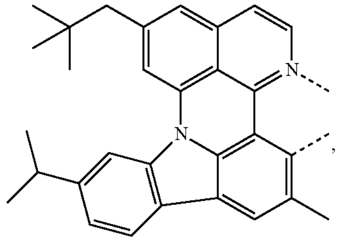
$L_{a144}$
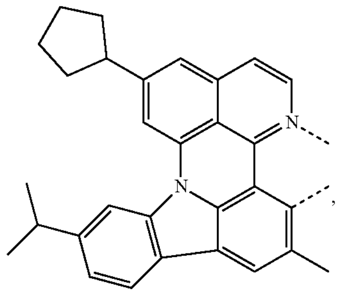
$L_{a145}$
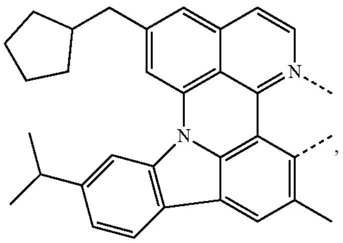

-continued
$L_{a146}$
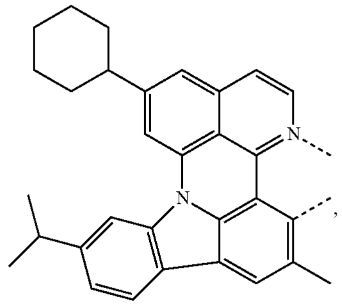
$L_{a147}$
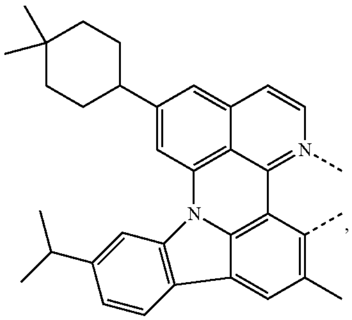
$L_{a148}$
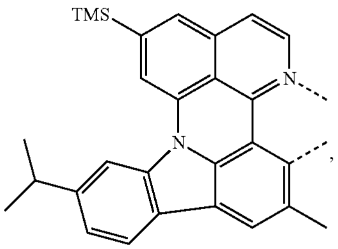
$L_{a149}$
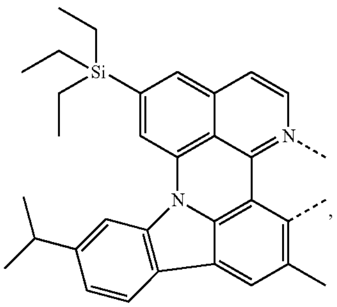
$L_{a150}$
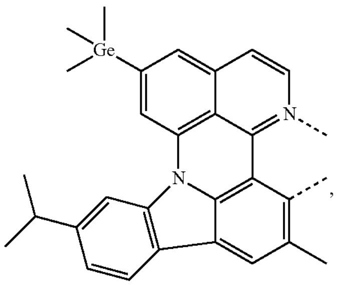
-continued
$L_{a151}$
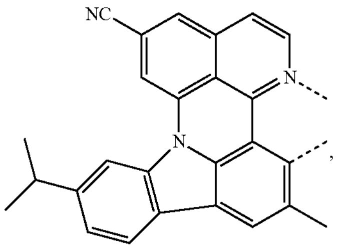
$L_{a152}$
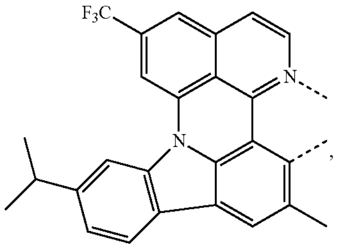
$L_{a153}$
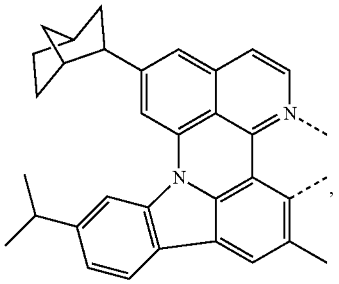
$L_{a154}$
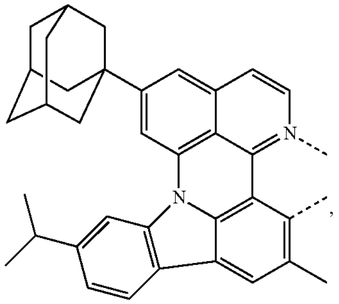
$L_{a155}$
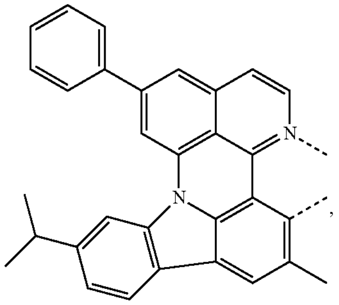

-continued
$L_{a156}$
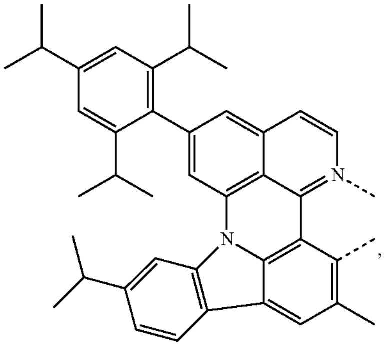
$L_{a157}$
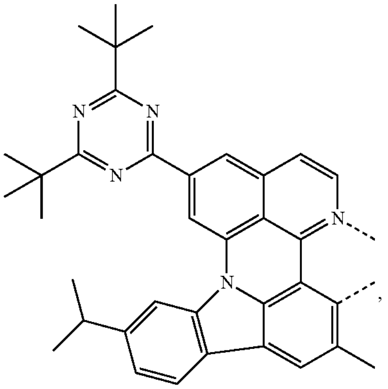
$L_{a158}$
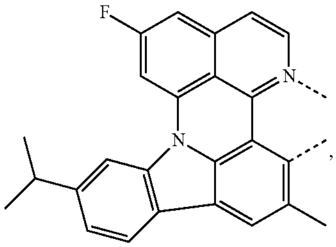
$L_{a159}$
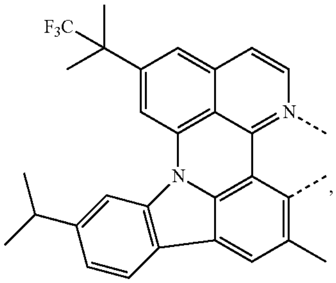
$L_{a160}$
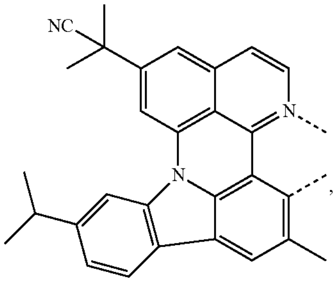
-continued
$L_{a161}$
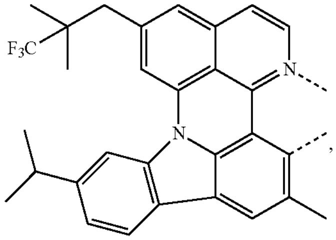
$L_{a162}$
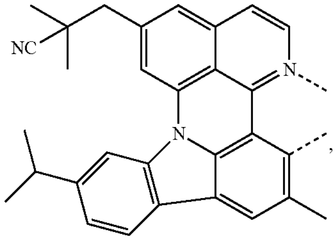
$L_{a163}$
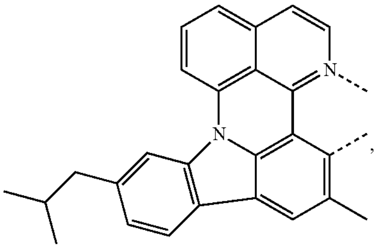
$L_{a164}$
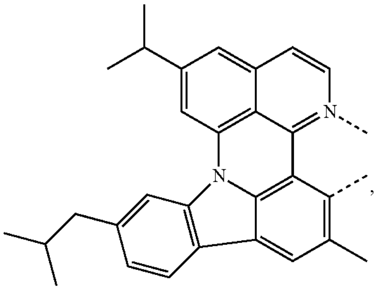
$L_{a165}$
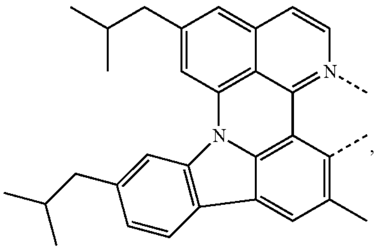
$L_{a166}$
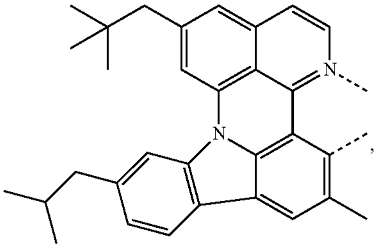

-continued
$L_{a167}$
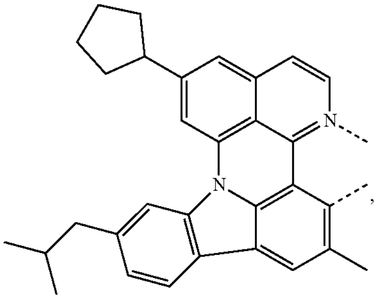
$L_{a168}$
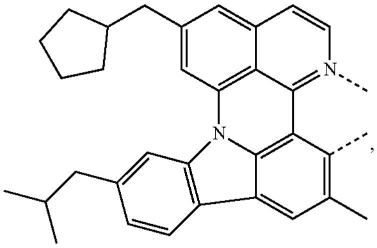
$L_{a169}$
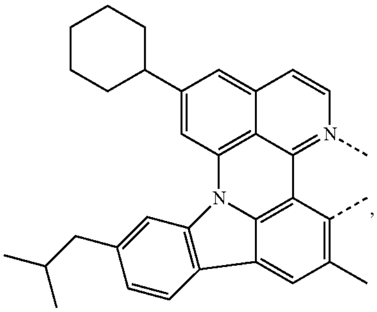
$L_{a170}$
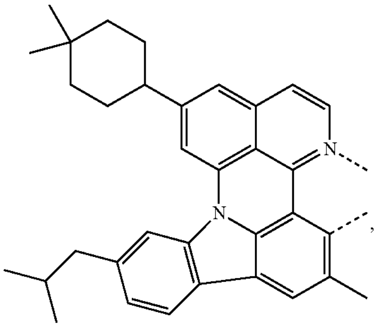
$L_{a171}$
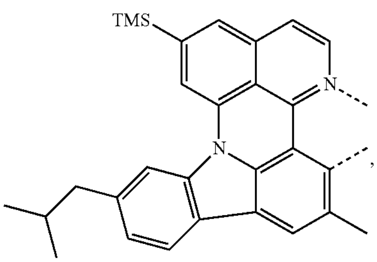
-continued
$L_{a172}$
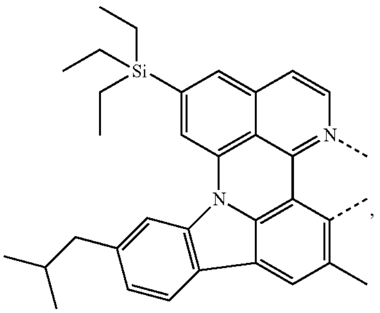
$L_{a173}$
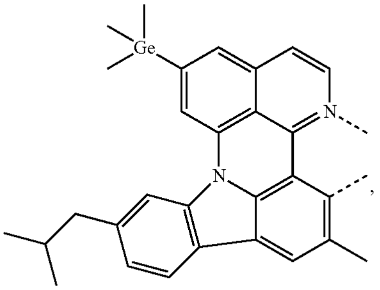
$L_{a174}$
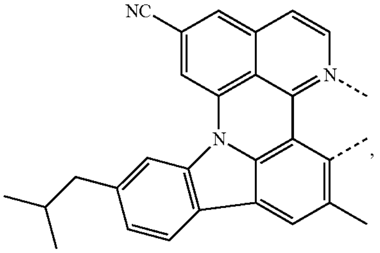
$L_{a175}$
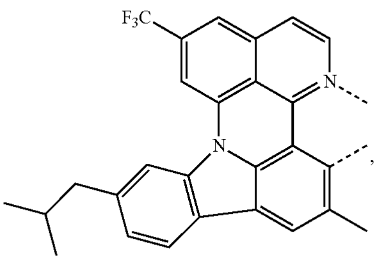
$L_{a176}$
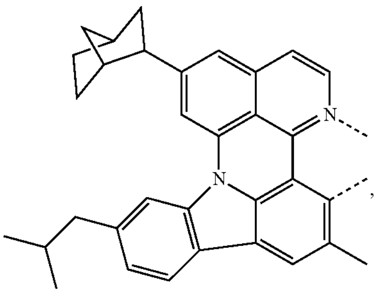

-continued
L$_{a177}$
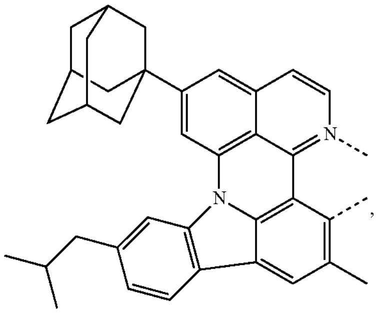
L$_{a178}$
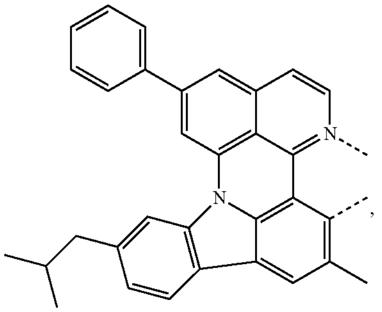
L$_{a179}$
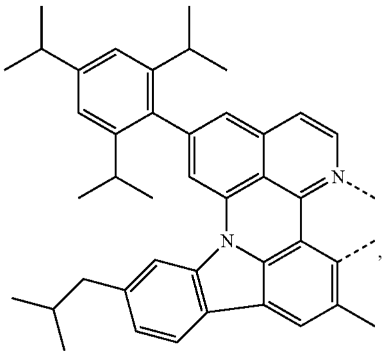
L$_{a180}$
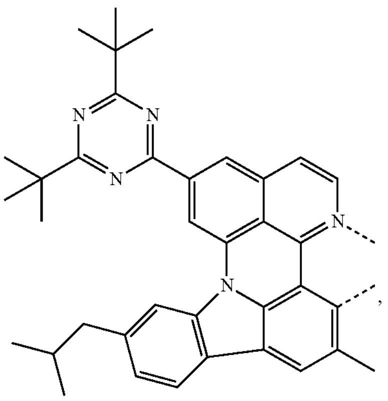
-continued
L$_{a181}$
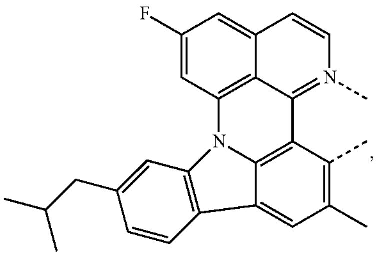
L$_{a182}$
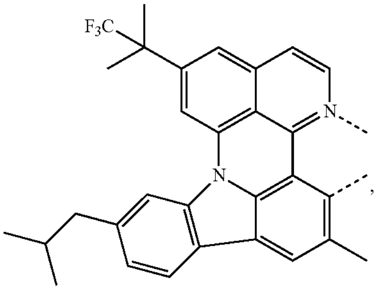
L$_{a183}$
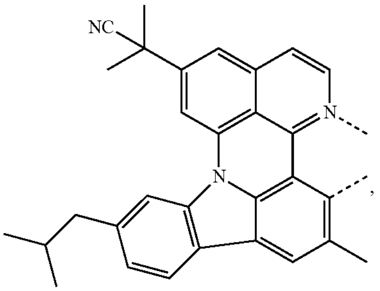
L$_{a184}$
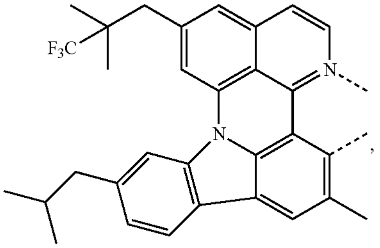
L$_{a185}$
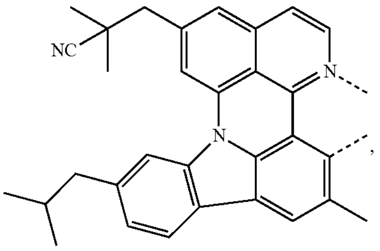
L$_{a186}$
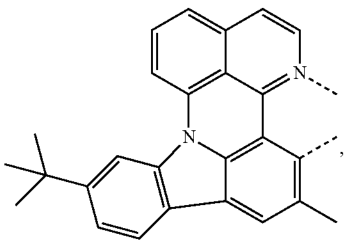

-continued
$L_{a187}$
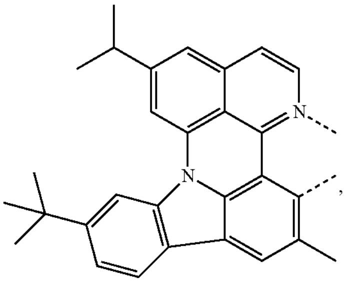
$L_{a188}$
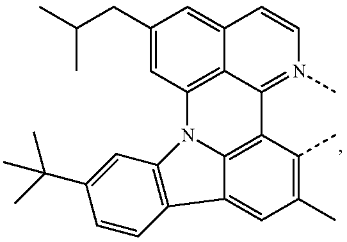
$L_{a189}$
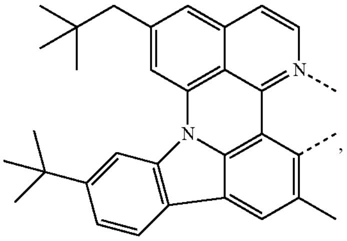
$L_{a190}$
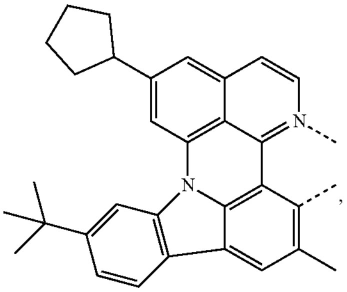
$L_{a191}$
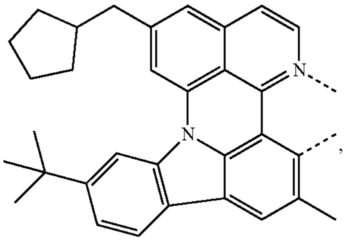
-continued
$L_{a192}$
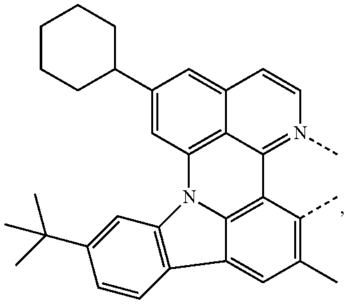
$L_{a193}$
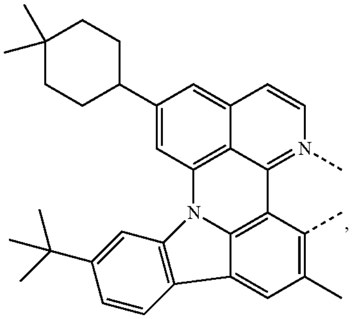
$L_{a194}$
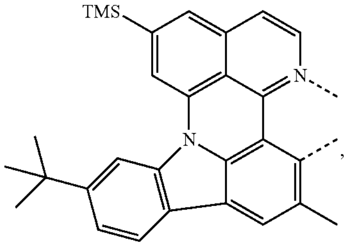
$L_{a195}$
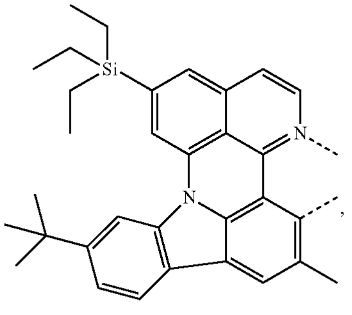
$L_{a196}$
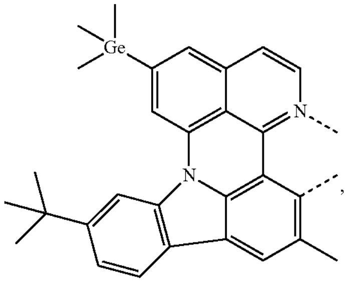

-continued
$L_{a197}$
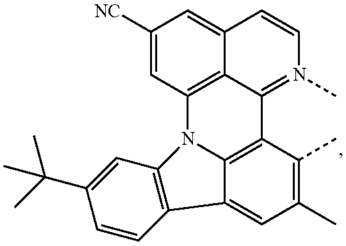
$L_{a198}$
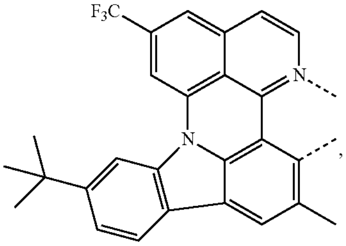
$L_{a199}$
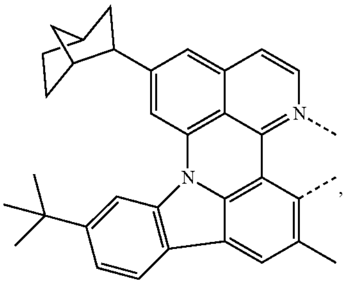
$L_{a200}$
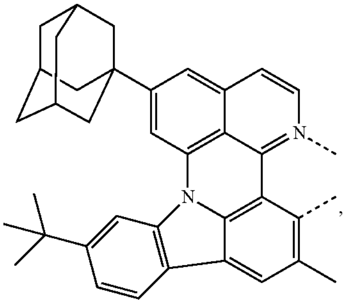
$L_{a201}$
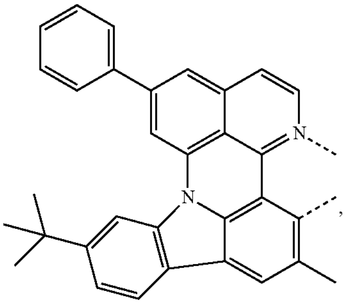
-continued
$L_{a202}$
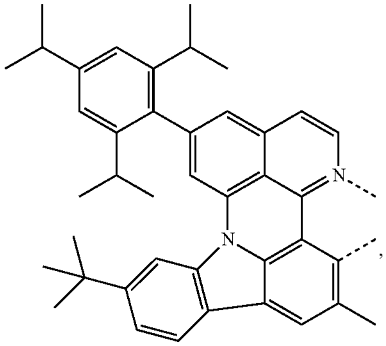
$L_{a203}$
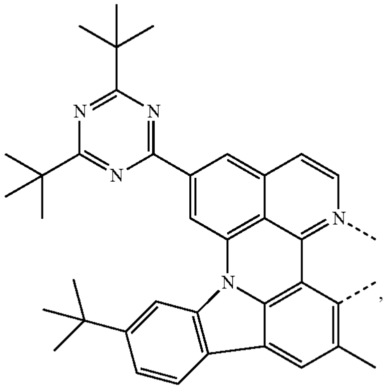
$L_{a204}$
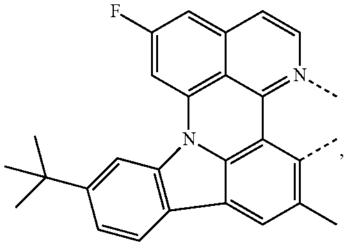
$L_{a205}$
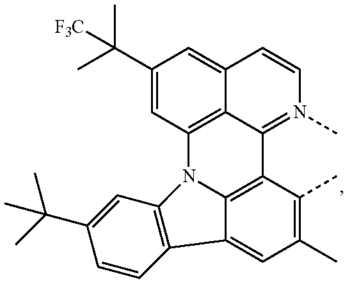
$L_{a206}$
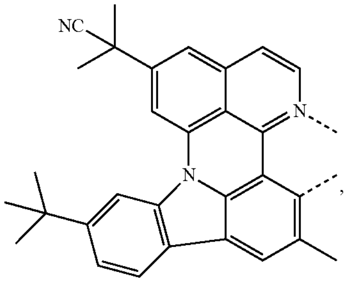

-continued
$L_{a207}$
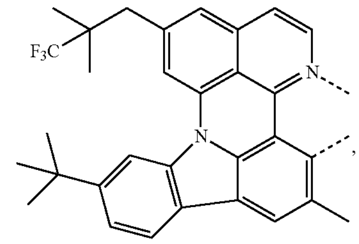
$L_{a208}$
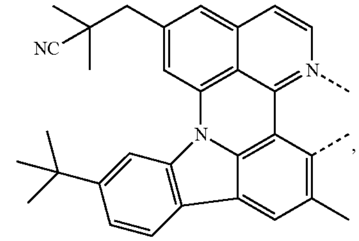
$L_{a209}$
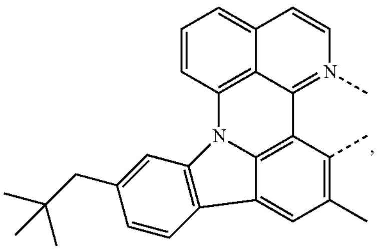
$L_{a210}$
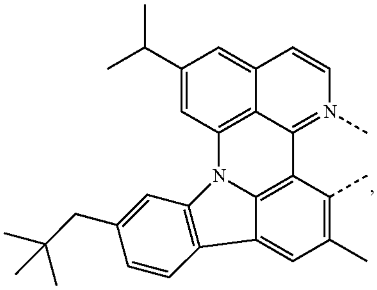
$L_{a211}$
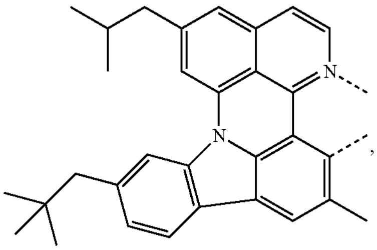
$L_{a212}$
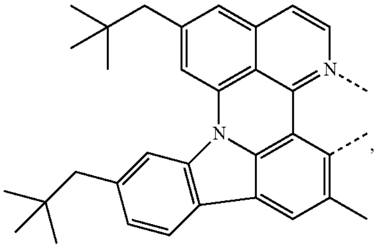
-continued
$L_{a213}$
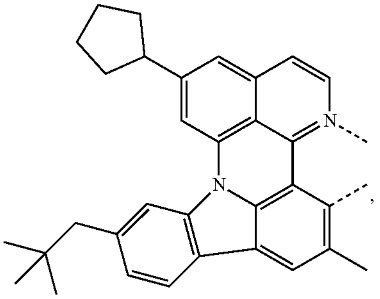
$L_{a214}$
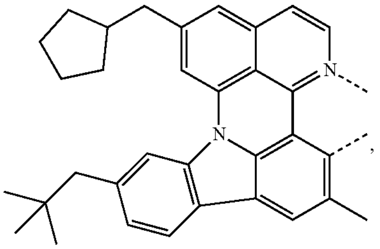
$L_{a215}$
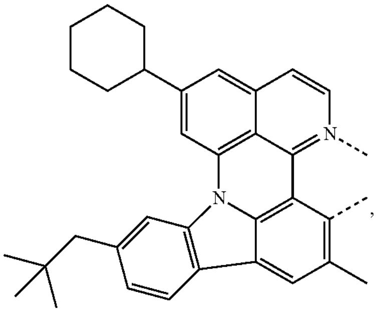
$L_{a216}$
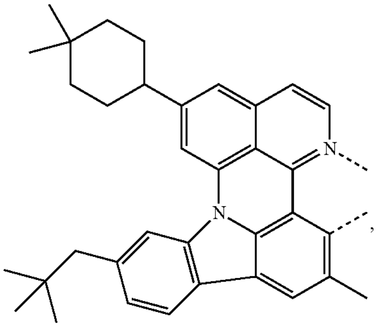
$L_{a217}$
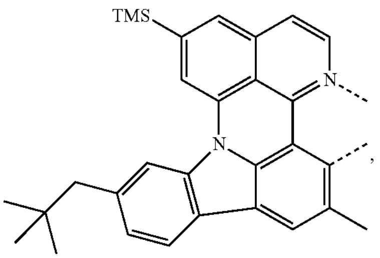

-continued
$L_{a218}$
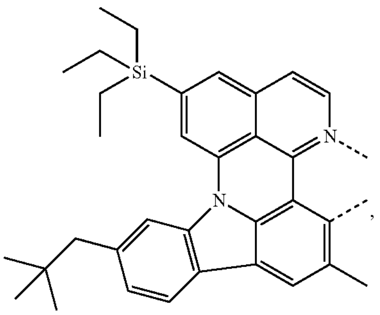
$L_{a219}$
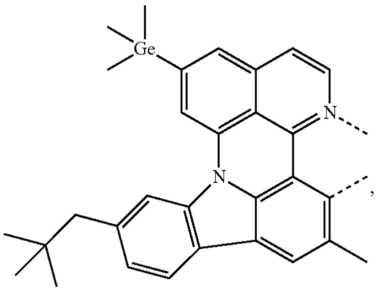
$L_{a220}$
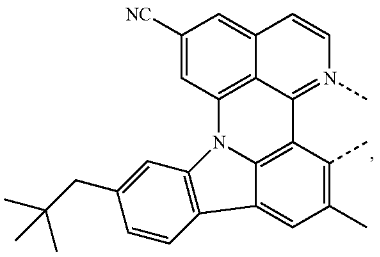
$L_{a221}$
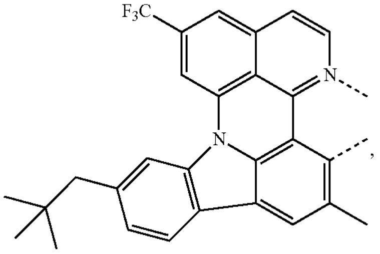
$L_{a222}$
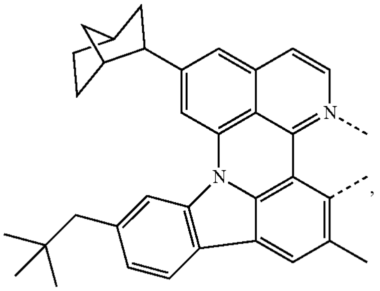
-continued
$L_{a223}$
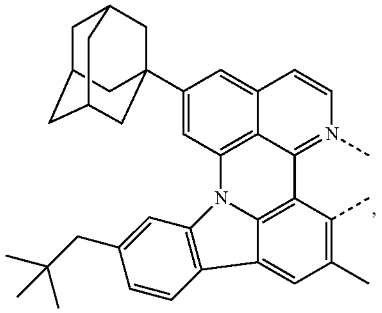
$L_{a224}$
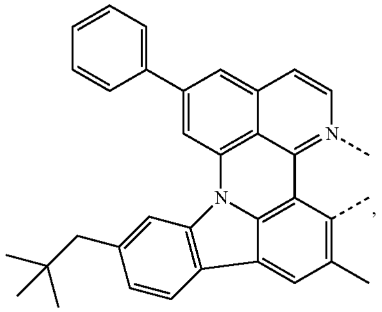
$L_{a225}$
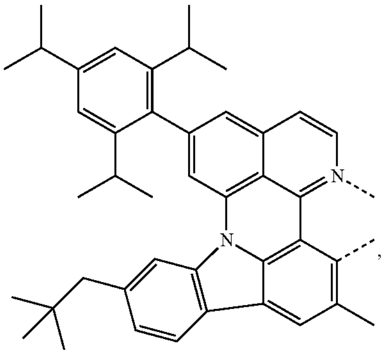
$L_{a226}$
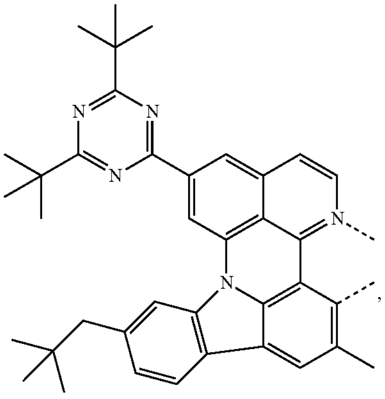

-continued
$L_{a227}$
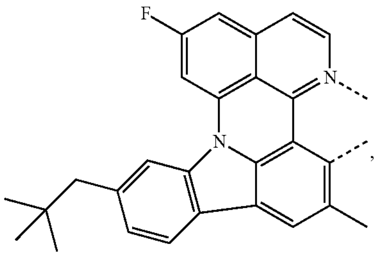
$L_{a228}$
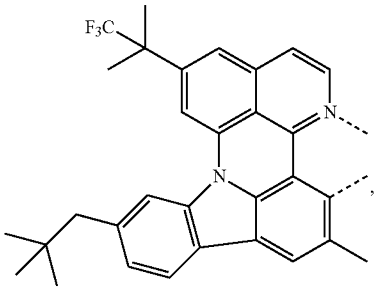
$L_{a229}$
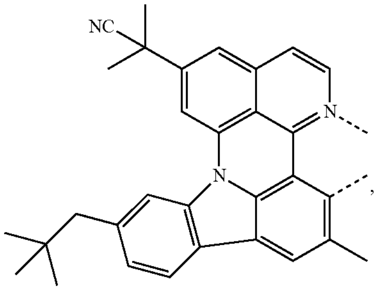
$L_{a230}$
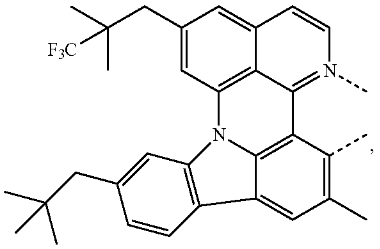
$L_{a231}$
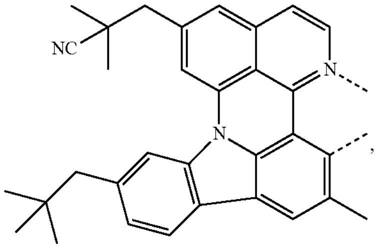
-continued
$L_{a232}$
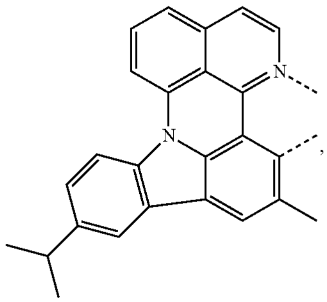
$L_{a233}$
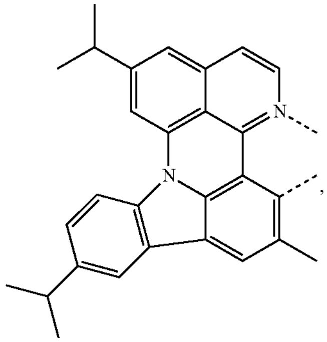
$L_{a234}$
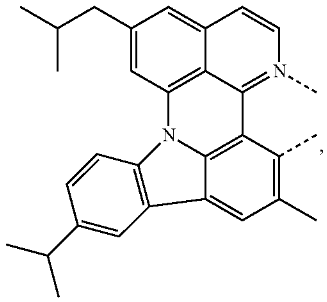
$L_{a235}$
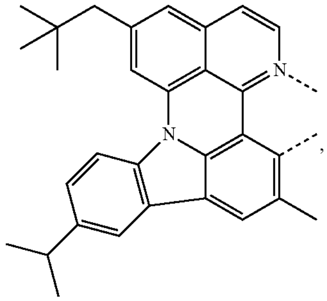

-continued
$L_{a236}$
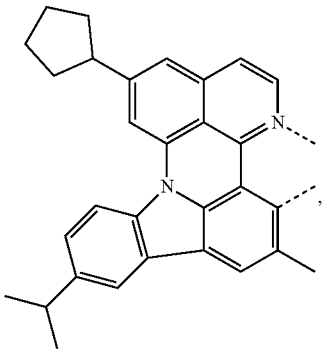
$L_{a237}$
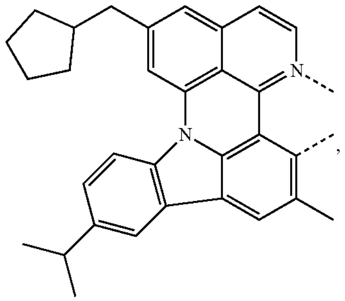
$L_{a238}$
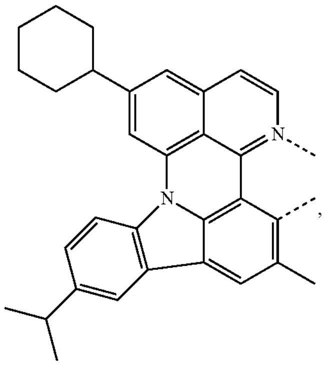
$L_{a239}$
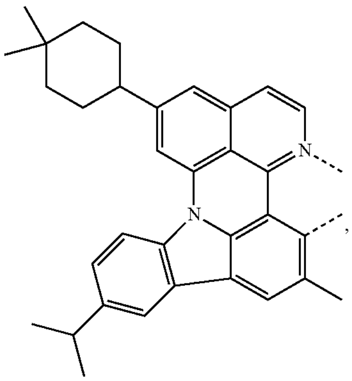
-continued
$L_{a240}$
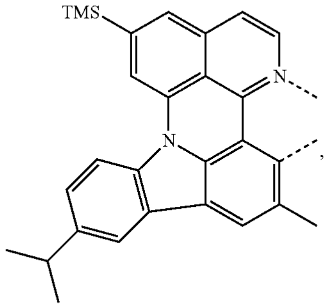
$L_{a241}$
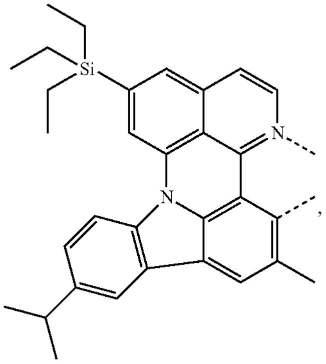
$L_{a242}$
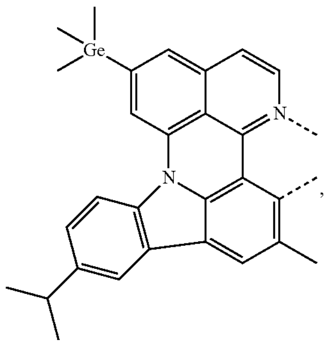
$L_{a243}$
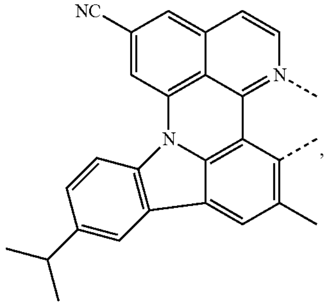

-continued
$L_{a244}$
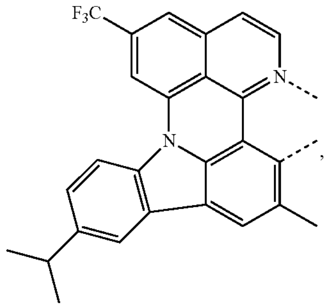
$L_{a245}$
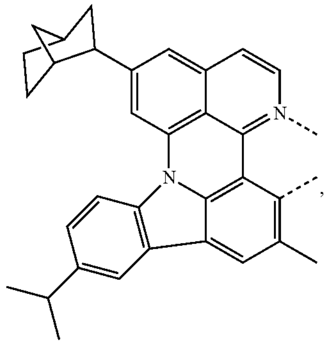
$L_{a246}$
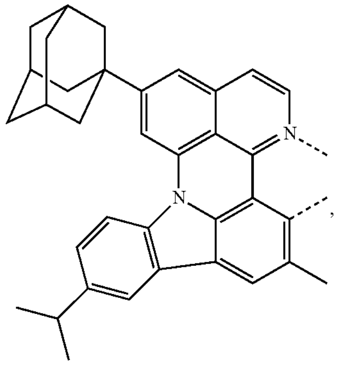
$L_{a247}$
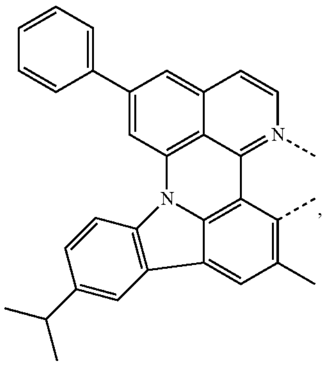
-continued
$L_{a248}$
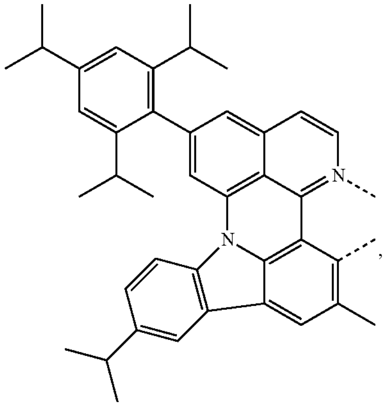
$L_{a249}$
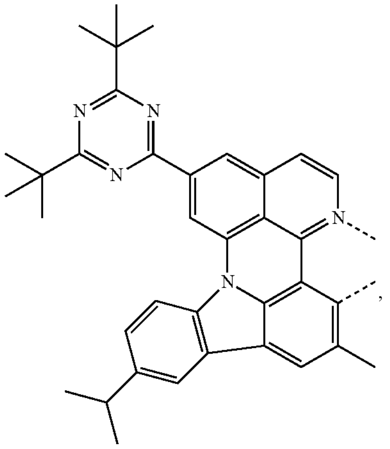
$L_{a250}$
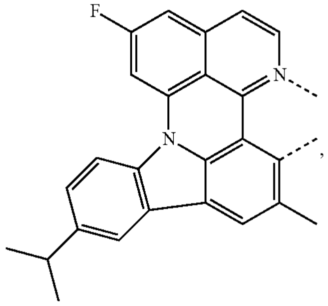
$L_{a251}$
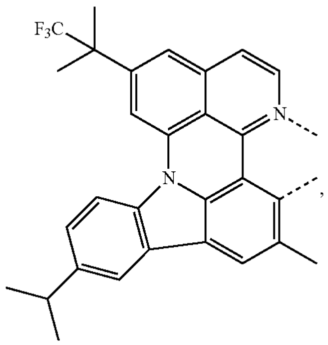

-continued
$L_{a252}$
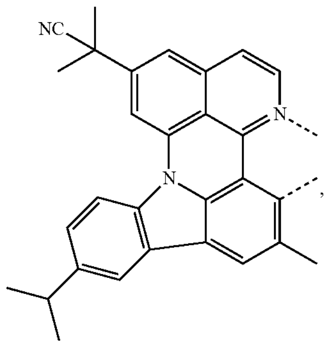
$L_{a253}$
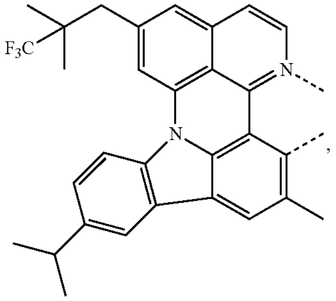
$L_{a254}$
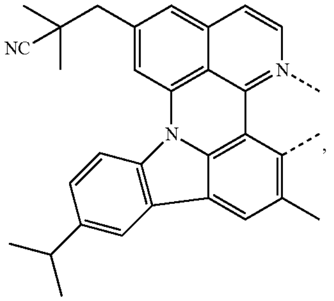
$L_{a255}$
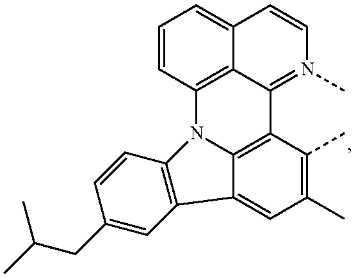
$L_{a256}$
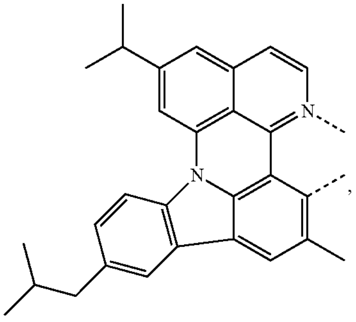
-continued
$L_{a257}$
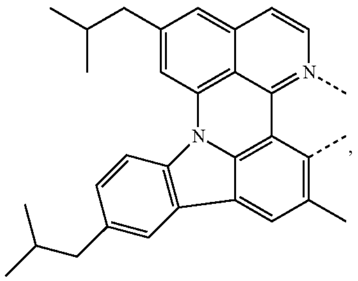
$L_{a258}$
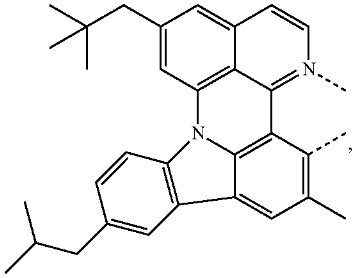
$L_{a259}$
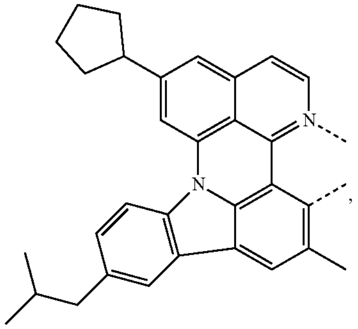
$L_{a260}$
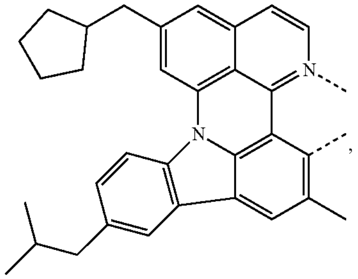
$L_{a261}$
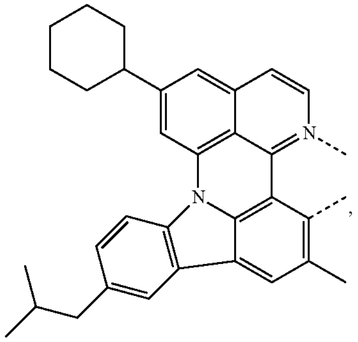

-continued
$L_{a262}$
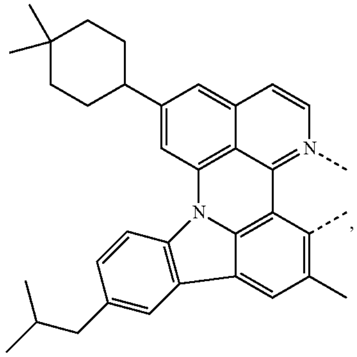
$L_{a263}$
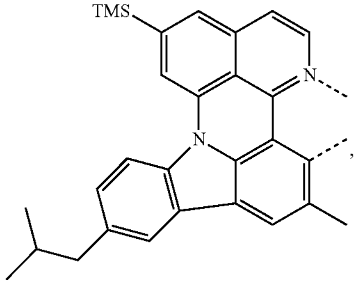
$L_{a264}$
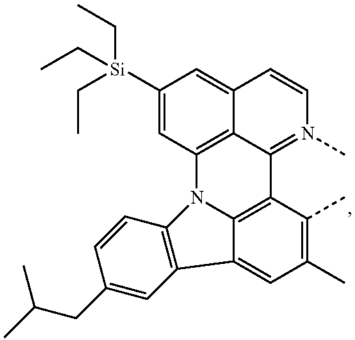
$L_{a265}$
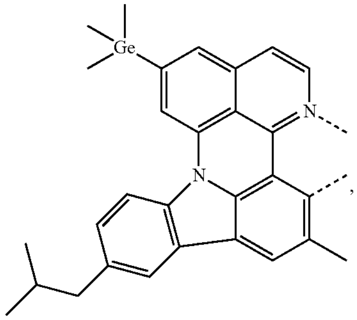
$L_{a266}$
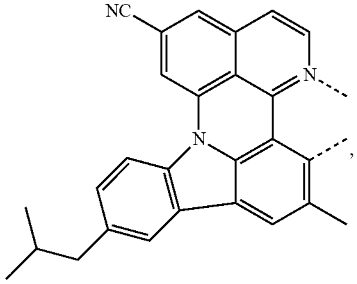
-continued
$L_{a267}$
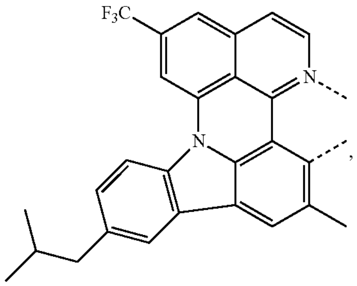
$L_{a268}$
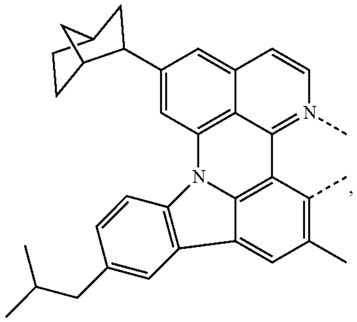
$L_{a269}$
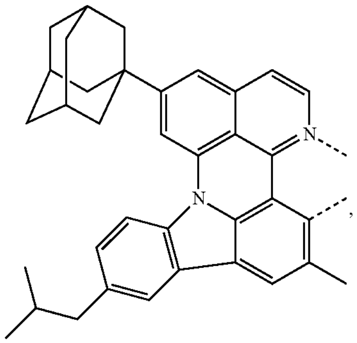
$L_{a270}$
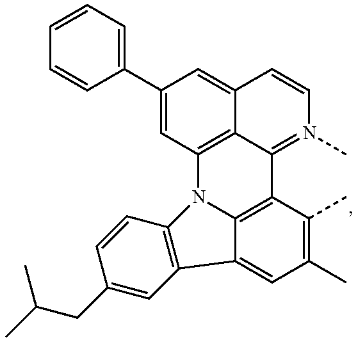

-continued
$L_{a271}$
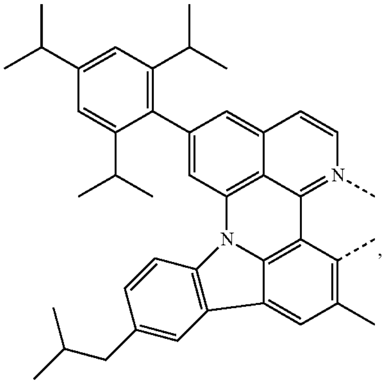
$L_{a272}$
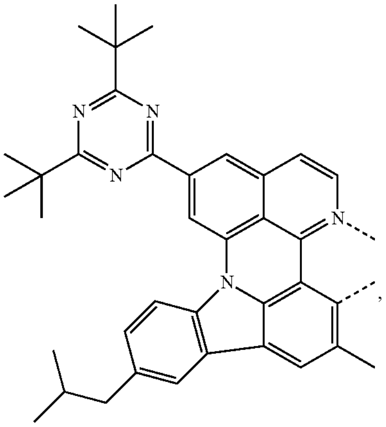
$L_{a273}$
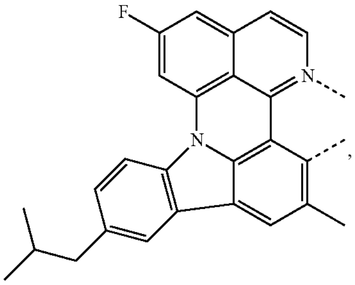
$L_{a274}$
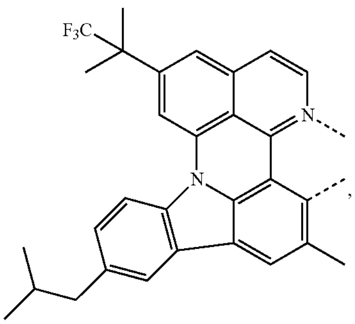
-continued
$L_{a275}$
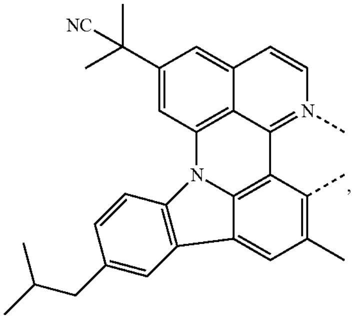
$L_{a276}$
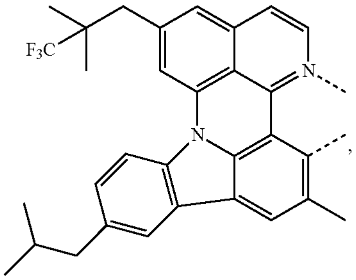
$L_{a277}$
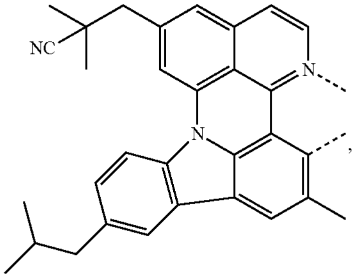
$L_{a278}$
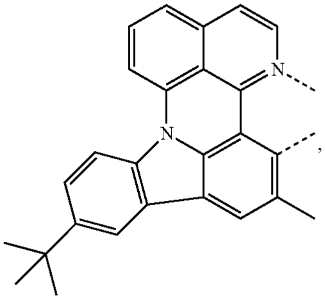
$L_{a279}$
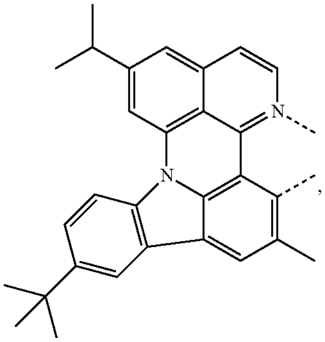

-continued
$L_{a280}$
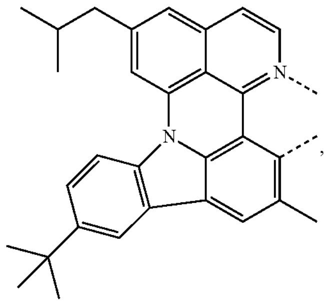
$L_{a281}$
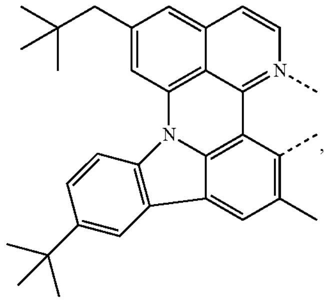
$L_{a282}$
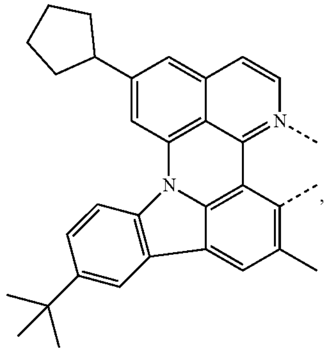
$L_{a283}$
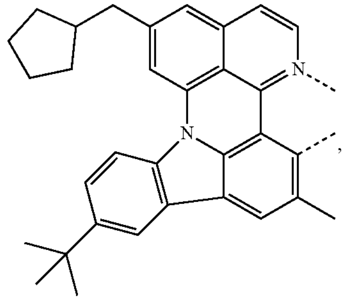
-continued
$L_{a284}$
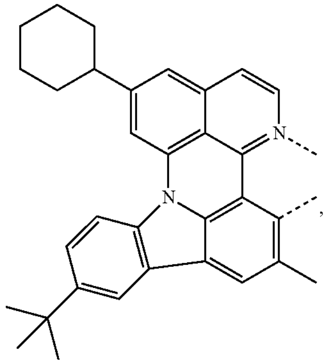
$L_{a285}$
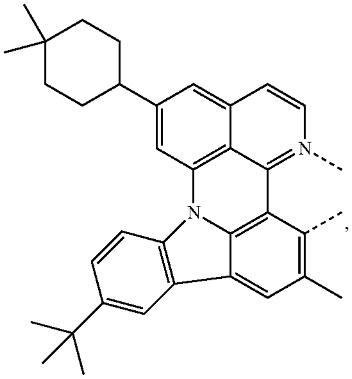
$L_{a286}$
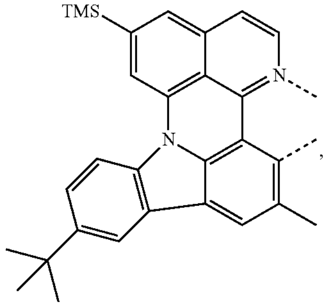
$L_{a287}$
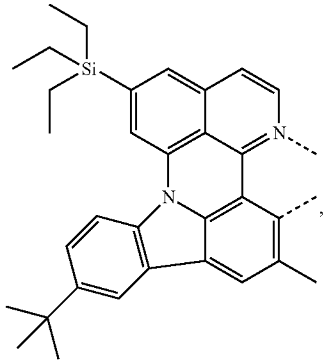

-continued
$L_{a288}$
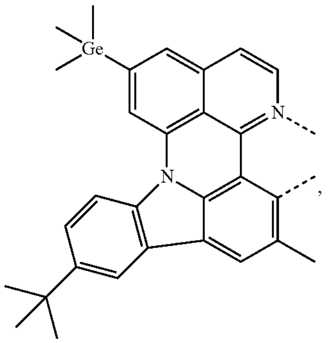
$L_{a289}$
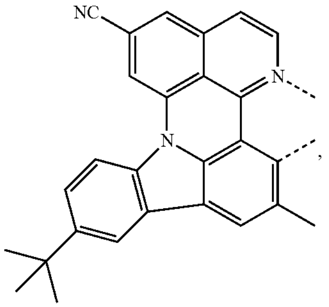
$L_{a290}$
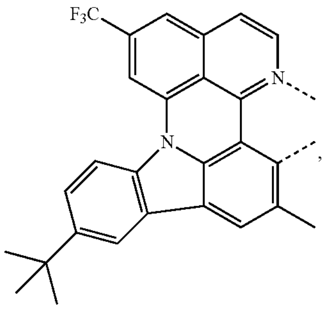
$L_{a291}$
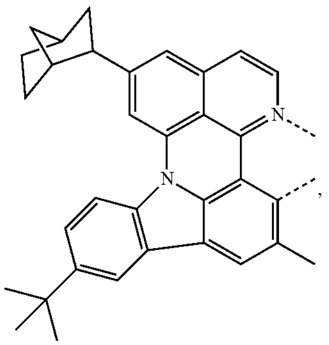
-continued
$L_{a292}$
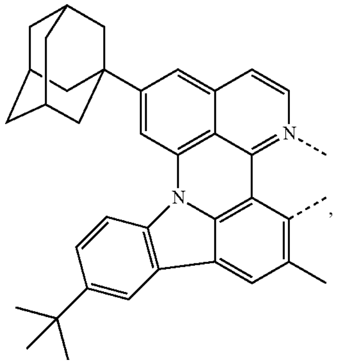
$L_{a293}$
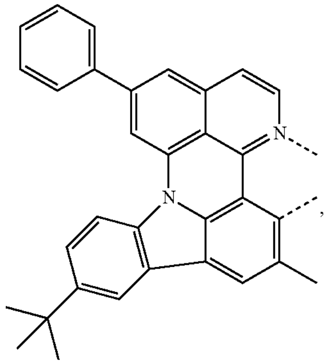
$L_{a294}$
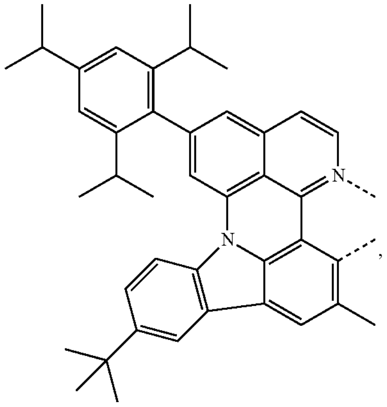
$L_{a295}$
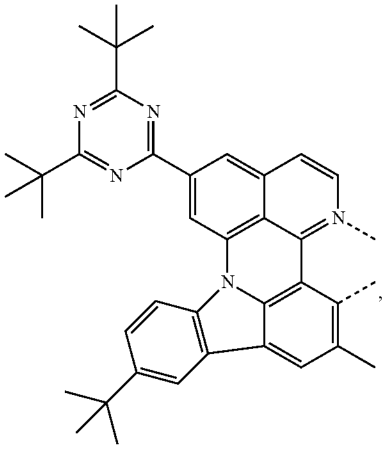

-continued
$L_{a296}$
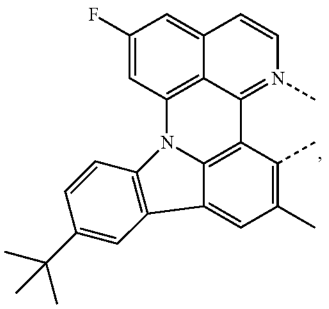
$L_{a297}$
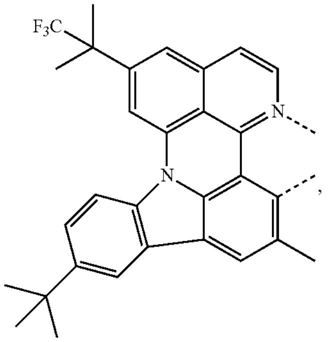
$L_{a298}$
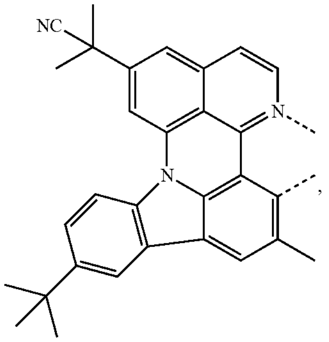
$L_{a299}$
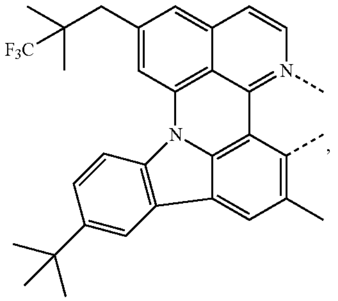
$L_{a300}$
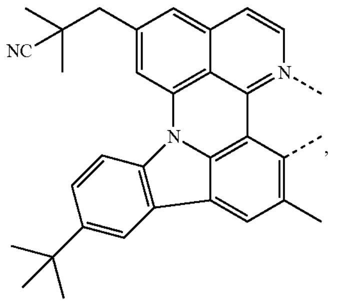
-continued
$L_{a301}$
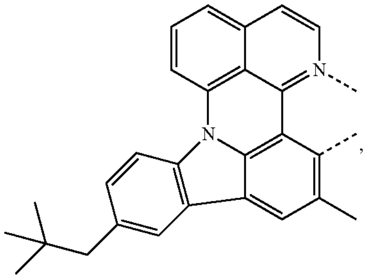
$L_{a302}$
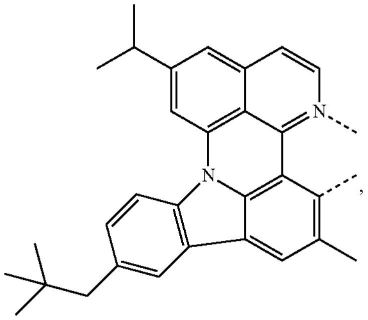
$L_{a303}$
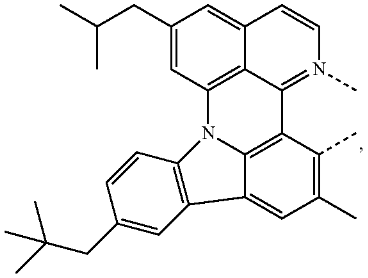
$L_{a304}$
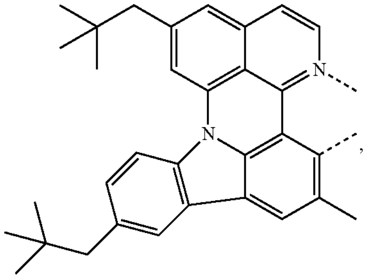
$L_{a305}$
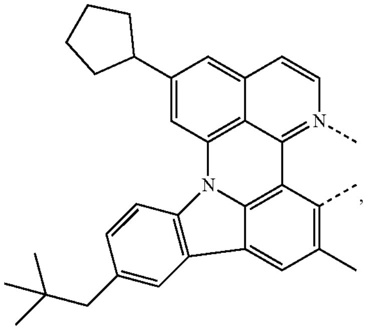

-continued
$L_{a306}$
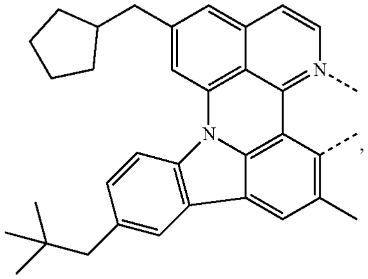
$L_{a307}$
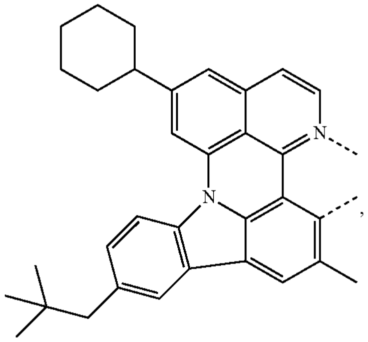
$L_{a308}$
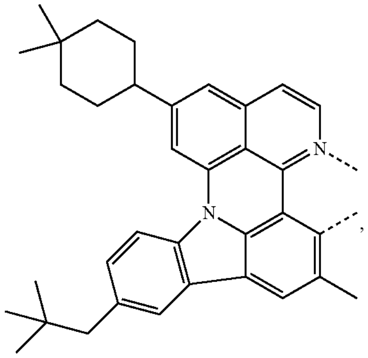
$L_{a309}$
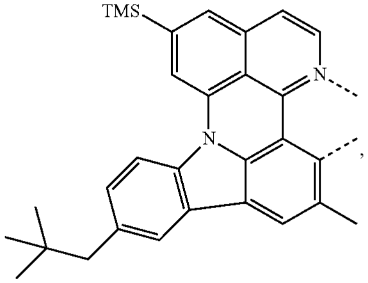
$L_{a310}$
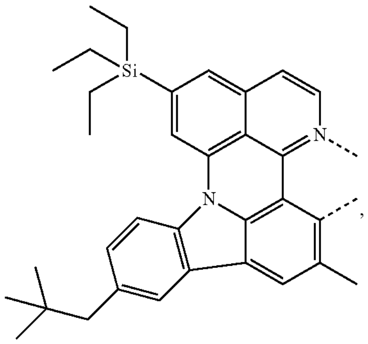
-continued
$L_{a311}$
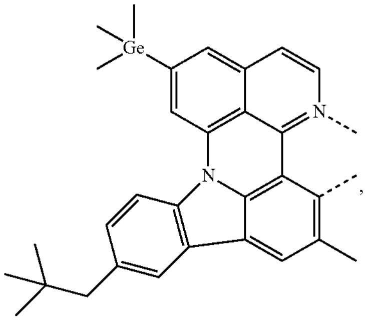
$L_{a312}$
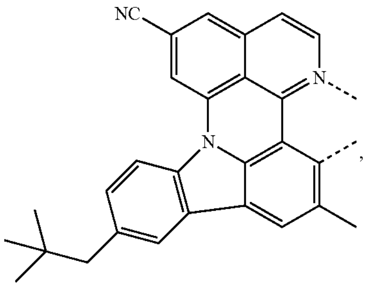
$L_{a313}$
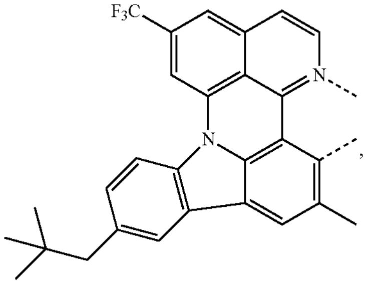
$L_{a314}$
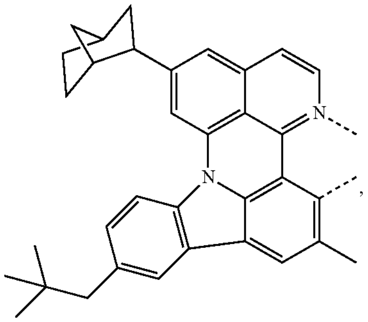
$L_{a315}$
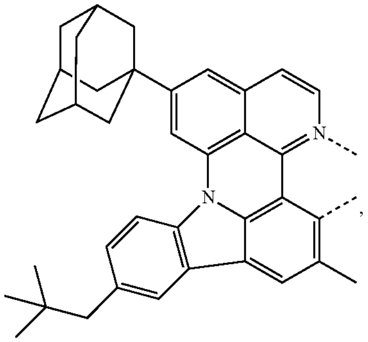

-continued
$L_{a316}$
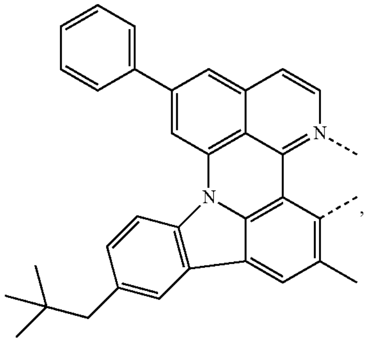
$L_{a317}$
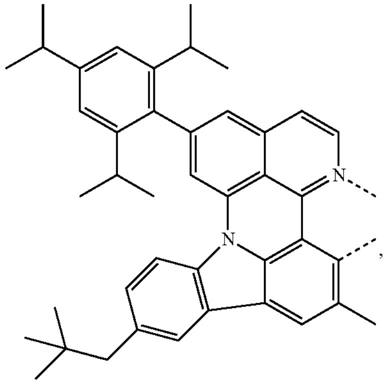
$L_{a318}$
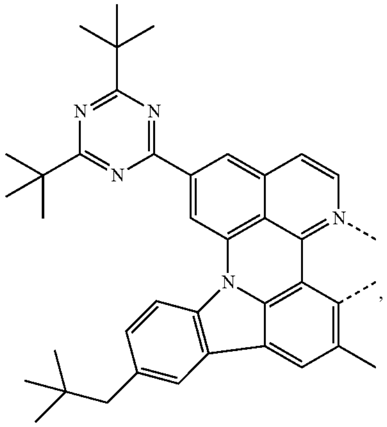
$L_{a319}$
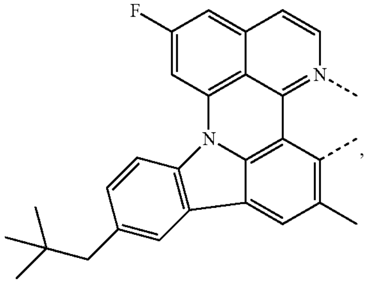
-continued
$L_{a320}$
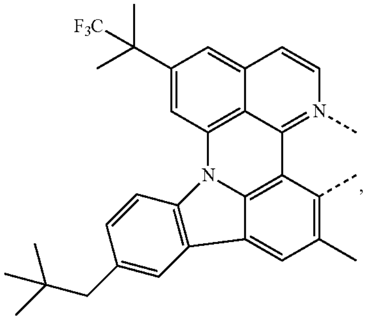
$L_{a321}$
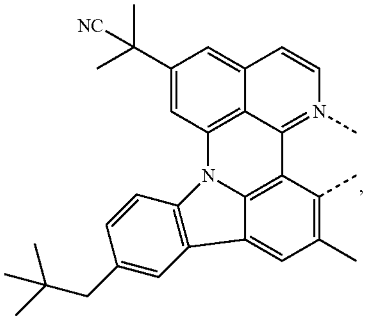
$L_{a322}$
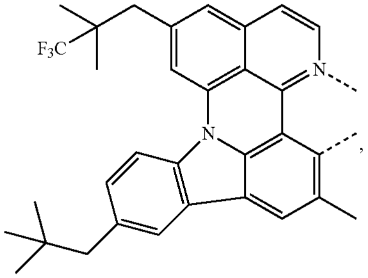
$L_{a323}$
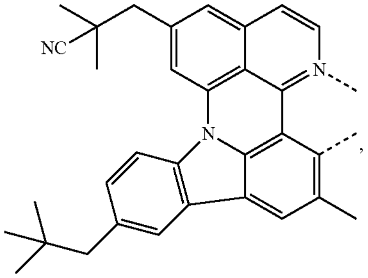
$L_{a324}$
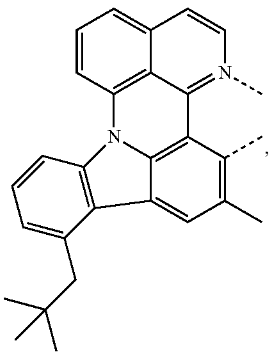

-continued
$L_{a325}$
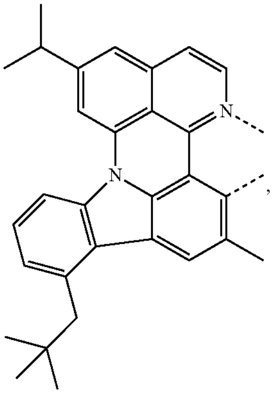
$L_{a326}$
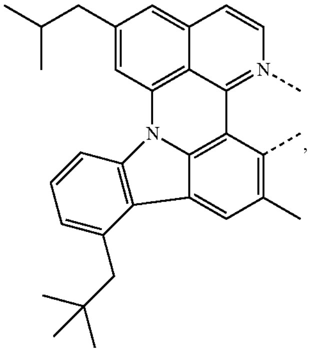
$L_{a327}$
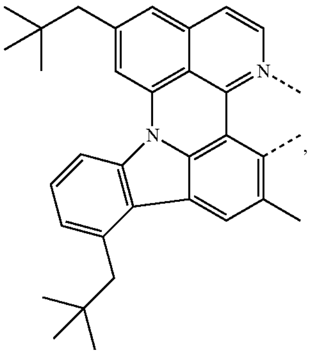
$L_{a328}$
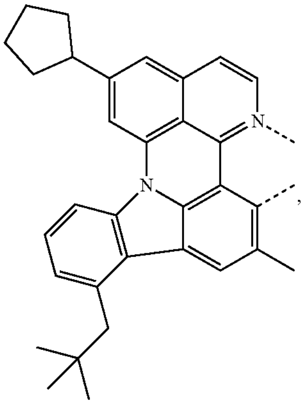
-continued
$L_{a329}$
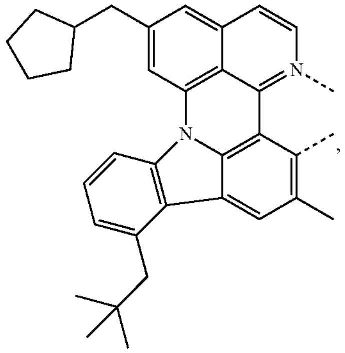
$L_{a330}$
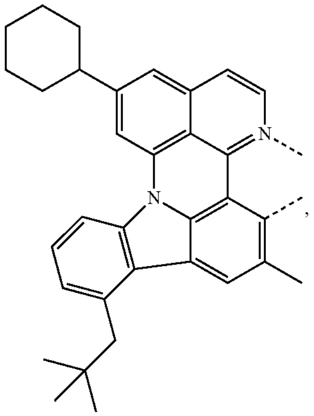
$L_{a331}$
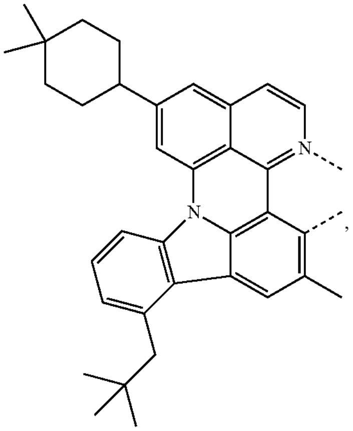
$L_{a332}$
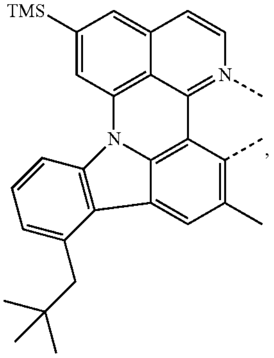

-continued
$L_{a333}$
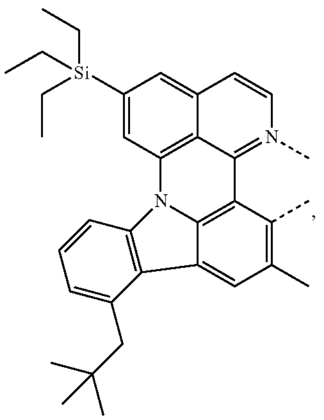
$L_{a334}$
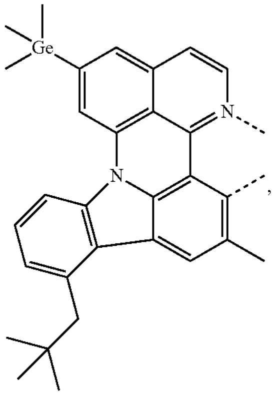
$L_{a335}$
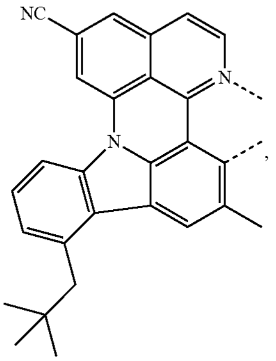
$L_{a336}$
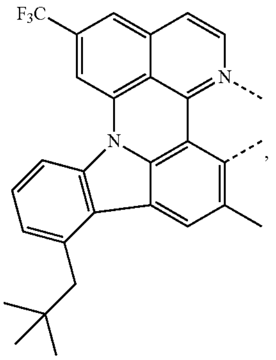
-continued
$L_{a337}$
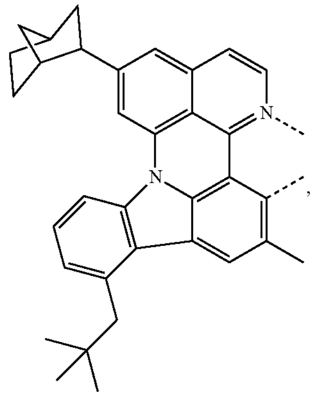
$L_{a338}$
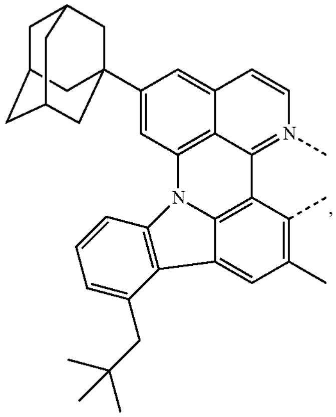
$L_{a339}$
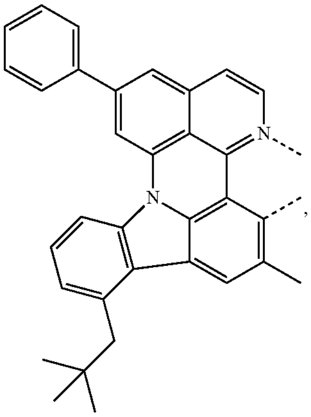

-continued
$L_{a340}$
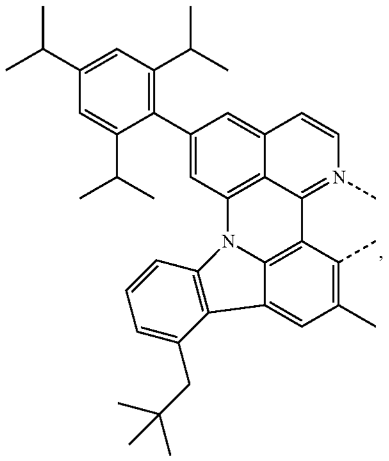
$L_{a341}$
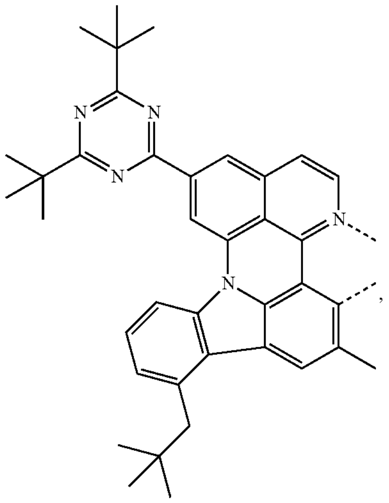
$L_{a342}$
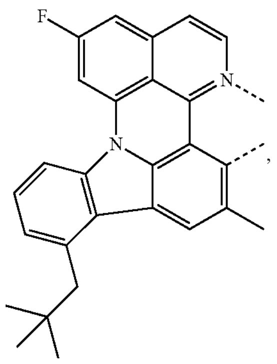
-continued
$L_{a343}$
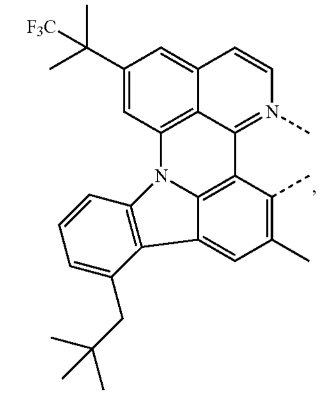
$L_{a344}$
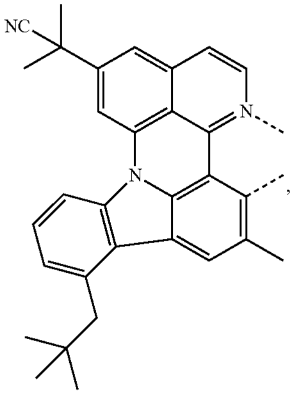
$L_{a345}$
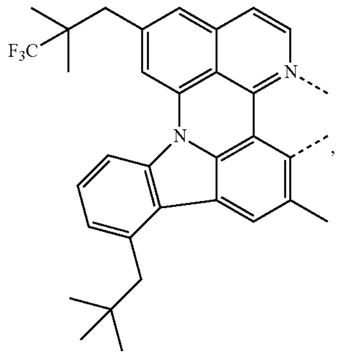
$L_{a346}$
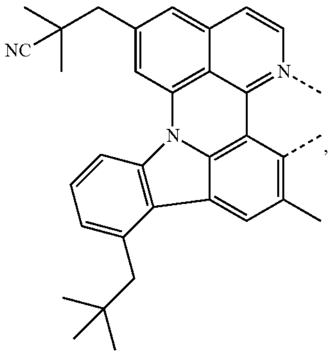

-continued
La347
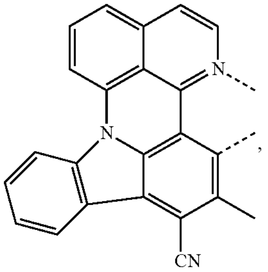
La348
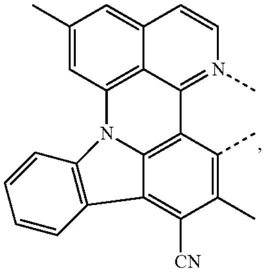
La349
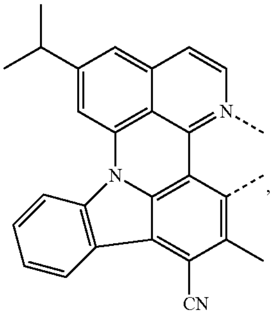
La350
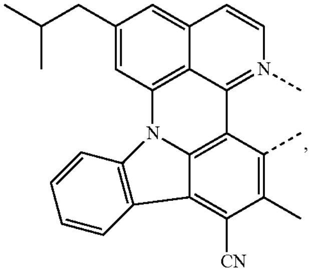
La351
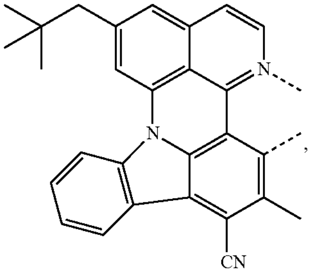
-continued
La352
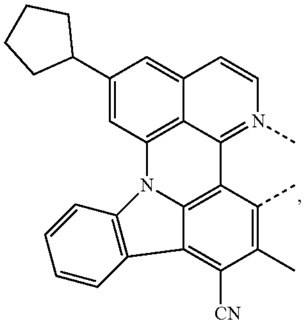
La353
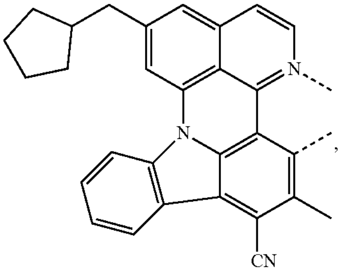
La354
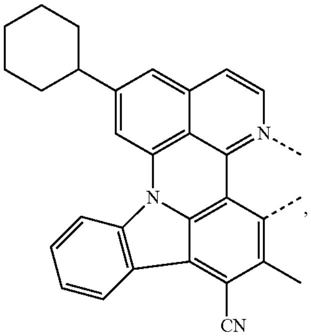
La355
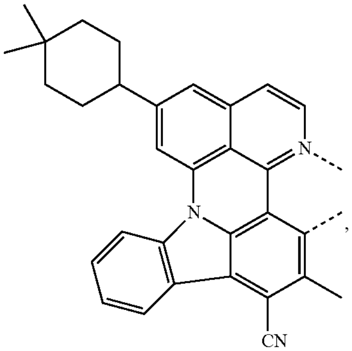
La356
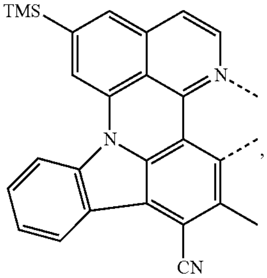

-continued
$L_{a357}$
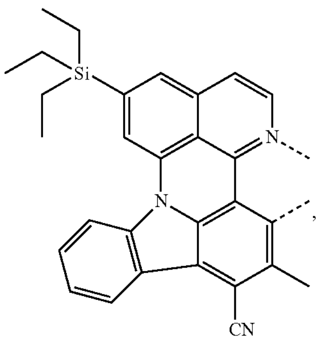
$L_{a358}$
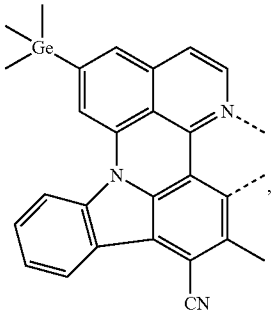
$L_{a359}$
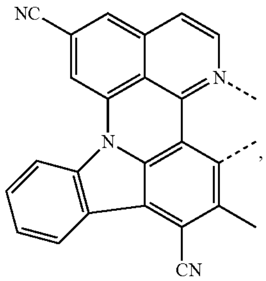
$L_{a360}$
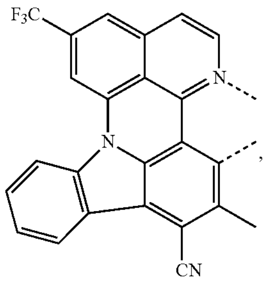
$L_{a361}$
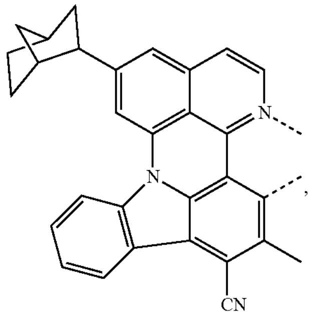
-continued
$L_{a362}$
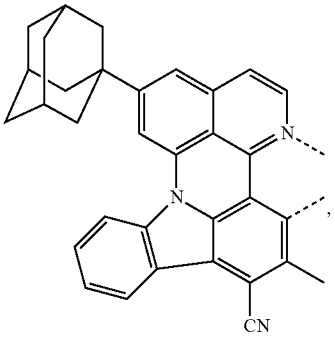
$L_{a363}$
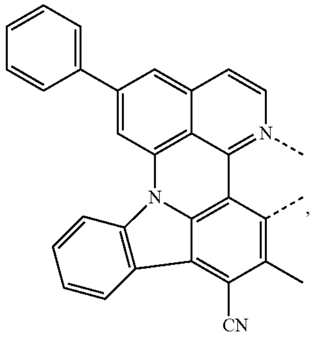
$L_{a364}$
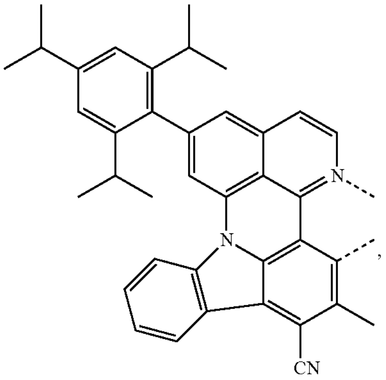
$L_{a365}$
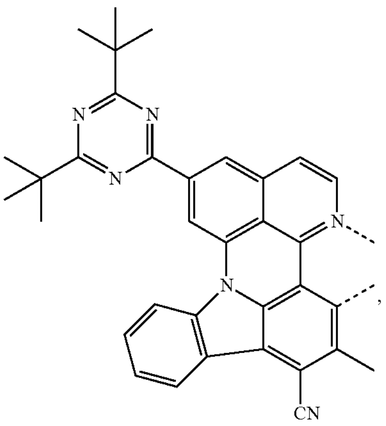

-continued
$L_{a366}$
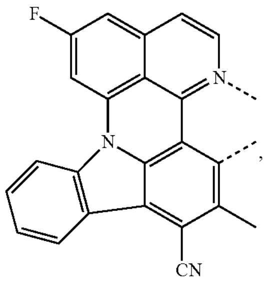
$L_{a367}$
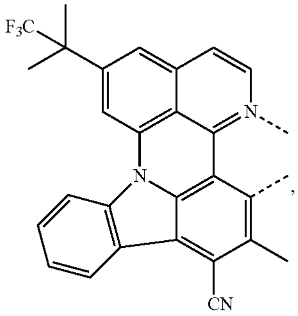
$L_{a368}$
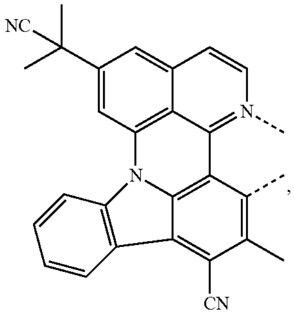
$L_{a369}$
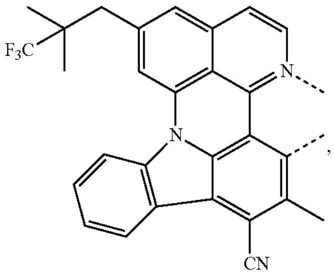
$L_{a370}$
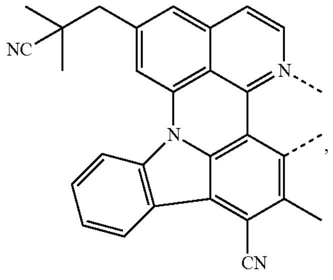
-continued
$L_{a371}$
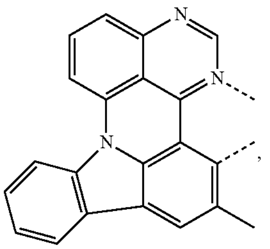
$L_{a372}$
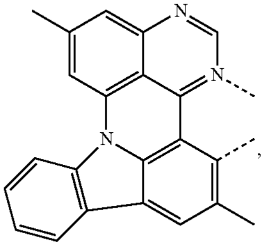
$L_{a373}$
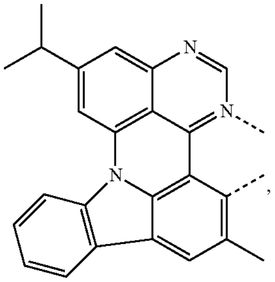
$L_{a374}$
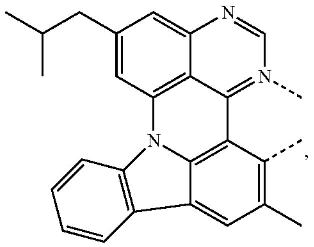
$L_{a375}$
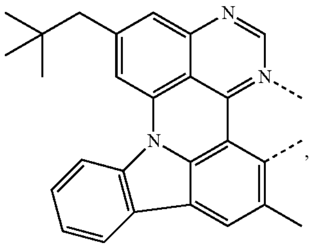
$L_{a376}$
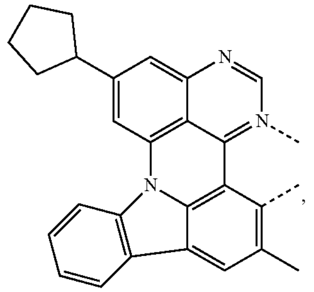

-continued
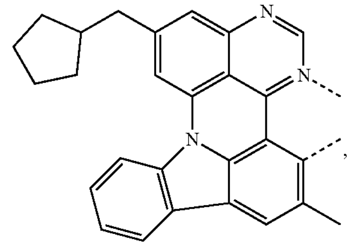
$L_{a377}$
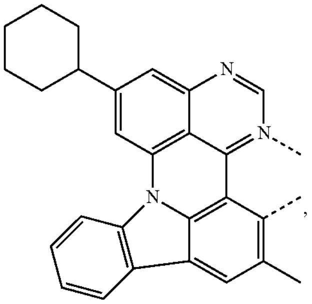
$L_{a378}$
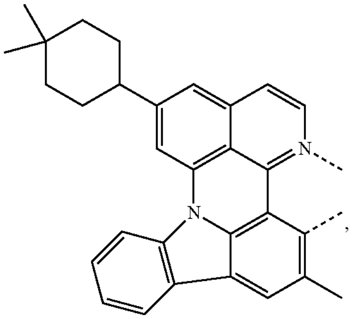
$L_{a379}$
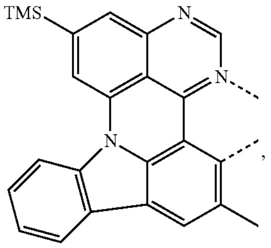
$L_{a380}$
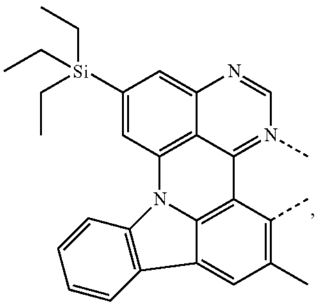
$L_{a381}$
-continued
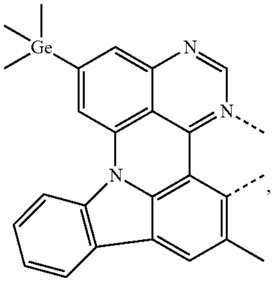
$L_{a382}$
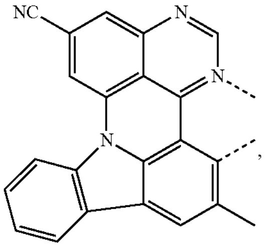
$L_{a383}$
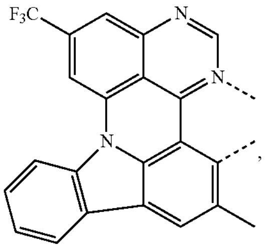
$L_{a384}$
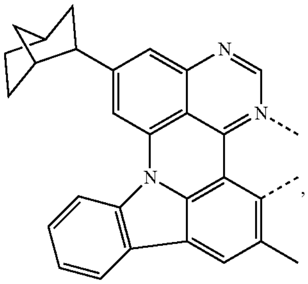
$L_{a385}$
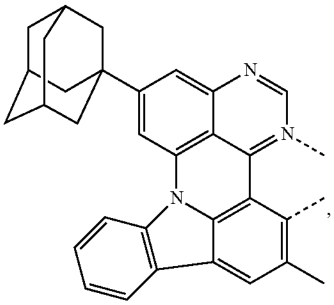
$L_{a386}$ -continued
$L_{a387}$
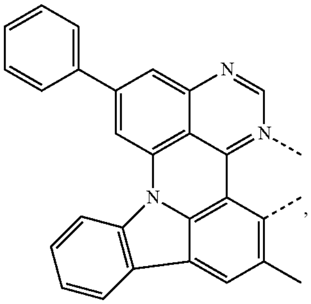
$L_{a388}$
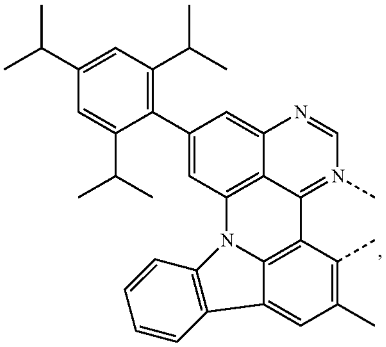
$L_{a389}$
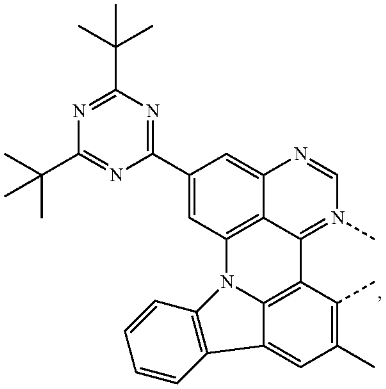
$L_{a390}$
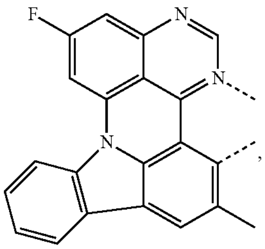
$L_{a391}$
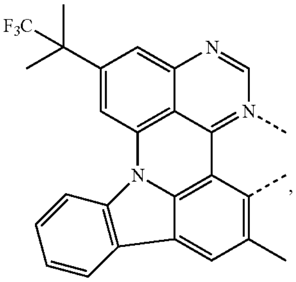
-continued
$L_{a392}$
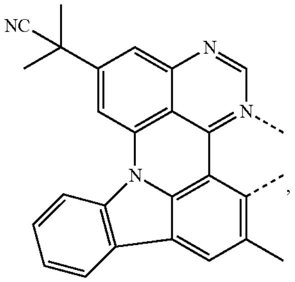
$L_{a393}$
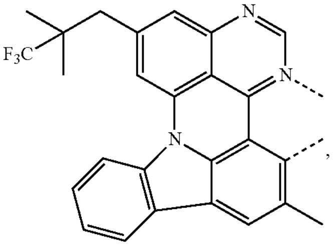
$L_{a394}$
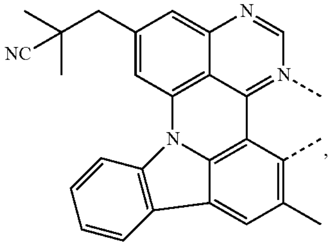
$L_{a395}$
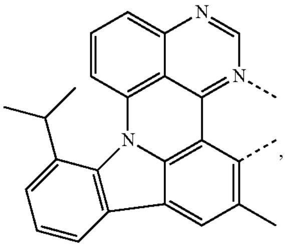
$L_{a396}$
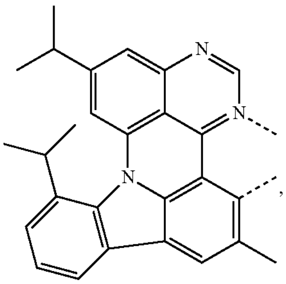
$L_{a397}$
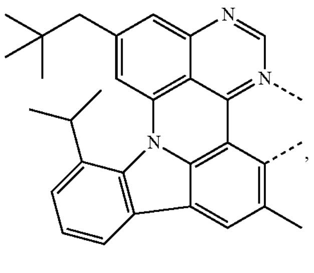

$L_{a398}$
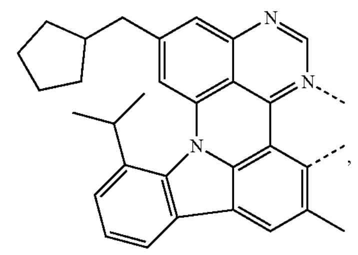
$L_{a399}$
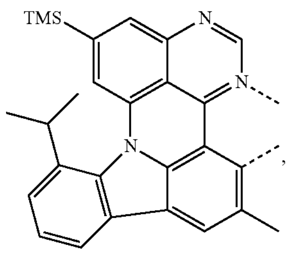
$L_{a400}$
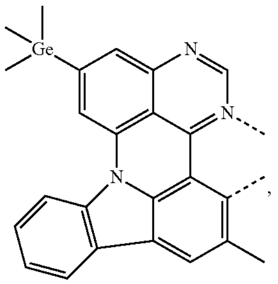
$L_{a401}$
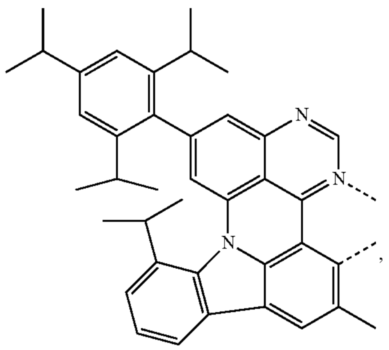
$L_{a402}$
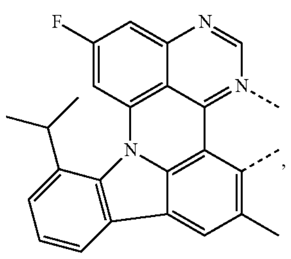
$L_{a403}$
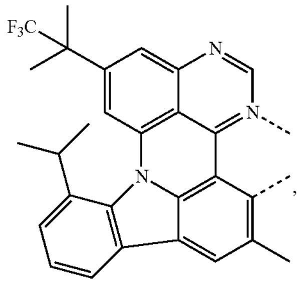
$L_{a404}$
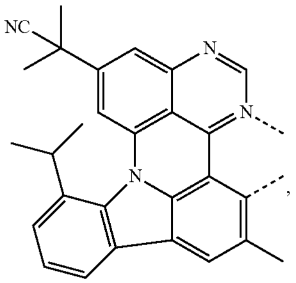
$L_{a405}$
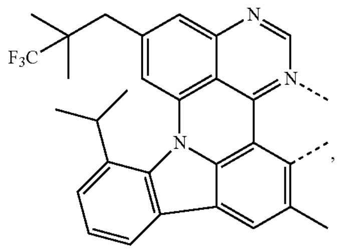
$L_{a406}$
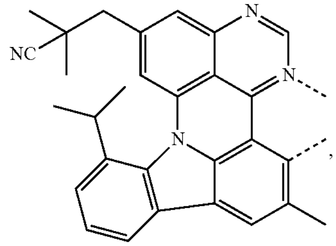
$L_{a407}$
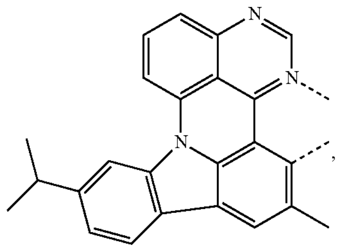
$L_{a408}$
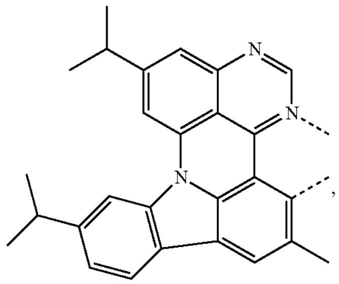

-continued
$L_{a409}$
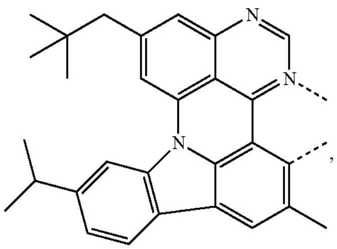
$L_{a410}$
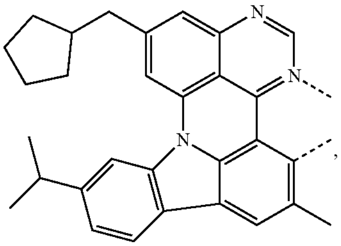
$L_{a411}$
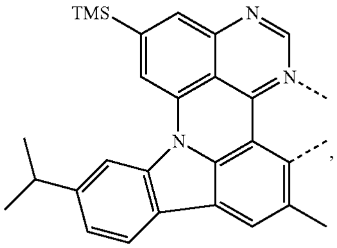
$L_{a412}$
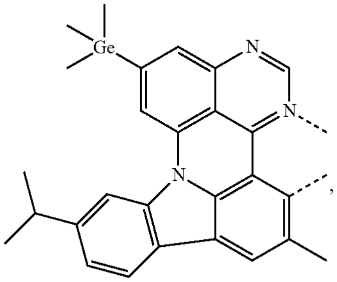
$L_{a413}$
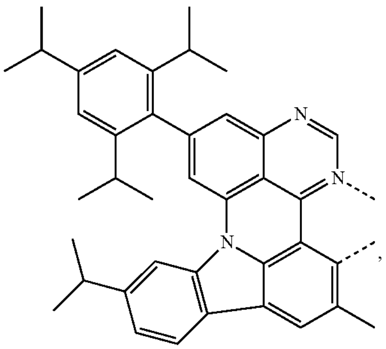
-continued
$L_{a414}$
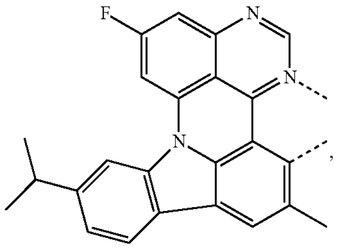
$L_{a415}$
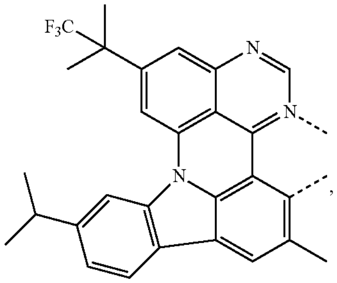
$L_{a416}$
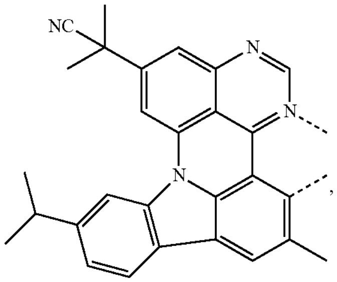
$L_{a417}$
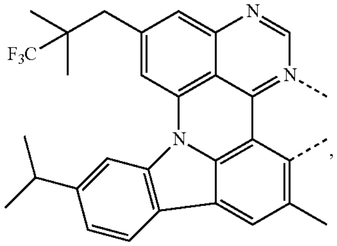
$L_{a418}$
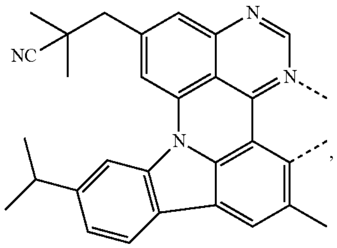
$L_{a419}$
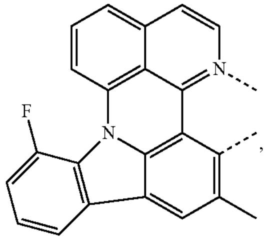

-continued
$L_{a420}$
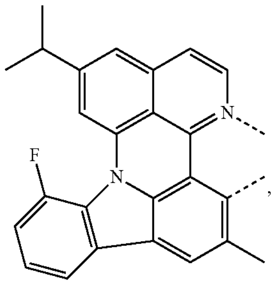
$L_{a421}$
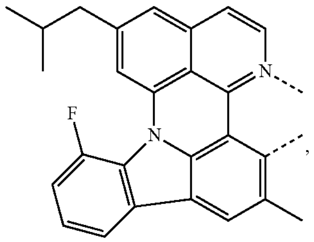
$L_{a422}$
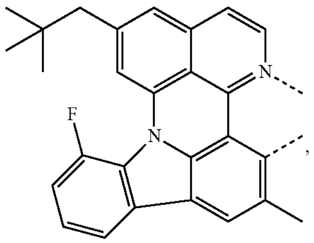
$L_{a423}$
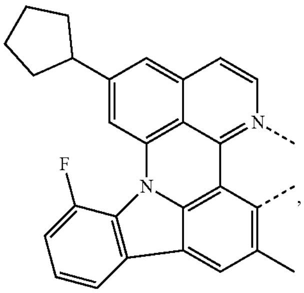
$L_{a424}$
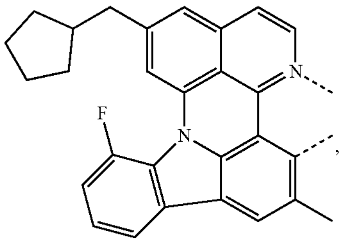
-continued
$L_{a425}$
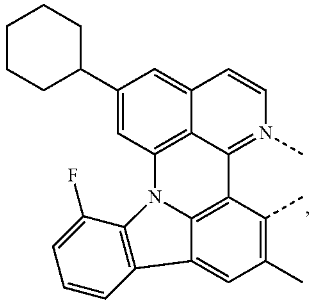
$L_{a426}$
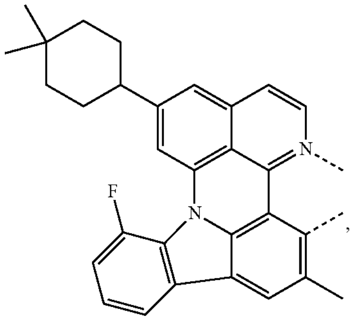
$L_{a427}$
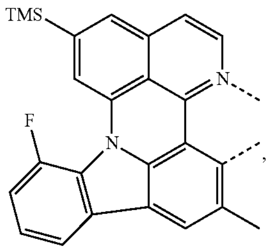
$L_{a428}$
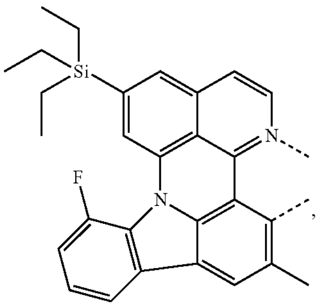
$L_{a429}$
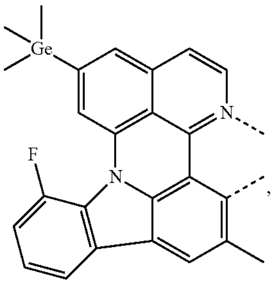

$L_{a430}$
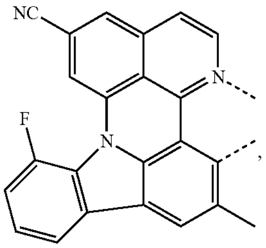
$L_{a431}$
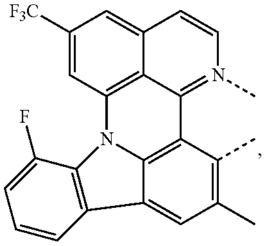
$L_{a432}$
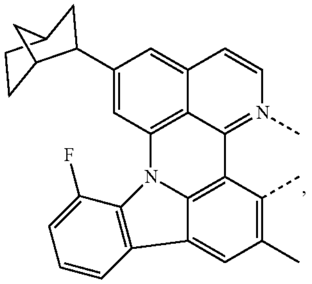
$L_{a433}$
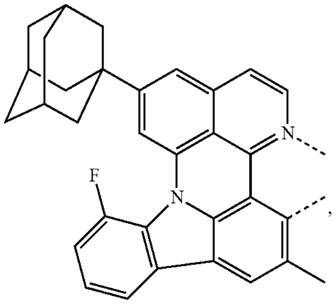
$L_{a434}$
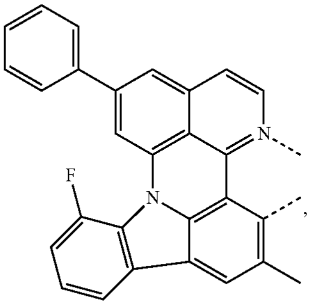
$L_{a435}$
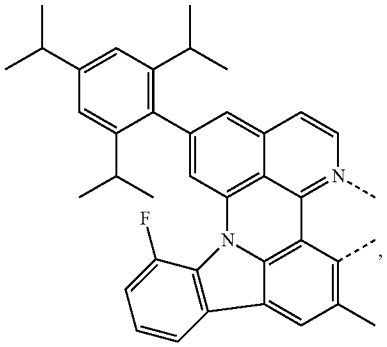
$L_{a436}$
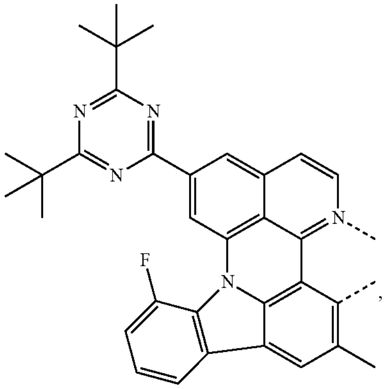
$L_{a437}$
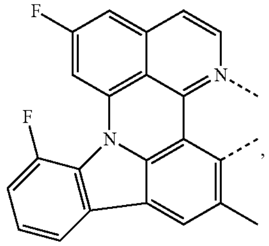
$L_{a438}$
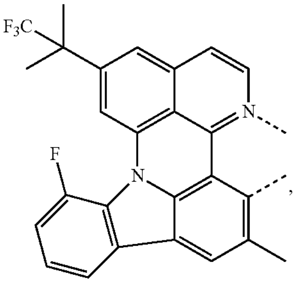
$L_{a439}$
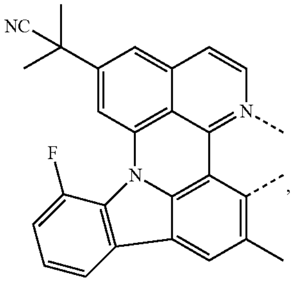

-continued
$L_{a440}$
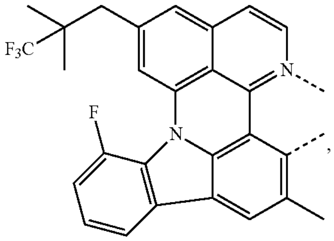
$L_{a441}$
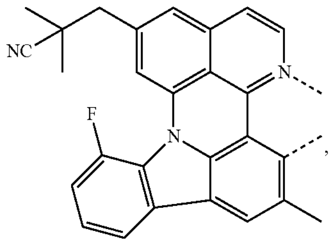
$L_{a442}$
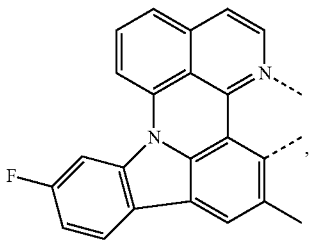
$L_{a443}$
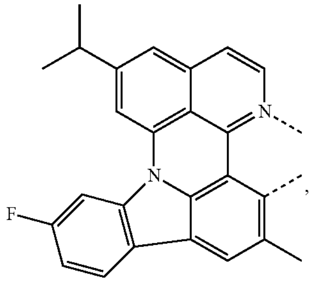
$L_{a444}$
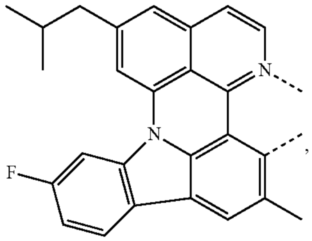
$L_{a445}$
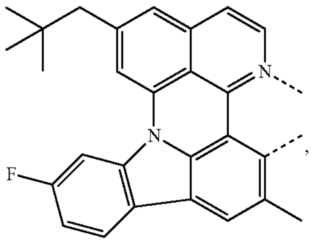
-continued
$L_{a446}$
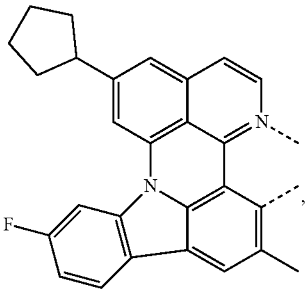
$L_{a447}$
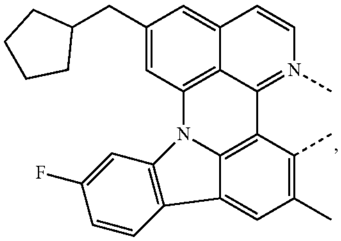
$L_{a448}$
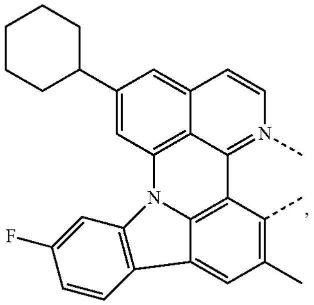
$L_{a449}$
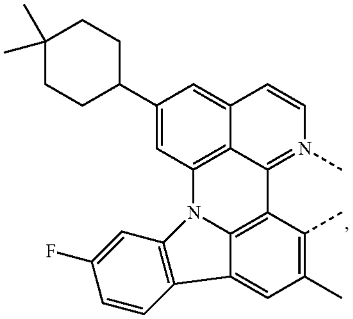
$L_{a450}$
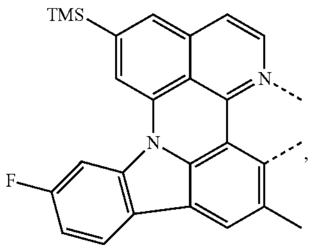

-continued
$L_{a451}$
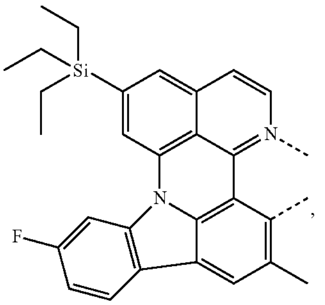
$L_{a452}$
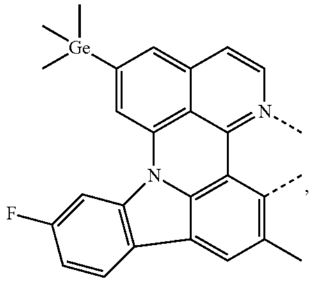
$L_{a453}$
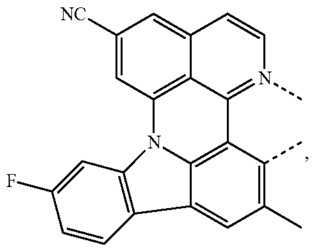
$L_{a454}$
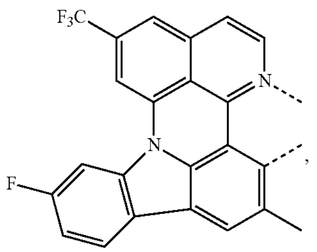
$L_{a455}$
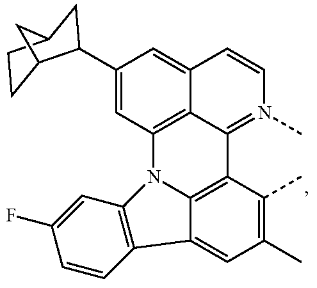
-continued
$L_{a456}$
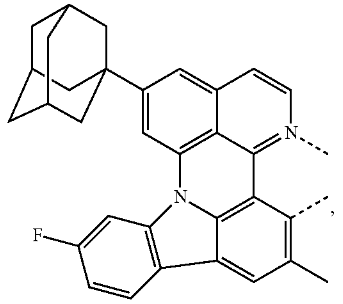
$L_{a457}$
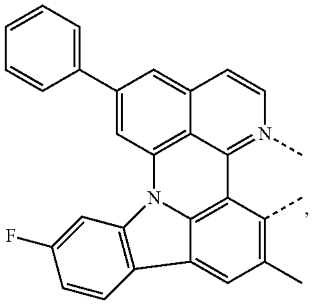
$L_{a458}$
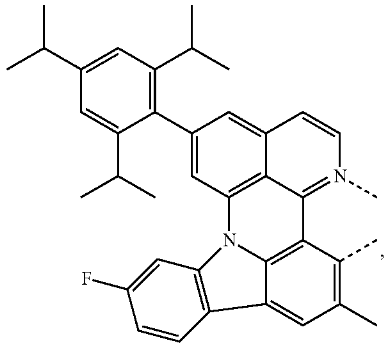
$L_{a459}$
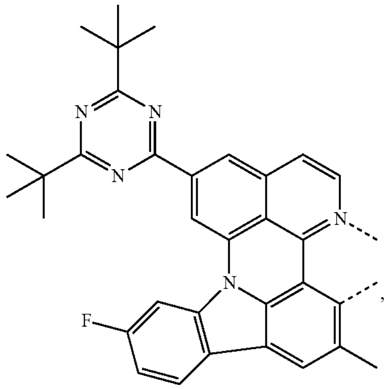
$L_{a460}$
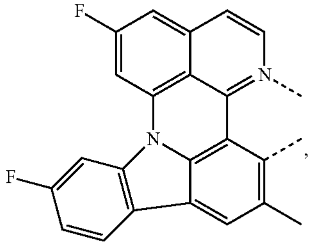

-continued
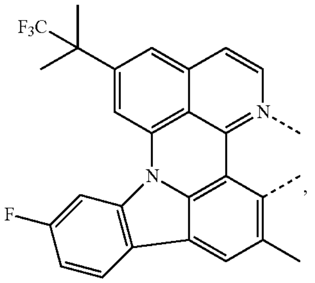
$L_{a461}$
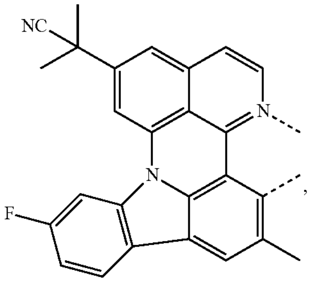
$L_{a462}$
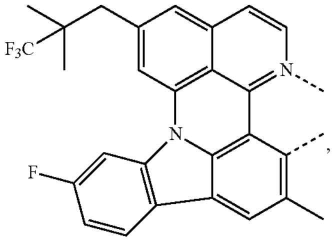
$L_{a463}$
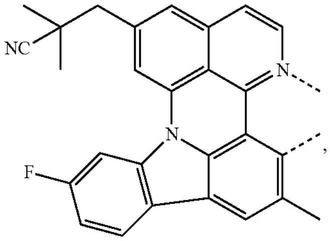
$L_{a464}$
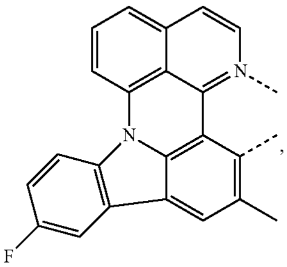
$L_{a465}$
-continued
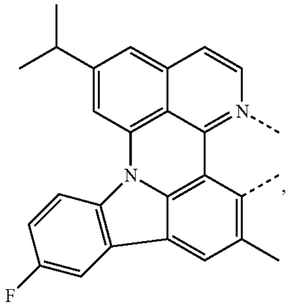
$L_{a466}$
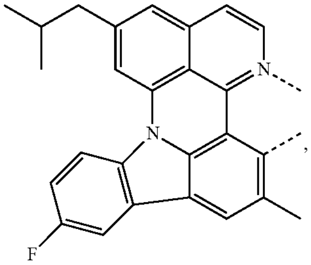
$L_{a467}$
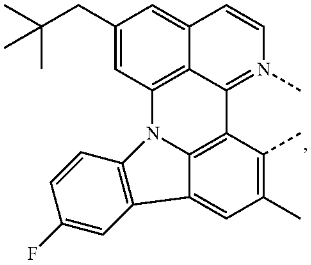
$L_{a468}$
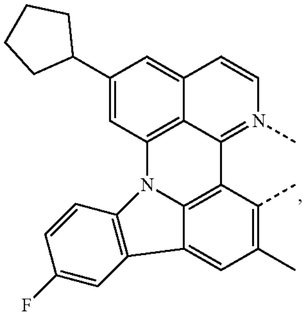
$L_{a469}$
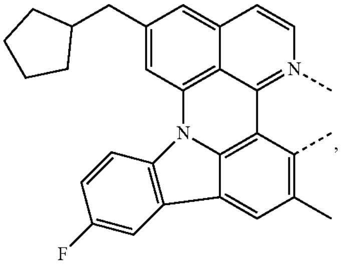
$L_{a470}$ -continued
$L_{a471}$
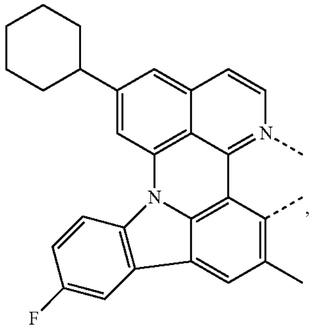
$L_{a472}$
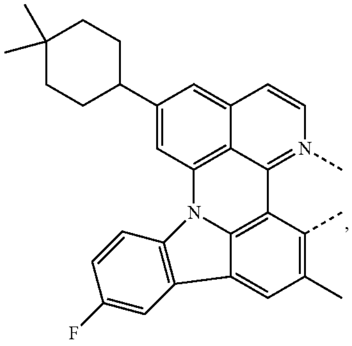
$L_{a473}$
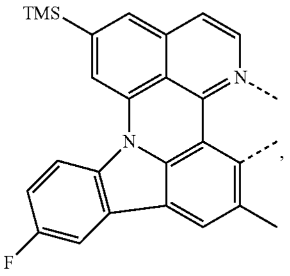
$L_{a474}$
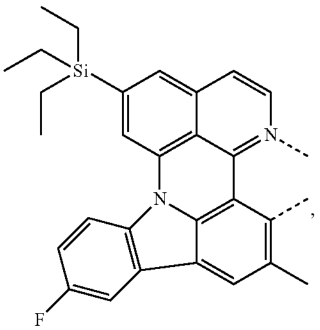
$L_{a475}$
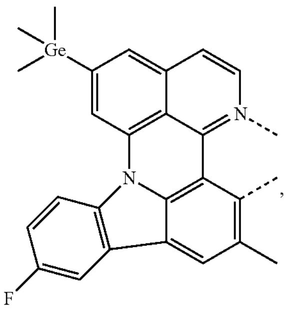
-continued
$L_{a476}$
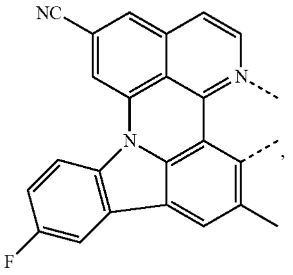
$L_{a477}$
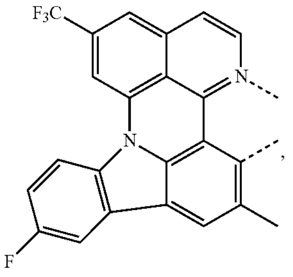
$L_{a478}$
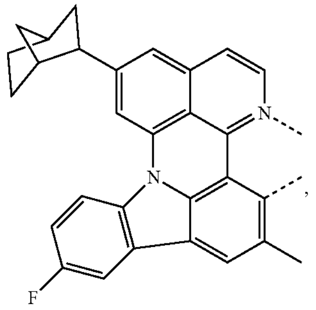
$L_{a479}$
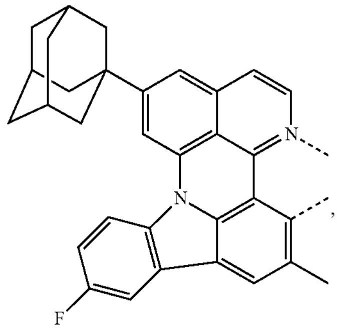
$L_{a480}$
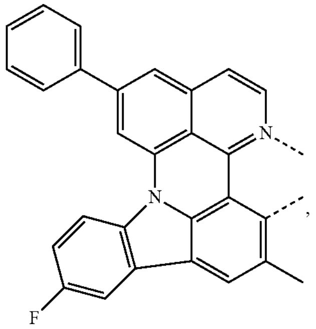

-continued
$L_{a481}$
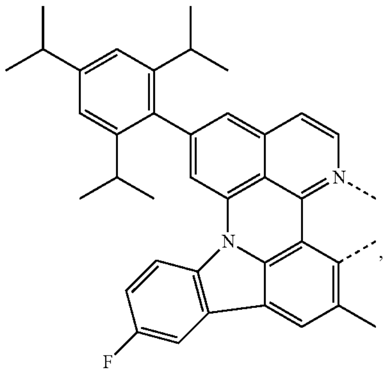
$L_{a482}$
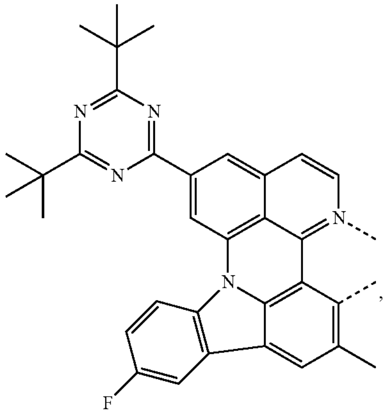
$L_{a483}$
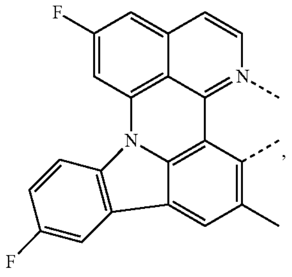
$L_{a484}$
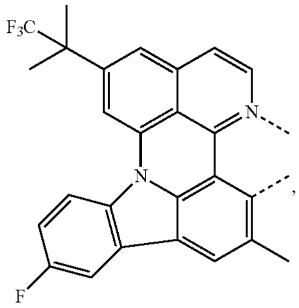
-continued
$L_{a485}$
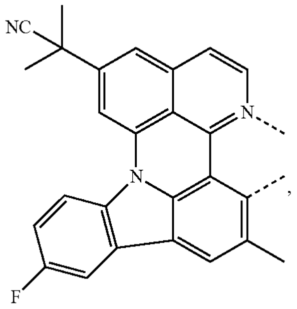
$L_{a486}$
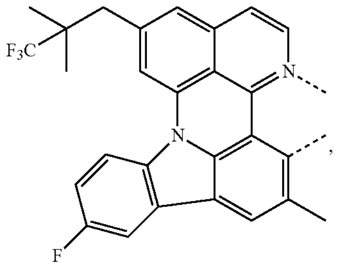
$L_{a487}$
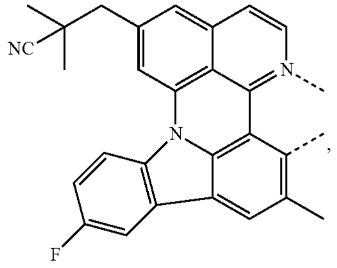
$L_{a488}$
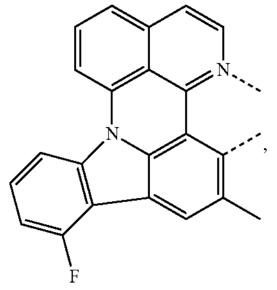
$L_{a489}$
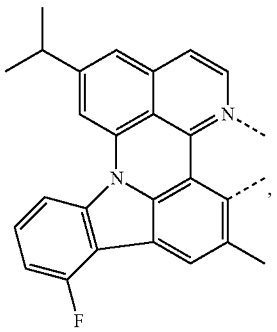

-continued
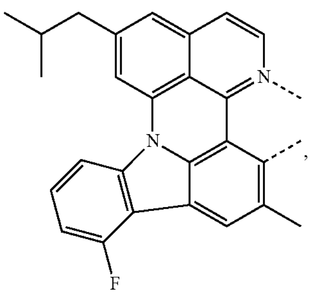
$L_{a490}$
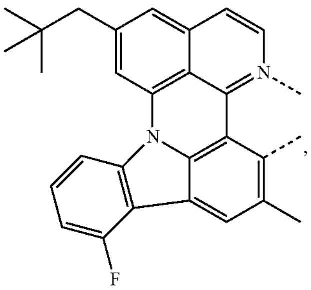
$L_{a491}$
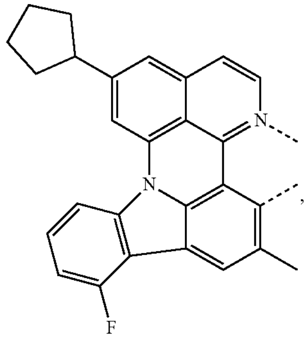
$L_{a492}$
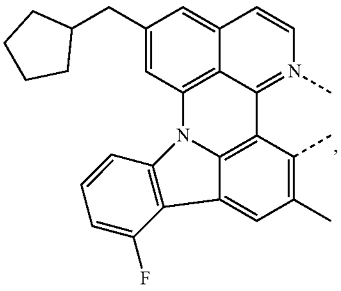
$L_{a493}$
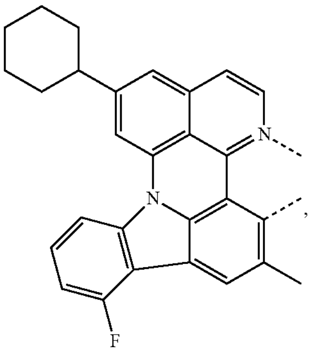
$L_{a494}$
-continued
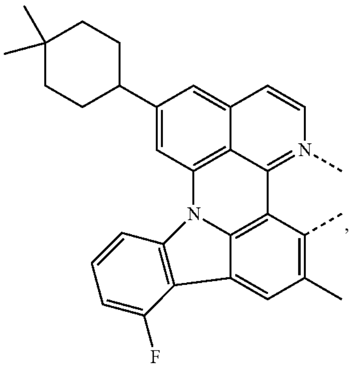
$L_{a495}$
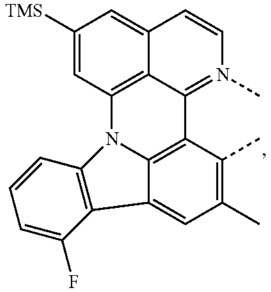
$L_{a496}$
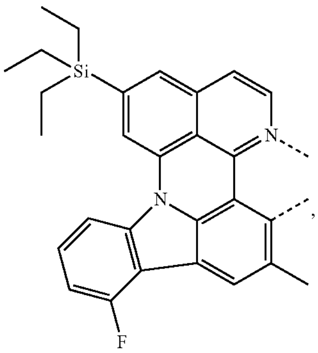
$L_{a497}$
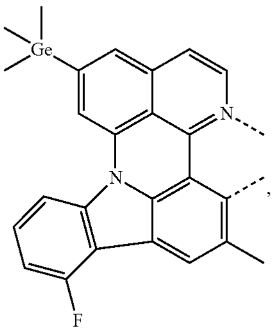
$L_{a498}$ -continued
$L_{a499}$
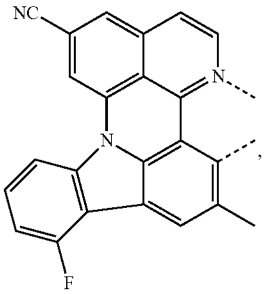
$L_{a500}$
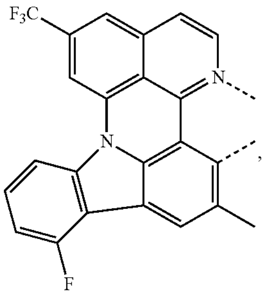
$L_{a501}$
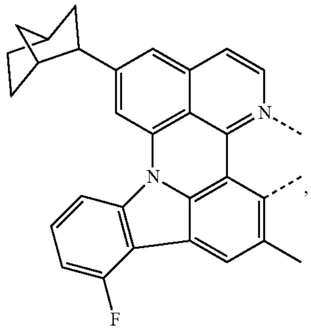
$L_{a502}$
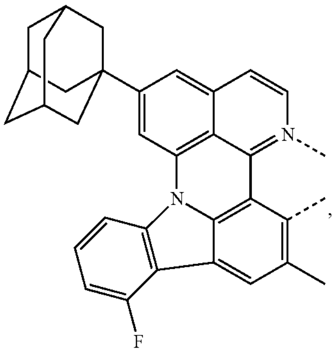
-continued
$L_{a503}$
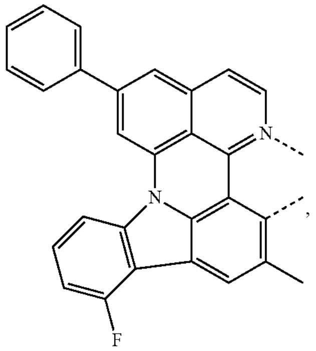
$L_{a504}$
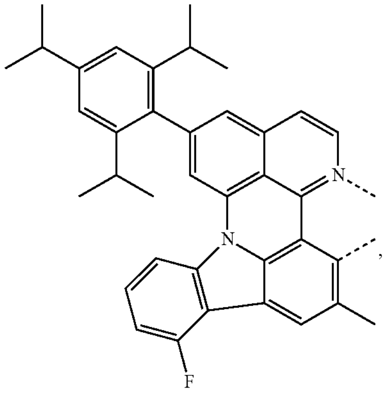
$L_{a505}$
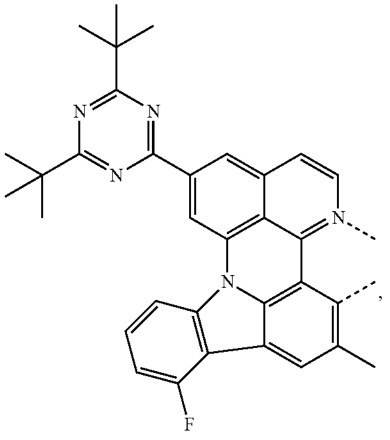
$L_{a506}$
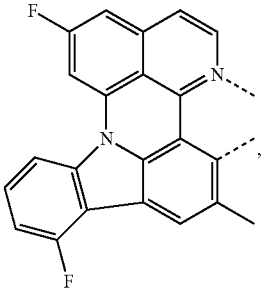

-continued
$L_{a507}$
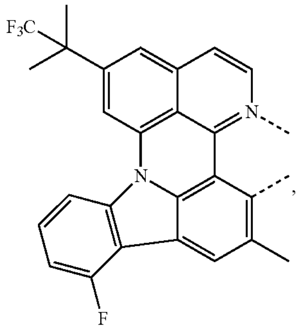
$L_{a508}$
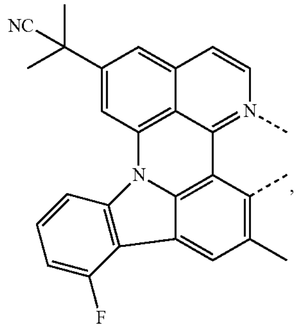
$L_{a509}$
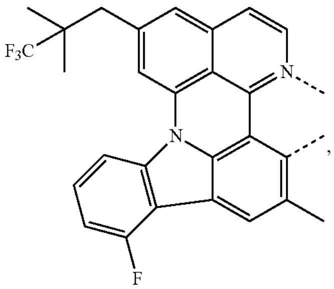
$L_{a510}$
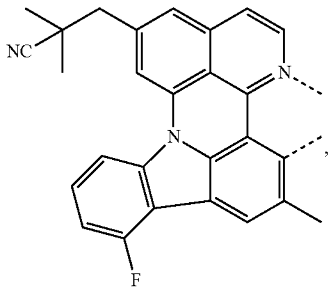
$L_{a511}$
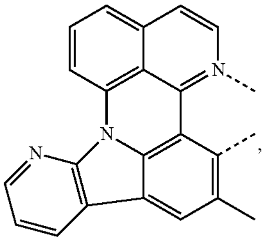
-continued
$L_{a512}$
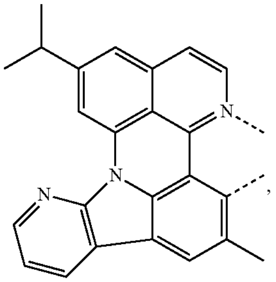
$L_{a513}$
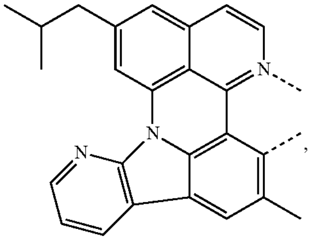
$L_{a514}$
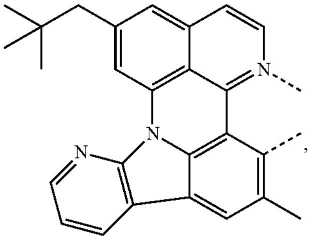
$L_{a515}$
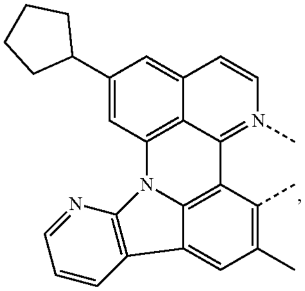
$L_{a516}$
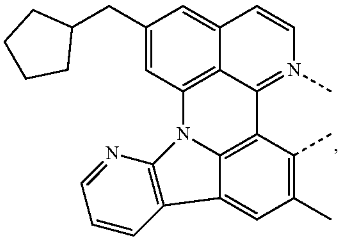

-continued
$L_{a517}$
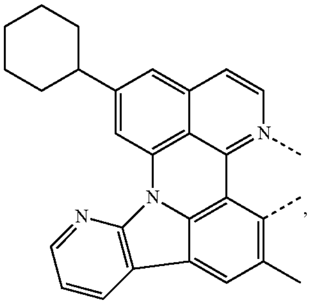
$L_{a518}$
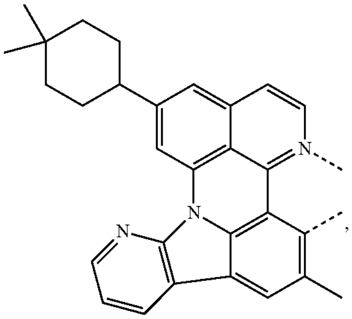
$L_{a519}$
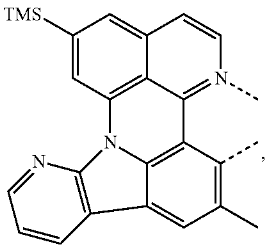
$L_{a520}$
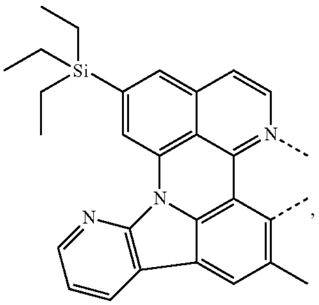
$L_{a521}$
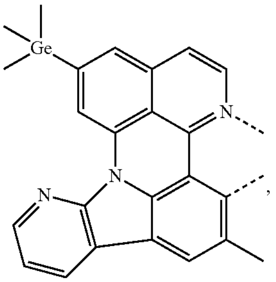
-continued
$L_{a522}$
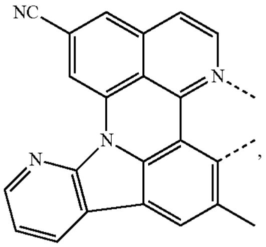
$L_{a523}$
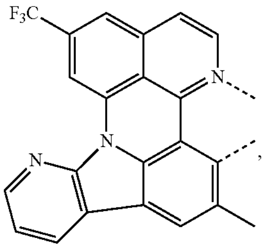
$L_{a524}$
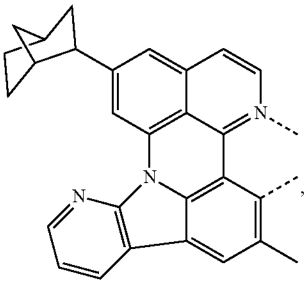
$L_{a525}$
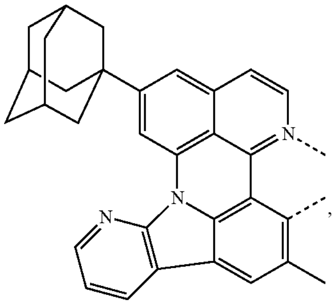
$L_{a526}$
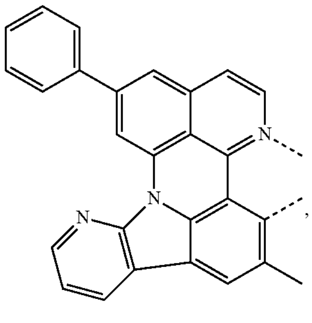

-continued
$L_{a527}$
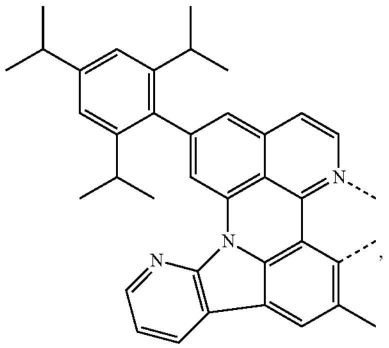
$L_{a528}$
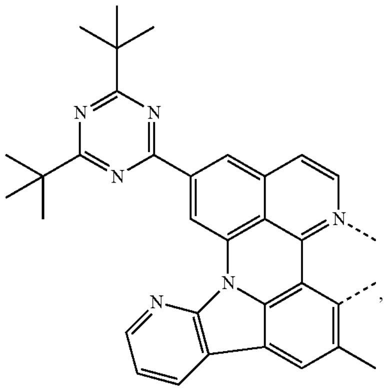
$L_{a529}$
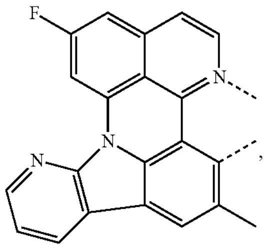
$L_{a530}$
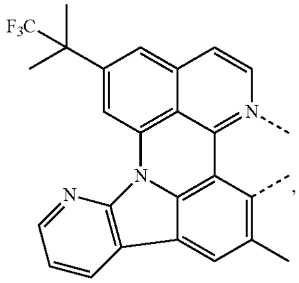
$L_{a531}$
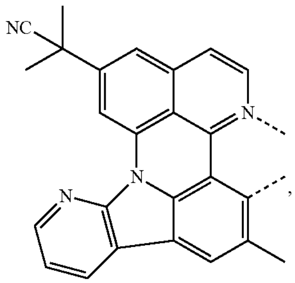
-continued
$L_{a532}$
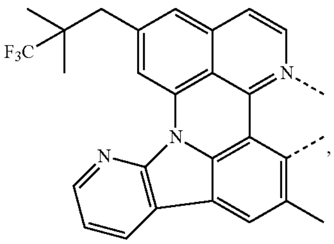
$L_{a533}$
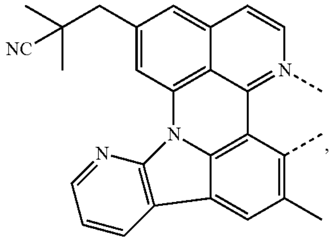
$L_{a534}$
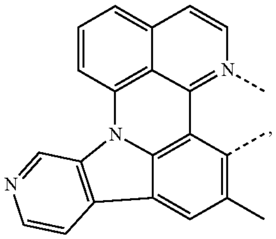
$L_{a535}$
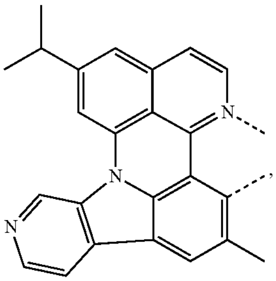
$L_{a536}$
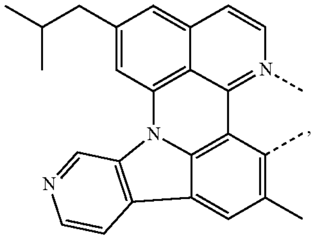
$L_{a537}$
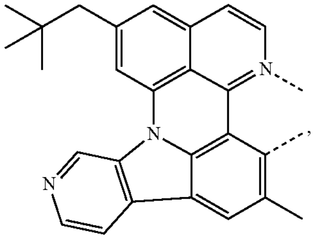

-continued
$L_{a538}$
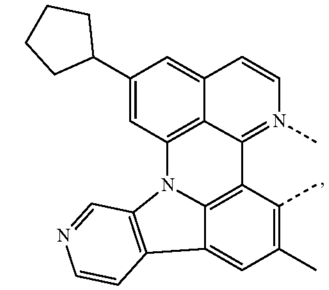
$L_{a539}$
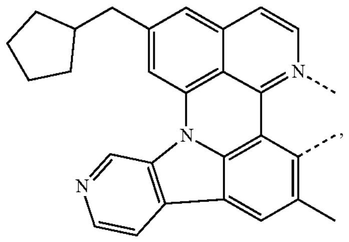
$L_{a540}$
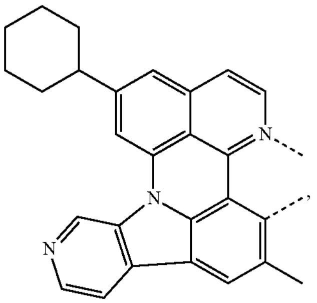
$L_{a541}$
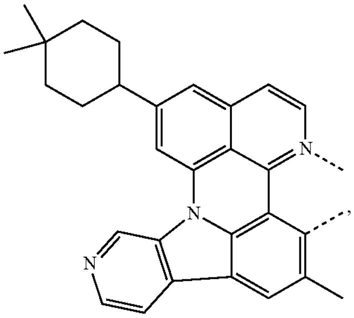
$L_{a542}$
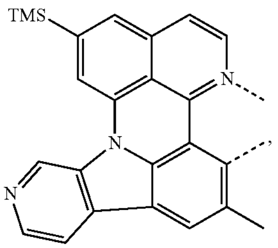
-continued
$L_{a543}$
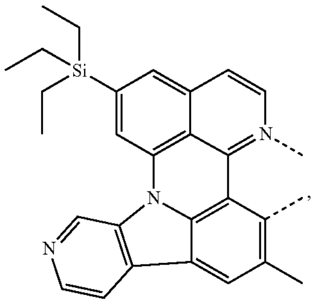
$L_{a544}$
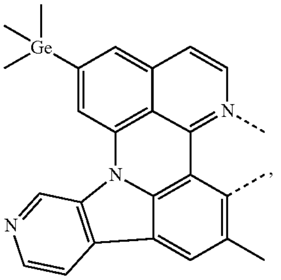
$L_{a545}$
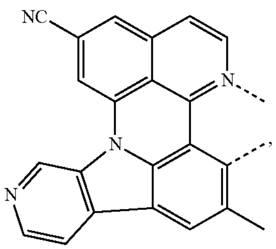
$L_{a546}$
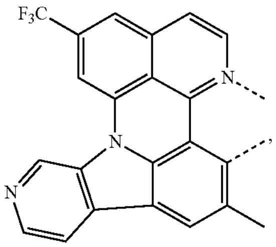
$L_{a547}$
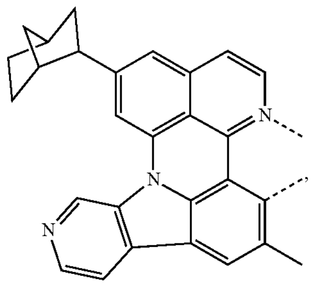

-continued
$L_{a548}$
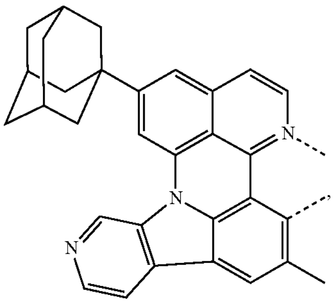
$L_{a549}$
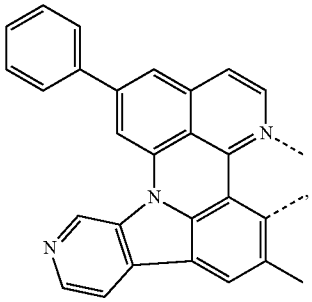
$L_{a550}$
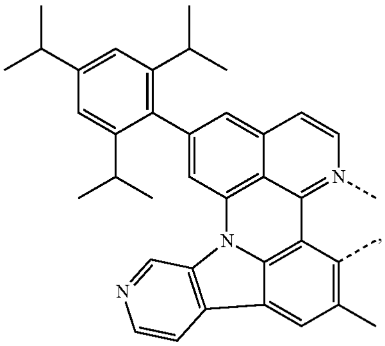
$L_{a551}$
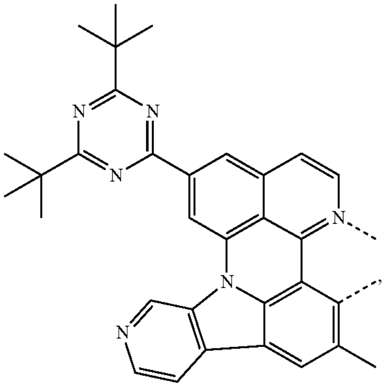
$L_{a552}$
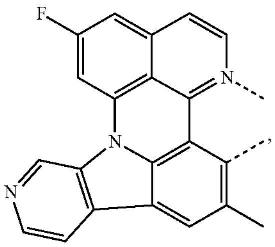
-continued
$L_{a553}$
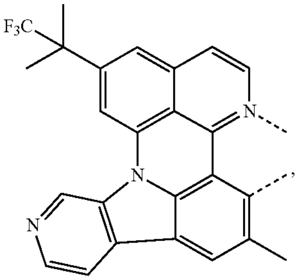
$L_{a554}$
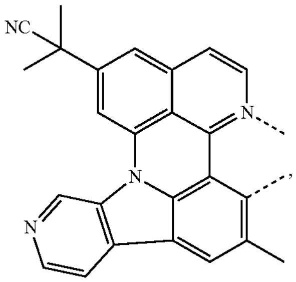
$L_{a555}$
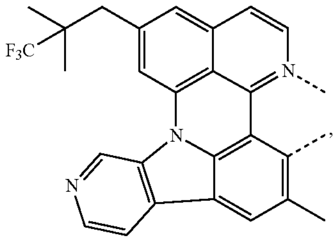
$L_{a556}$
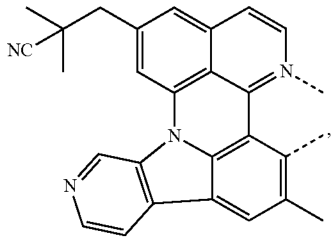
$L_{a557}$
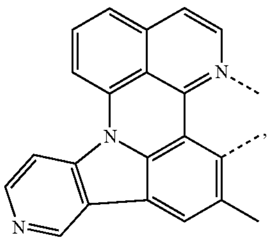
$L_{a558}$
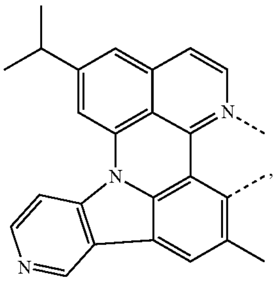

-continued
$L_{a559}$
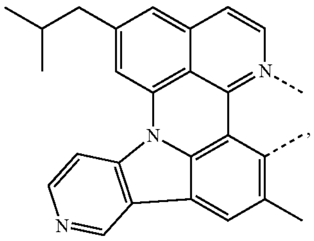
$L_{a560}$
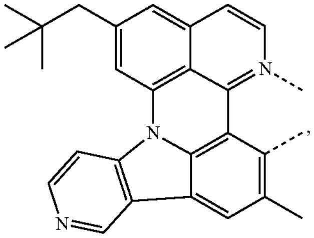
$L_{a561}$
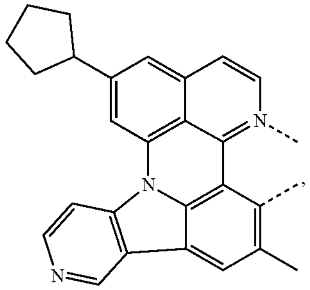
$L_{a562}$
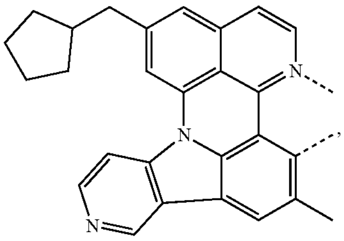
$L_{a563}$
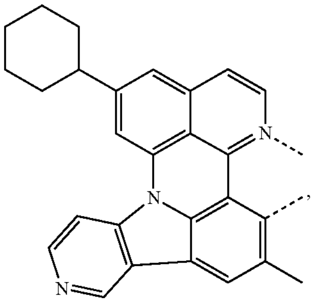
-continued
$L_{a564}$
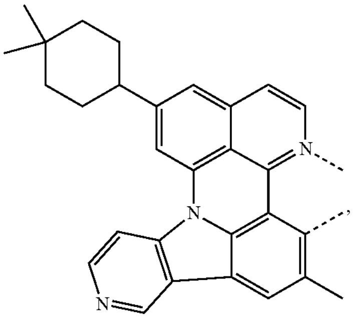
$L_{a565}$
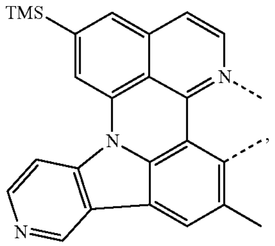
$L_{a566}$
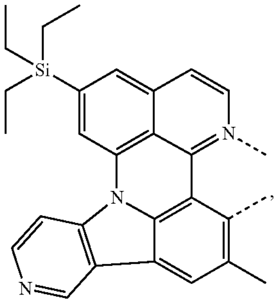
$L_{a567}$
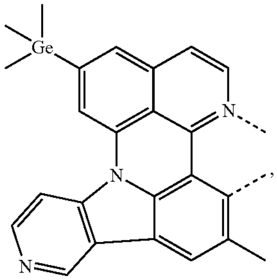
$L_{a568}$
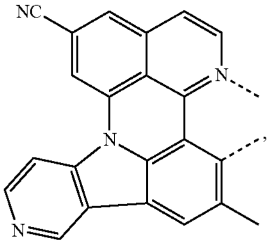

-continued
$L_{a569}$
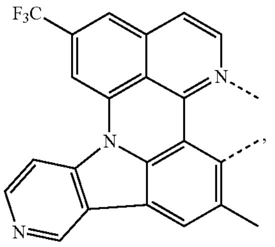
$L_{a570}$
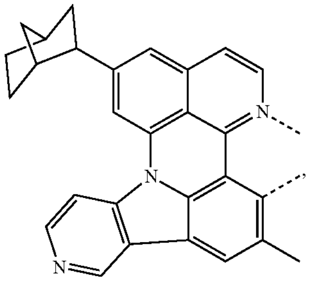
$L_{a571}$
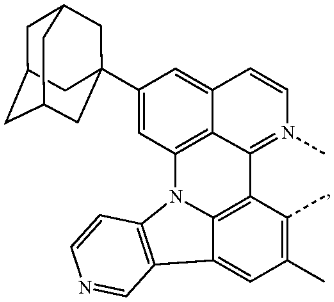
$L_{a572}$
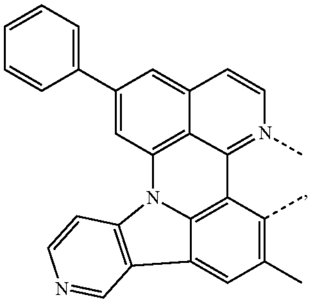
$L_{a573}$
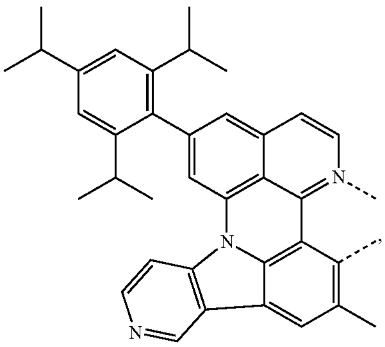
-continued
$L_{a574}$
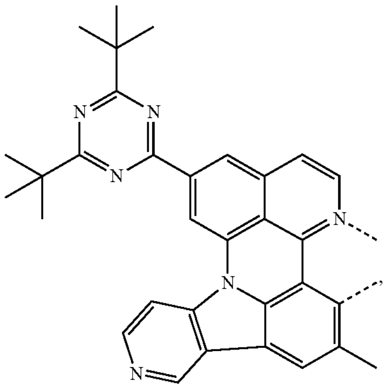
$L_{a575}$
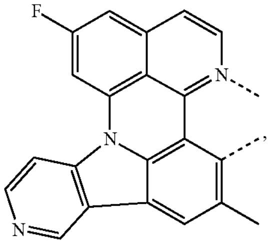
$L_{a576}$
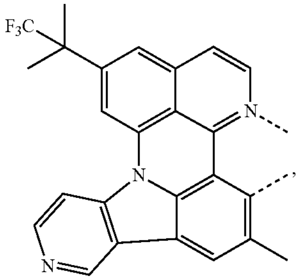
$L_{a577}$
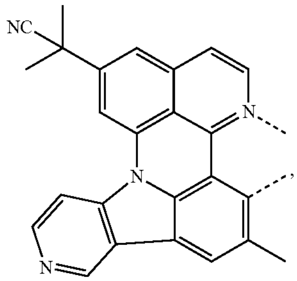
$L_{a578}$
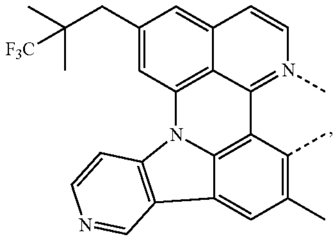

-continued
$L_{a579}$
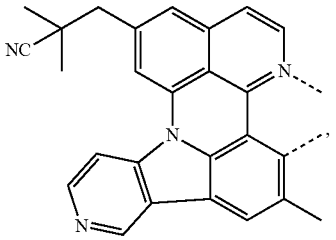
$L_{a580}$
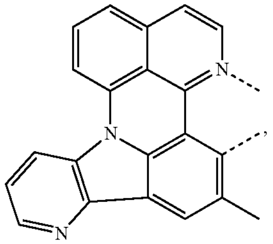
$L_{a581}$
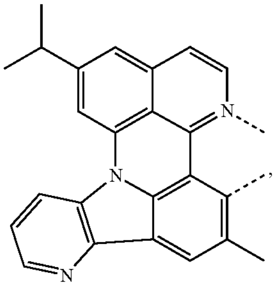
$L_{a582}$
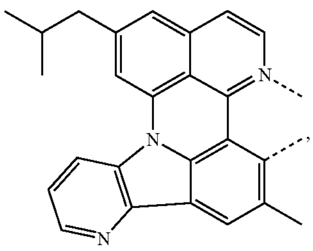
$L_{a583}$
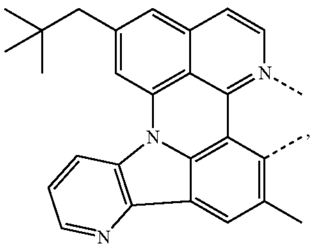
$L_{a584}$
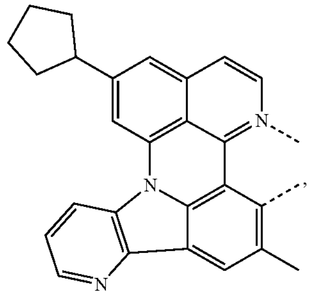
-continued
$L_{a585}$
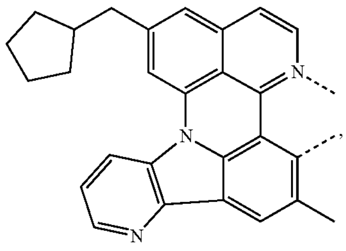
$L_{a586}$
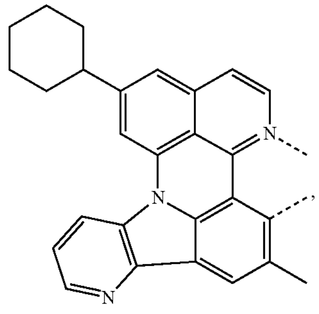
$L_{a587}$
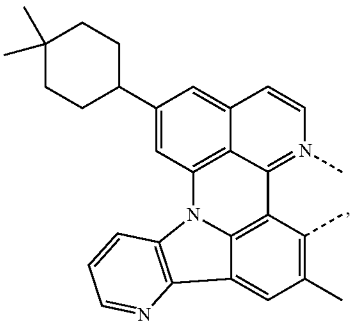
$L_{a588}$
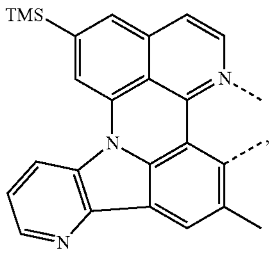
$L_{a589}$
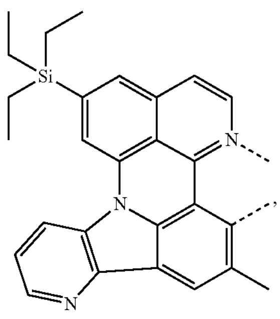

$L_{a590}$
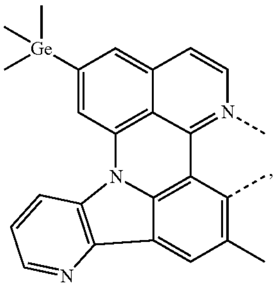
$L_{a591}$
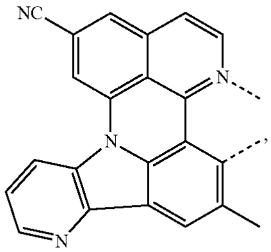
$L_{a592}$
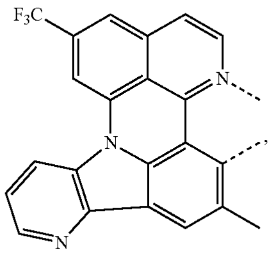
$L_{a593}$
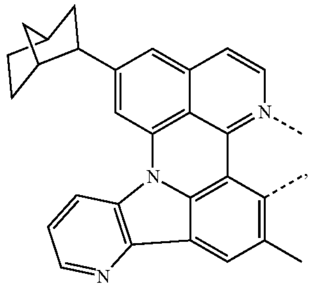
$L_{a594}$
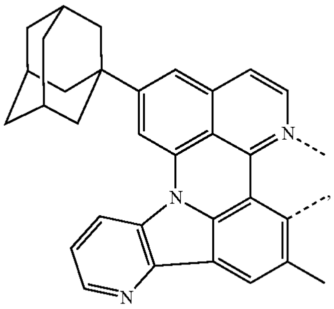
$L_{a595}$
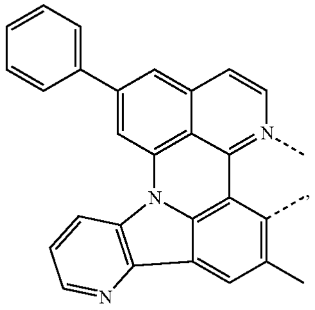
$L_{a596}$
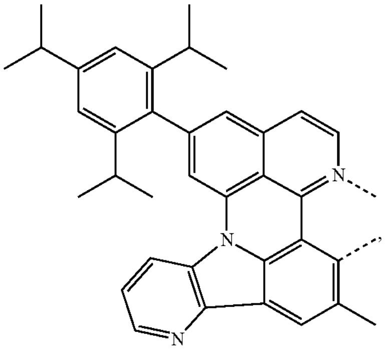
$L_{a597}$
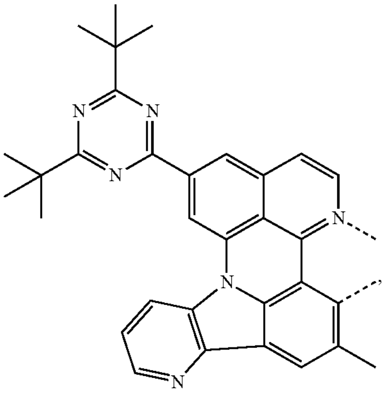
$L_{a598}$
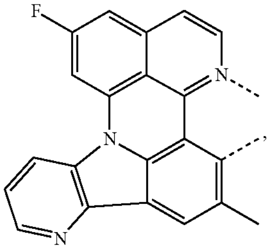
$L_{a599}$
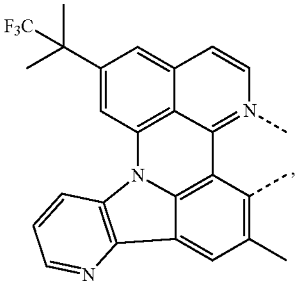

-continued
$L_{a600}$
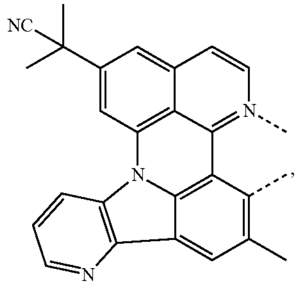
$L_{a601}$
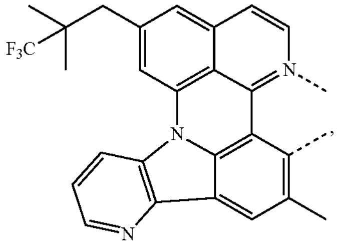
$L_{a602}$
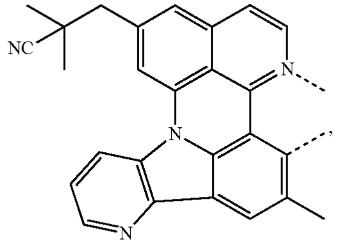
$L_{a603}$
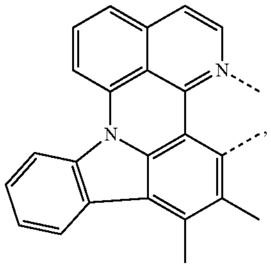
$L_{a604}$
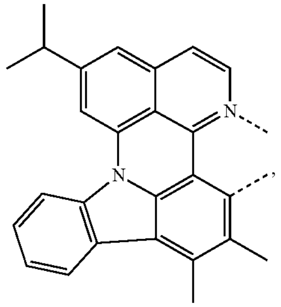
-continued
$L_{a605}$
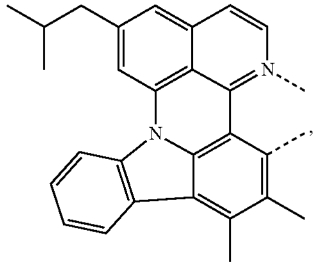
$L_{a606}$
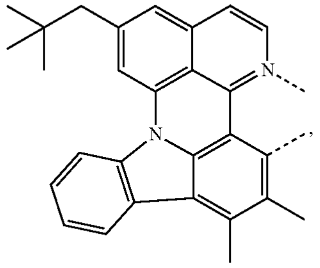
$L_{a607}$
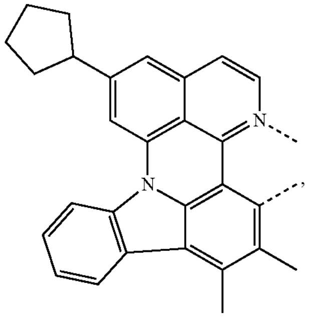
$L_{a608}$
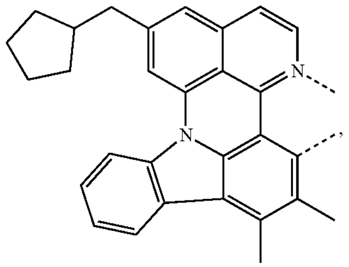
$L_{a609}$
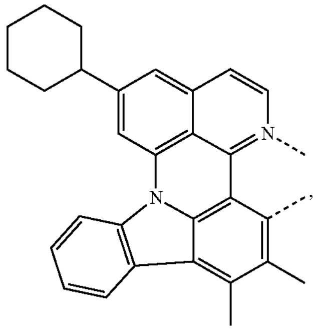

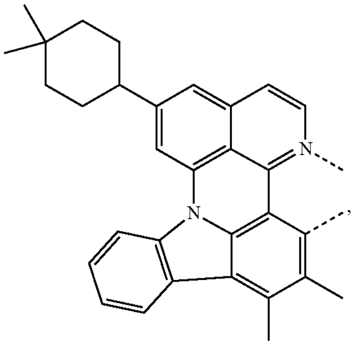
$L_{a610}$
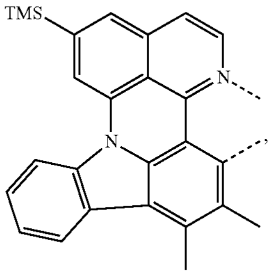
$L_{a611}$
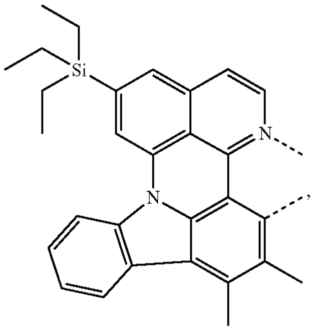
$L_{a612}$
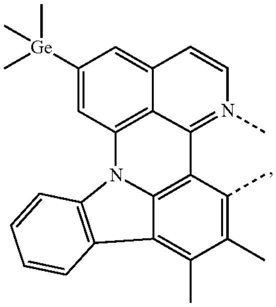
$L_{a613}$
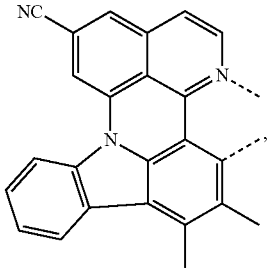
$L_{a614}$
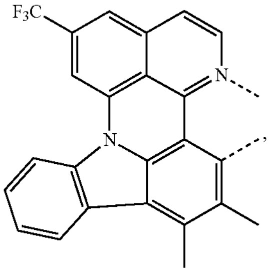
$L_{a615}$
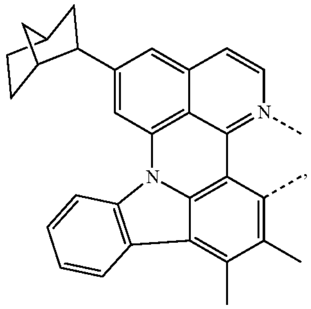
$L_{a616}$
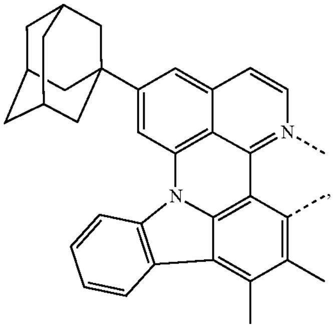
$L_{a617}$
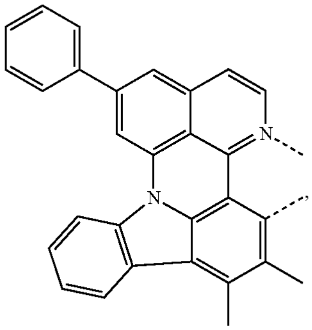
$L_{a618}$ -continued
$L_{a619}$
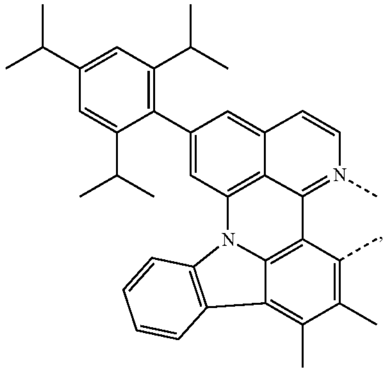
$L_{a620}$
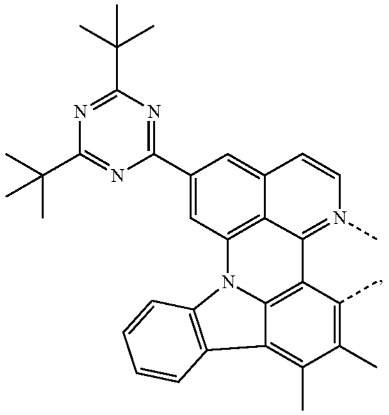
$L_{a621}$
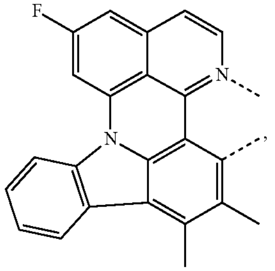
$L_{a622}$
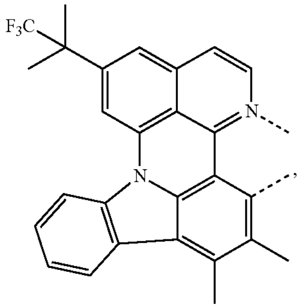
-continued
$L_{a623}$
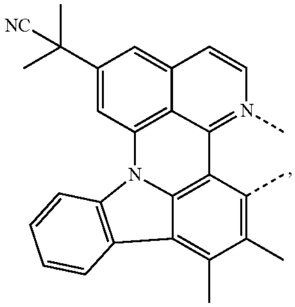
$L_{a624}$
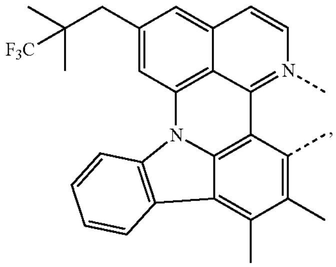
$L_{a625}$
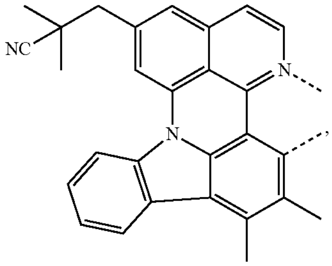
$L_{a626}$
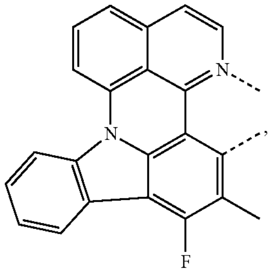
$L_{a627}$
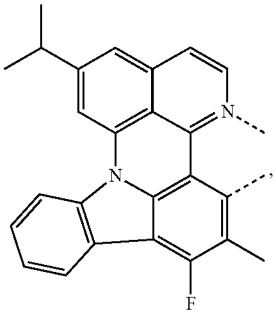

-continued
$L_{a628}$
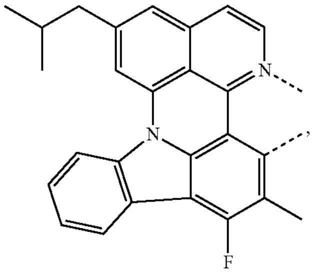
$L_{a629}$
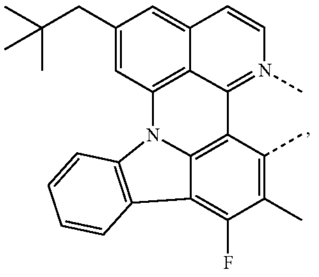
$L_{a630}$
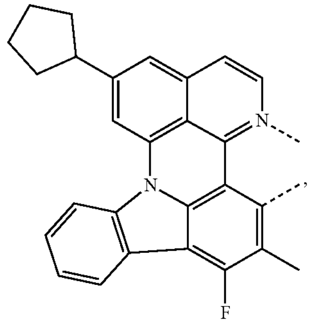
$L_{a631}$
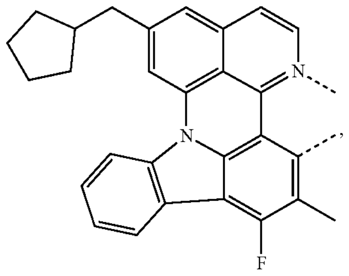
$L_{a632}$
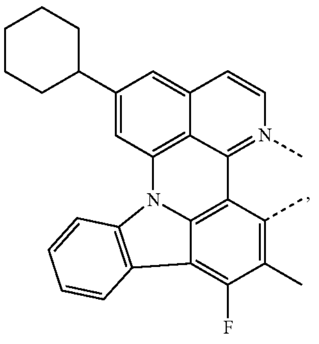
-continued
$L_{a633}$
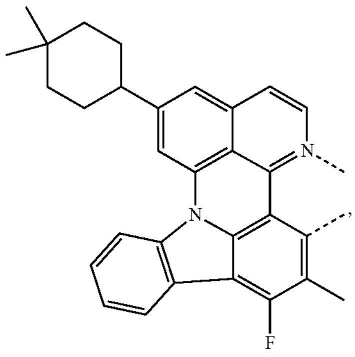
$L_{a634}$
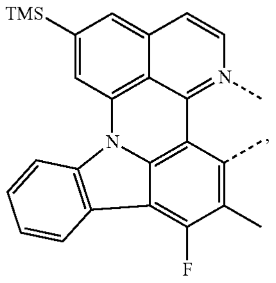
$L_{a635}$
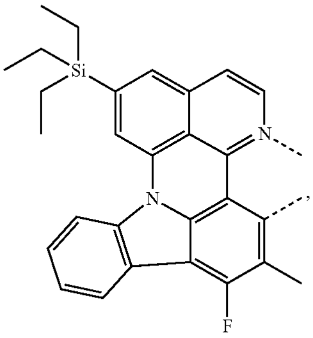
$L_{a636}$
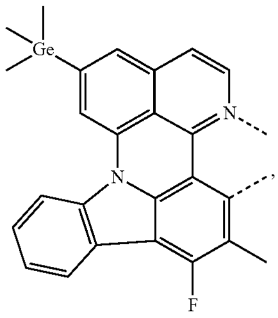
$L_{a637}$
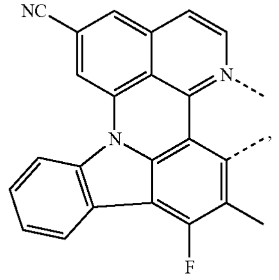

-continued
$L_{a638}$
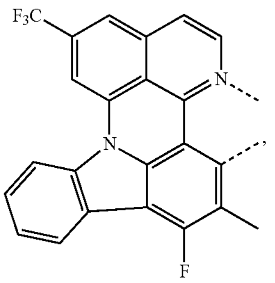
$L_{a639}$
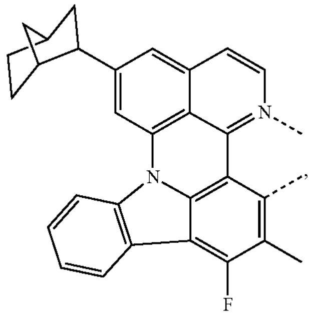
$L_{a640}$
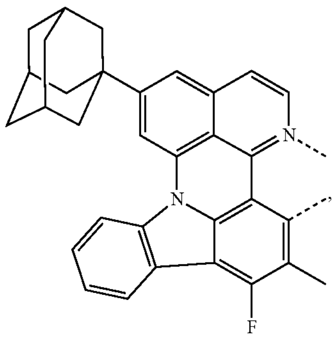
$L_{a641}$
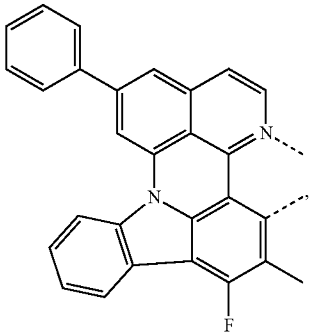
-continued
$L_{a642}$
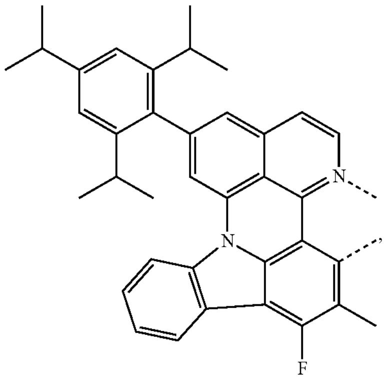
$L_{a643}$
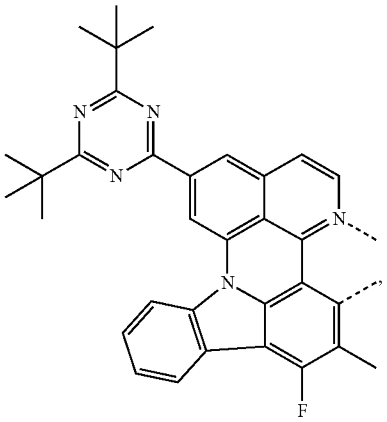
$L_{a644}$
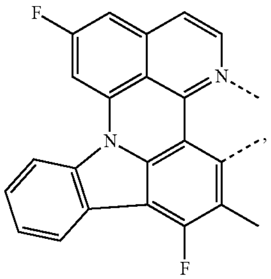
$L_{a645}$
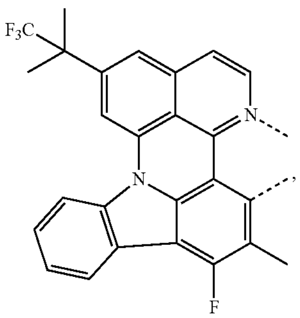

-continued
$L_{a646}$
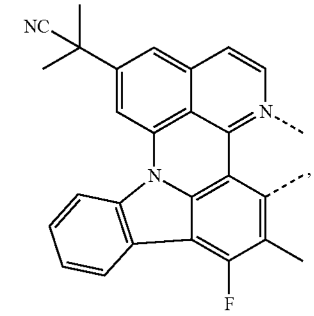
$L_{a647}$
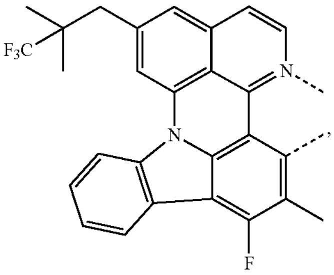
$L_{a648}$
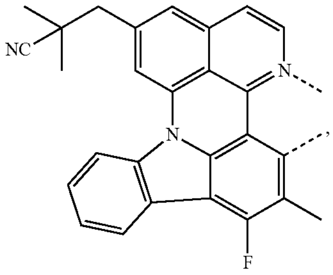
$L_{a649}$
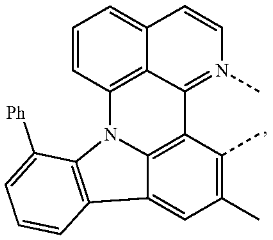
$L_{a650}$
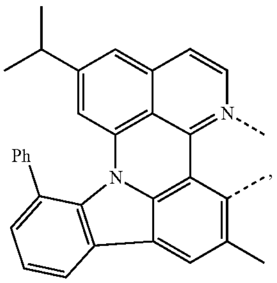
-continued
$L_{a651}$
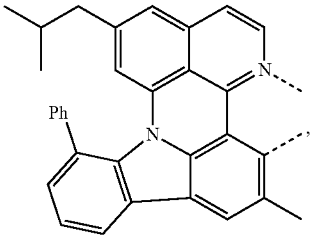
$L_{a652}$
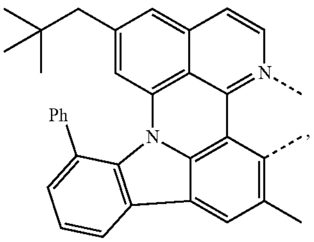
$L_{a653}$
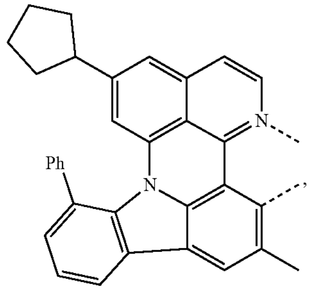
$L_{a654}$
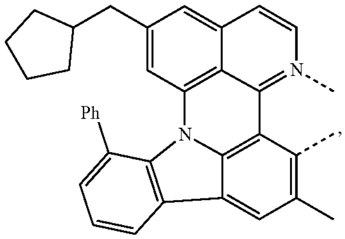
$L_{a655}$
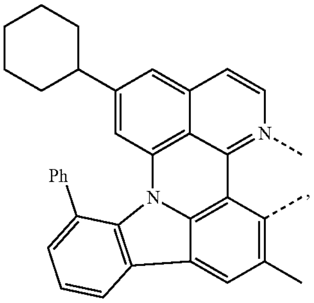

-continued
$L_{a656}$
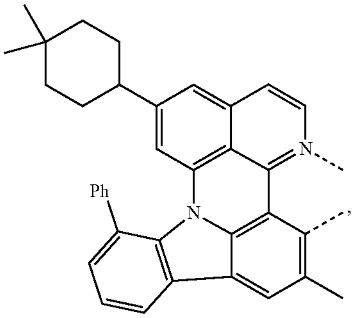
$L_{a657}$
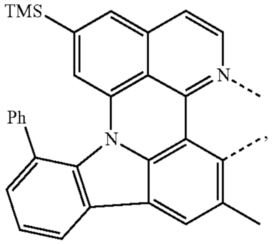
$L_{a658}$
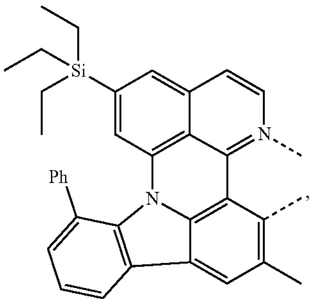
$L_{a659}$
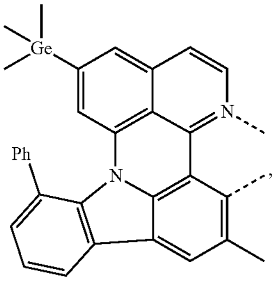
$L_{a660}$
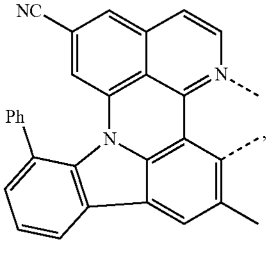
-continued
$L_{a661}$
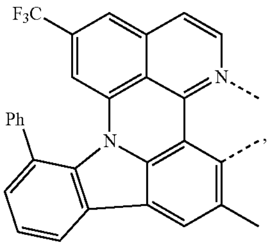
$L_{a662}$
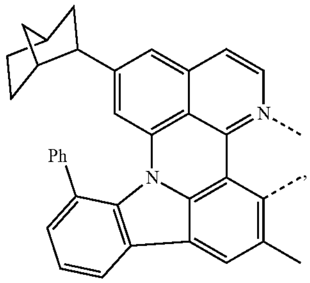
$L_{a663}$
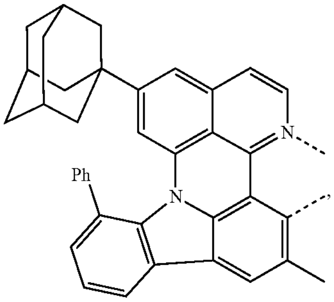
$L_{a664}$
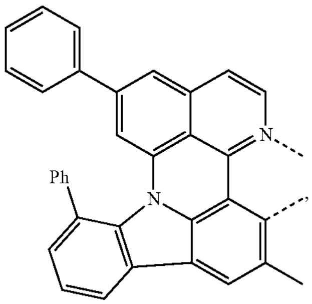
$L_{a665}$
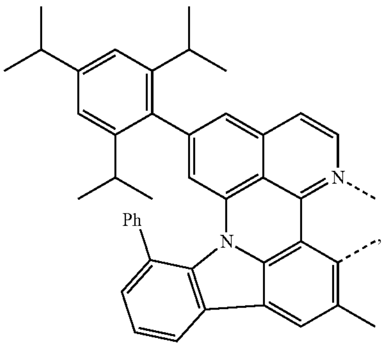

-continued
$L_{a666}$
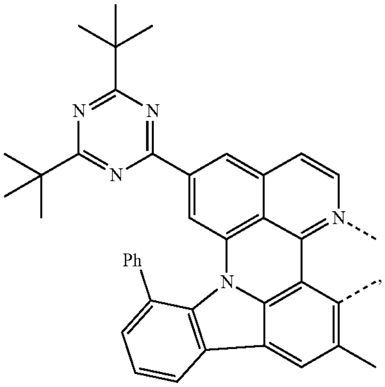
$L_{a667}$
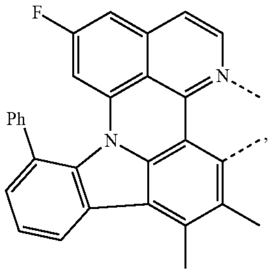
$L_{a668}$
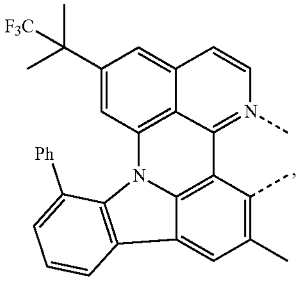
$L_{a669}$
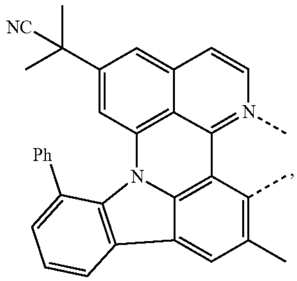
$L_{a670}$
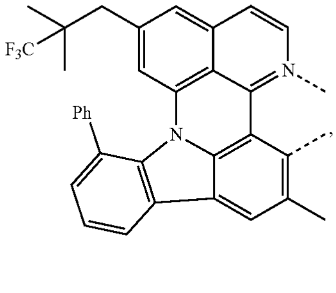
-continued
$L_{a671}$
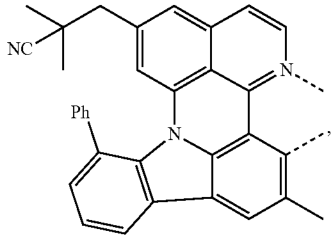
$L_{a672}$
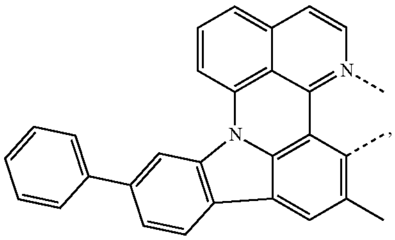
$L_{a673}$
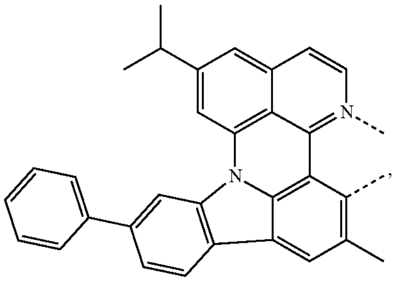
$L_{a674}$
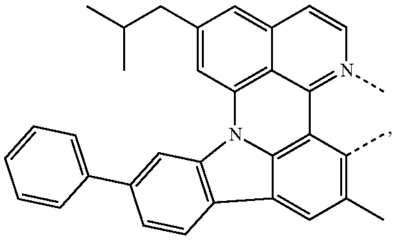
$L_{a675}$
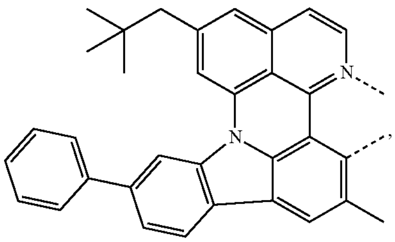
$L_{a676}$
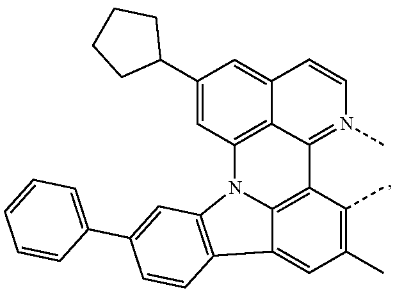

-continued
$L_{a677}$
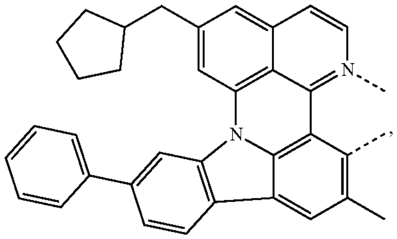
$L_{a678}$
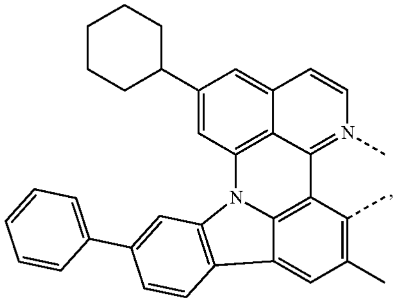
$L_{a679}$
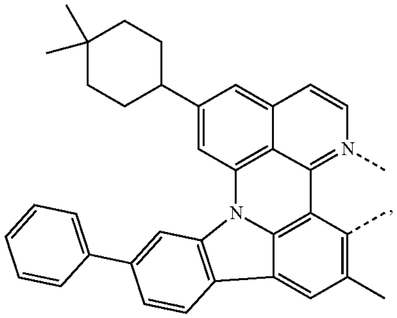
$L_{a680}$
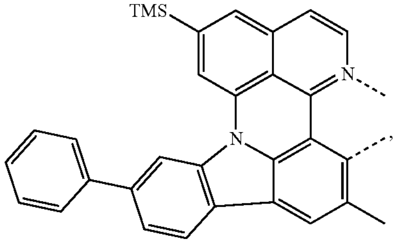
$L_{a681}$
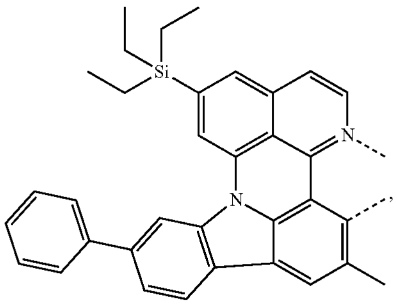
-continued
$L_{a682}$
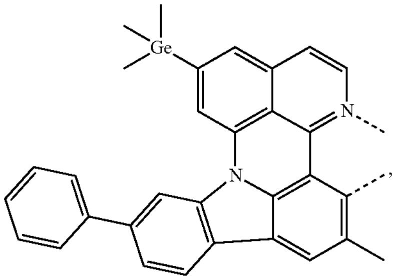
$L_{a683}$
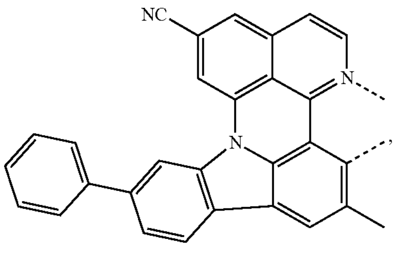
$L_{a684}$
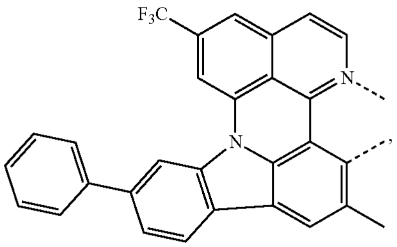
$L_{a685}$
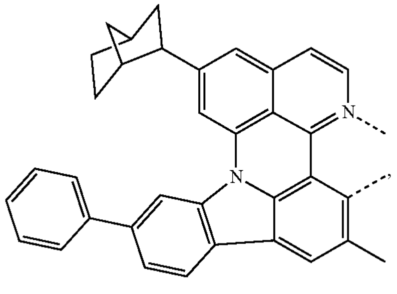
$L_{a686}$
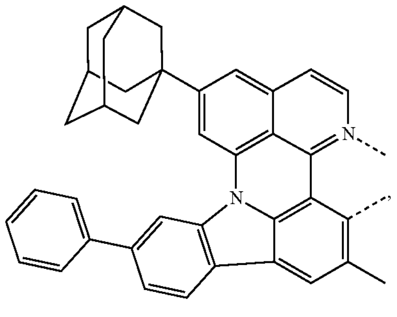

-continued
$L_{a687}$
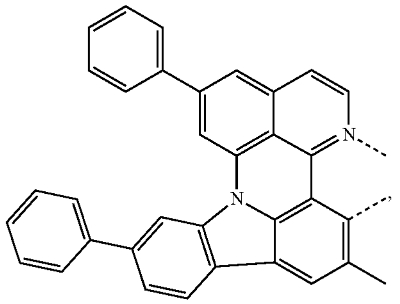
$L_{a688}$
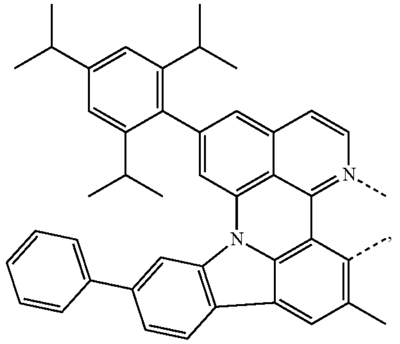
$L_{a689}$
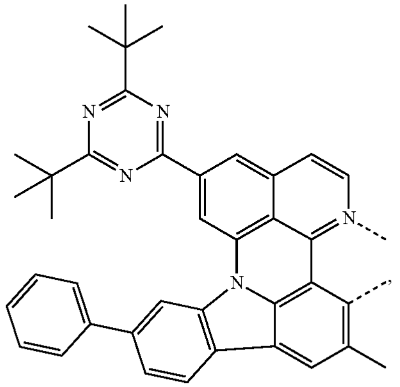
$L_{a690}$
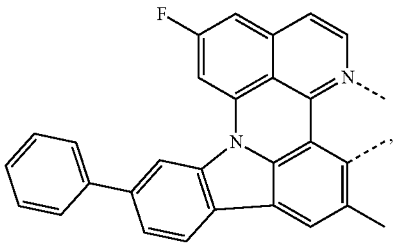
$L_{a691}$
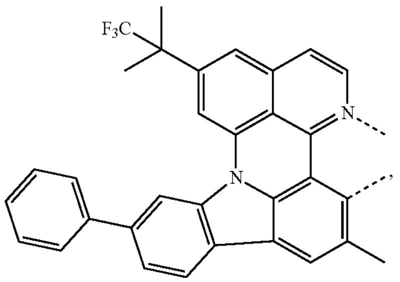
-continued
$L_{a692}$
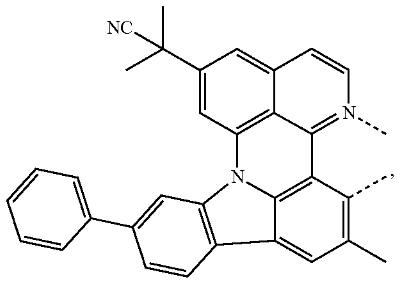
$L_{a693}$
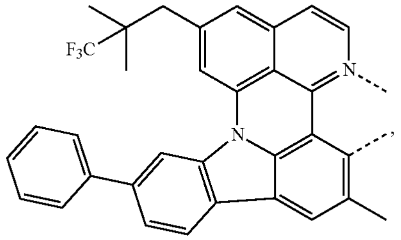
$L_{a694}$
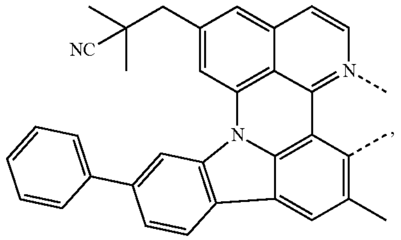
$L_{a695}$
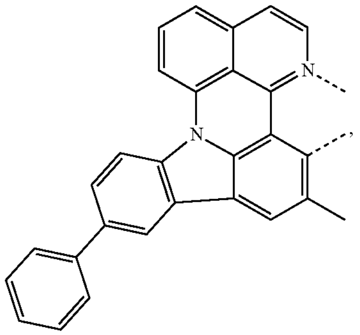
$L_{a696}$
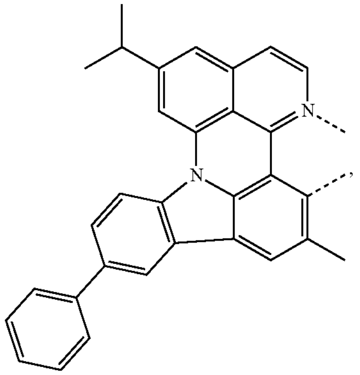

$L_{a697}$
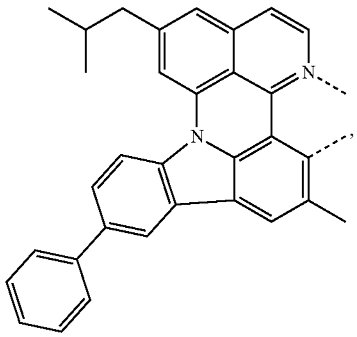
$L_{a698}$
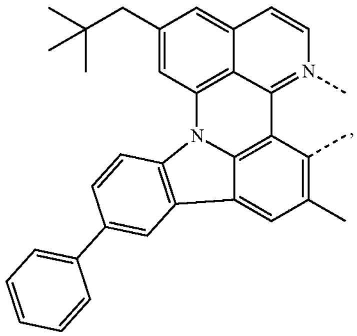
$L_{a699}$
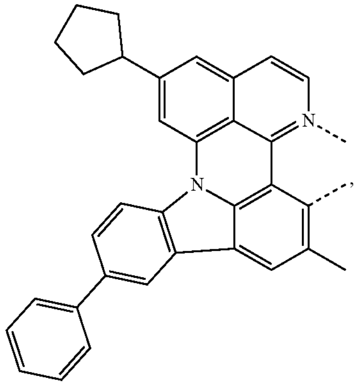
$L_{a700}$
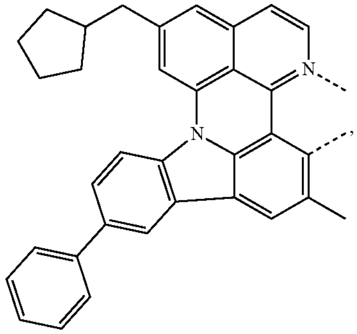
$L_{a701}$
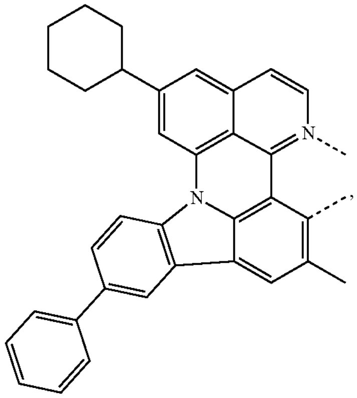
$L_{a702}$
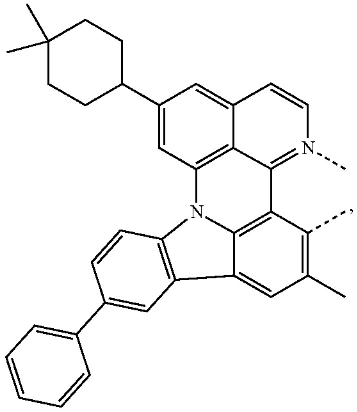
$L_{a703}$
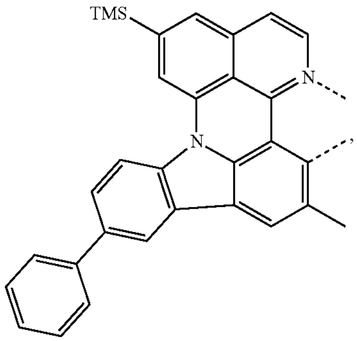
$L_{a704}$
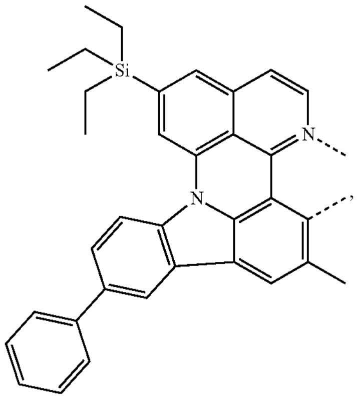

-continued
$L_{a705}$
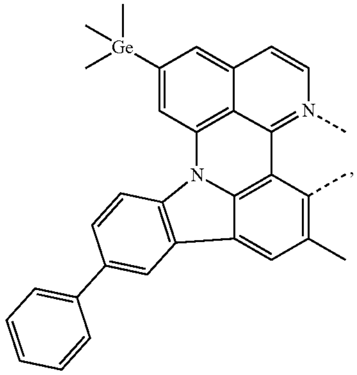
$L_{a706}$
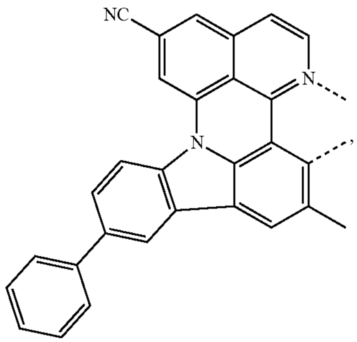
$L_{a707}$
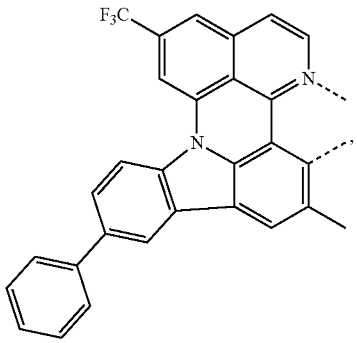
$L_{a708}$
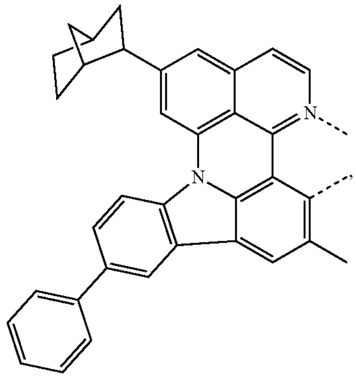
-continued
$L_{a709}$
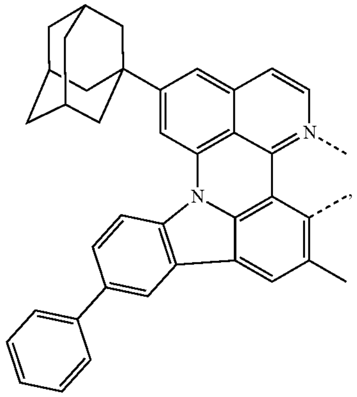
$L_{a710}$
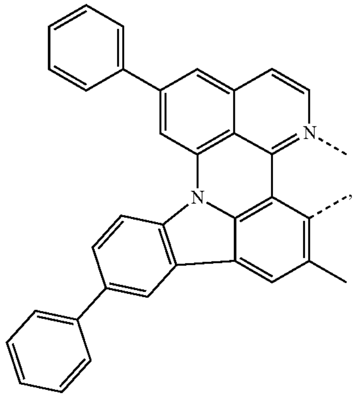
$L_{a711}$
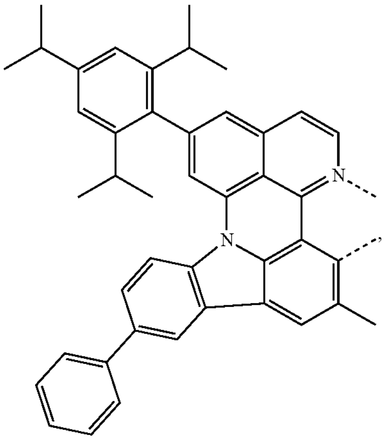

-continued
$L_{a712}$
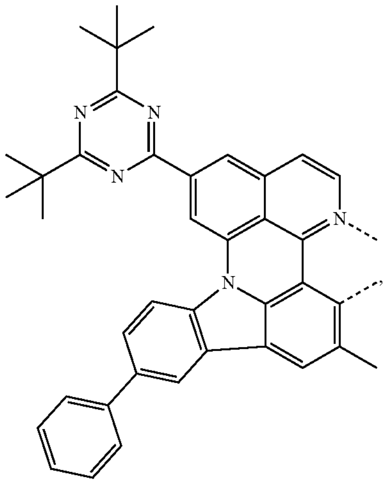
$L_{a713}$
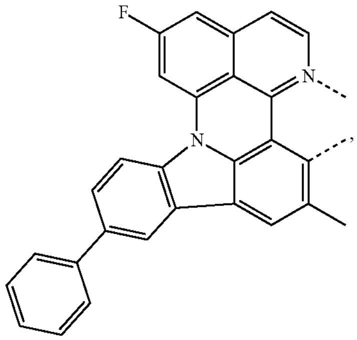
$L_{a714}$
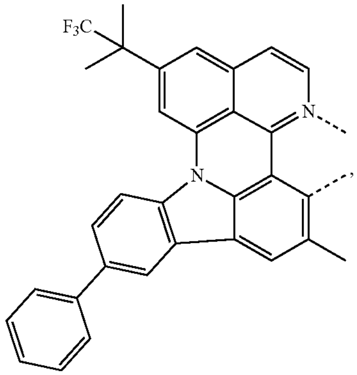
$L_{a715}$
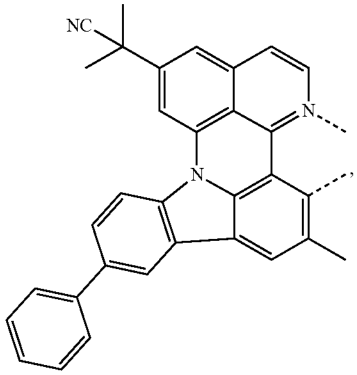
-continued
$L_{a716}$
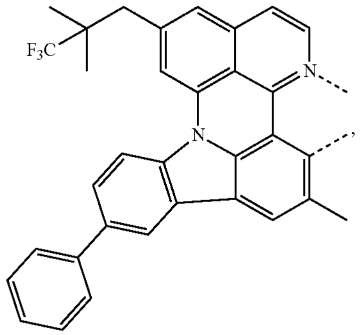
$L_{a717}$
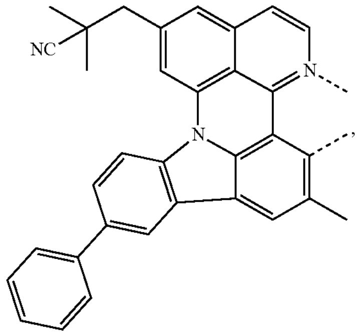
$L_{a718}$
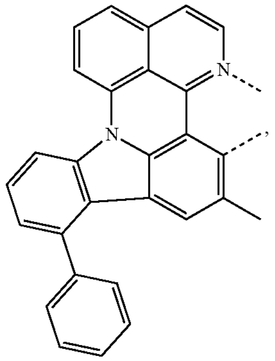
$L_{a719}$
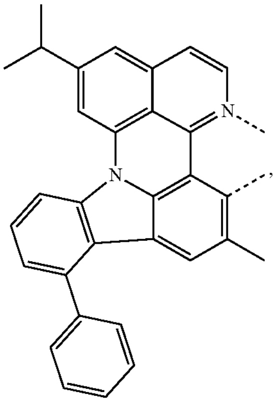

$L_{a720}$
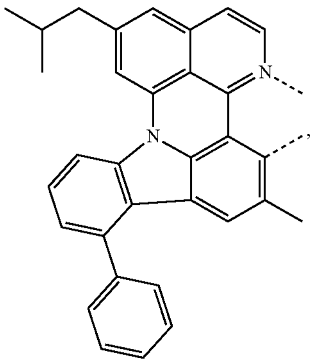
$L_{a721}$
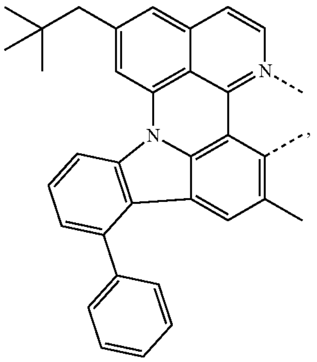
$L_{a722}$
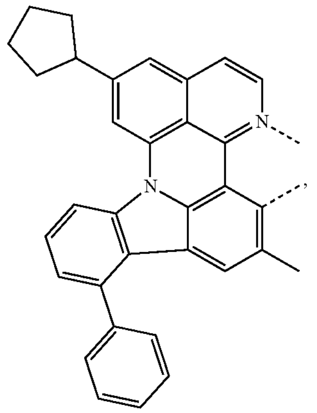
$L_{a723}$
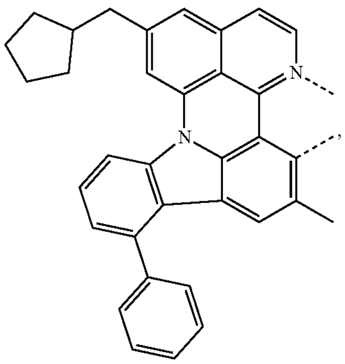
$L_{a724}$
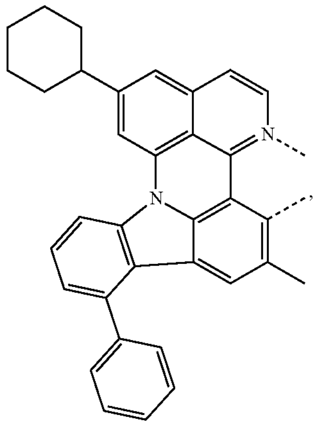
$L_{a725}$
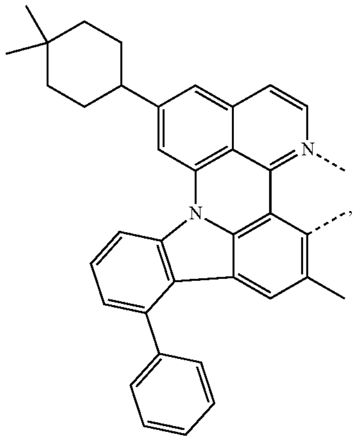
$L_{a726}$
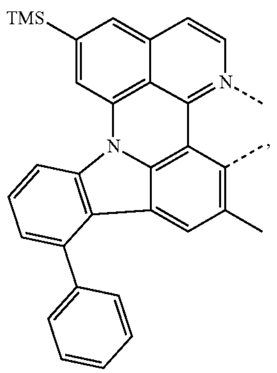

$L_{a727}$
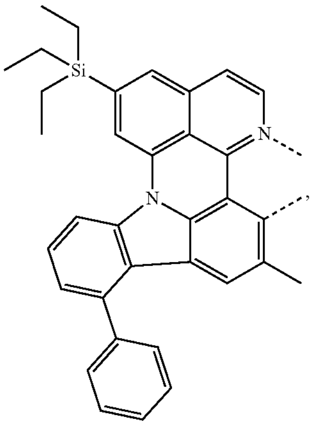
$L_{a728}$
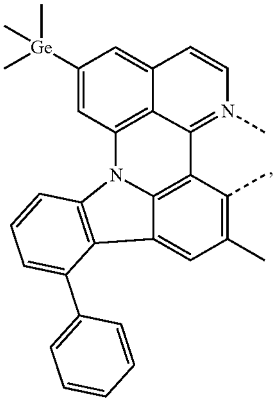
$L_{a729}$
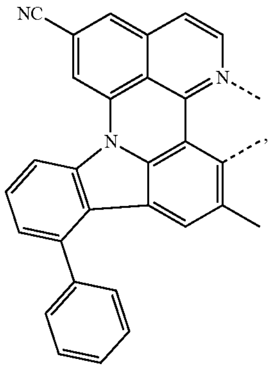
$L_{a730}$
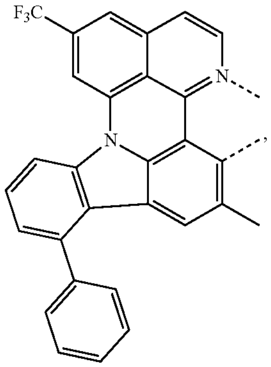
$L_{a731}$
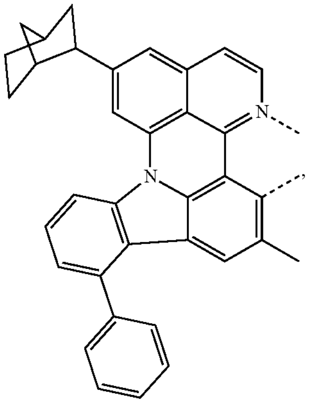
$L_{a732}$
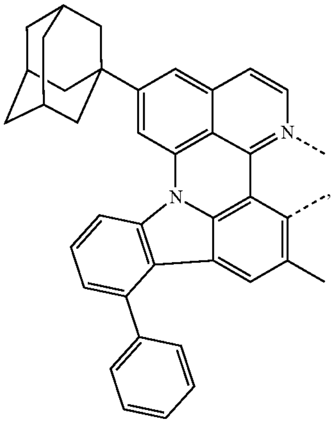
$L_{a733}$
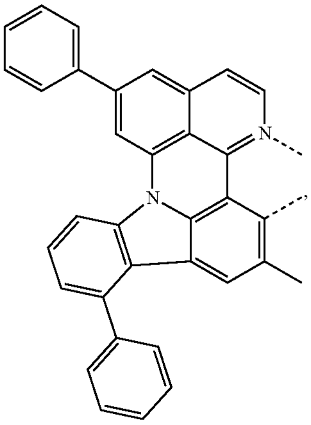

-continued
$L_{a734}$
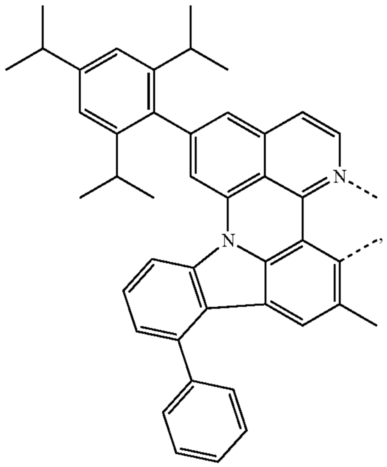
$L_{a735}$
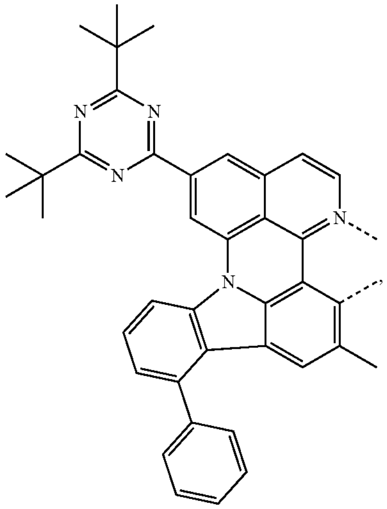
$L_{a736}$
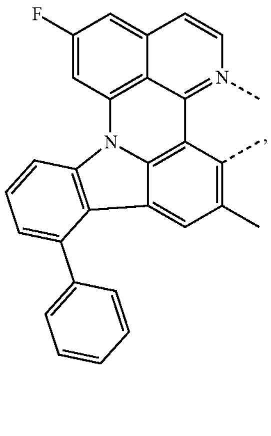
-continued
$L_{a737}$
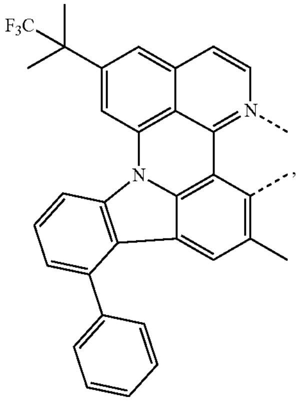
$L_{a738}$
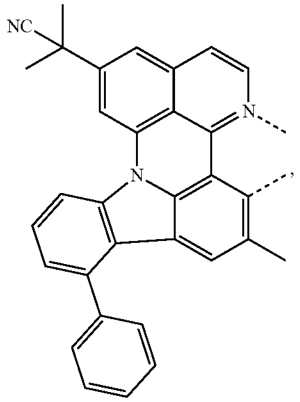
$L_{a739}$
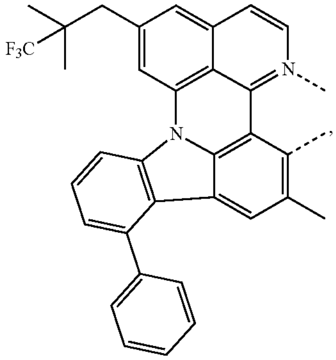
$L_{a740}$
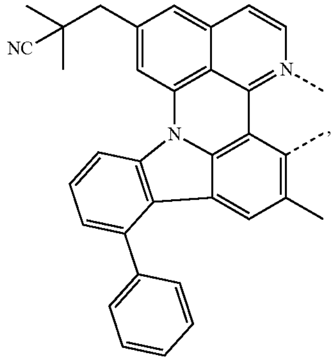

-continued
$L_{a741}$
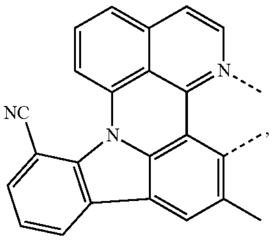
$L_{a742}$
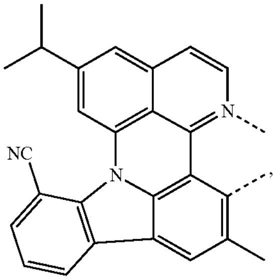
$L_{a743}$
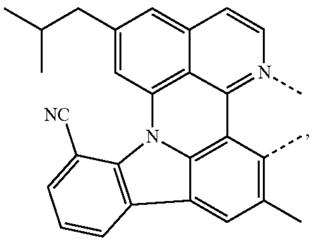
$L_{a744}$
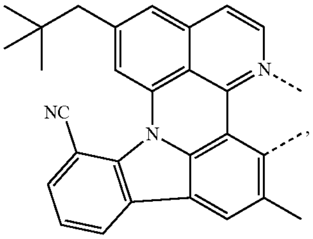
$L_{a745}$
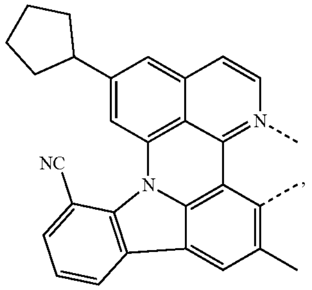
$L_{a746}$
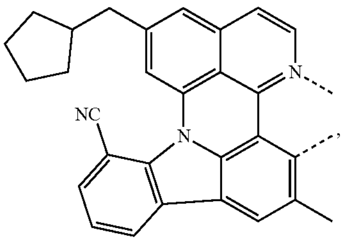
-continued
$L_{a747}$
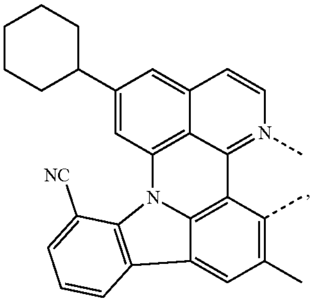
$L_{a748}$
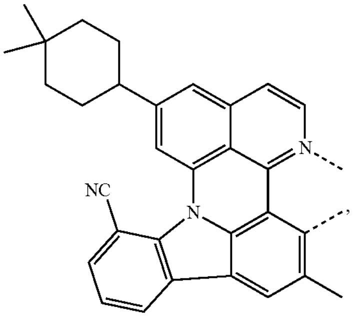
$L_{a749}$
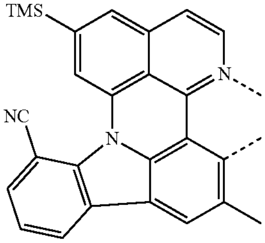
$L_{a750}$
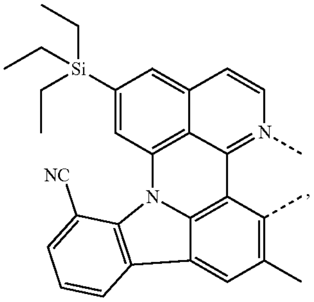
$L_{a751}$
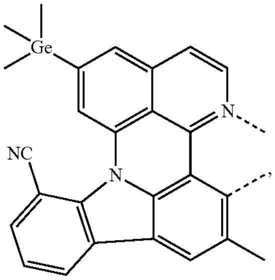

$L_{a752}$
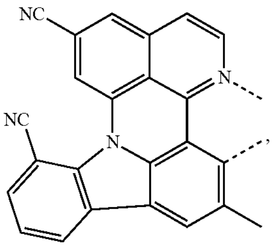
$L_{a753}$
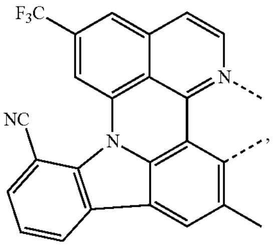
$L_{a754}$
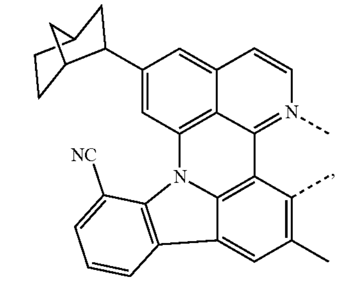
$L_{a755}$
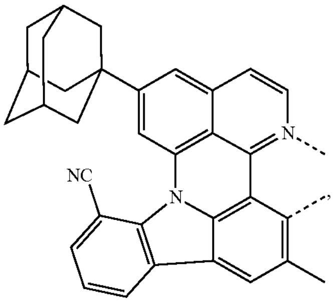
$L_{a756}$
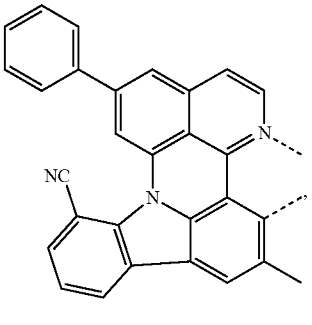
$L_{a757}$
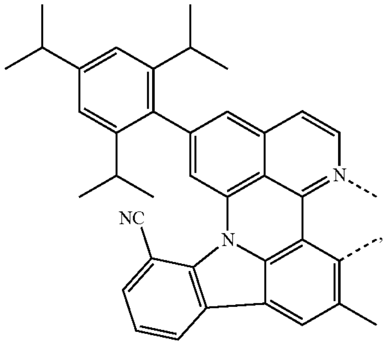
$L_{a758}$
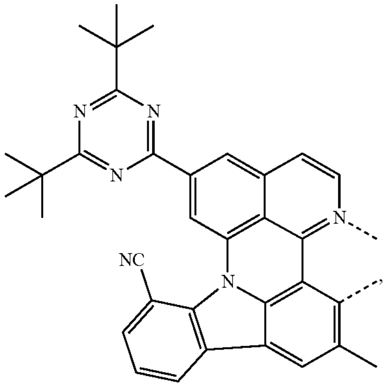
$L_{a759}$
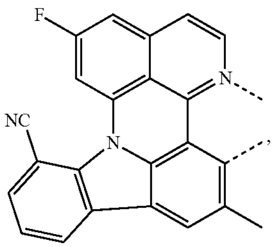
$L_{a760}$
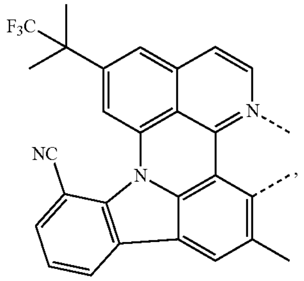
$L_{a761}$
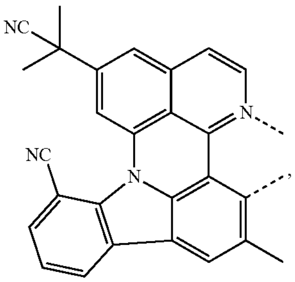

-continued
$L_{a762}$
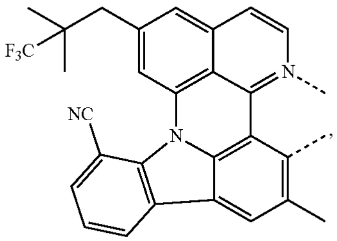
$L_{a763}$
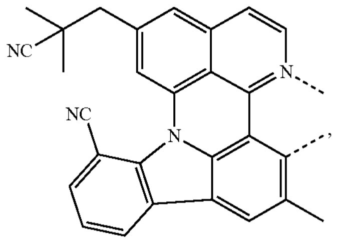
$L_{a764}$
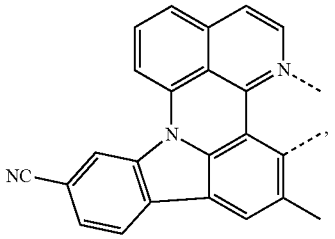
$L_{a765}$
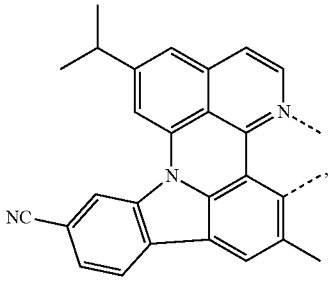
$L_{a766}$
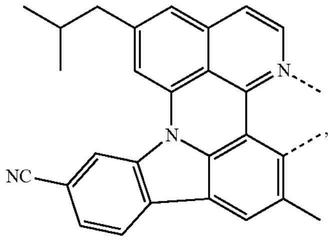
$L_{a767}$
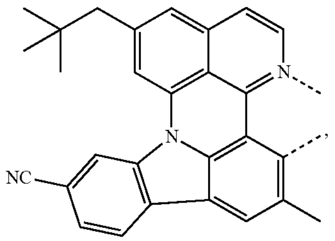
-continued
$L_{a768}$
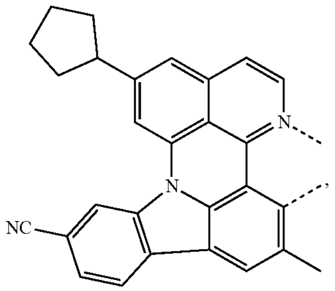
$L_{a769}$
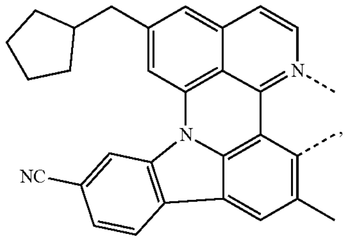
$L_{a770}$
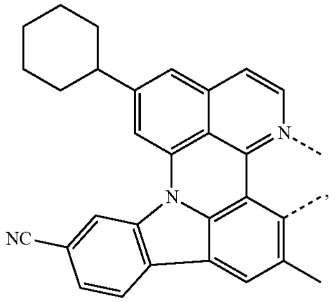
$L_{a771}$
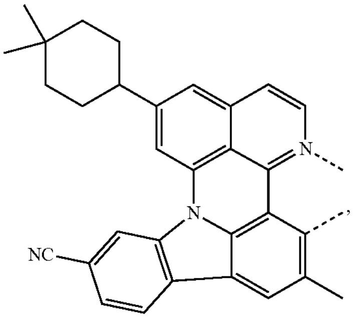
$L_{a772}$
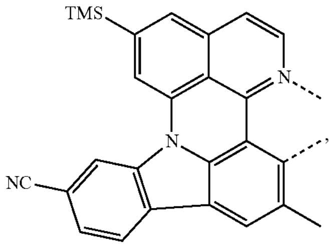

-continued
$L_{a773}$
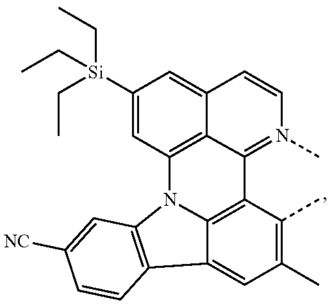
$L_{a774}$
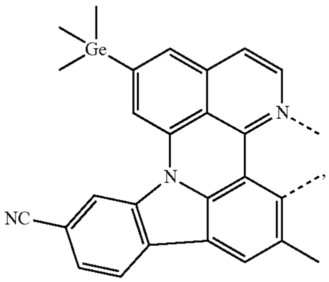
$L_{a775}$
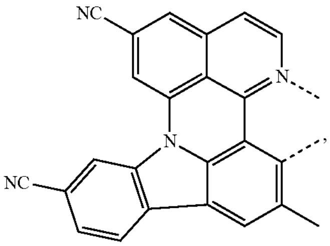
$L_{a776}$
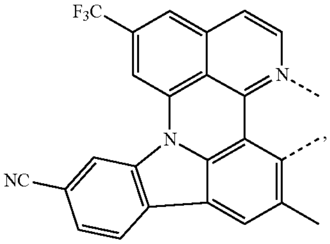
$L_{a777}$
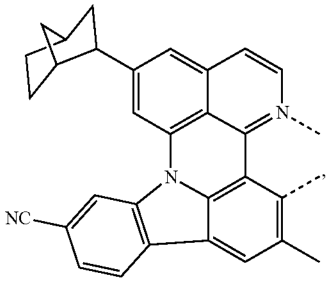
-continued
$L_{a778}$
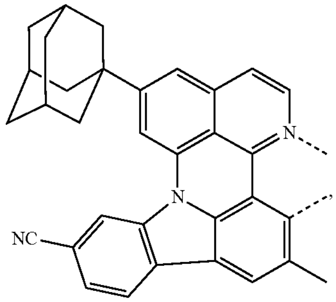
$L_{a779}$
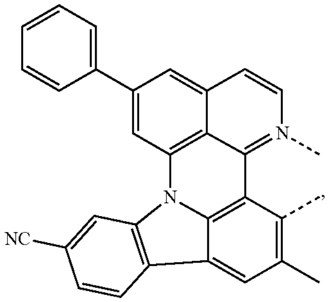
$L_{a780}$
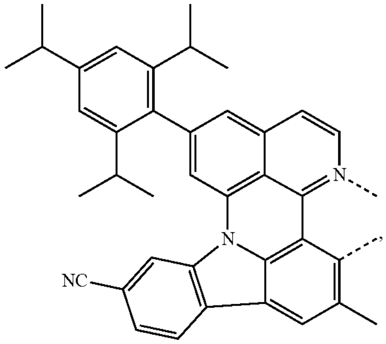
$L_{a781}$
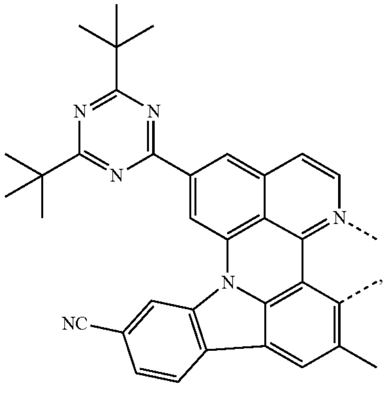
$L_{a782}$
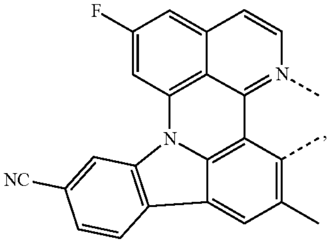

$L_{a783}$
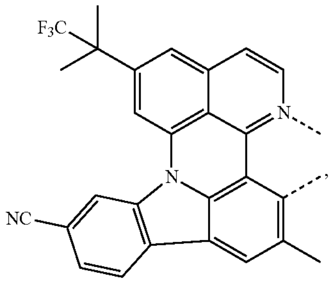
$L_{a784}$
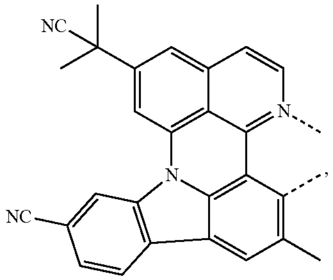
$L_{a785}$
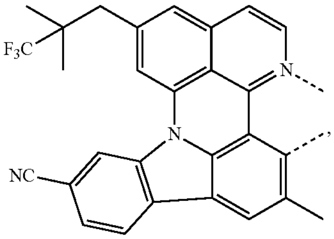
$L_{a786}$
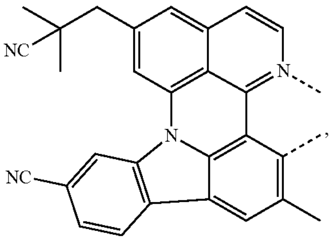
$L_{a787}$
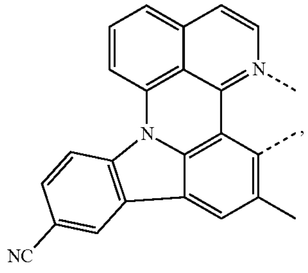
$L_{a788}$
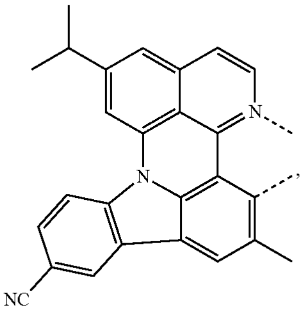
$L_{a789}$
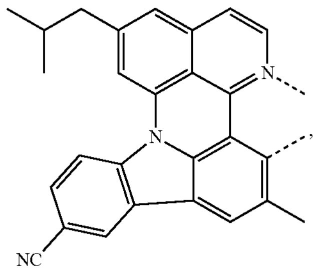
$L_{a790}$
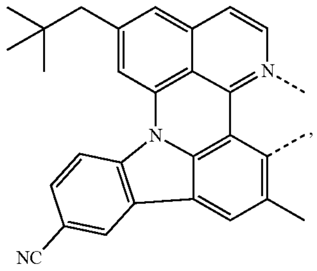
$L_{a791}$
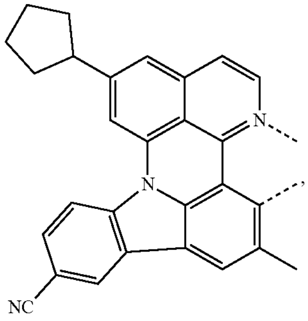
$L_{a792}$
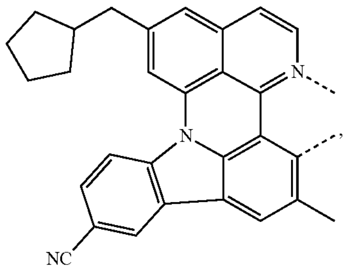

-continued
L$_{a793}$
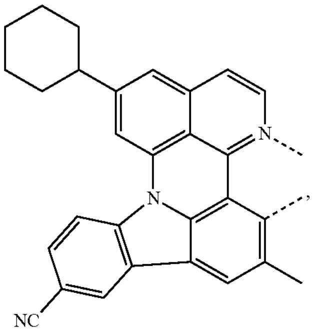
L$_{a794}$
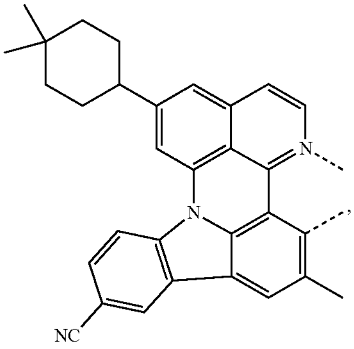
L$_{a795}$
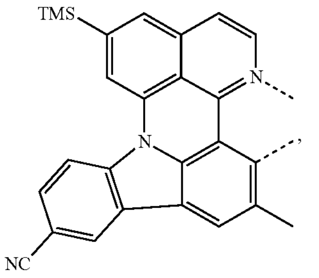
L$_{a796}$
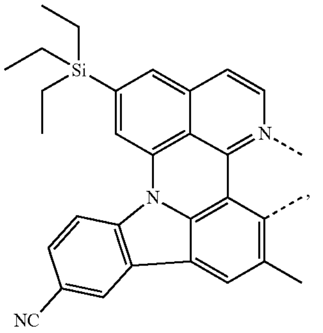
L$_{a797}$
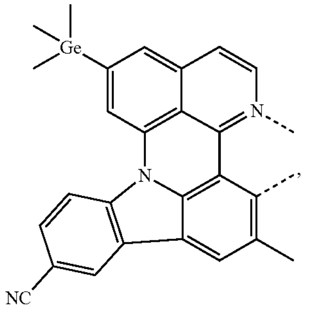
-continued
L$_{a798}$
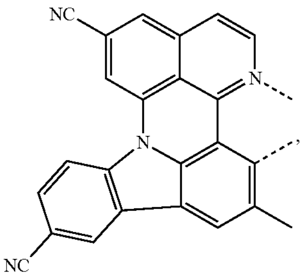
L$_{a799}$
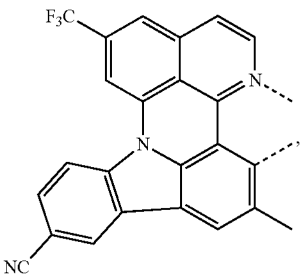
L$_{a800}$
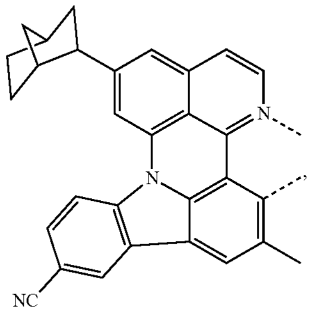
L$_{a801}$
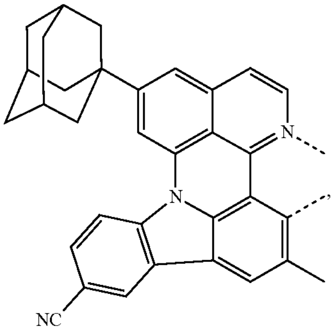
L$_{a802}$
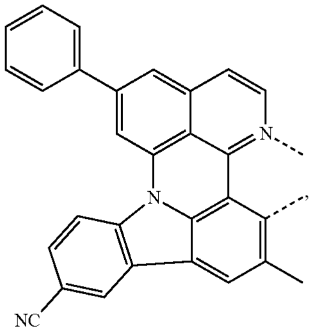

-continued
$L_{a803}$
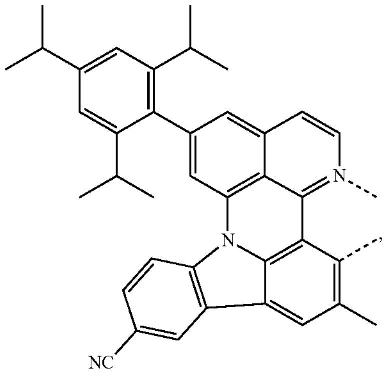
$L_{a804}$
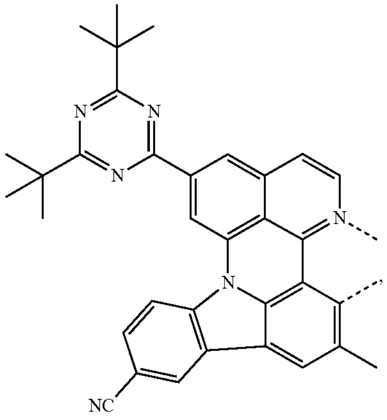
$L_{a805}$
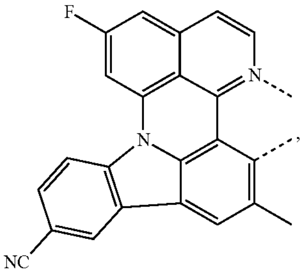
$L_{a806}$
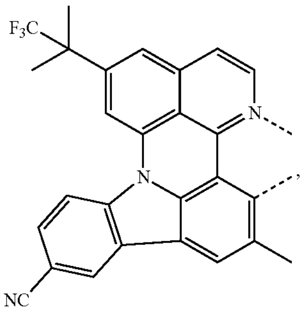
-continued
$L_{a807}$
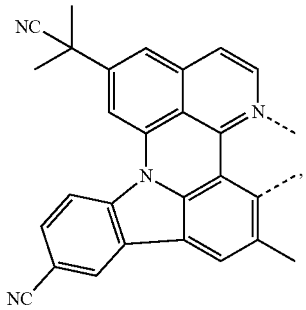
$L_{a808}$
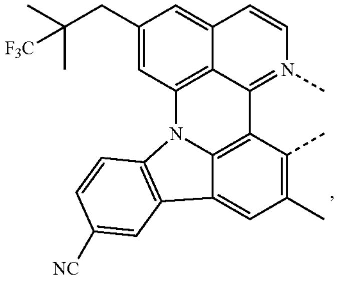
$L_{a809}$
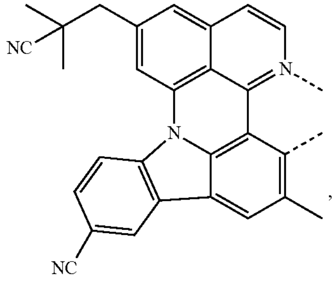
$L_{a810}$
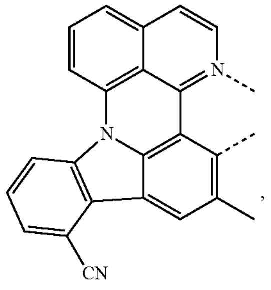
$L_{a811}$
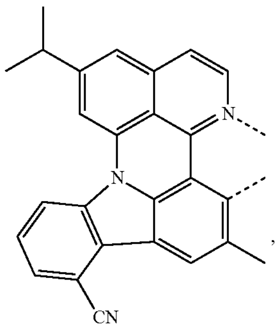

-continued
$L_{a812}$
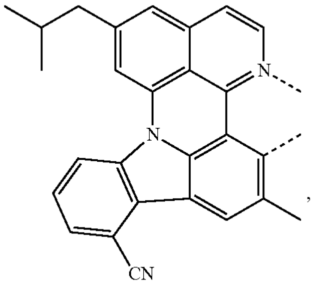
$L_{a813}$
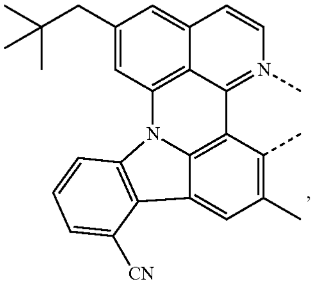
$L_{a814}$
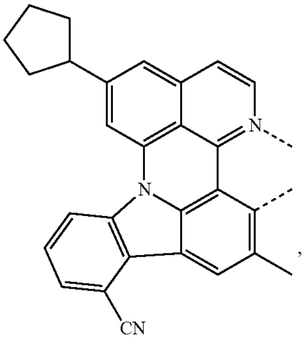
$L_{a815}$
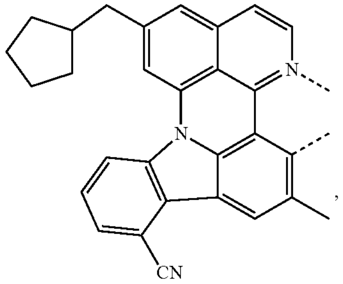
$L_{a816}$
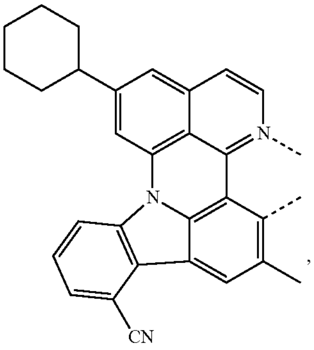
-continued
$L_{a817}$
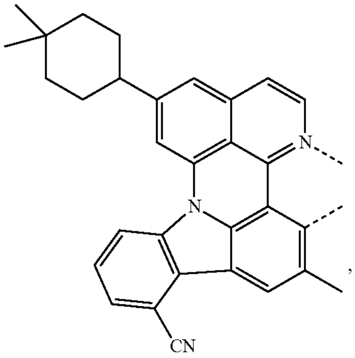
$L_{a818}$
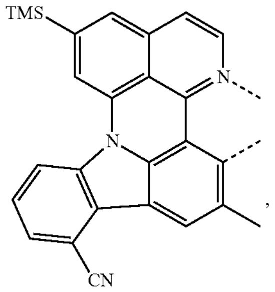
$L_{a819}$
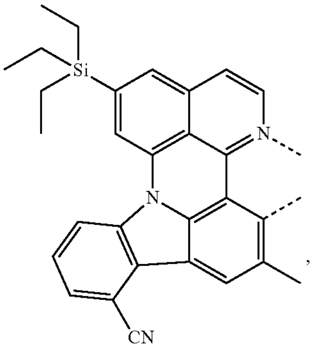
$L_{a820}$
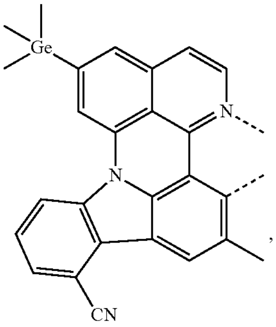
$L_{a821}$
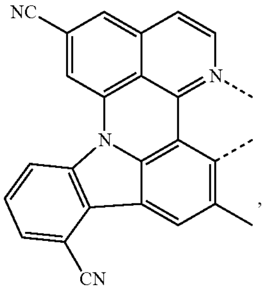

$L_{a822}$
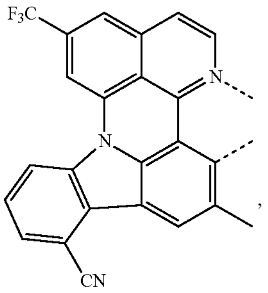
$L_{a823}$
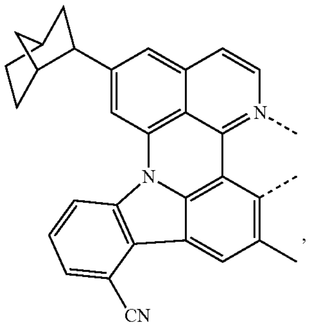
$L_{a824}$
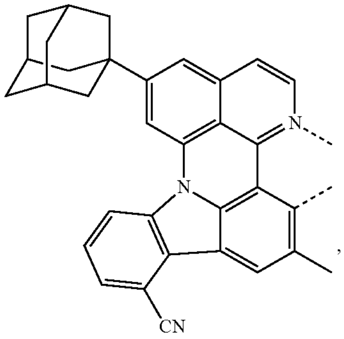
$L_{a825}$
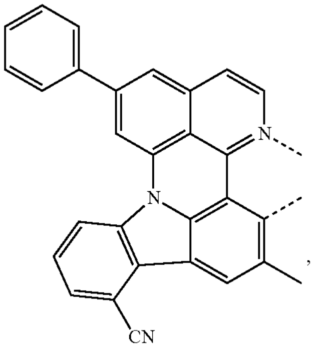
$L_{a826}$
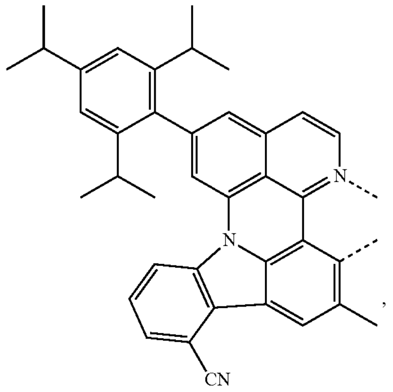
$L_{a827}$
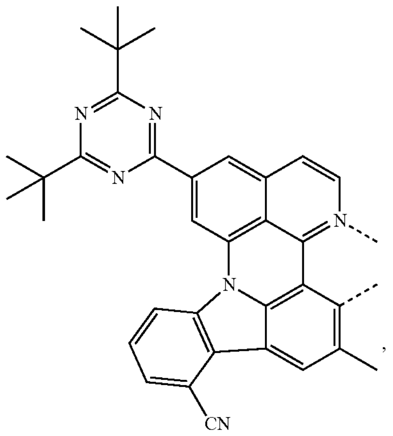
$L_{a828}$
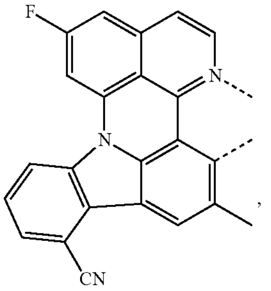
$L_{a829}$
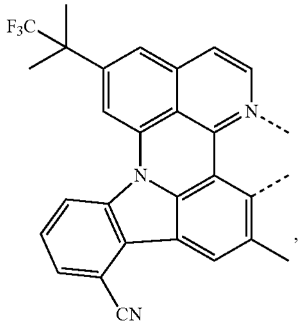

-continued
$L_{a830}$
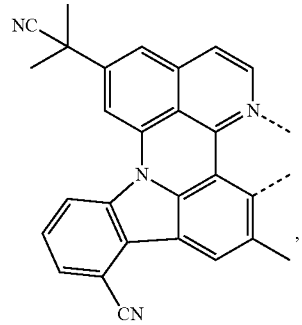
$L_{a831}$
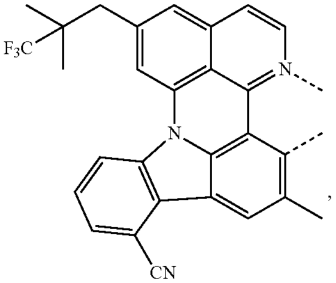
$L_{a832}$
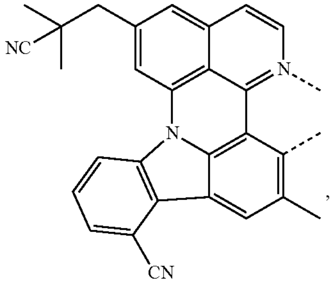
$L_{a833}$
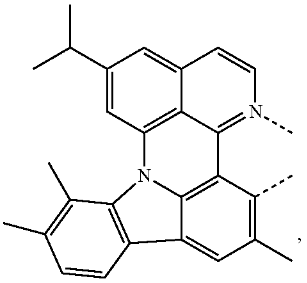
$L_{a834}$
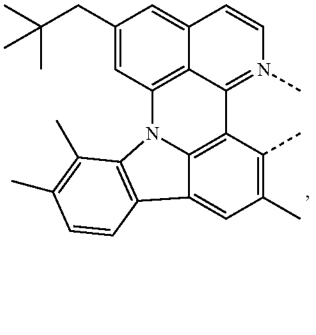
-continued
$L_{a835}$
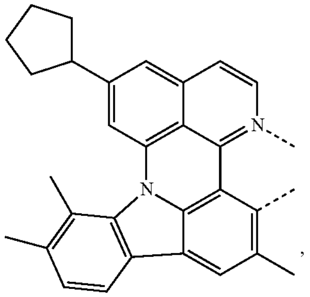
$L_{a836}$
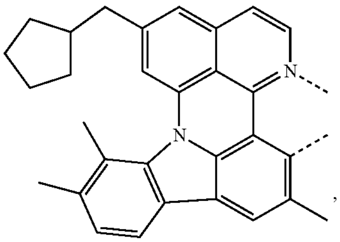
$L_{a837}$
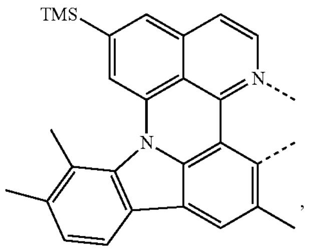
$L_{a838}$
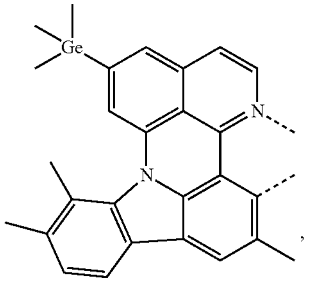
$L_{a839}$
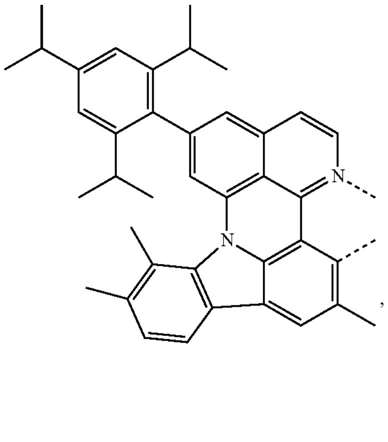

$L_{a840}$
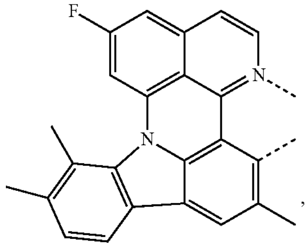
$L_{a841}$
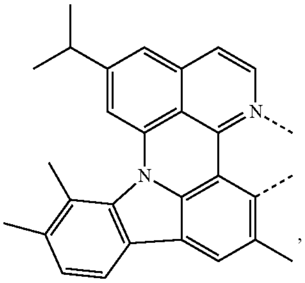
$L_{a842}$
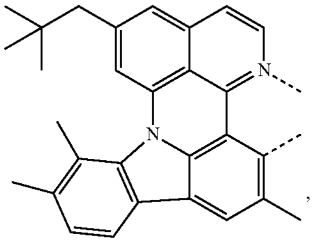
$L_{a843}$
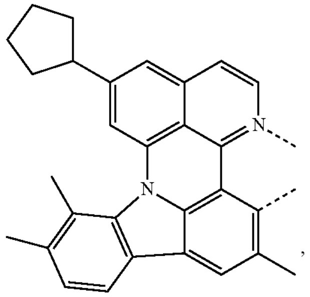
$L_{a844}$
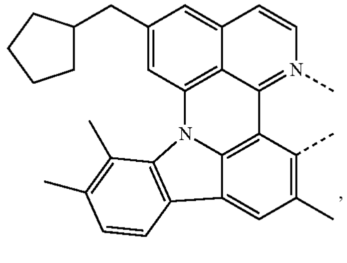
$L_{a845}$
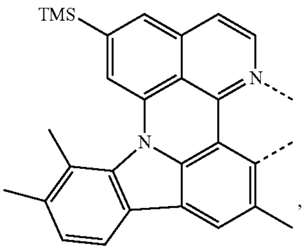
$L_{a846}$
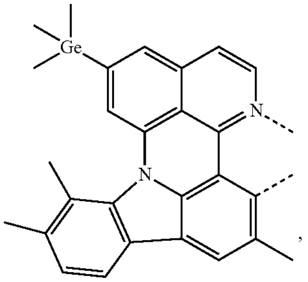
$L_{a847}$
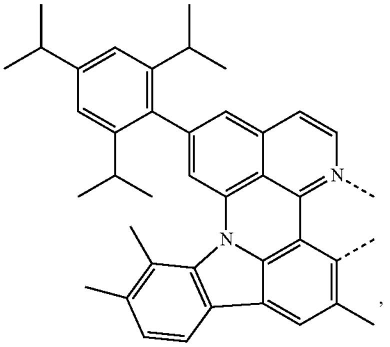
$L_{a848}$
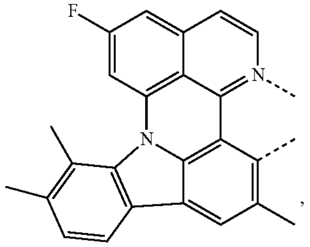
$L_{a849}$
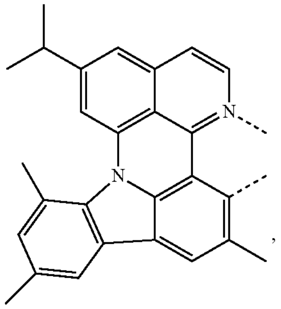
$L_{a850}$
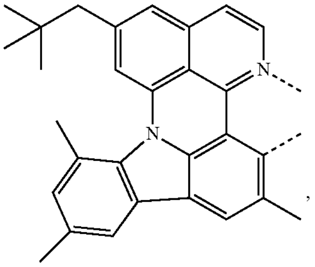

-continued
L$_{a851}$
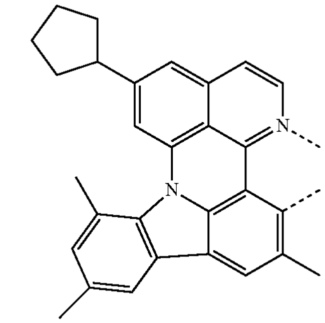
,
L$_{a852}$
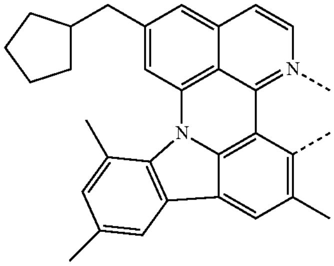
,
L$_{a853}$
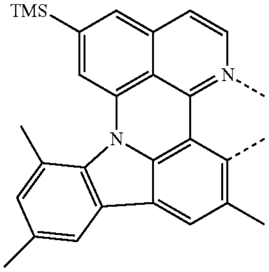
,
L$_{a854}$
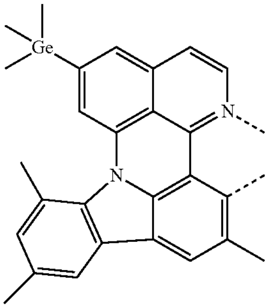
,
L$_{a855}$
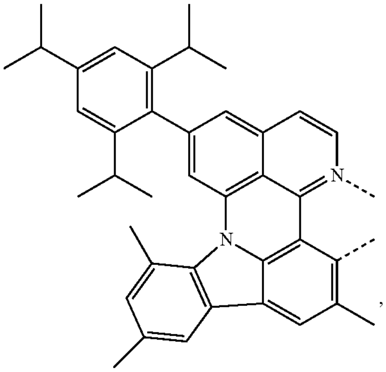
,
-continued
L$_{a856}$
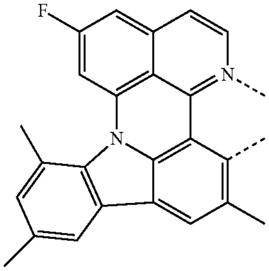
,
L$_{a857}$
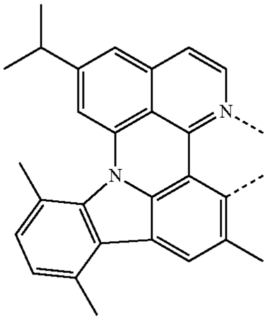
,
L$_{a858}$
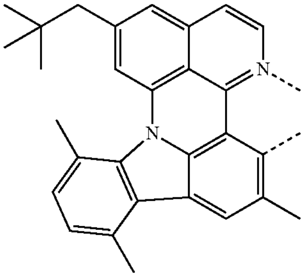
,
L$_{a859}$
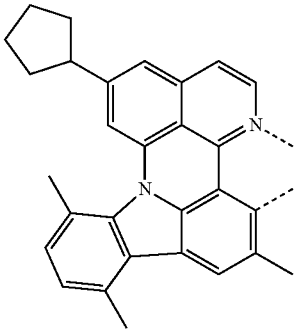
,
L$_{a860}$
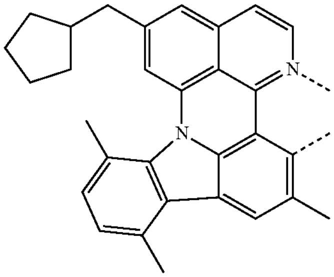
, -continued
$L_{a861}$
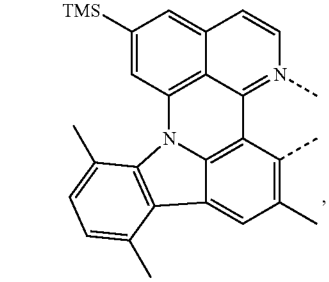
,
$L_{a862}$
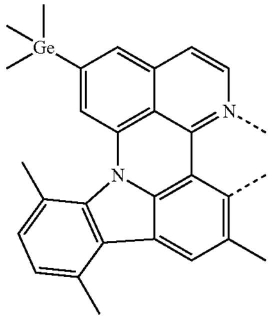
,
$L_{a863}$
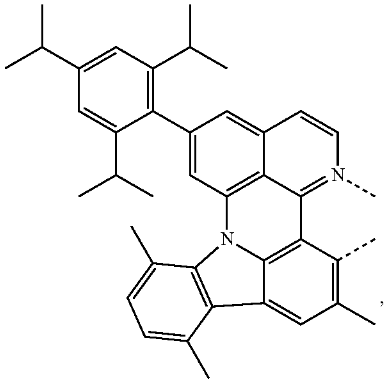
,
$L_{a864}$
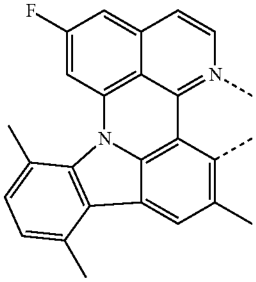
,
$L_{a865}$
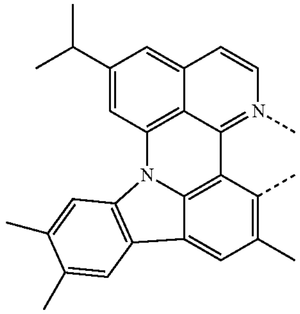
,
-continued
$L_{a866}$
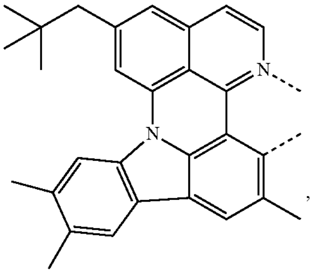
,
$L_{a867}$
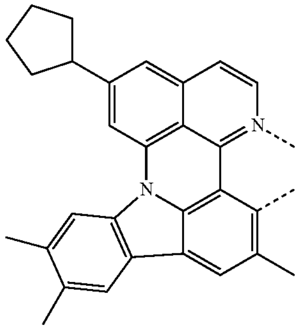
,
$L_{a868}$
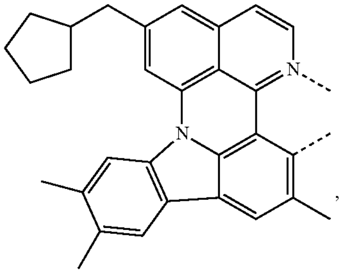
,
$L_{a869}$
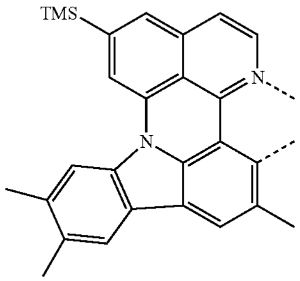
,
$L_{a870}$
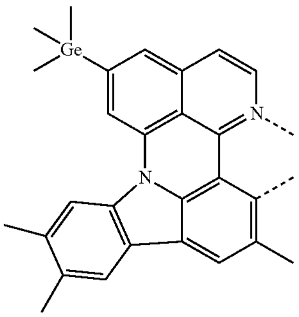
, -continued
$L_{a871}$
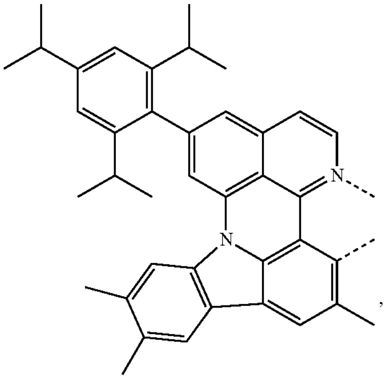
,
$L_{a872}$
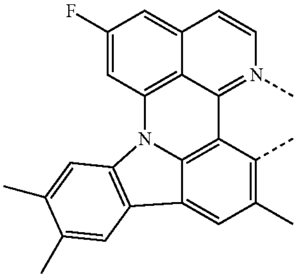
,
$L_{a873}$
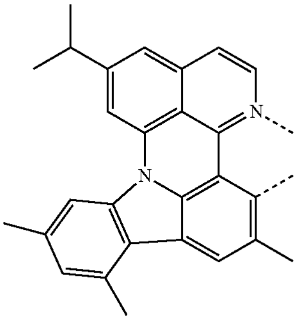
,
$L_{a874}$
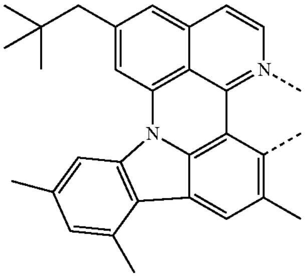
,
$L_{a875}$
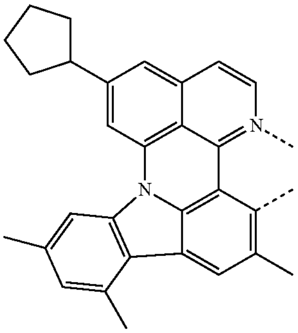
,
-continued
$L_{a876}$
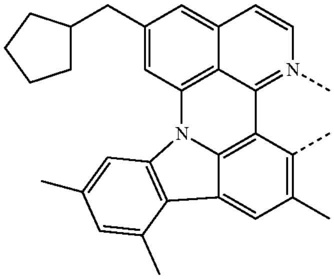
,
$L_{a877}$
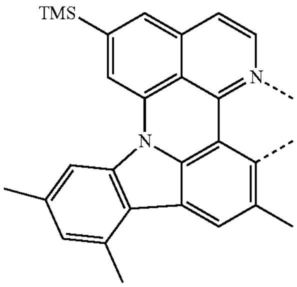
,
$L_{a878}$
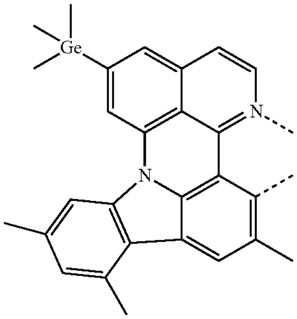
,
$L_{a879}$
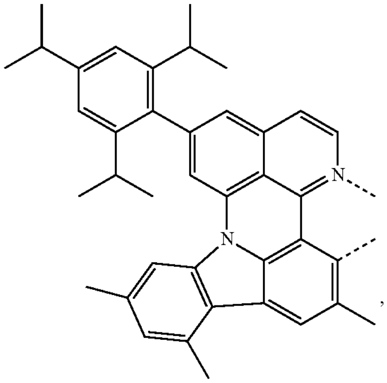
,
$L_{a880}$
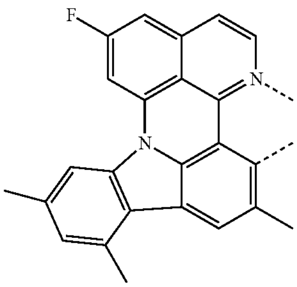
, -continued
$L_{a881}$
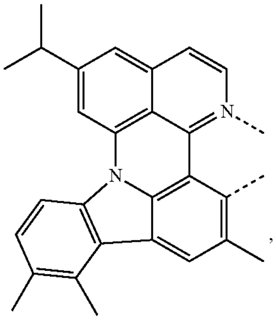
$L_{a882}$
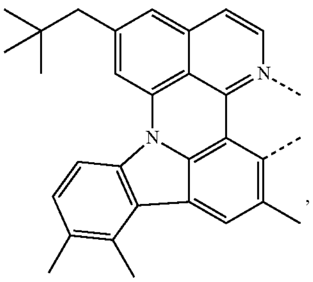
$L_{a883}$
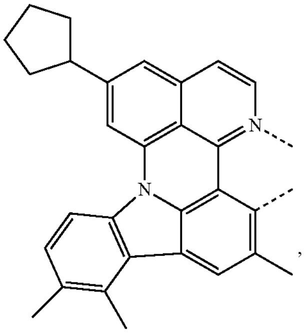
$L_{a884}$
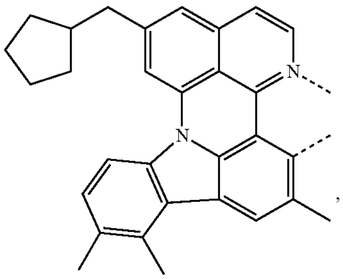
$L_{a885}$
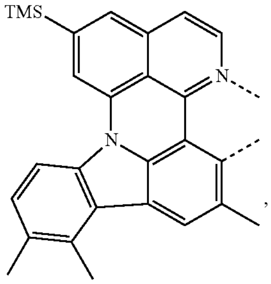
-continued
$L_{a886}$
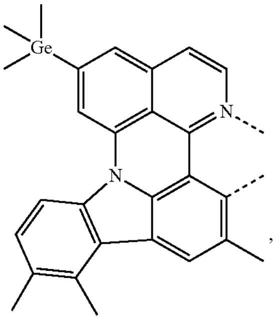
$L_{a887}$
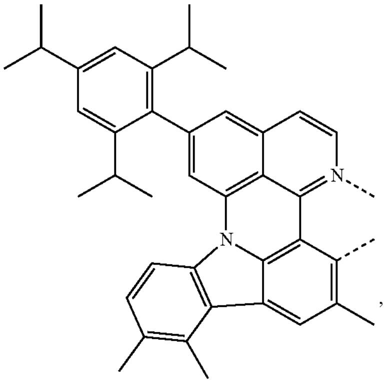
$L_{a888}$
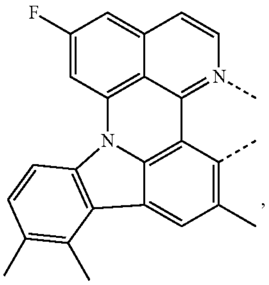
$L_{a889}$
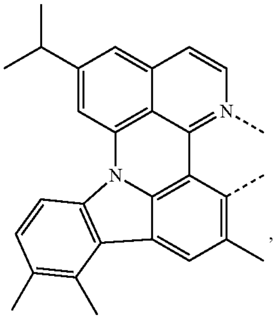
$L_{a890}$
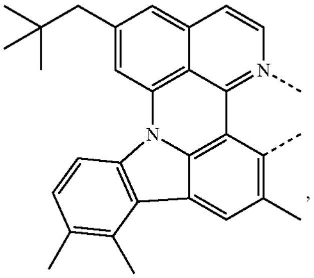

-continued
La891
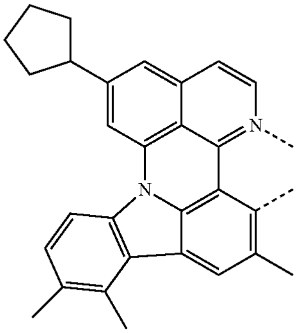
,
La892
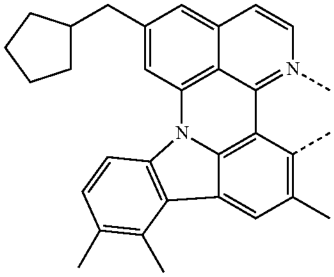
,
La893
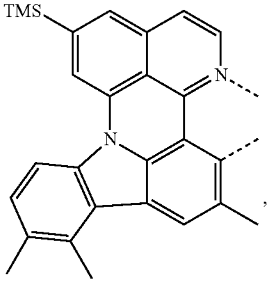
,
La894
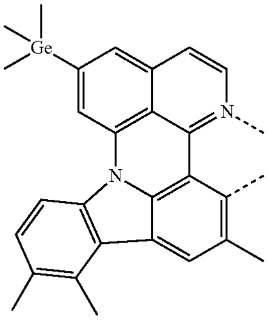
,
La895
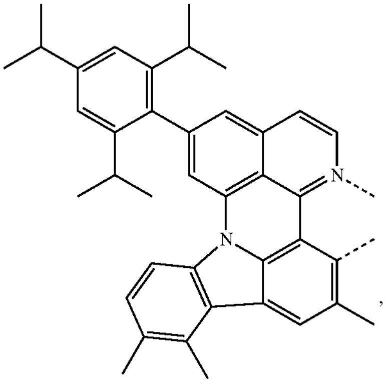
,
-continued
La896
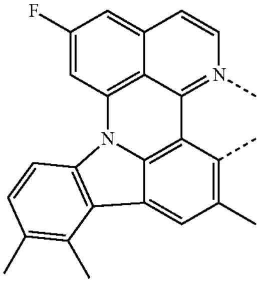
,
La897
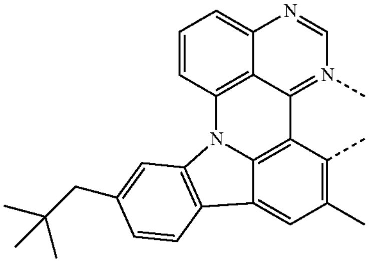
,
La898
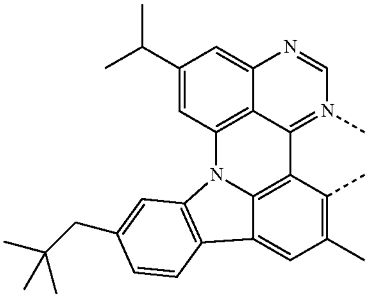
,
La899
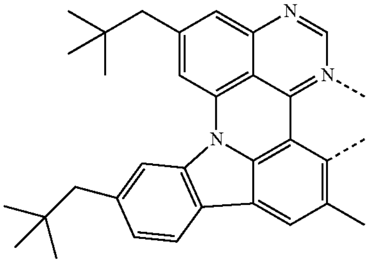
,
La900
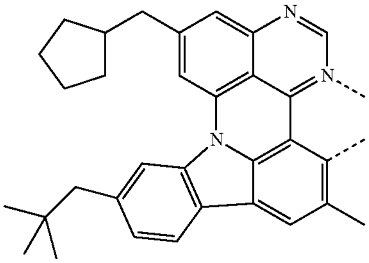
, -continued
$L_{a901}$
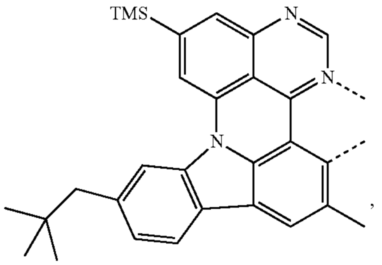
$L_{a902}$
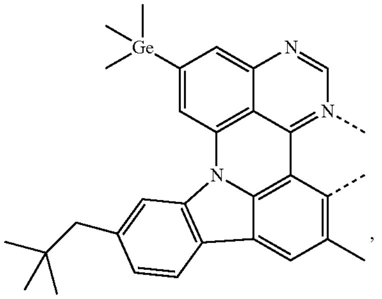
$L_{a903}$
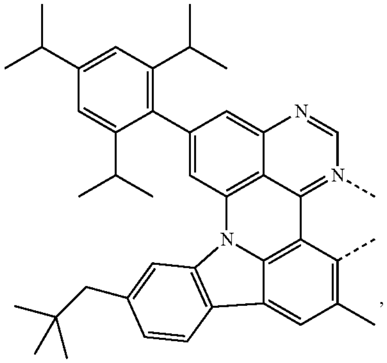
$L_{a904}$
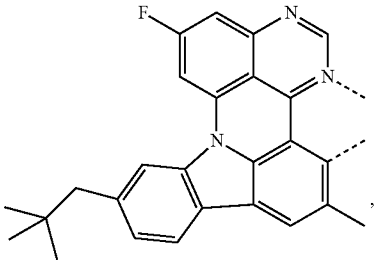
$L_{a905}$
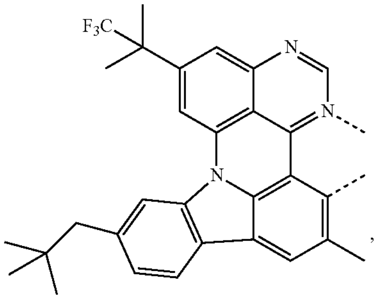
-continued
$L_{a906}$
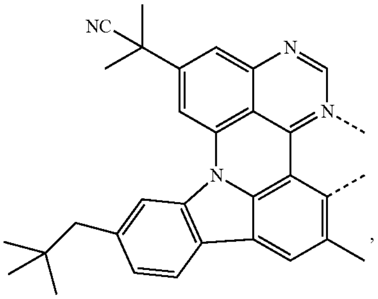
$L_{a907}$
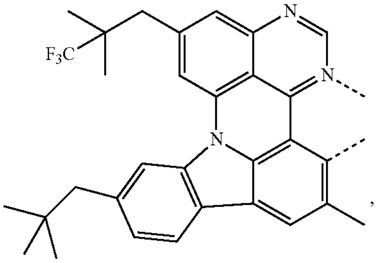
$L_{a908}$
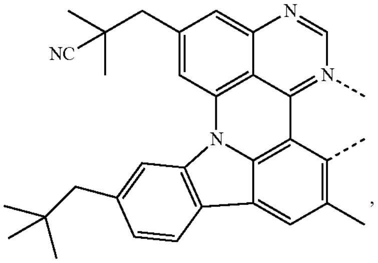
$L_{a909}$
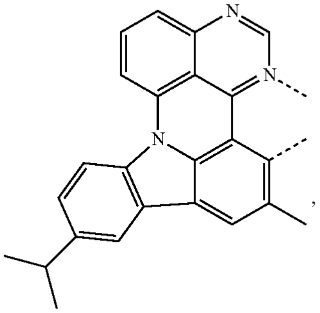
$L_{a910}$
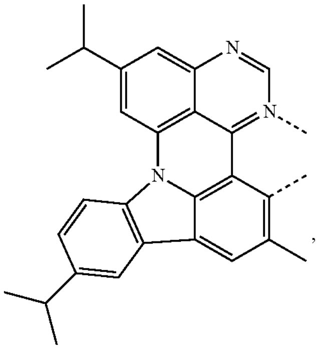

$L_{a911}$
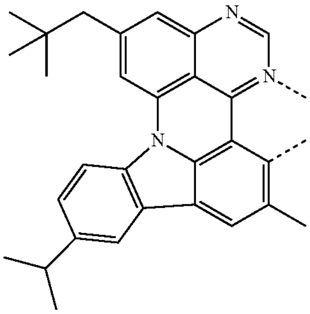
,
$L_{a912}$
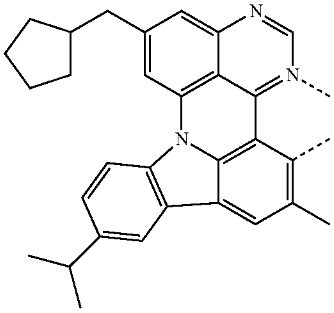
,
$L_{a913}$
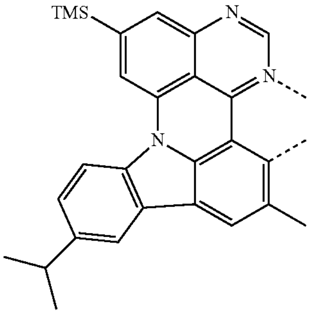
,
$L_{a914}$
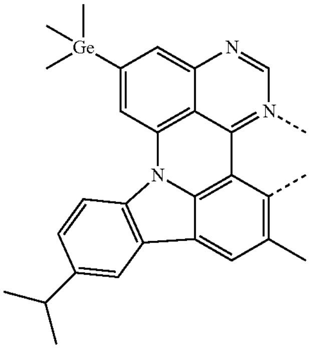
,
$L_{a915}$
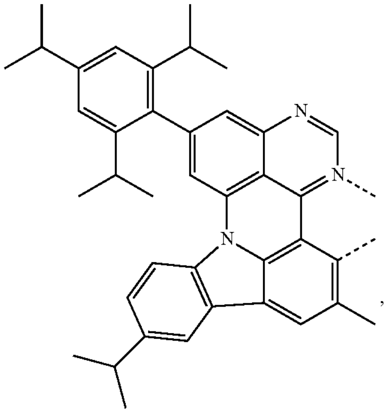
,
$L_{a916}$
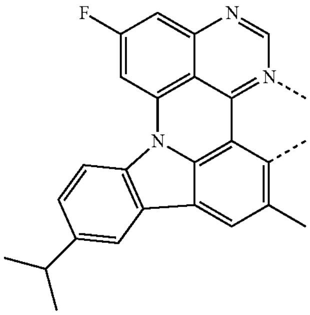
,
$L_{a917}$
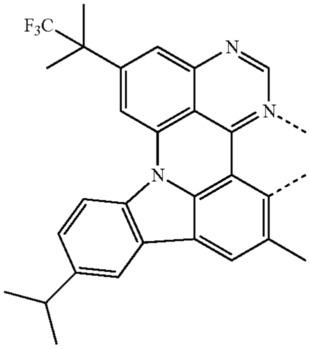
,
$L_{a918}$
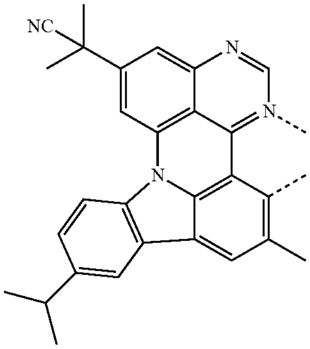
, -continued
$L_{a919}$
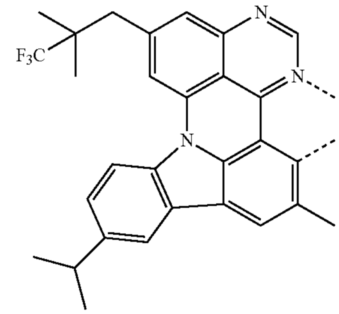
,
$L_{a920}$
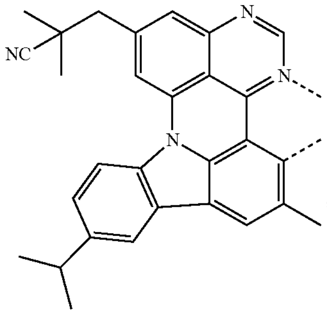
,
$L_{a921}$
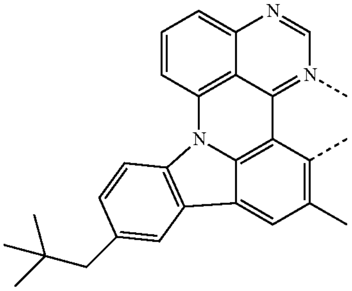
,
$L_{a922}$
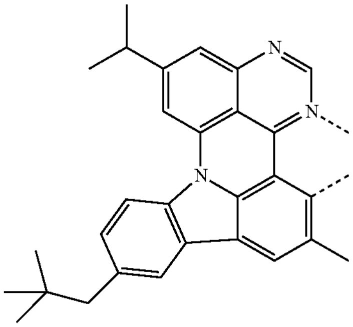
,
$L_{a923}$
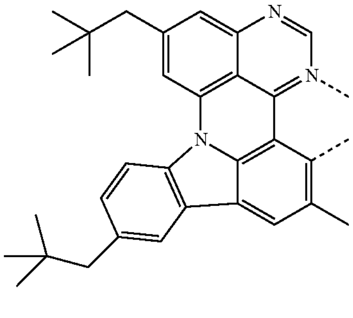
,
-continued
$L_{a924}$
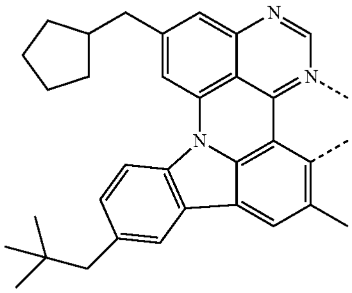
,
$L_{a925}$
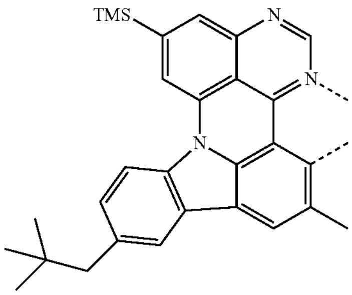
,
$L_{a926}$
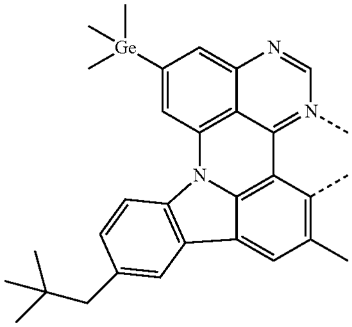
,
$L_{a927}$
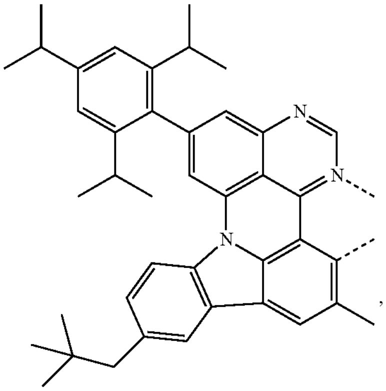
,
$L_{a928}$
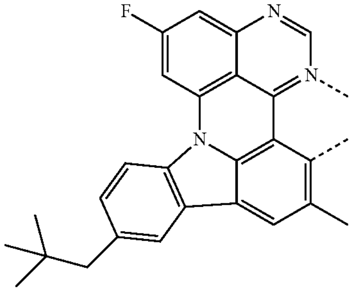
, -continued
$L_{a929}$
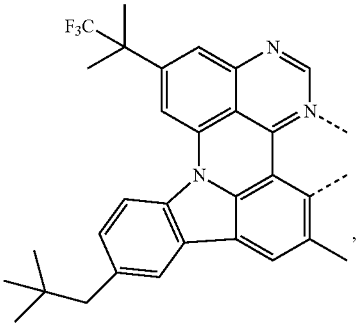
$L_{a930}$
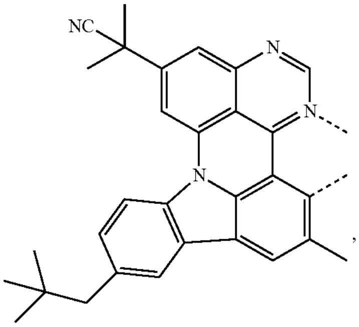
$L_{a931}$
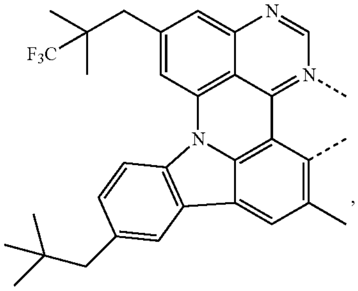
$L_{a932}$
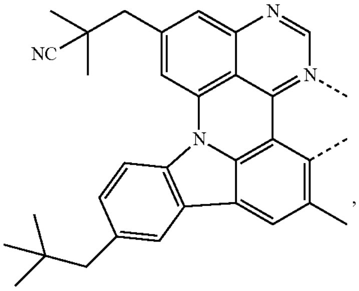
$L_{a933}$
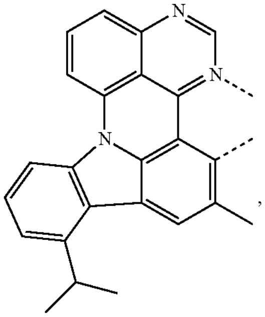
-continued
$L_{a934}$
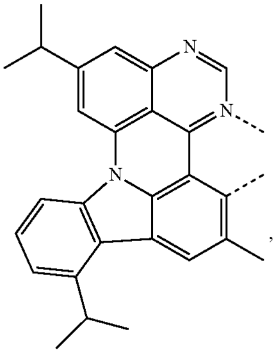
$L_{a935}$
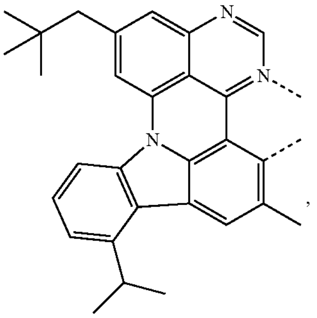
$L_{a936}$
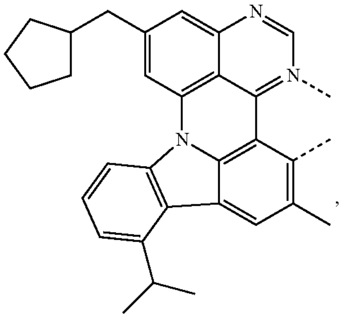
$L_{a937}$
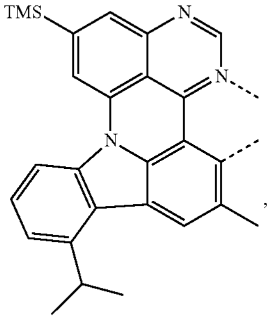

-continued
$L_{a938}$
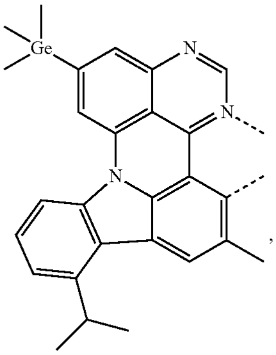
$L_{a939}$
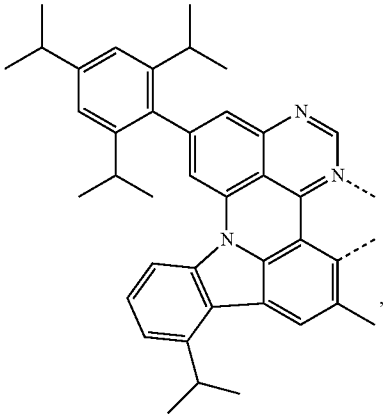
$L_{a940}$
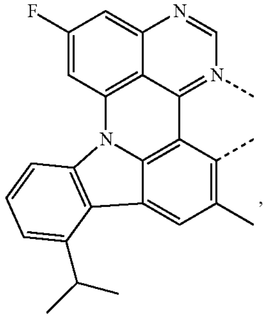
$L_{a941}$
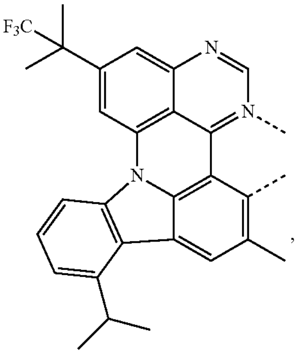
-continued
$L_{a942}$
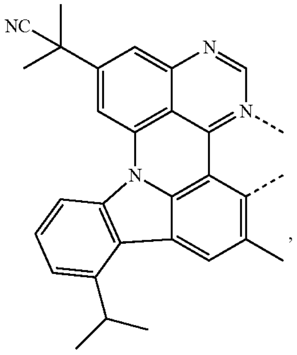
$L_{a943}$
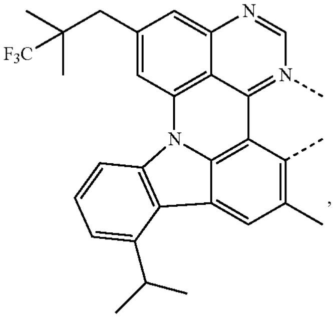
$L_{a944}$
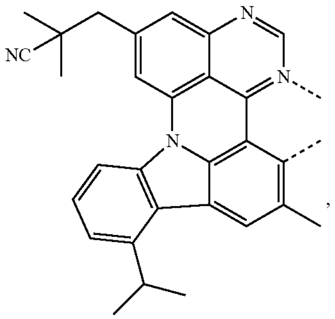
$L_{a945}$
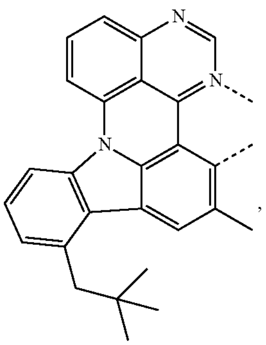

-continued
L$_{a946}$
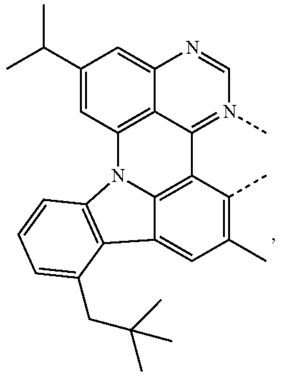
L$_{a947}$
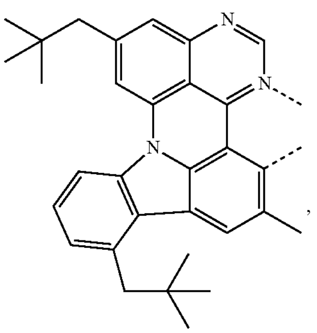
L$_{a948}$
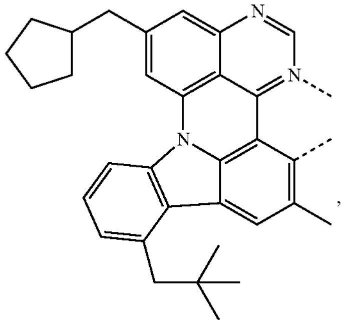
L$_{a949}$
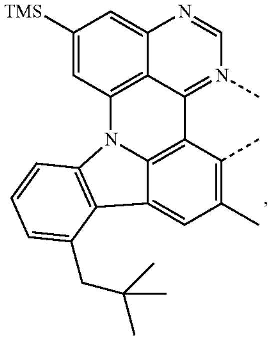
-continued
L$_{a950}$
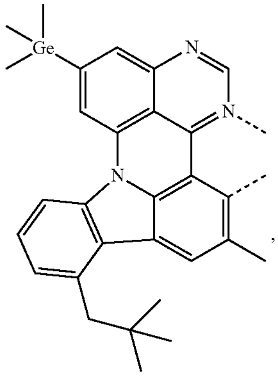
L$_{a951}$
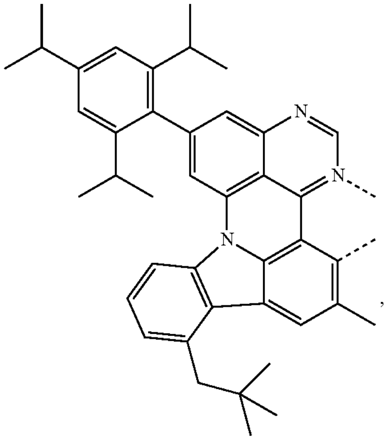
L$_{a952}$
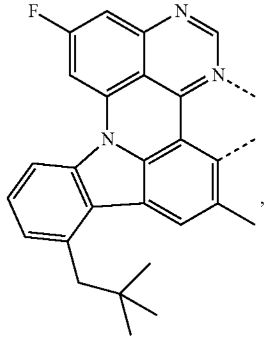
L$_{a953}$
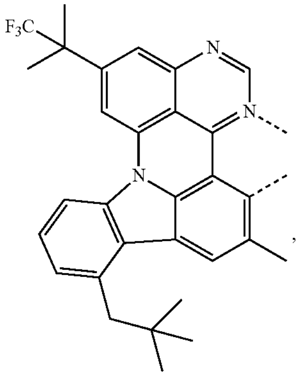

-continued
$L_{a954}$
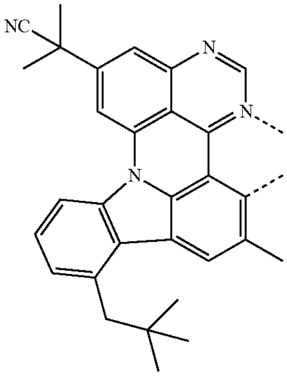
,
$L_{a955}$
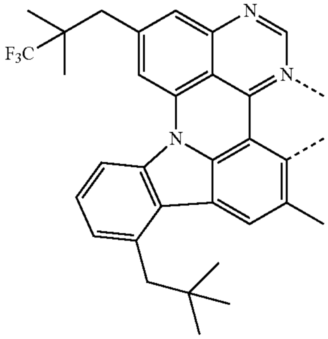
,
$L_{a956}$
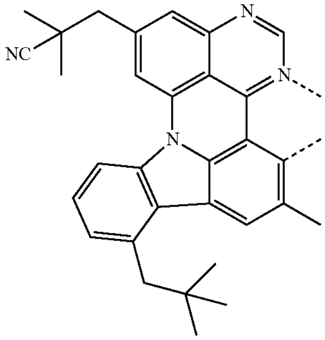
,
$L_{a985}$
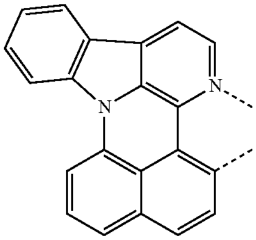
,
$L_{a986}$
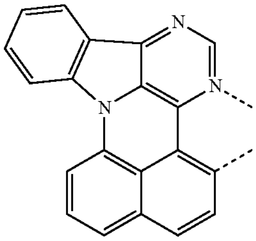
,
-continued
$L_{a987}$
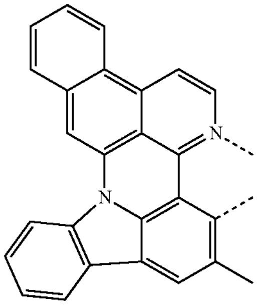
,
$L_{a988}$
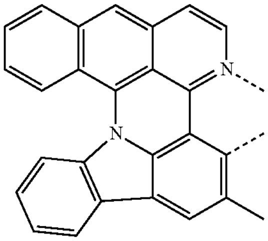
,
$L_{a989}$
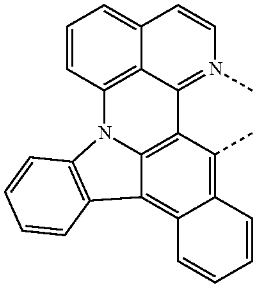
,
$L_{a990}$
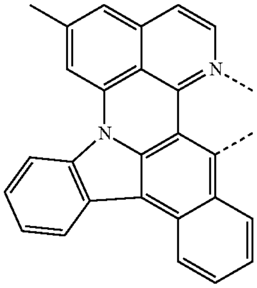
,
$L_{a991}$
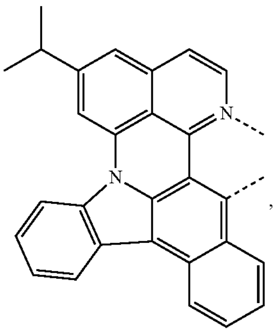
, -continued
$L_{a992}$
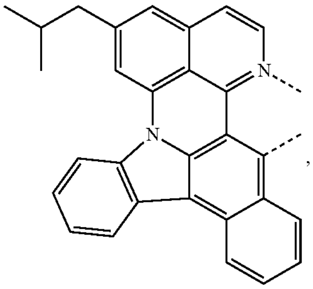
$L_{a993}$
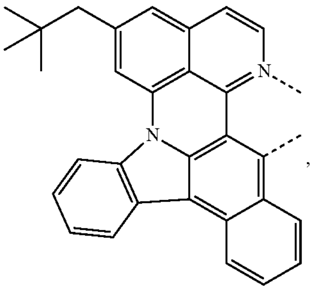
$L_{a994}$
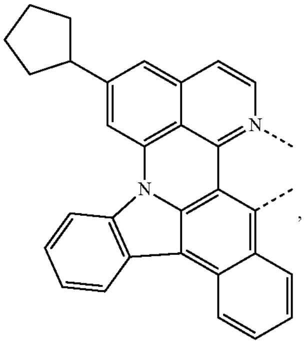
$L_{a995}$
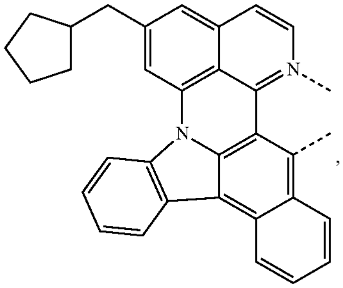
$L_{a996}$
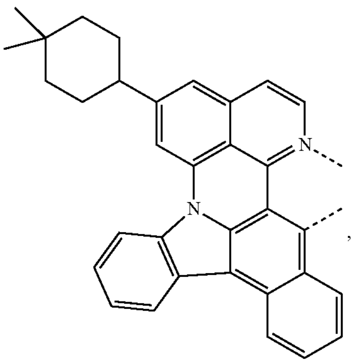
-continued
$L_{a997}$
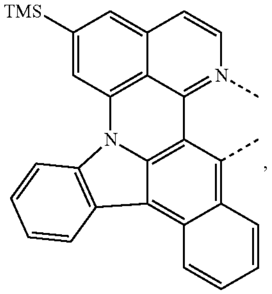
$L_{a998}$
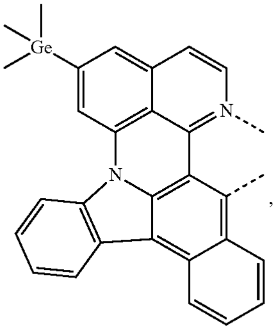
$L_{a999}$
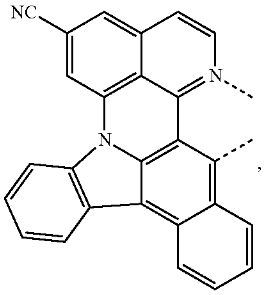
$L_{a1000}$
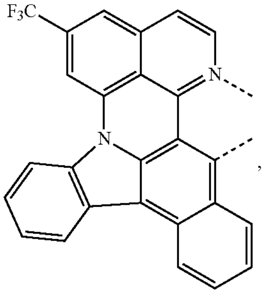
$L_{a1001}$
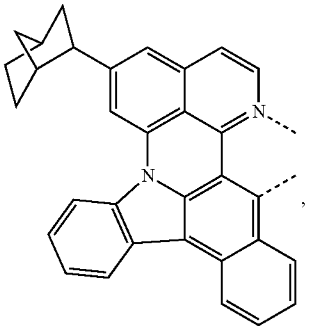

-continued
$L_{a1002}$
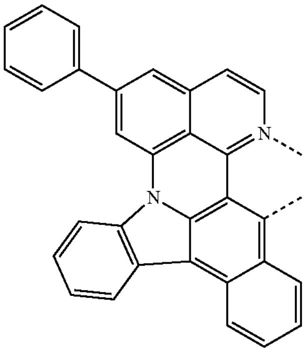
,
$L_{a1003}$
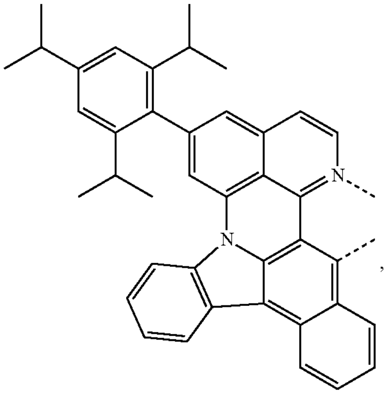
,
$L_{a1004}$
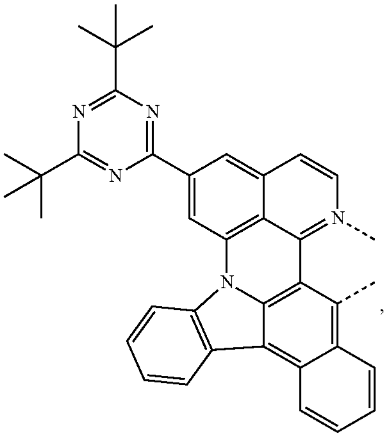
,
$L_{a1005}$
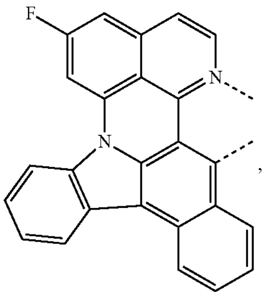
,
-continued
$L_{a1006}$
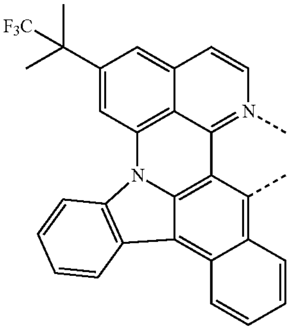
,
$L_{a1007}$
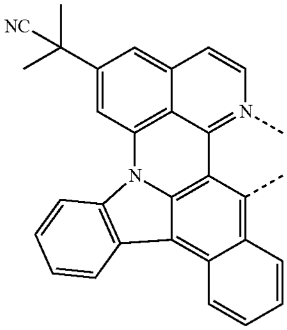
,
$L_{a1008}$
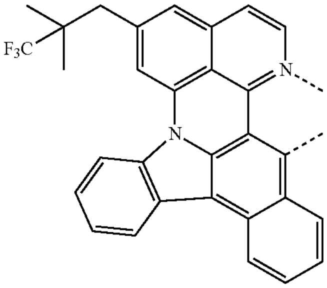
,
$L_{a1009}$
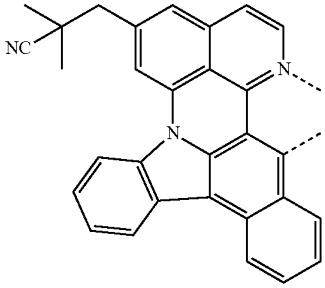
,
$L_{a1020}$
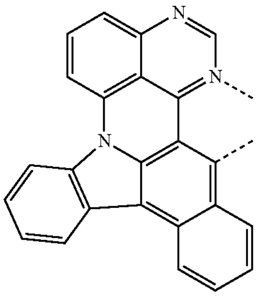
, -continued
$L_{a1021}$
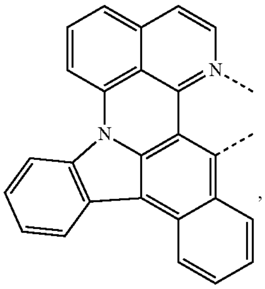
,
$L_{a1022}$
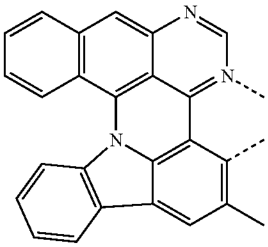
,
$L_{a1023}$
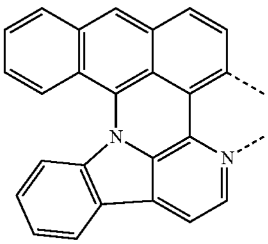
,
$L_{a1024}$
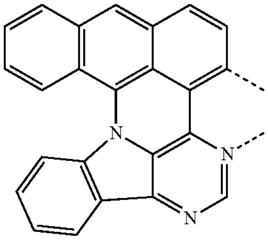
,
$L_{a1025}$
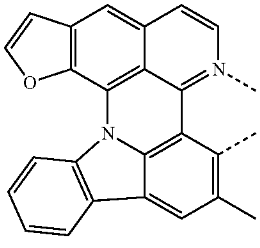
,
$L_{a1026}$
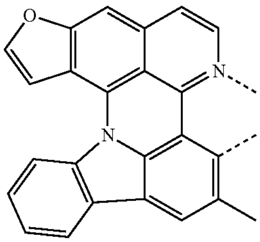
,
-continued
$L_{a1027}$
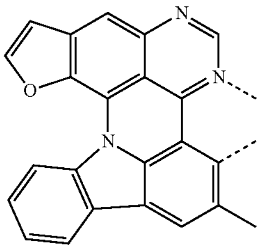
,
$L_{a1028}$
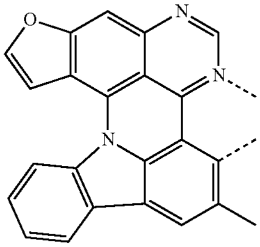
,
$L_{a1029}$
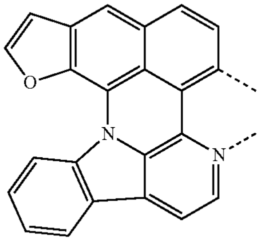
,
$L_{a1030}$
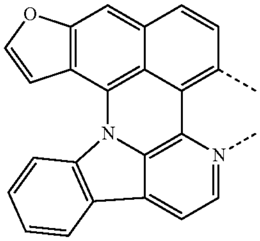
,
$L_{a1031}$
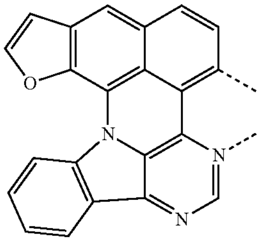
,
$L_{a1032}$
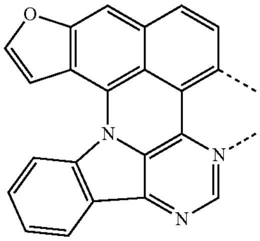
, -continued
$L_{a1033}$
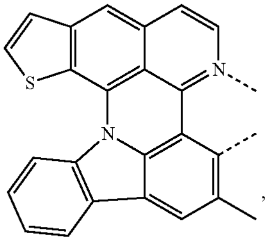
$L_{a1034}$
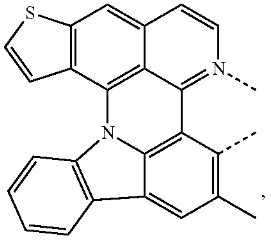
$L_{a1035}$
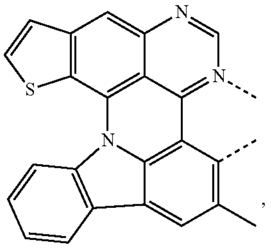
$L_{a1036}$
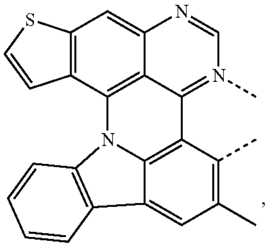
$L_{a1037}$
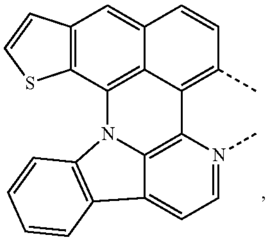
$L_{a1038}$
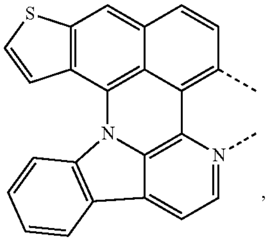
-continued
$L_{a1039}$
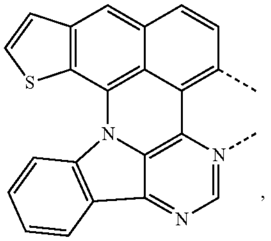
$L_{a1040}$
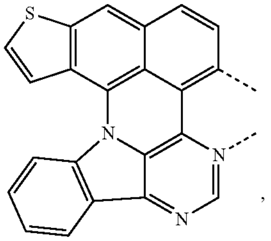
$L_{a1041}$
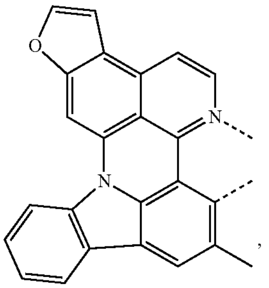
$L_{a1042}$
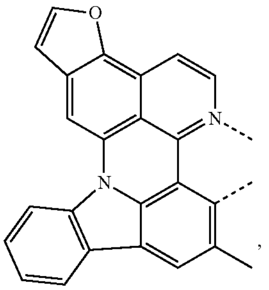
$L_{a1043}$
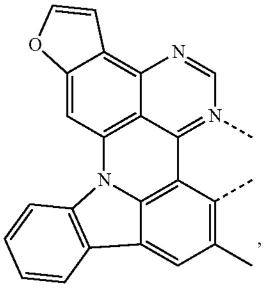

-continued
L$_{a1044}$
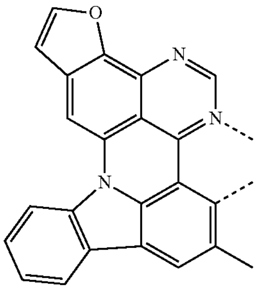
,
L$_{a1045}$
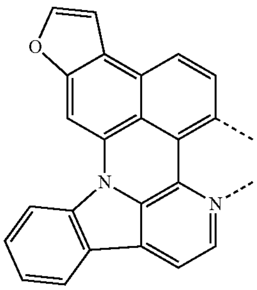
,
L$_{a1046}$
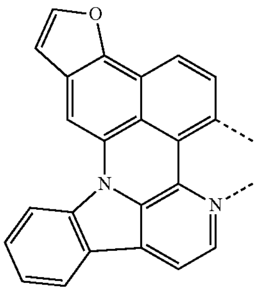
,
L$_{a1047}$
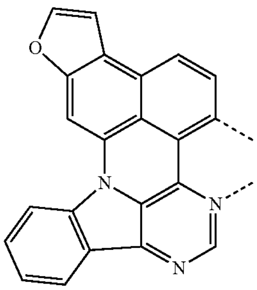
,
L$_{a1048}$
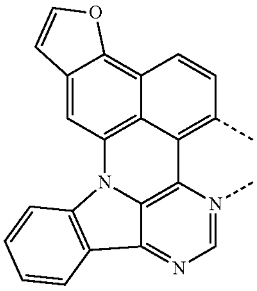
,
-continued
L$_{a1049}$
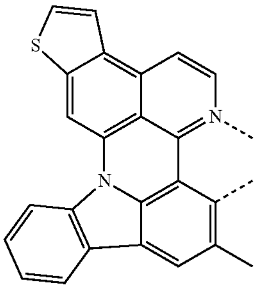
,
L$_{a1050}$
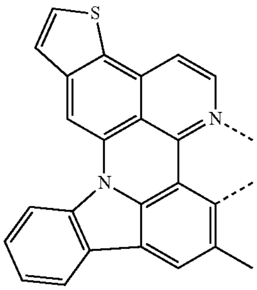
,
L$_{a1051}$
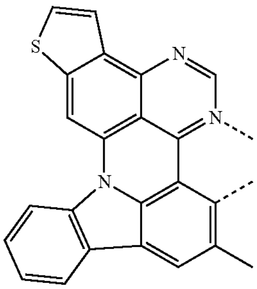
,
L$_{a1052}$
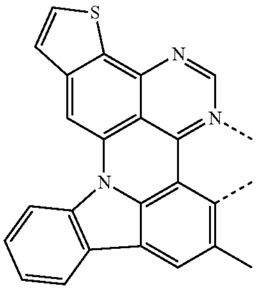
,
L$_{a1053}$
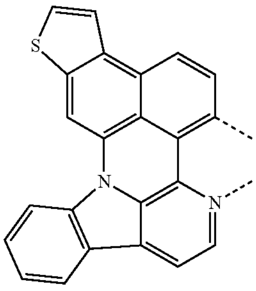
, -continued
$L_{a1054}$
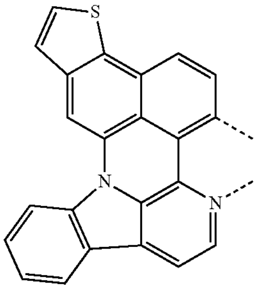
,
$L_{a1055}$
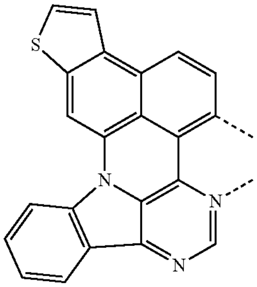
,
$L_{a1056}$
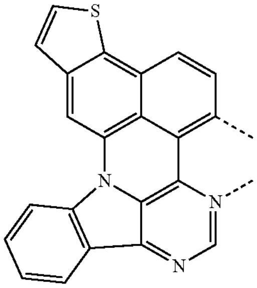
,
$L_{a1057}$
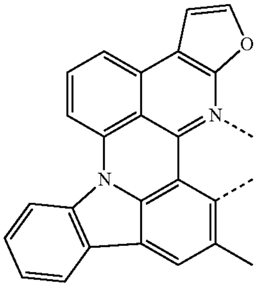
,
$L_{a1058}$
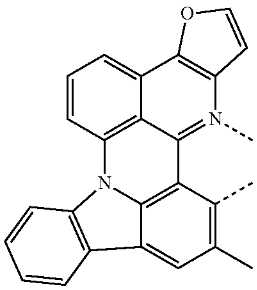
,
$L_{a1059}$
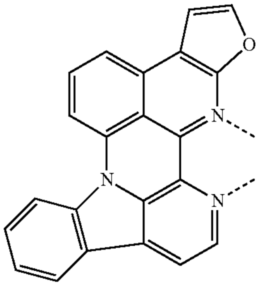
,
$L_{a1060}$
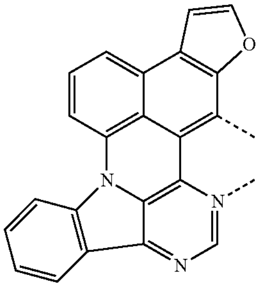
,
$L_{a1061}$
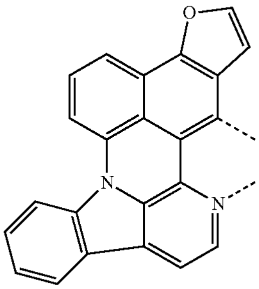
,
$L_{a1062}$
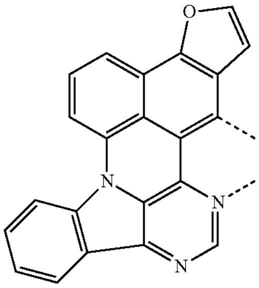
,
$L_{a1063}$
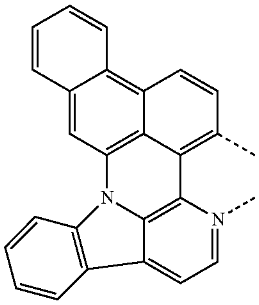
, -continued
$L_{a1064}$
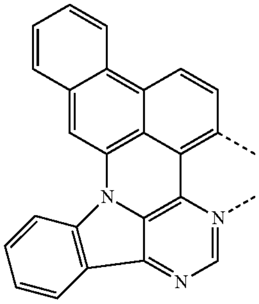
,
$L_{a1065}$
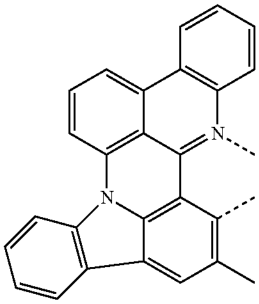
,
$L_{a1066}$
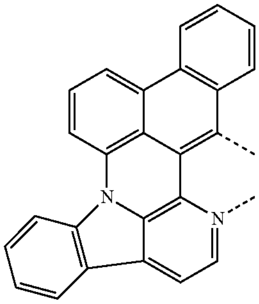
,
$L_{a1067}$
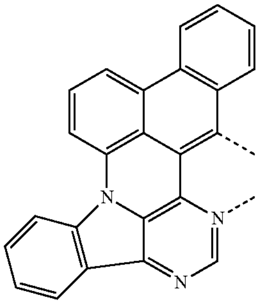
,
$L_{a1068}$
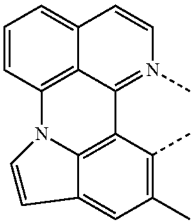
,
-continued
$L_{a1069}$
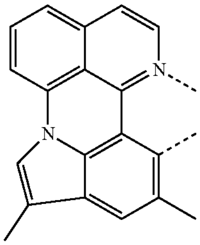
,
$L_{a1070}$
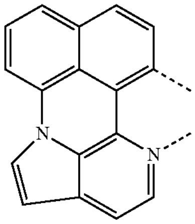
,
$L_{a1071}$
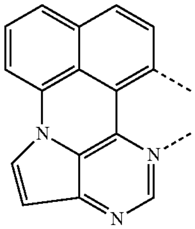
,
$L_{a1072}$
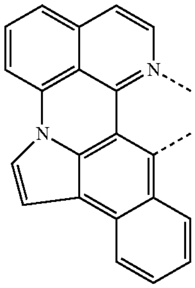
,
$L_{a1073}$
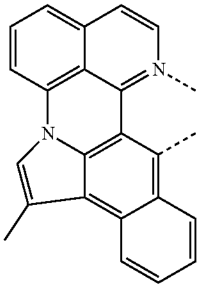
,
$L_{a1074}$
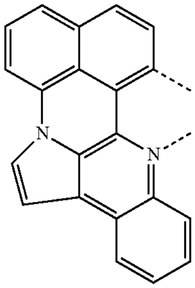
, -continued
$L_{a1097}$
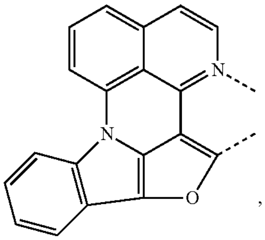
,
$L_{a1098}$
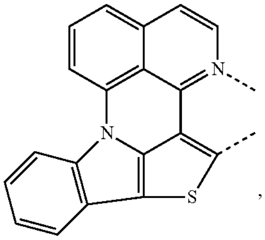
,
$L_{a1099}$
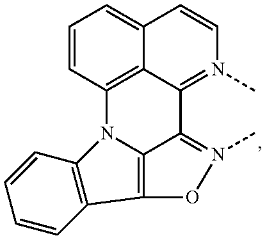
,
$L_{a1100}$
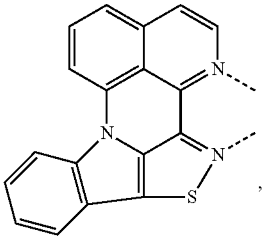
,
$L_{a1105}$
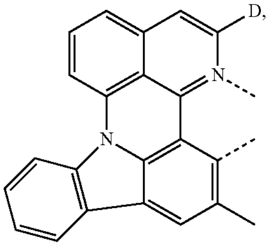
$L_{a1106}$
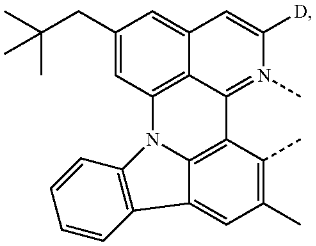
-continued
$L_{a1107}$
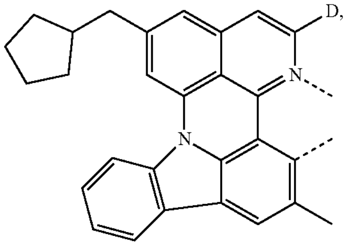
$L_{a1108}$
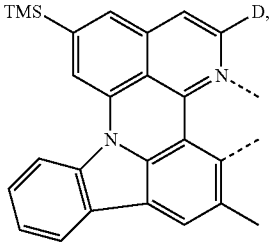
$L_{a1109}$
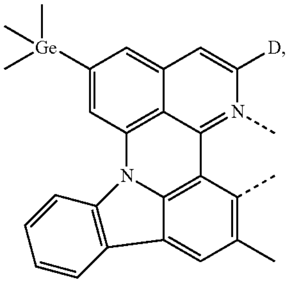
$L_{a1110}$
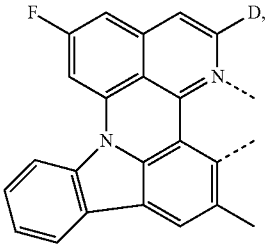
$L_{a1111}$
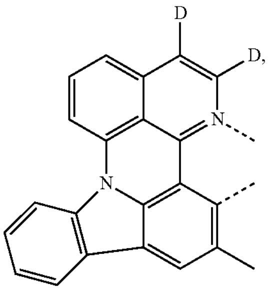

-continued
$L_{a1112}$
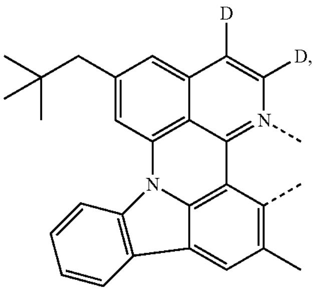
$L_{a1113}$
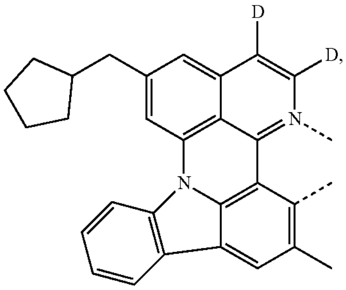
$L_{a1114}$
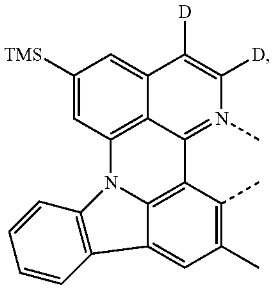
$L_{a1115}$
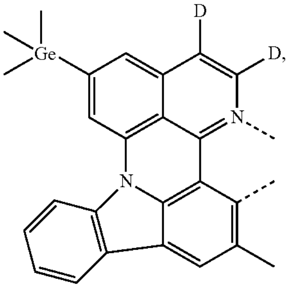
$L_{a1116}$
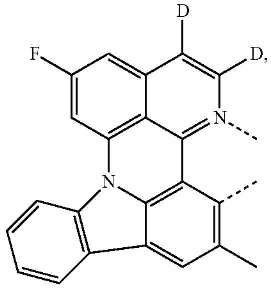
-continued
$L_{a1117}$
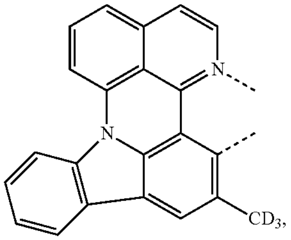
$L_{a1118}$
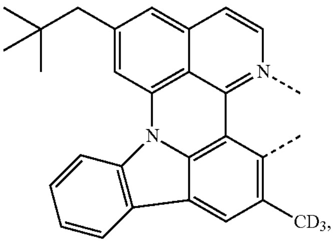
$L_{a1119}$
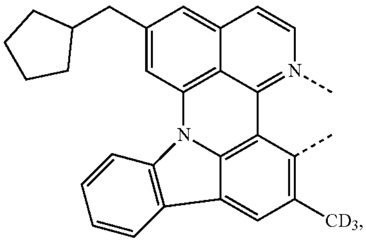
$L_{a1120}$
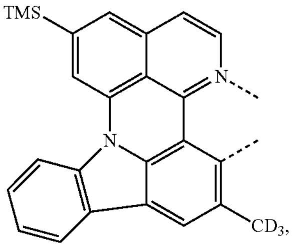
$L_{a1121}$
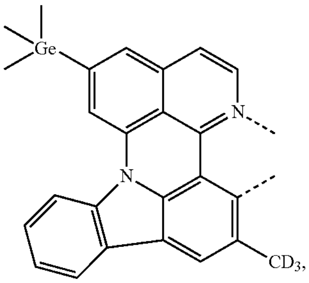
$L_{a1122}$
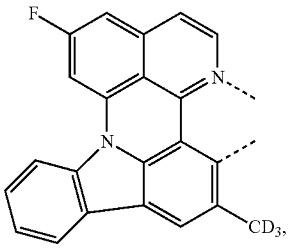

-continued
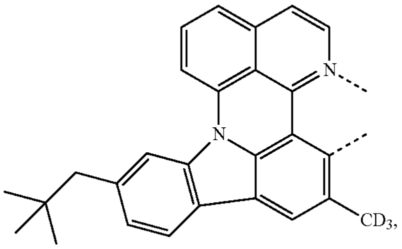
$L_{a1123}$
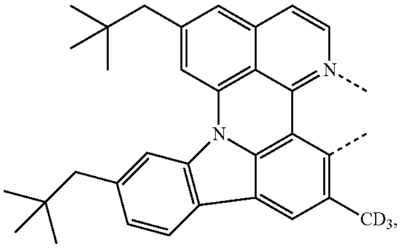
$L_{a1124}$
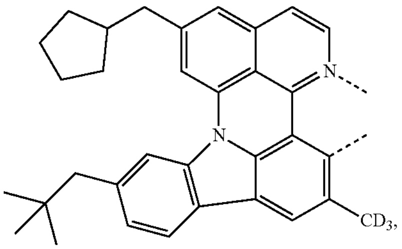
$L_{a1125}$
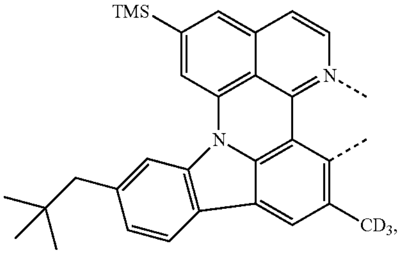
$L_{a1126}$
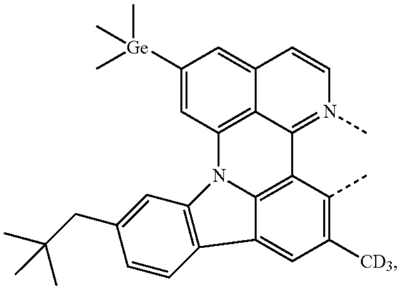
$L_{a1127}$
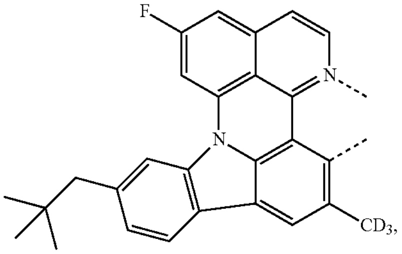
$L_{a1128}$
-continued
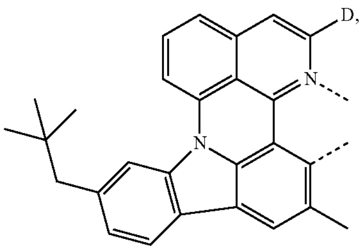
$L_{a1129}$
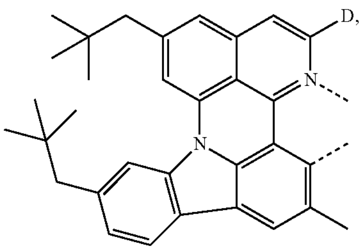
$L_{a1130}$
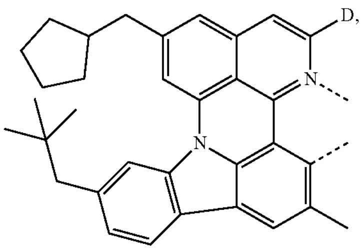
$L_{a1131}$
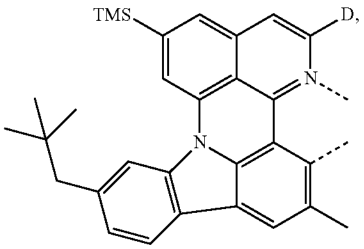
$L_{a1132}$
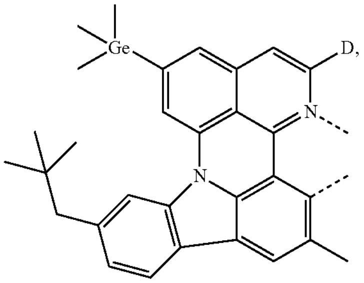
$L_{a1133}$
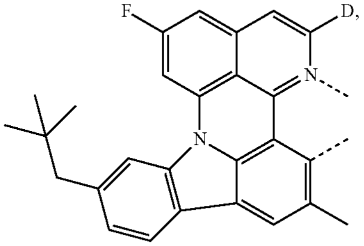
$L_{a1134}$ -continued
$L_{a1135}$
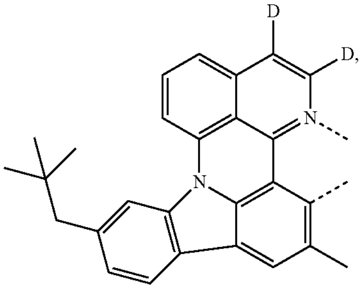
$L_{a1136}$
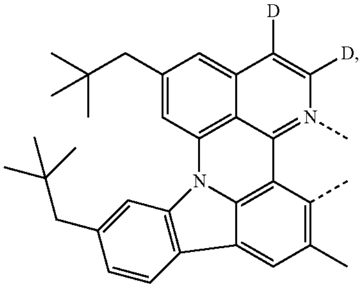
$L_{a1137}$
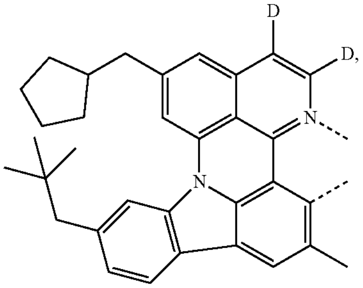
$L_{a1138}$
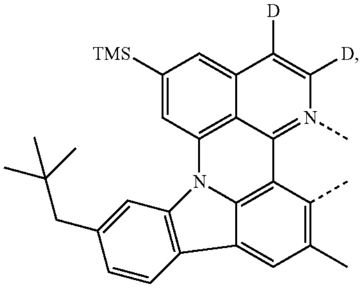
$L_{a1139}$
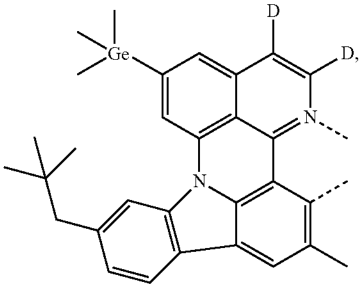
-continued
$L_{a140}$
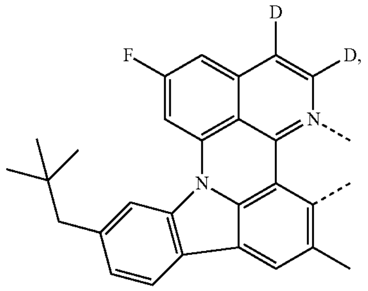
$L_{a1141}$
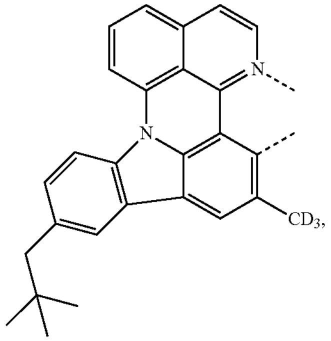
$L_{a1142}$
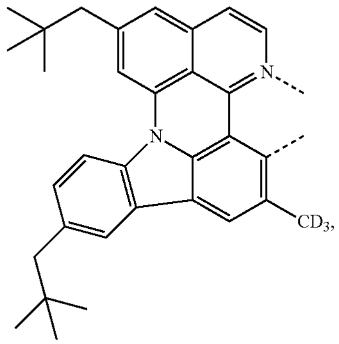
$L_{a1143}$
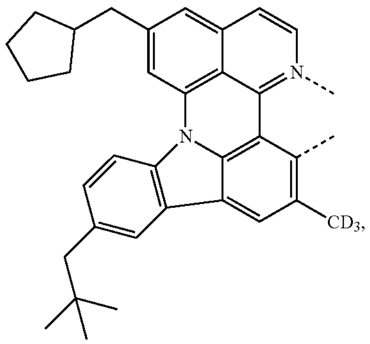

-continued
$L_{a1144}$
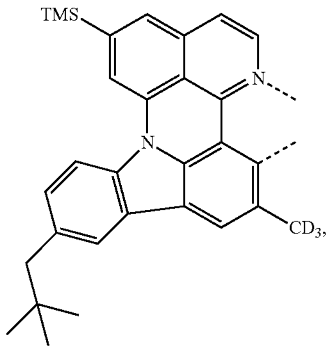
$L_{a1145}$
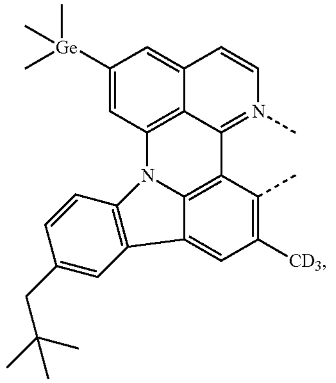
$L_{a1146}$
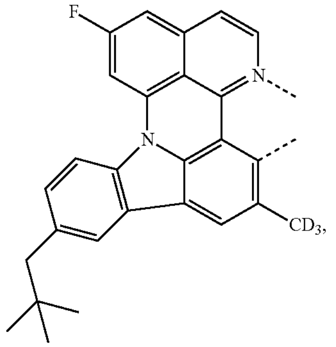
$L_{a1147}$
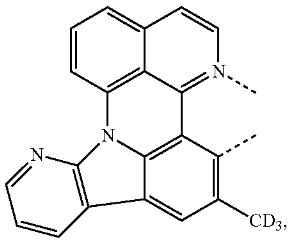
$L_{a1148}$
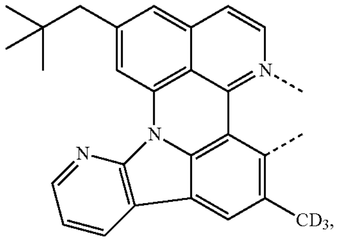
-continued
$L_{a1149}$
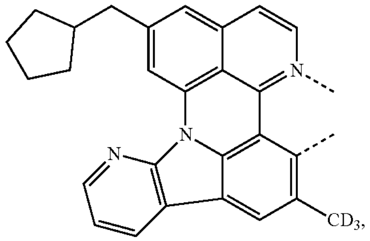
$L_{a1150}$
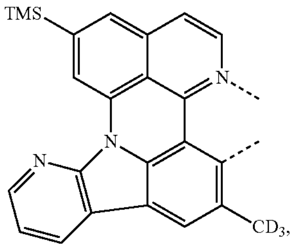
$L_{a1151}$
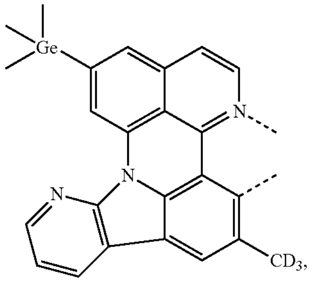
$L_{a1152}$
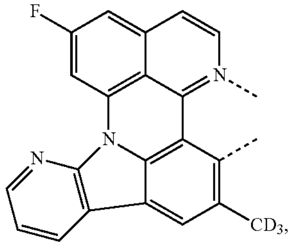
$L_{a1153}$
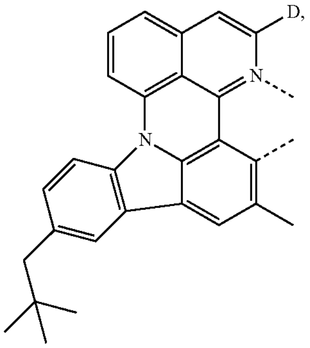

$L_{a1154}$
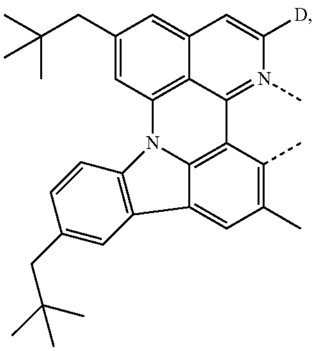
$L_{a1155}$
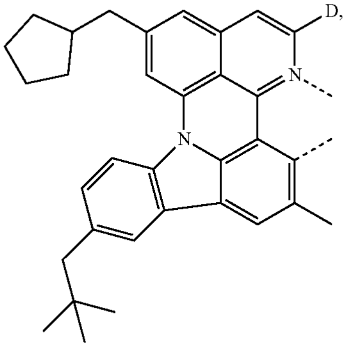
$L_{a1156}$
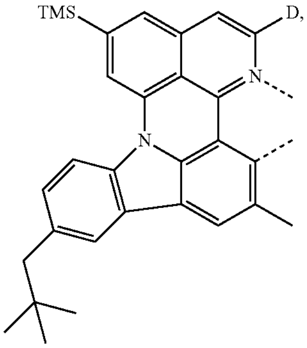
$L_{a1157}$
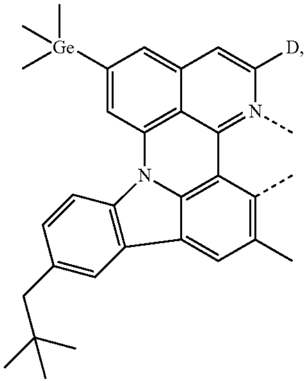
$L_{a1158}$
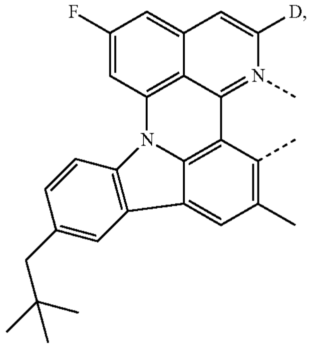
$L_{a1159}$
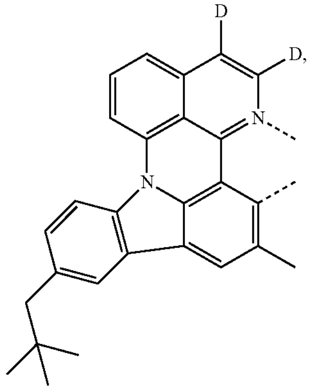
$L_{a1160}$
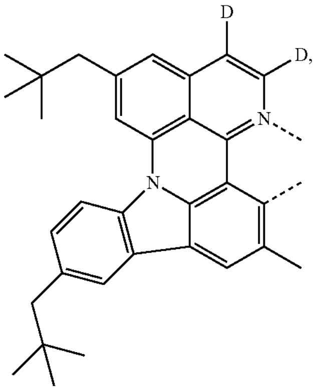
$L_{a1161}$
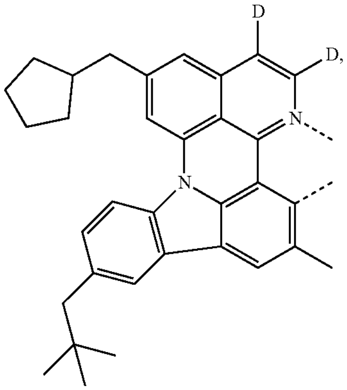

-continued
$L_{a1162}$
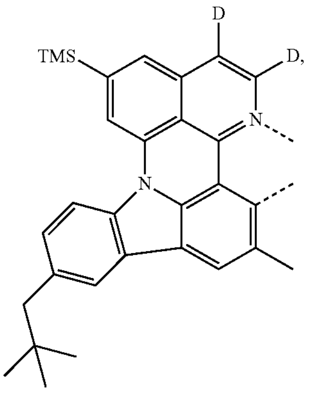
$L_{a1163}$
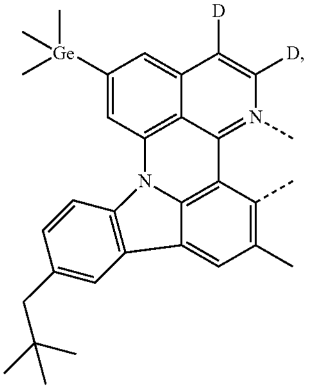
$L_{a1164}$
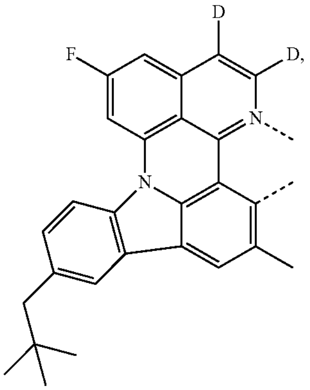
$L_{a1165}$
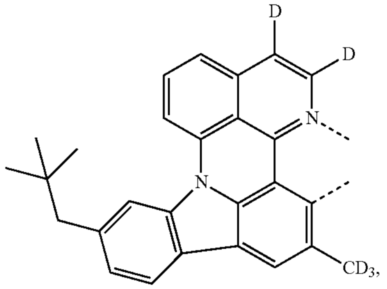
-continued
$L_{a1166}$
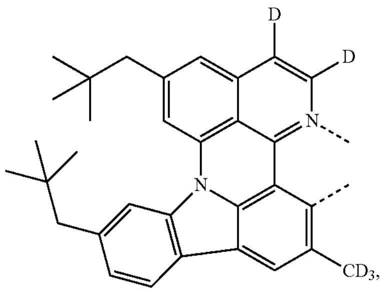
$L_{a1167}$
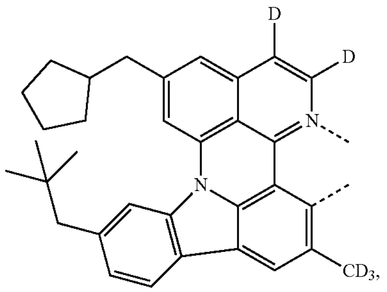
$L_{a1168}$
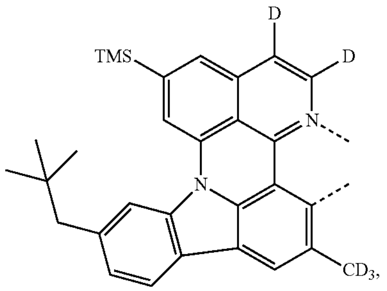
$L_{a1169}$
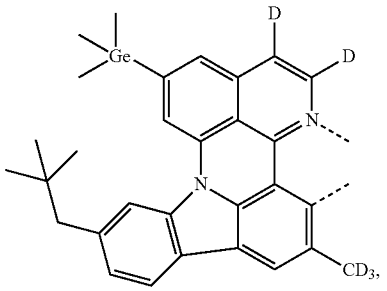
$L_{a1170}$
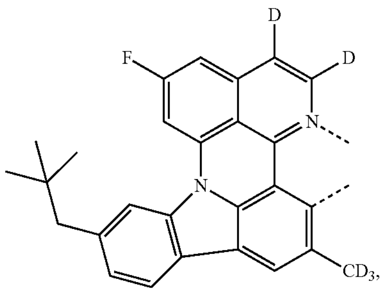

-continued
$L_{a1171}$
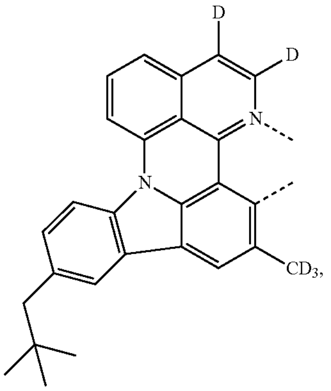
$L_{a1172}$
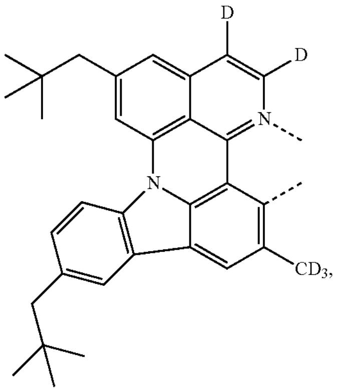
$L_{a1173}$
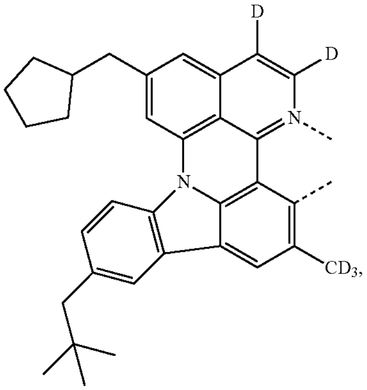
$L_{a1174}$
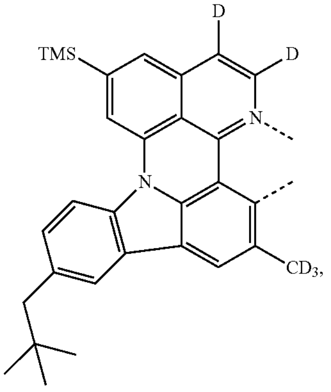
-continued
$L_{a1175}$
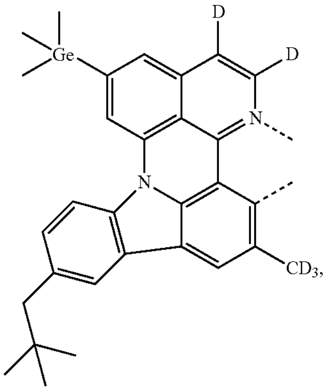
$L_{a1176}$
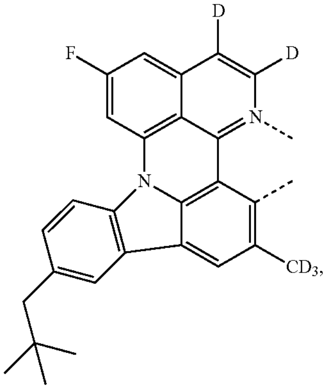
$L_{a1177}$
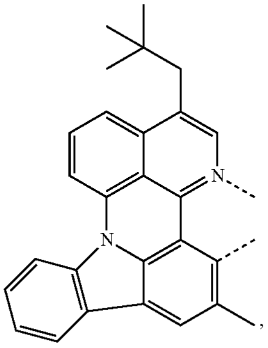
$L_{a1178}$
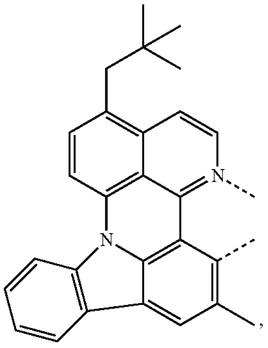

-continued
$L_{a1179}$
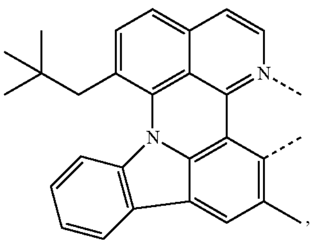
$L_{a1180}$
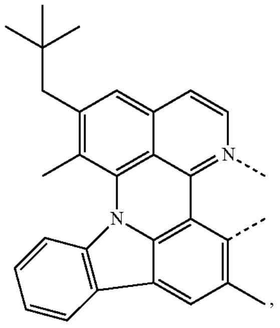
$L_{a1181}$
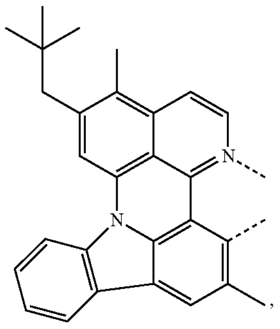
$L_{a1182}$
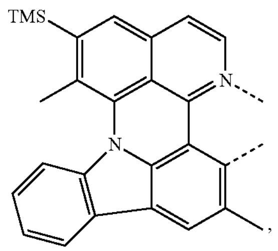
$L_{a1183}$
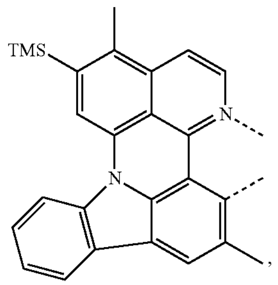
-continued
$L_{a1184}$
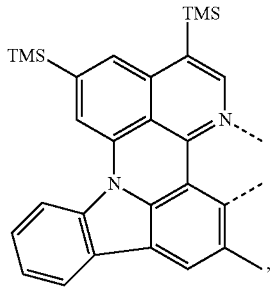
$L_{a1185}$
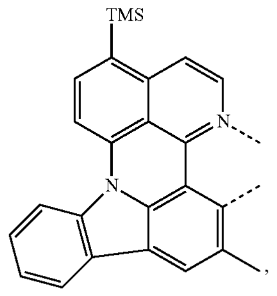
$L_{a1186}$
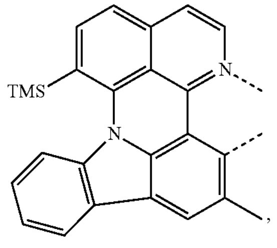
$L_{a1187}$
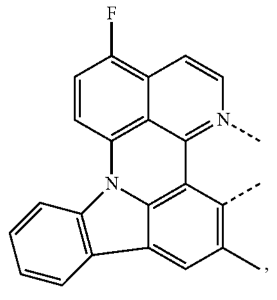
$L_{a1188}$
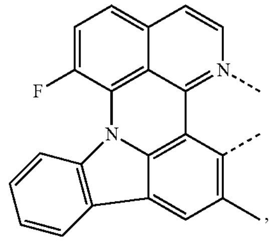

$L_{a1189}$
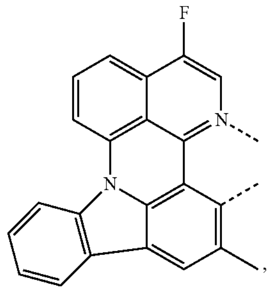
$L_{a1190}$
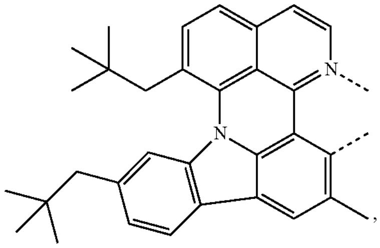
$L_{a1191}$
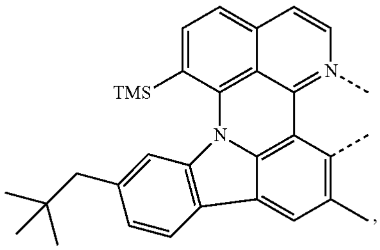
$L_{a1192}$
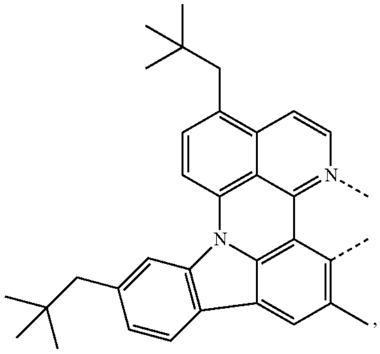
$L_{a1193}$
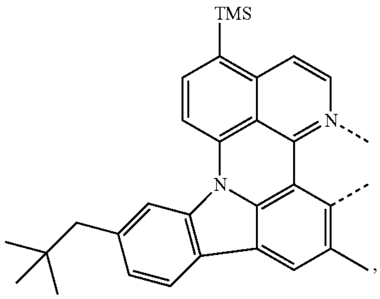
$L_{a1194}$
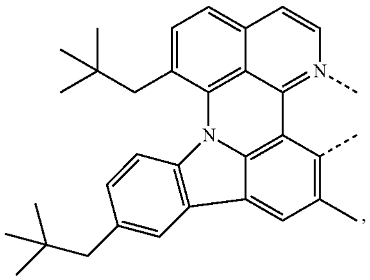
$L_{a1195}$
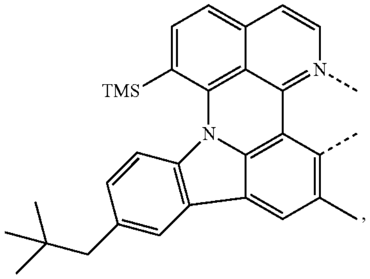
$L_{a1196}$
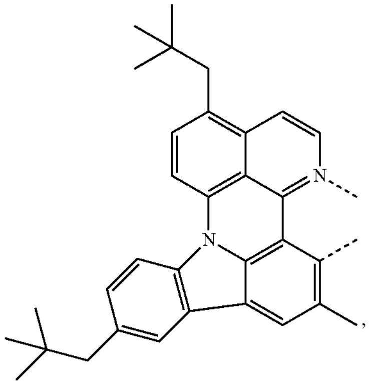
$L_{a1197}$
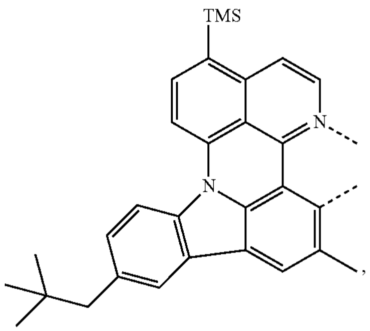

-continued
$L_{a1198}$
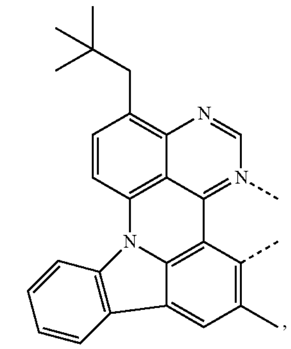
$L_{a1199}$
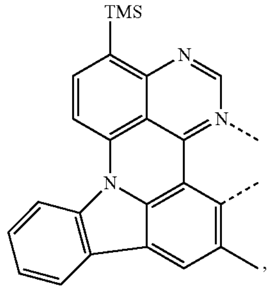
$L_{a1200}$
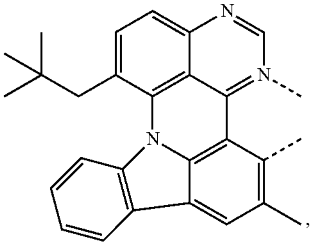
$L_{a1201}$
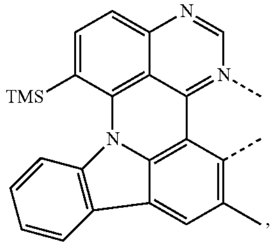
$L_{a1202}$
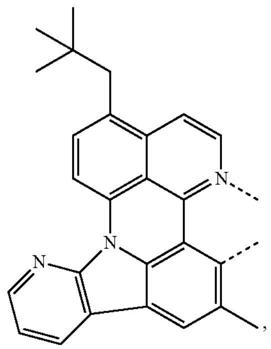
-continued
$L_{a1203}$
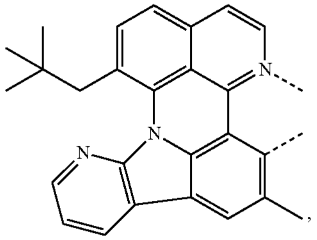
$L_{a1204}$
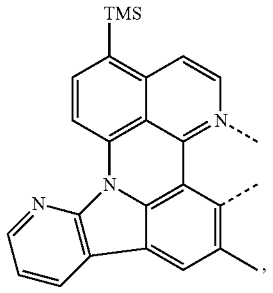
$L_{a1205}$
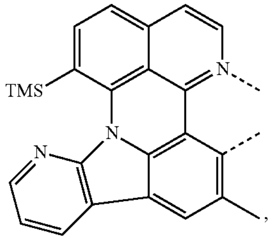
$L_{a1206}$
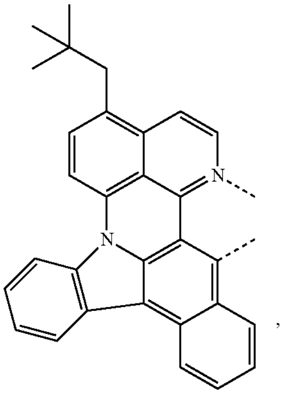
$L_{a1207}$
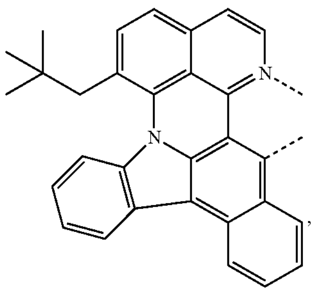

-continued
$L_{a1208}$
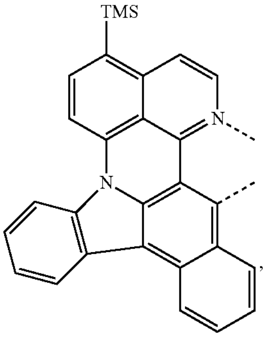
$L_{a1209}$
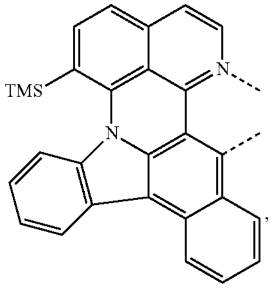
$L_{a1210}$
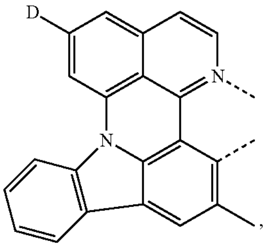
$L_{a1211}$
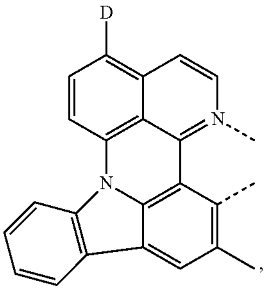
$L_{a1212}$
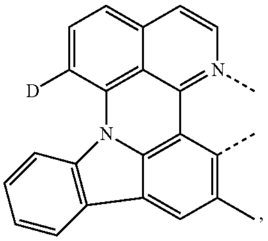
-continued
$L_{a1213}$
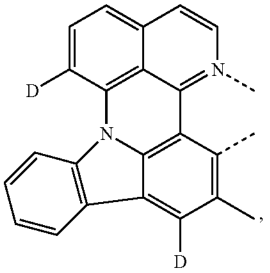
$L_{a1214}$
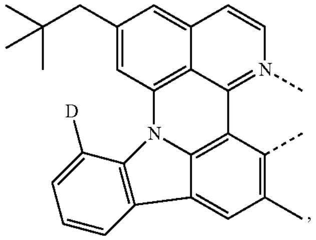
$L_{a1215}$
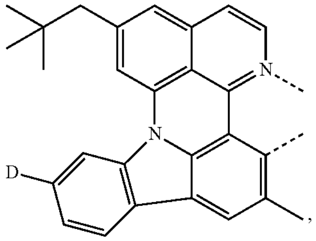
$L_{a1216}$
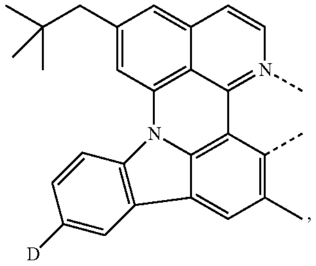
$L_{a1217}$
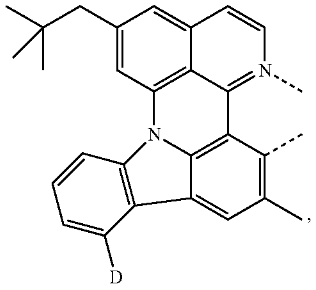

-continued
$L_{a1218}$
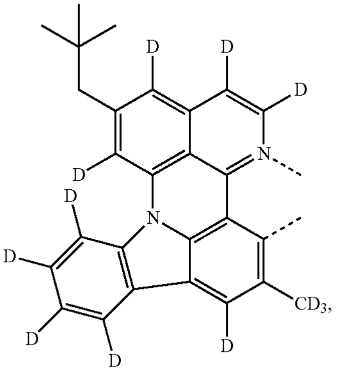
$L_{a1219}$
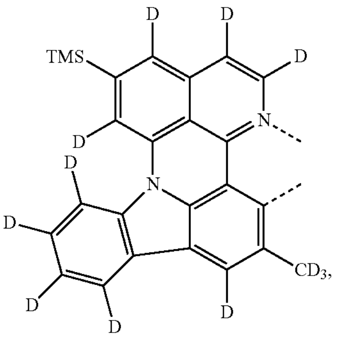
$L_{a1220}$
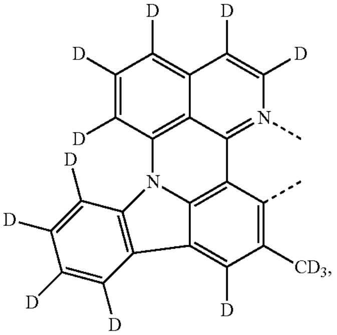
$L_{a1221}$
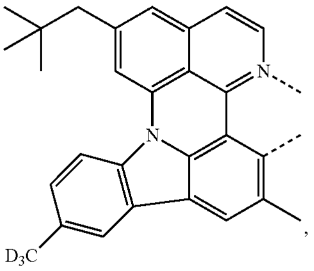
$L_{a1222}$
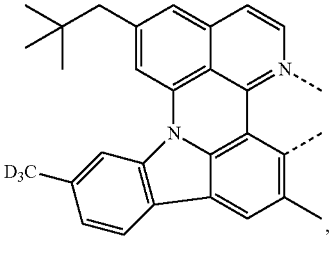
-continued
$L_{a1223}$
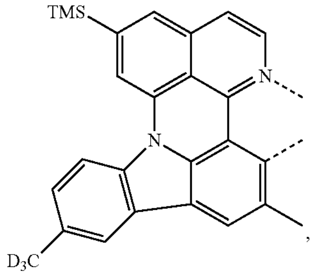
$L_{a1224}$
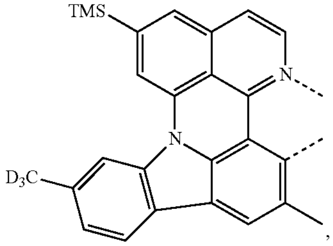
$L_{a1225}$
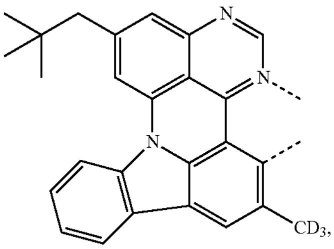
$L_{a1226}$
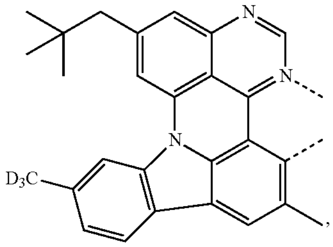
$L_{a1227}$
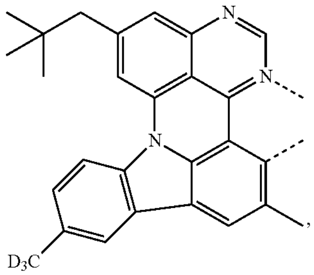
$L_{a1228}$
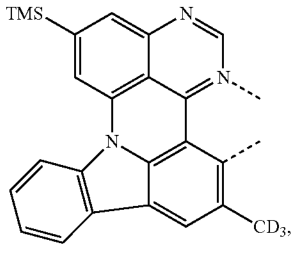

-continued
$L_{a1229}$
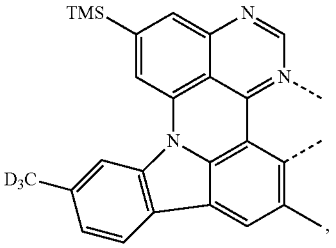
$L_{a1230}$
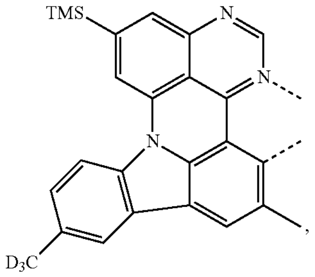
$L_{a1231}$
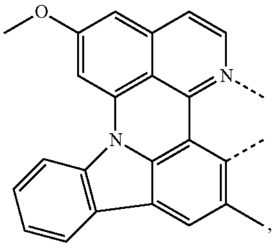
$L_{a1232}$
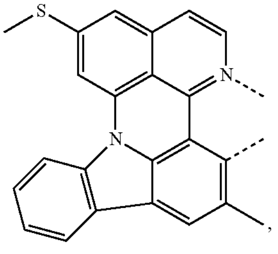
$L_{a1233}$
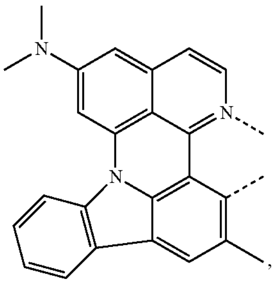
$L_{a1234}$
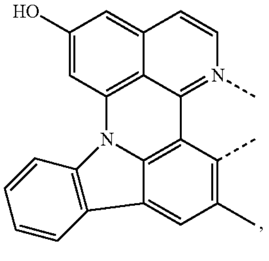
-continued
$L_{a1235}$
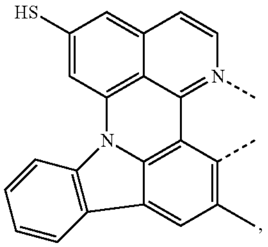
$L_{a1236}$
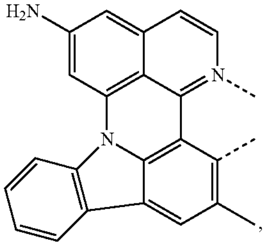
$L_{a1237}$
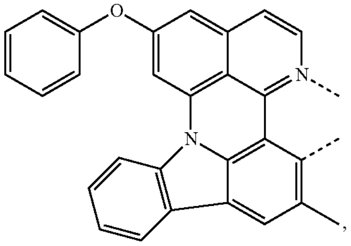
$L_{a1238}$
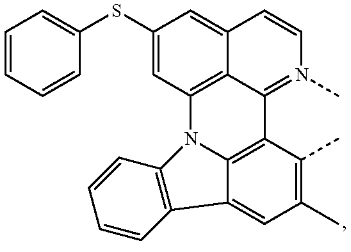
$L_{a1239}$
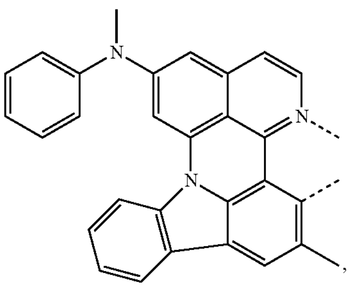

-continued
$L_{a1240}$
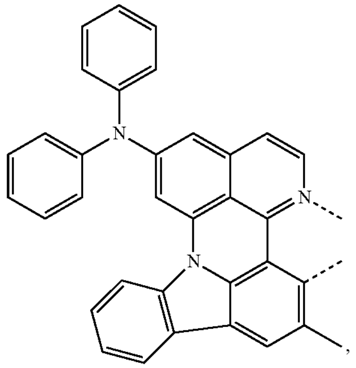
$L_{a1241}$
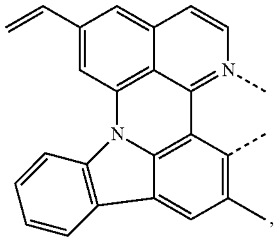
$L_{a1242}$
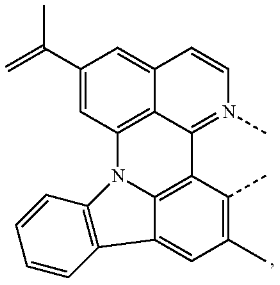
$L_{a1243}$
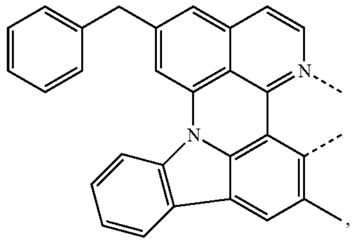
$L_{a1244}$
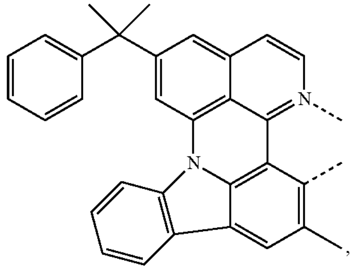
-continued
$L_{a1245}$
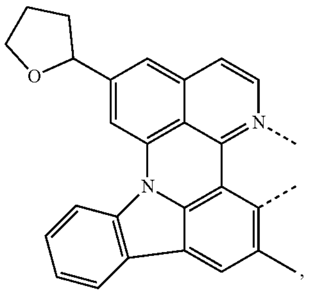
$L_{a1246}$
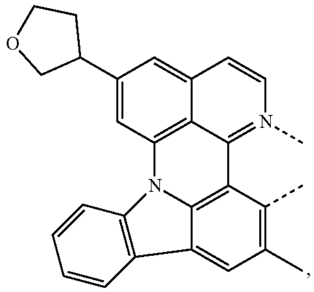
$L_{a1247}$
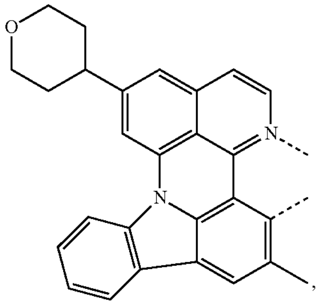
$L_{a1248}$
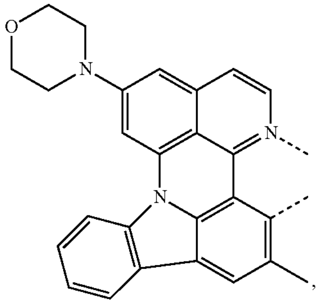
$L_{a1249}$
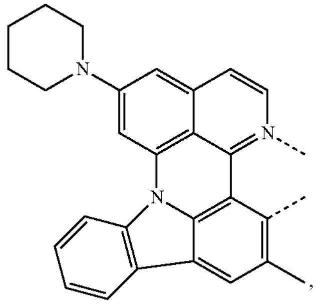

-continued
$L_{a1250}$
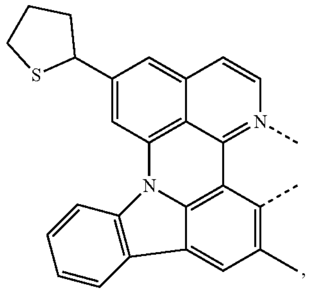
$L_{a1251}$
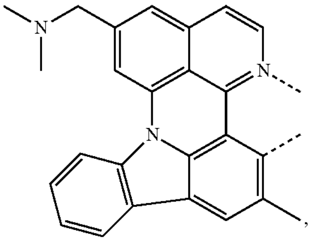
$L_{a1252}$
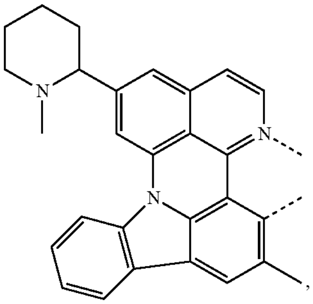
$L_{a1253}$
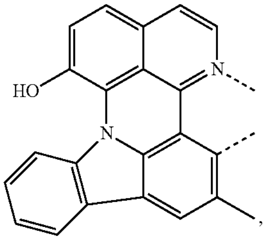
$L_{a1254}$
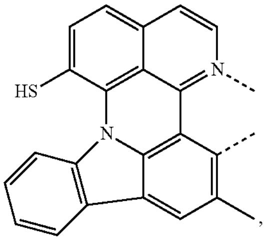
$L_{a1255}$
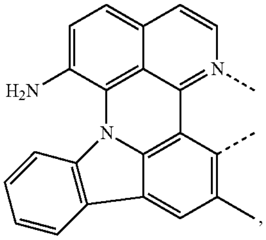
-continued
$L_{a1256}$
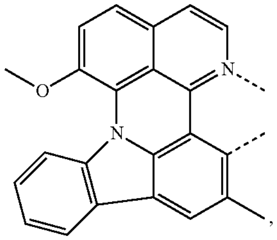
$L_{a1257}$
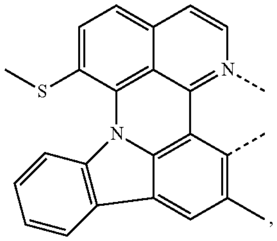
$L_{a1258}$
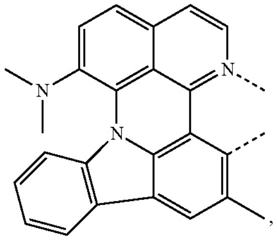
$L_{a1259}$
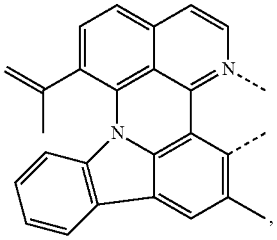
$L_{a1260}$
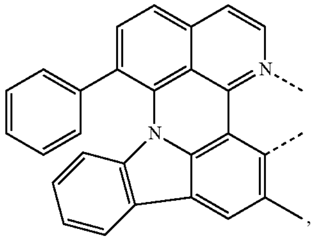
$L_{a1261}$
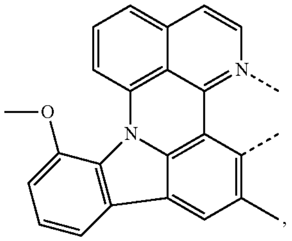

-continued
$L_{a1262}$
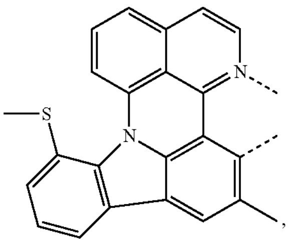
$L_{a1263}$
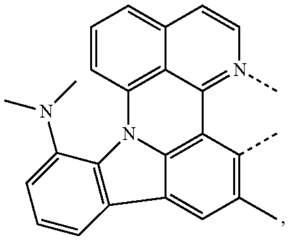
$L_{a1264}$
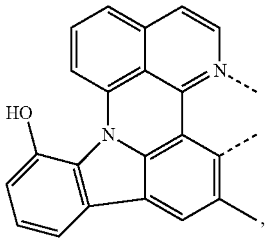
$L_{a1265}$
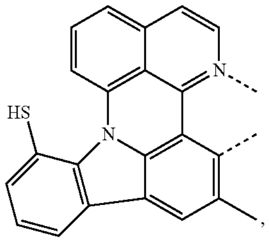
$L_{a1266}$
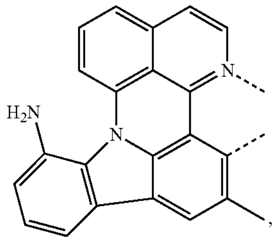
$L_{a1267}$
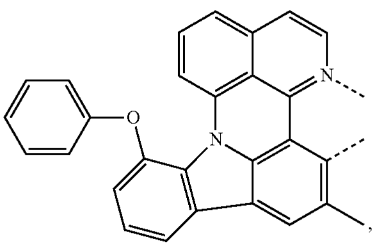
-continued
$L_{a1268}$
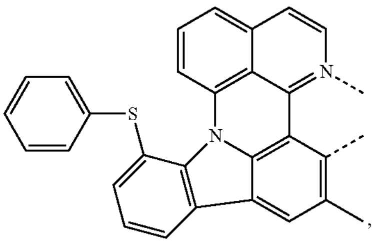
$L_{a1269}$
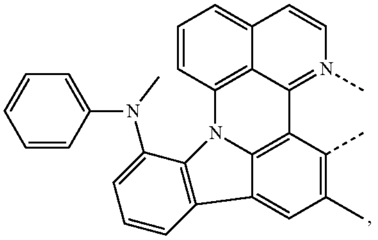
$L_{a1270}$
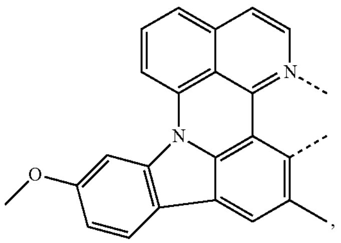
$L_{a1271}$
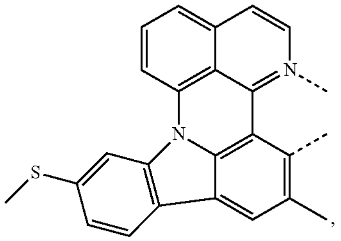
$L_{a1272}$
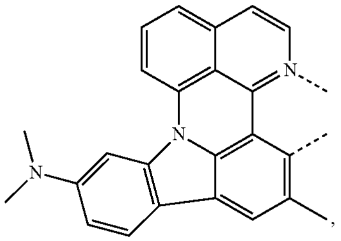
$L_{a1273}$
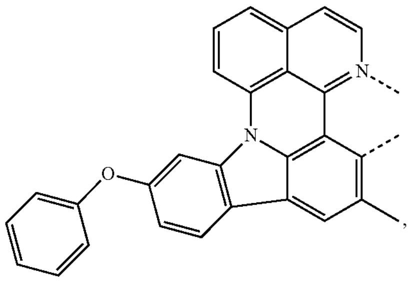

$L_{a1274}$
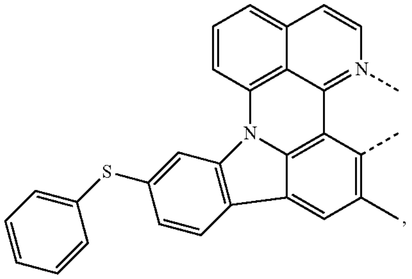
$L_{a1275}$
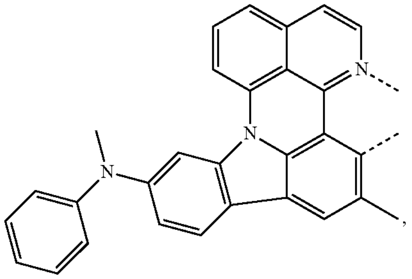
$L_{a1276}$
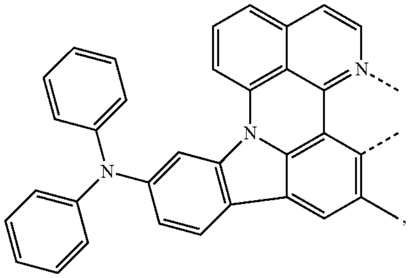
$L_{a1277}$
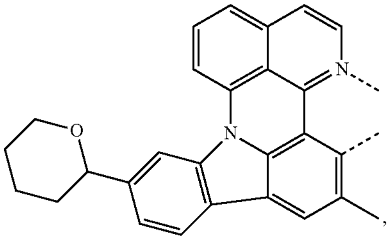
$L_{a1278}$
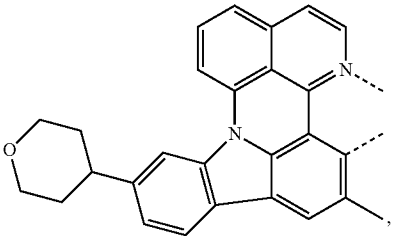
$L_{a1279}$
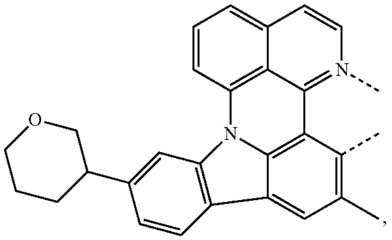
$L_{a1280}$
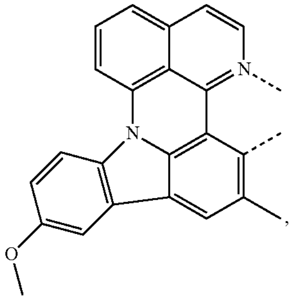
$L_{a1281}$
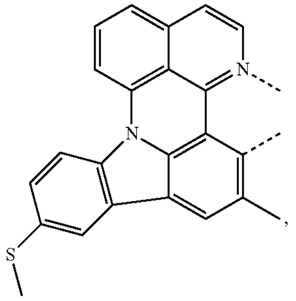
$L_{a1282}$
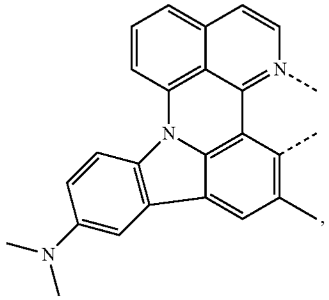
$L_{a1283}$
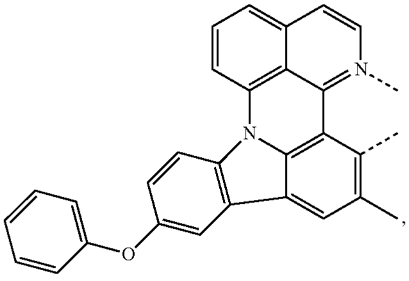
$L_{a1284}$
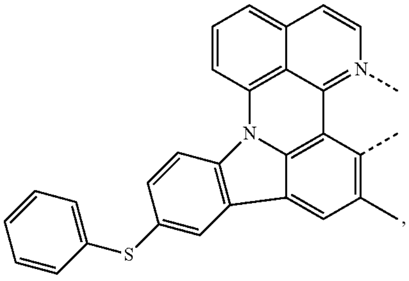

-continued
$L_{a1285}$
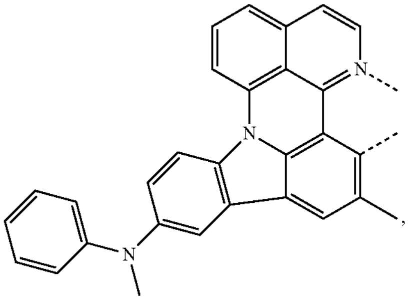
$L_{a1286}$
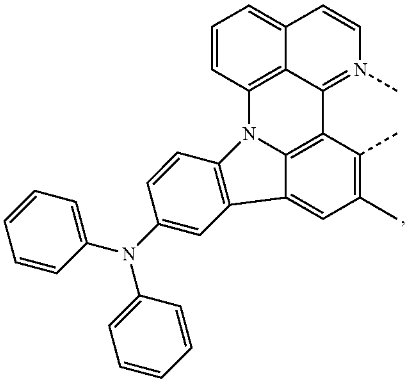
$L_{a1287}$
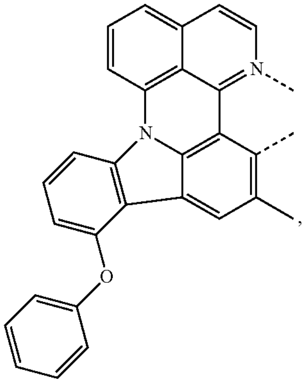
$L_{a1288}$
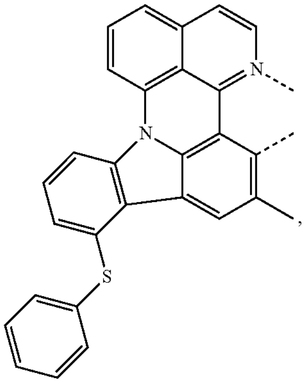
-continued
$L_{a1289}$
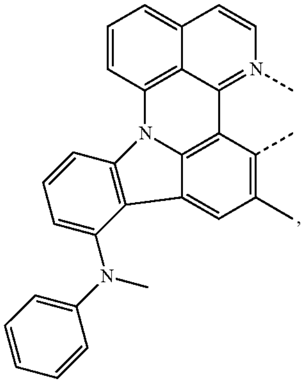
$L_{a1290}$
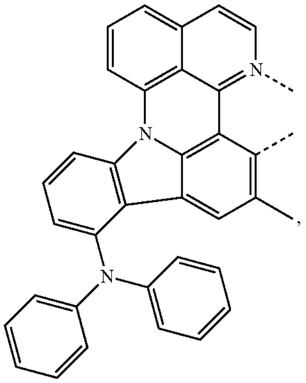
$L_{a1291}$
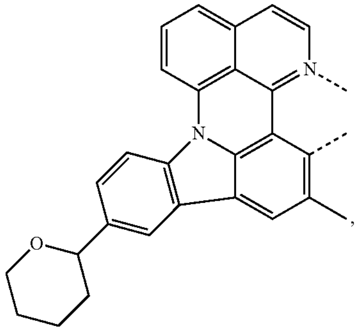
$L_{a1292}$
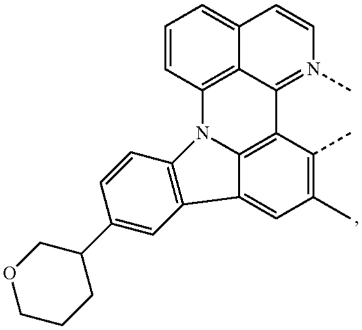

-continued
$L_{a1293}$
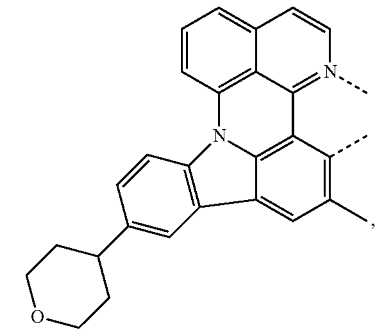
$L_{a1294}$
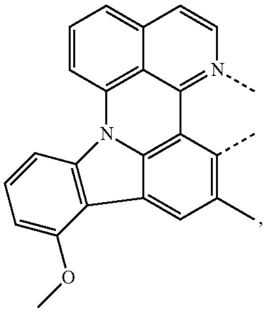
$L_{a1295}$
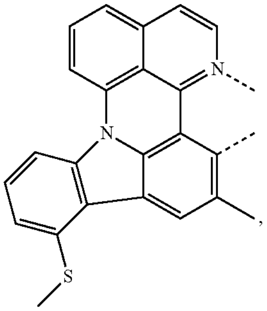
$L_{a1296}$
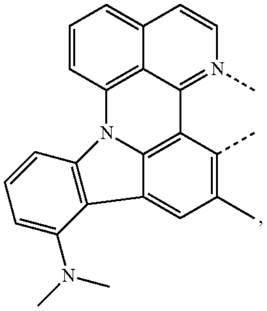
$L_{a1297}$
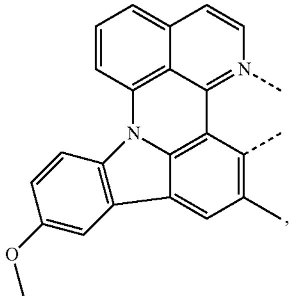
-continued
$L_{a1298}$
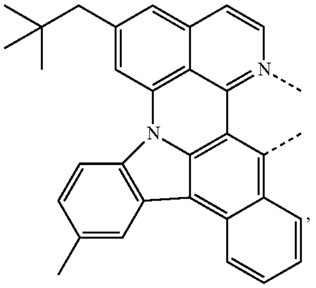
$L_{a1299}$
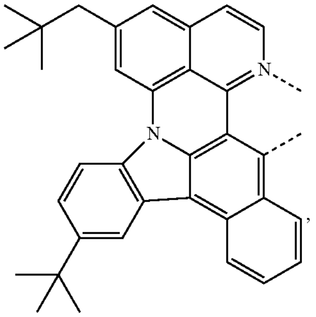
$L_{a1300}$
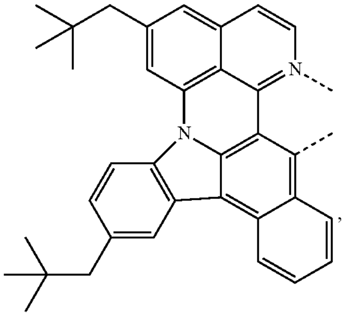
$L_{a1301}$
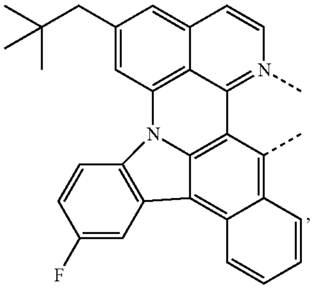
$L_{a1302}$
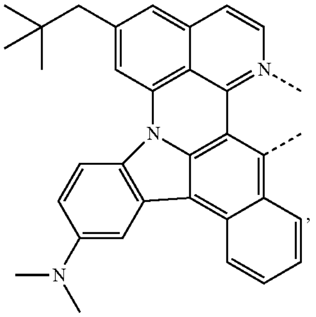

-continued
$L_{a1303}$
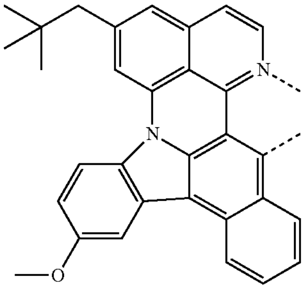
,
$L_{a1304}$
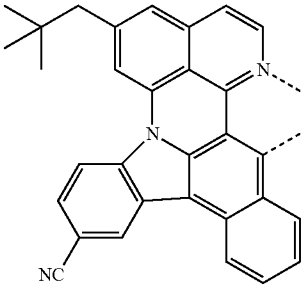
,
$L_{a1305}$
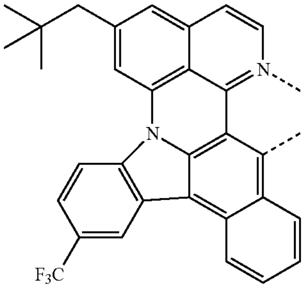
,
$L_{a1306}$
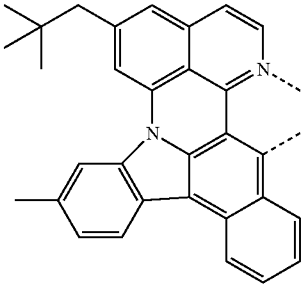
,
$L_{a1307}$
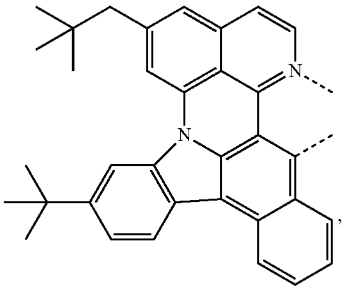
,
-continued
$L_{a1308}$
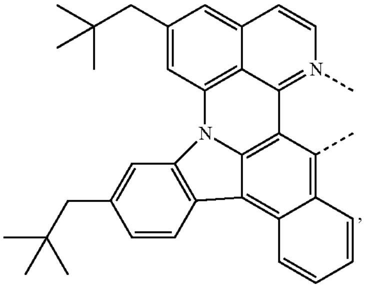
,
$L_{a1309}$
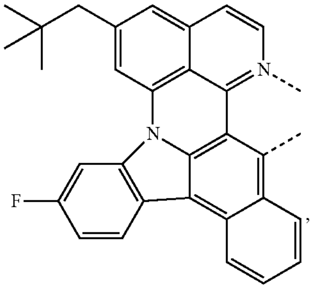
,
$L_{a1310}$
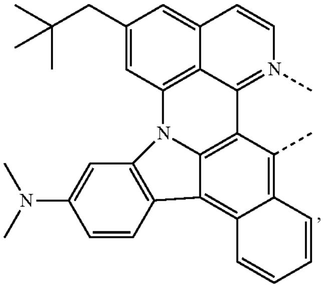
,
$L_{a1311}$
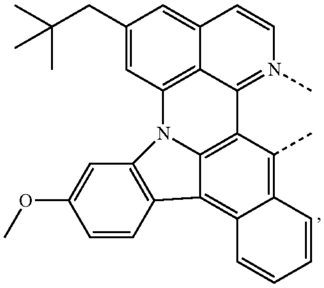
,
$L_{a1312}$
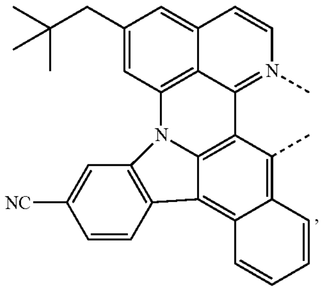
, $L_{a1313}$
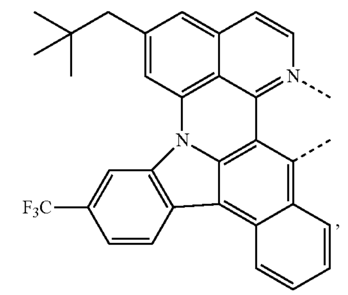
$L_{a1314}$
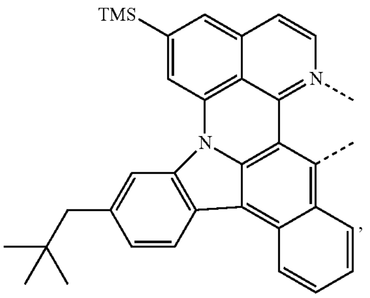
$L_{a1315}$
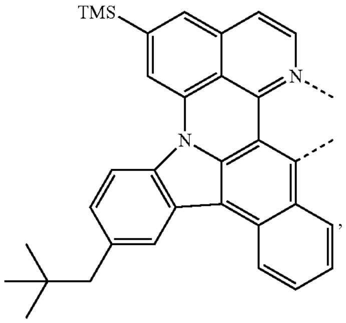
$L_{a1316}$
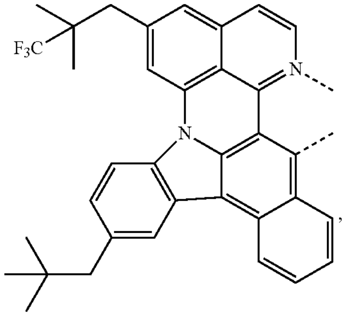
$L_{a1317}$
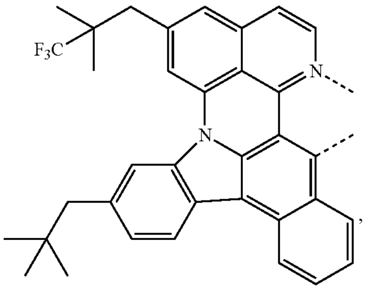
$L_{a1318}$
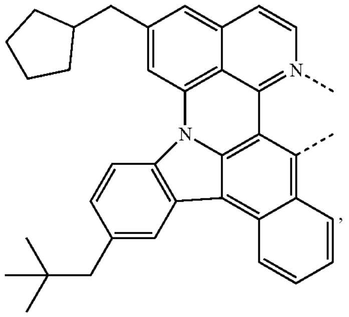
$L_{a1319}$
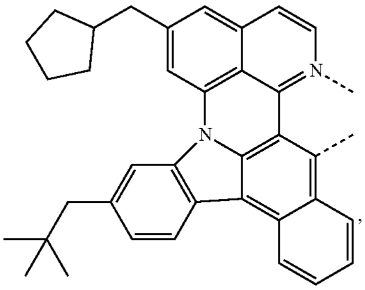
$L_{a1320}$
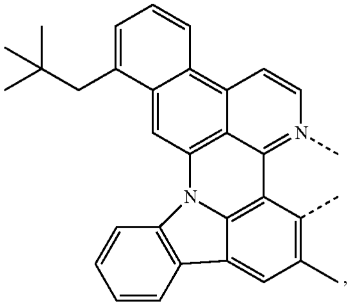
$L_{a1321}$
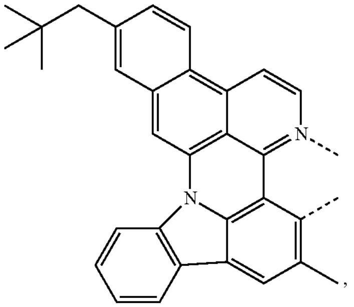

-continued
$L_{a1322}$
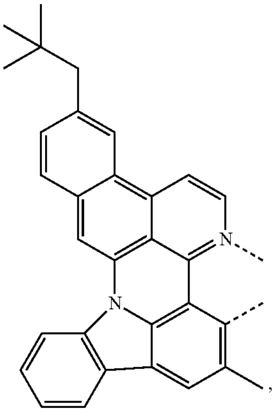
$L_{a1323}$
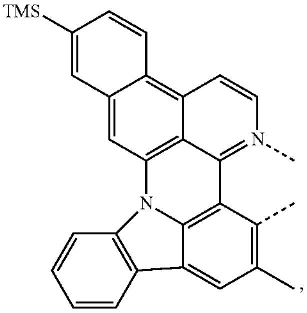
$L_{a1324}$
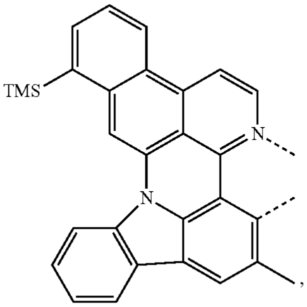
$L_{a1325}$
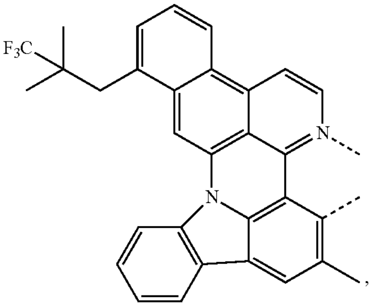
-continued
$L_{a1326}$
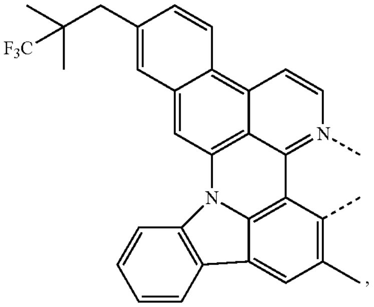
$L_{a1327}$
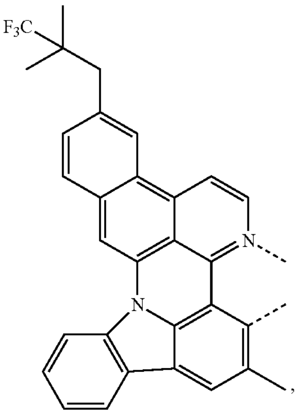
$L_{a1328}$
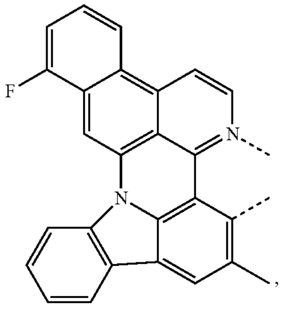
$L_{a1329}$
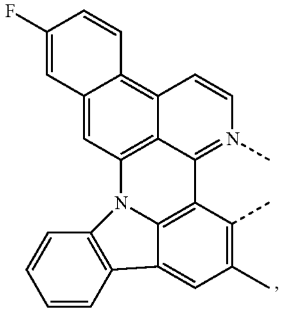

$L_{a1330}$
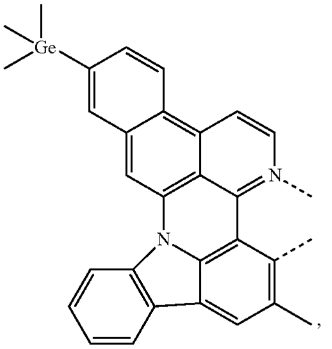
$L_{a1331}$
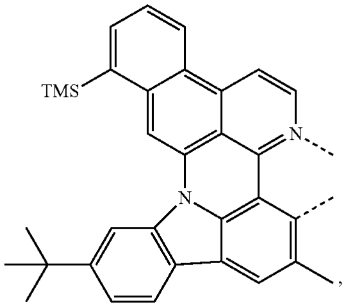
$L_{a1332}$
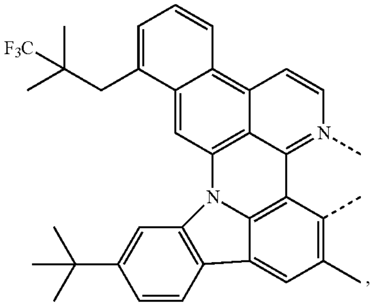
$L_{a1333}$
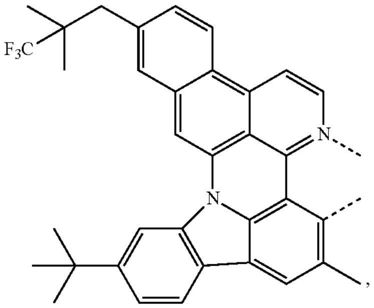
$L_{a1334}$
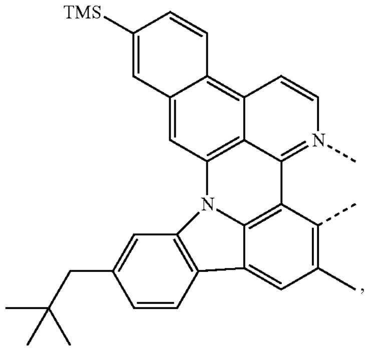
$L_{a1335}$
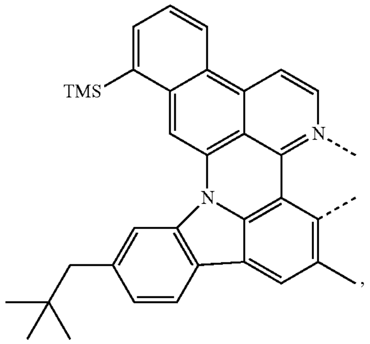
$L_{a1336}$
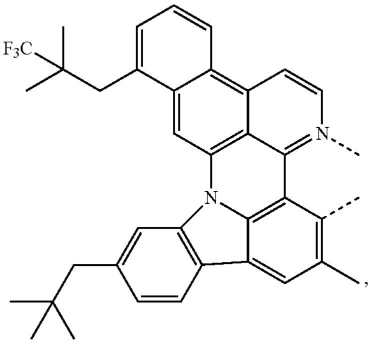
$L_{a1337}$
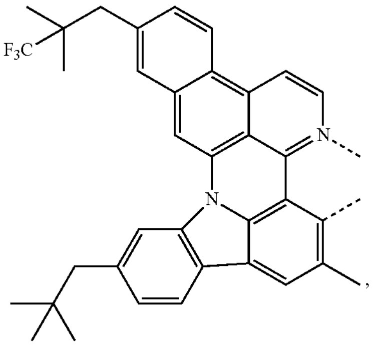

-continued $L_{a1338}$

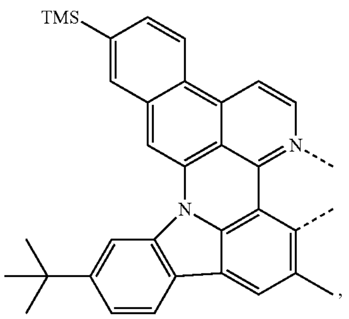

$L_{a1339}$

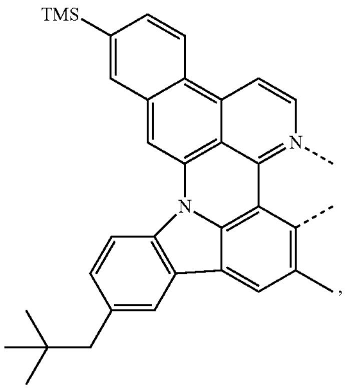

$L_{a1340}$

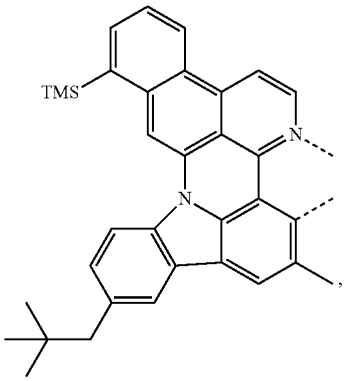

$L_{a1341}$

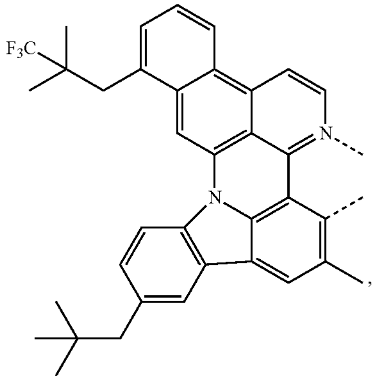

, and

-continued $L_{a1342}$

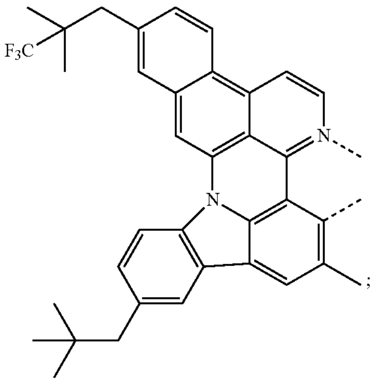

wherein TMS represents trimethylsilyl, and Ph represents phenyl;

wherein, optionally, hydrogen in the structures $L_{a1}$ to $L_{a956}$, $L_{a985}$ to $L_{a1009}$, $L_{a1020}$ to $L_{a1074}$, $L_{a1097}$ to $L_{a1100}$, $L_{a1105}$ to $L_{a1342}$ can be partially or completely substituted with deuterium.

17. The metal complex of claim 1, having a general formula of $M(L_a)_m(L_b)_n(L_c)_q$;

wherein the metal M is selected from Ir, Rh, Re, Os, Pt, Au or Cu $L_a$, $L_b$ and $L_c$ are a first ligand, a second ligand and a third ligand coordinated to the metal M, respectively; m is selected from 1, 2 or 3, n is selected from 0, 1 or 2, q is selected from 0, 1 or 2, and m+n+q is equal to an oxidation state of the metal M; when m is equal to 2 or 3, a plurality of $L_a$ can be identical or different; when n is equal to 2, two $L_b$ can be identical or different; and when q is equal to 2, two $L_c$ can be identical or different;

$L_a$, $L_b$, and $L_c$ can be optionally joined to form a multidentate ligand;

$L_b$ and $L_c$ are, at each occurrence identically or differently, selected from the group consisting of the following structures:

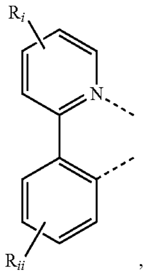

,

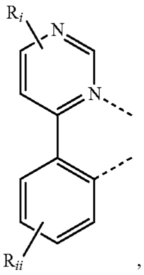

,

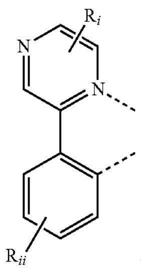

, and

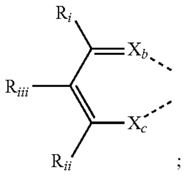

;

wherein, $R_i$, $R_{ii}$ represent, at each occurrence identically or differently, mono-substitution, multiple substitutions or non-substitution;

$X_b$ and $X_c$ are, at each occurrence identically or differently, selected from the group consisting of: O, S, Se, and $NR_{N2}$;

$R_i$, $R_{ii}$, $R_{iii}$, $R_{N2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_i$, $R_{ii}$, $R_{iii}$, $R_{N2}$ can be optionally joined to form a ring.

18. The metal complex of claim 17, wherein $L_b$ is, at each occurrence identically or differently, selected from the following structure:

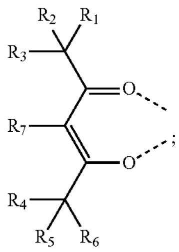

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

19. The metal complex of claim 18, wherein at least one or two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof; and/or at least one or two of $R_4$ to $R_6$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof.

20. The metal complex of claim 16, wherein $L_b$ is, at each occurrence identically or differently, selected from the group consisting of the following structures:

$L_{b1}$

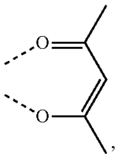, $L_{b2}$

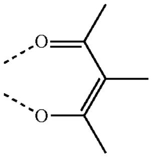, $L_{b3}$

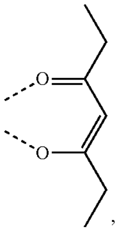, $L_{b4}$

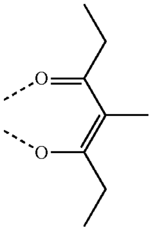, $L_{b5}$

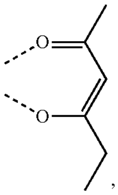,

-continued
$L_{b6}$
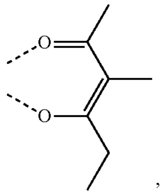
,
$L_{b7}$
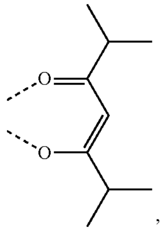
,
$L_{b8}$
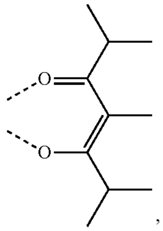
,
$L_{b9}$
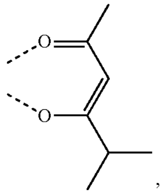
,
$L_{b10}$
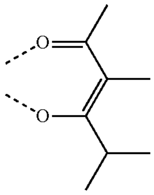
,
$L_{b11}$
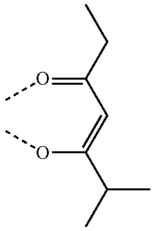
,
$L_{b12}$
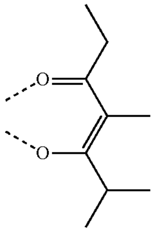
,
-continued
$L_{b13}$
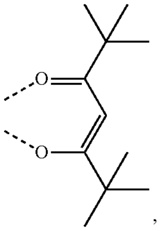
,
$L_{b14}$
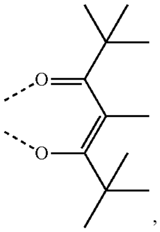
,
$L_{b15}$
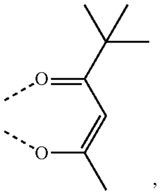
,
$L_{b16}$
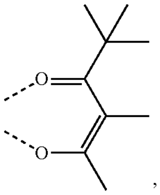
,
$L_{b17}$
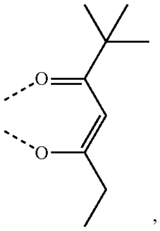
,
$L_{b18}$
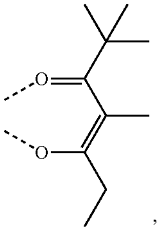
,
$L_{b19}$
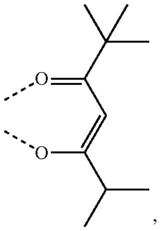
, -continued
$L_{b20}$
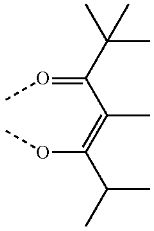,
$L_{b21}$
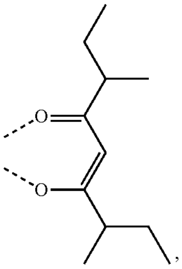,
$L_{b22}$
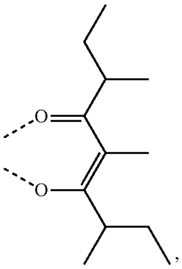,
$L_{b23}$
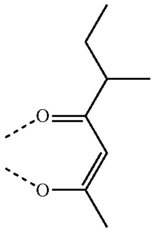,
$L_{b24}$
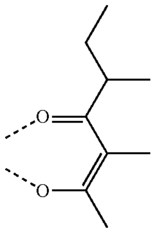,
$L_{b25}$
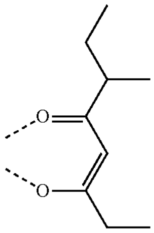,
-continued
$L_{b26}$
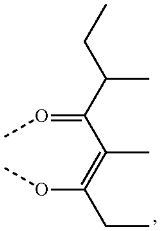,
$L_{b27}$
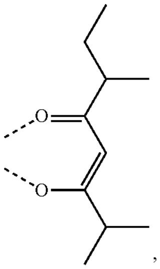,
$L_{b28}$
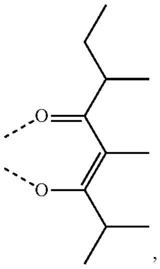,
$L_{b29}$
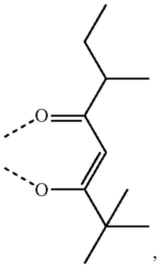,
$L_{b30}$
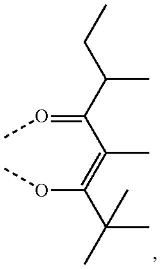, -continued
$L_{b31}$
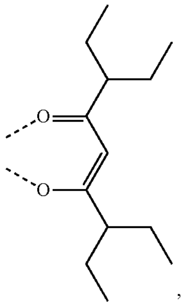
,
$L_{b32}$
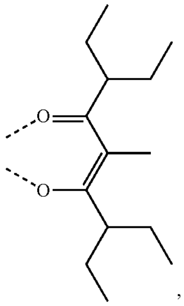
,
$L_{b33}$
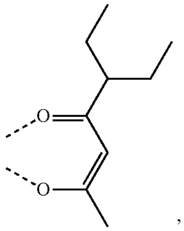
,
$L_{b34}$
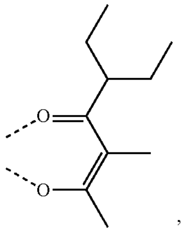
,
$L_{b35}$
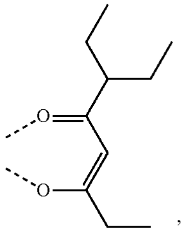
,
$L_{b36}$
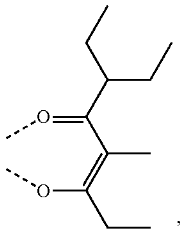
,
-continued
$L_{b37}$
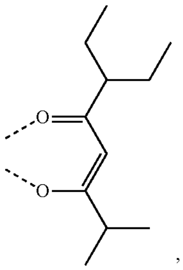
,
$L_{b38}$
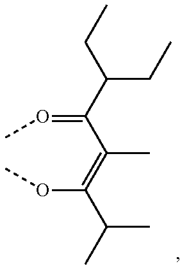
,
$L_{b39}$
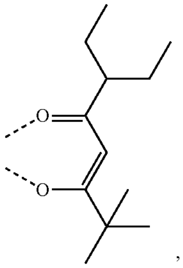
,
$L_{b40}$
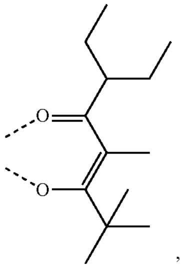
,
$L_{b41}$
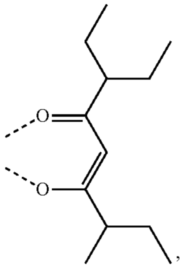
, -continued
$L_{b42}$
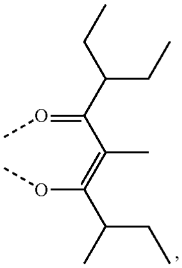
,
$L_{b43}$
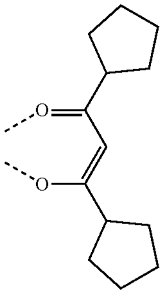
,
$L_{b44}$
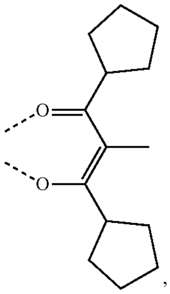
,
$L_{b45}$
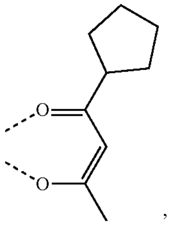
,
$L_{b46}$
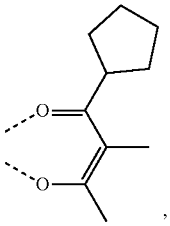
,
$L_{b47}$
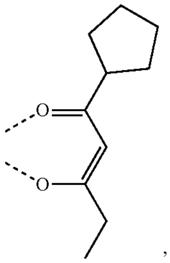
,
-continued
$L_{b48}$
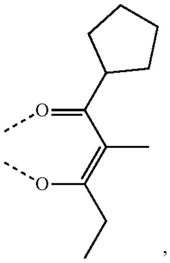
,
$L_{b49}$
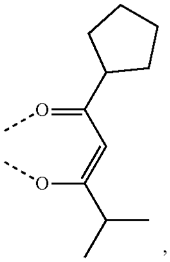
,
$L_{b50}$
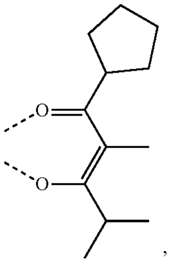
,
$L_{b51}$
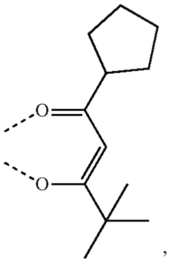
,
$L_{b52}$
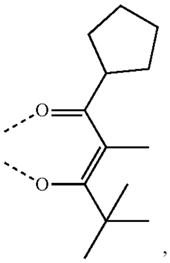
,
$L_{b53}$
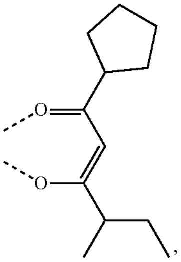
, -continued
$L_{b54}$
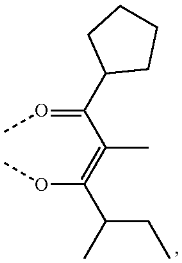
,
$L_{b55}$
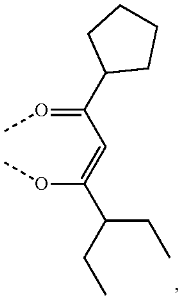
,
$L_{b56}$
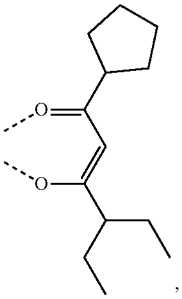
,
$L_{b57}$
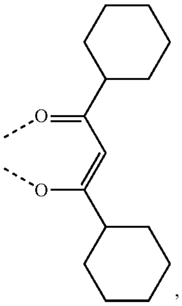
,
$L_{b58}$
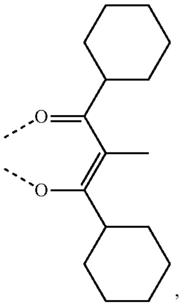
,
-continued
$L_{b59}$
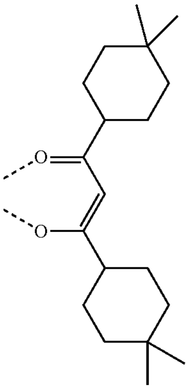
,
$L_{b60}$
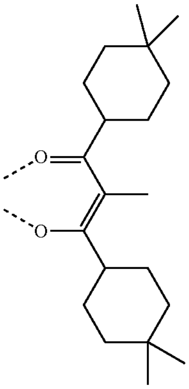
,
$L_{b61}$
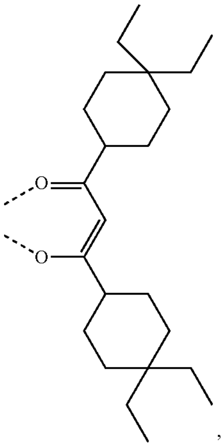
, -continued
$L_{b62}$
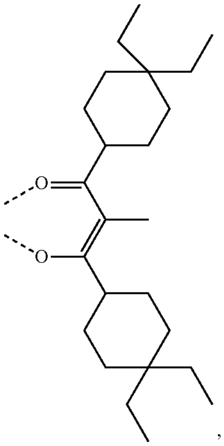
,
$L_{b63}$
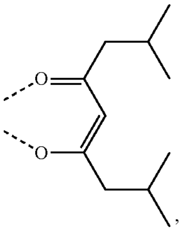
,
$L_{b64}$
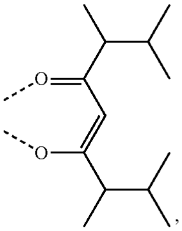
,
$L_{b65}$
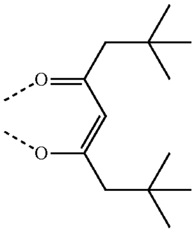
,
$L_{b66}$
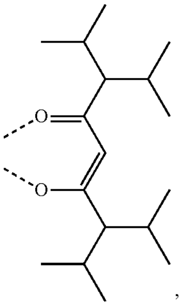
,
-continued
$L_{b67}$
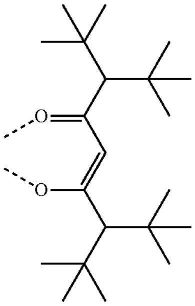
,
$L_{b68}$
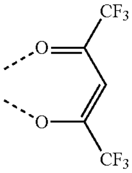
,
$L_{b69}$
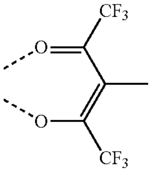
,
$L_{b70}$
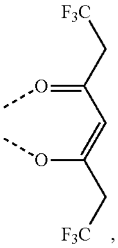
,
$L_{b71}$
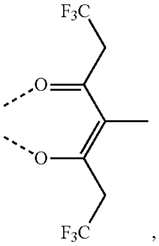
,
$L_{b72}$
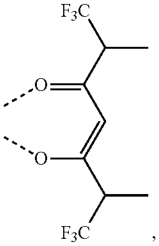
, -continued
$L_{b73}$
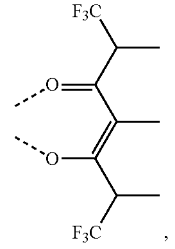
,
$L_{b74}$
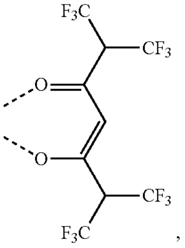
,
$L_{b75}$
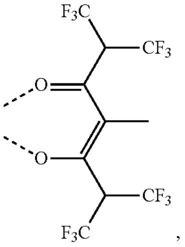
,
$L_{b76}$
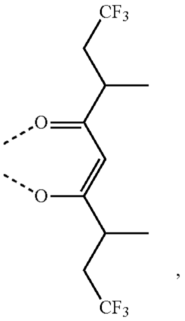
,
$L_{b77}$
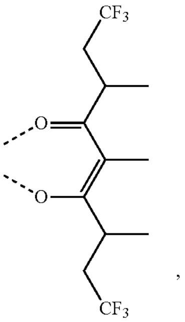
,
-continued
$L_{b78}$
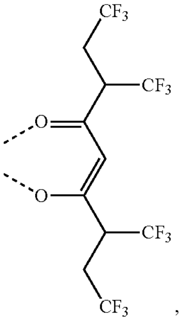
,
$L_{b79}$
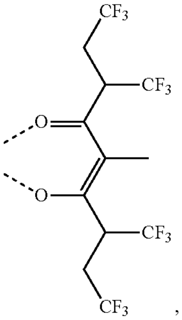
,
$L_{b80}$
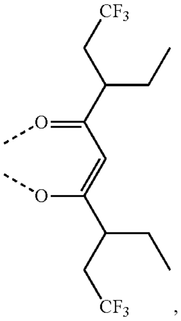
,
$L_{b81}$
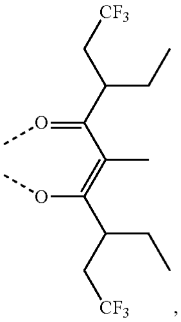
,
$L_{b82}$
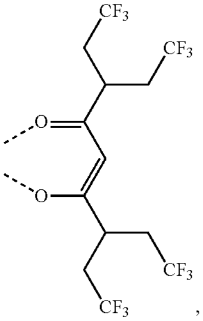
, -continued
$L_{b83}$
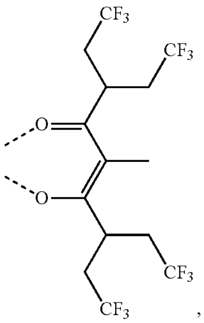
,
$L_{b84}$
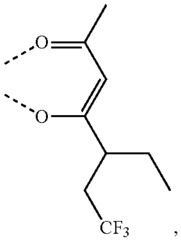
,
$L_{b85}$
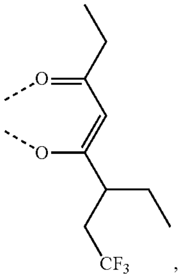
,
$L_{b86}$
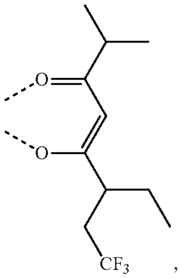
,
$L_{b87}$
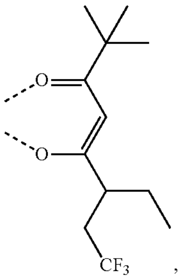
,
-continued
$L_{b88}$
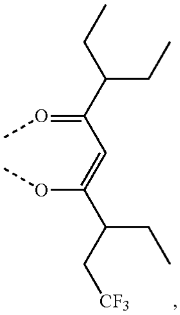
,
$L_{b89}$
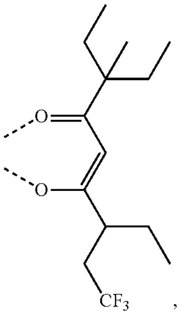
,
$L_{b90}$
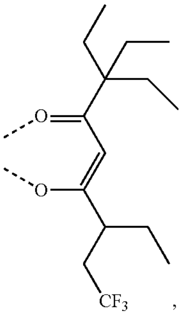
,
$L_{b91}$
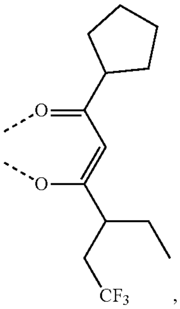
,
$L_{b92}$
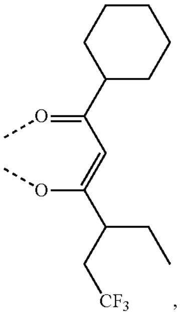
, -continued
$L_{b93}$
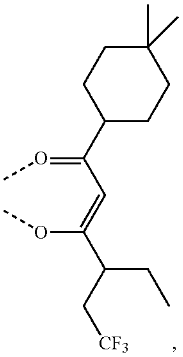
,
$L_{b94}$
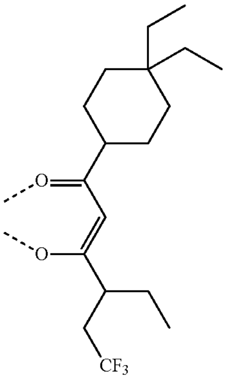
,
$L_{b95}$
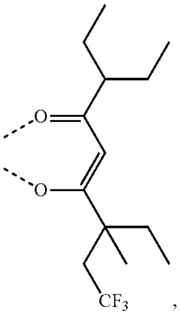
,
$L_{b96}$
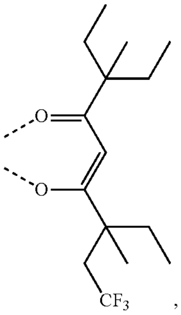
,
-continued
$L_{b97}$
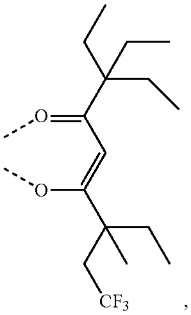
,
$L_{b98}$
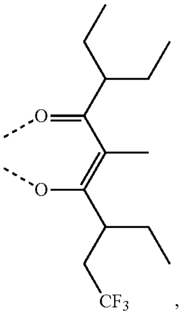
,
$L_{b99}$
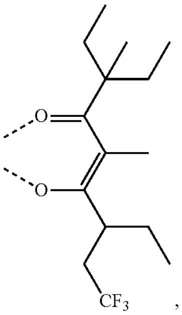
,
$L_{b100}$
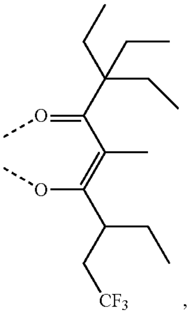
,
$L_{b101}$
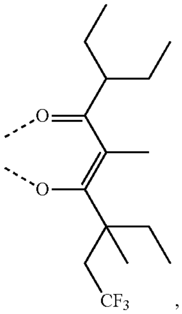
, -continued
$L_{b102}$
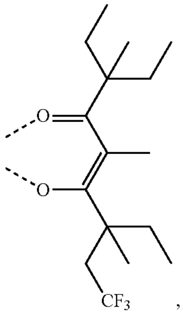
,
$L_{b103}$
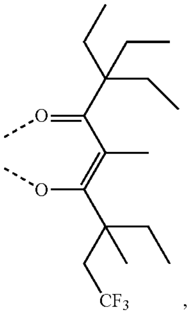
,
$L_{b104}$
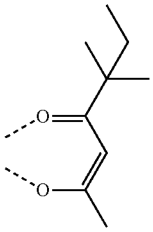
,
$L_{b105}$
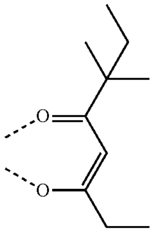
,
$L_{b106}$
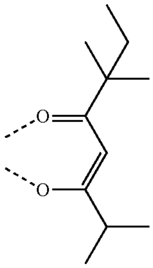
,
-continued
$L_{b107}$
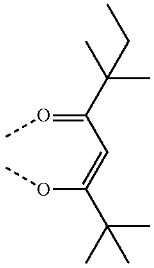
,
$L_{b108}$
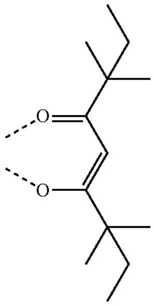
,
$L_{b109}$
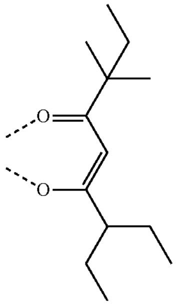
,
$L_{b110}$
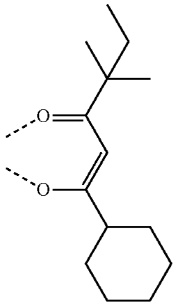
,
$L_{b111}$
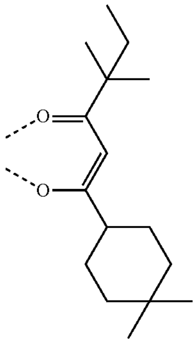
, -continued
$L_{b112}$
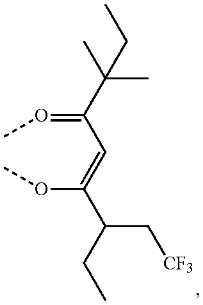
,
$L_{b113}$
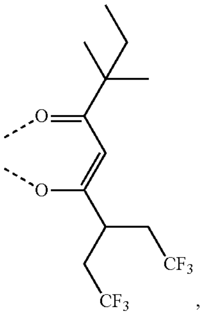
,
$L_{b114}$
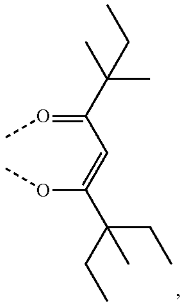
,
$L_{b115}$
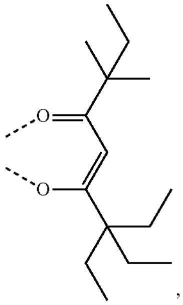
,
$L_{b116}$
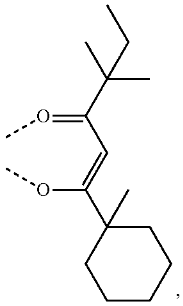
,
-continued
$L_{b117}$
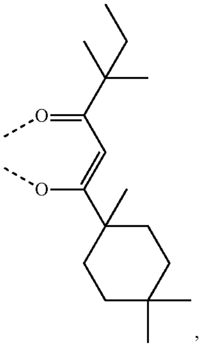
,
$L_{b118}$
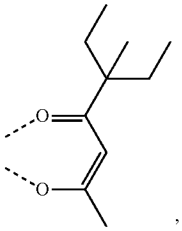
,
$L_{b119}$
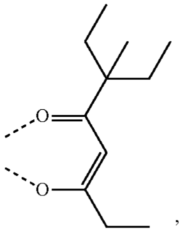
,
$L_{b120}$
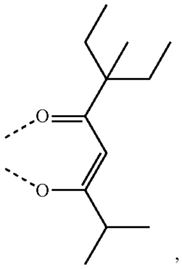
,
$L_{b121}$
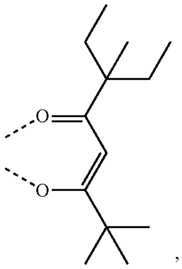
, -continued
$L_{b122}$
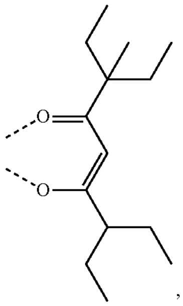
,
$L_{b123}$
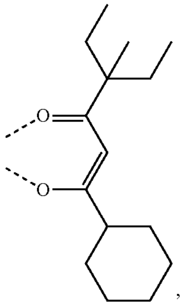
,
$L_{b124}$
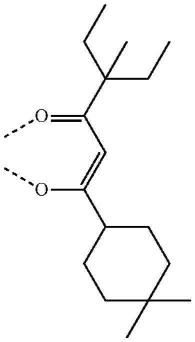
,
$L_{b125}$
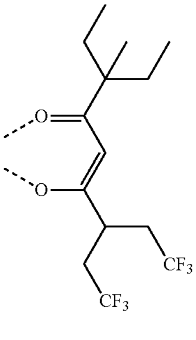
,
$L_{b126}$
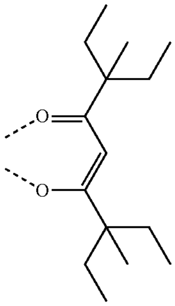
,
-continued
$L_{b127}$
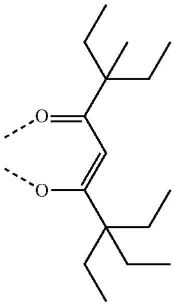
,
$L_{b128}$
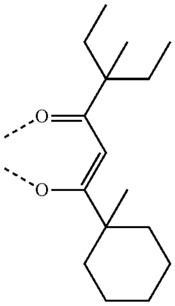
,
$L_{b129}$
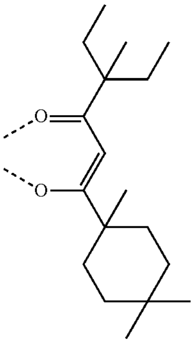
,
$L_{b130}$
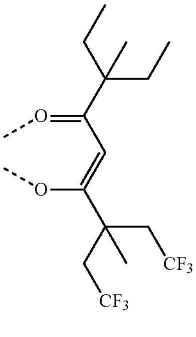
,
$L_{b131}$
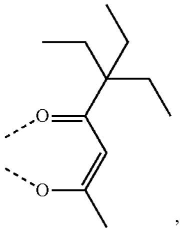
, -continued
$L_{b132}$
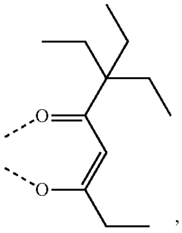
,
$L_{b133}$
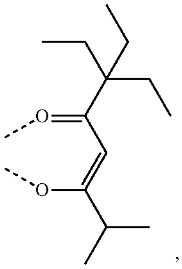
,
$L_{b134}$
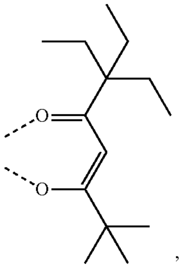
,
$L_{b135}$
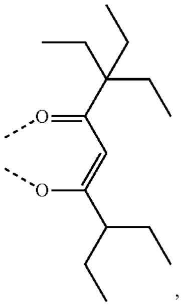
,
$L_{b136}$
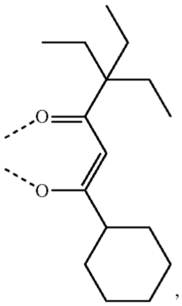
,
-continued
$L_{b137}$
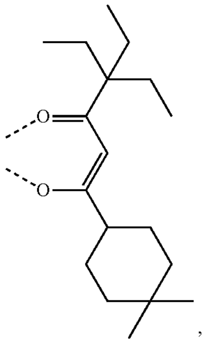
,
$L_{b138}$
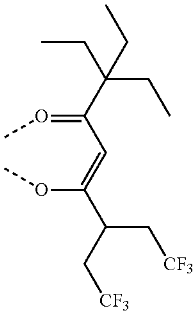
,
$L_{b139}$
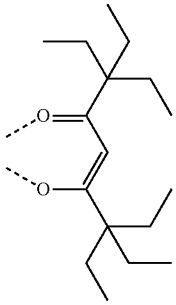
,
$L_{b140}$
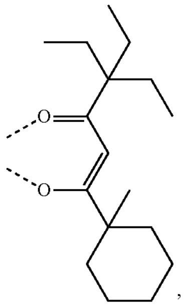
, -continued
$L_{b141}$
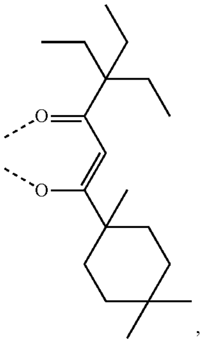
,
$L_{b142}$
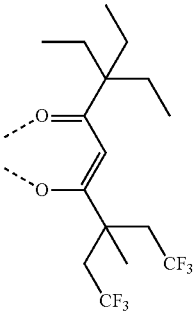
,
$L_{b143}$
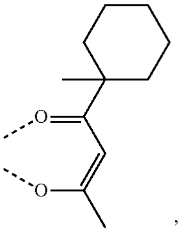
,
$L_{b144}$
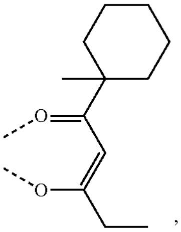
,
$L_{b145}$
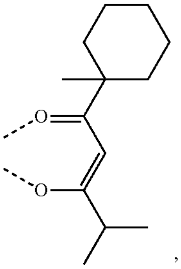
,
-continued
$L_{b146}$
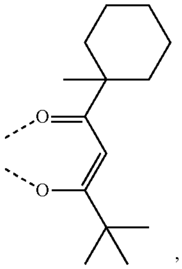
,
$L_{b147}$
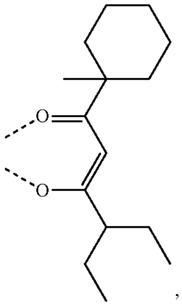
,
$L_{b148}$
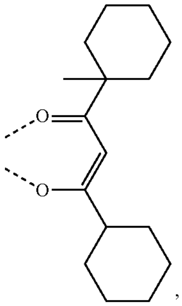
,
$L_{b149}$
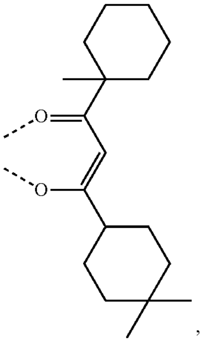
,
$L_{b150}$
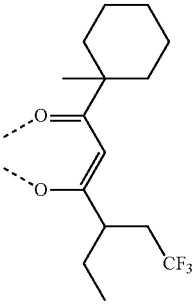
, -continued
$L_{b151}$
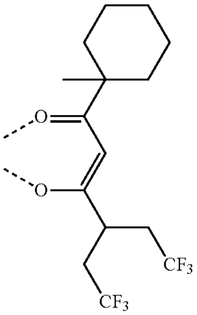
,
$L_{b152}$
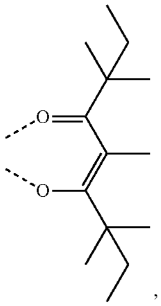
,
$L_{b153}$
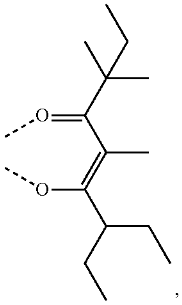
,
$L_{b154}$
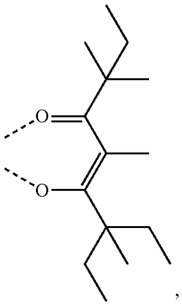
,
$L_{b155}$
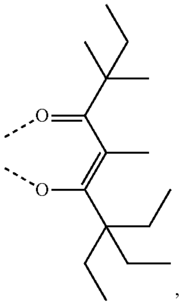
,
-continued
$L_{b156}$
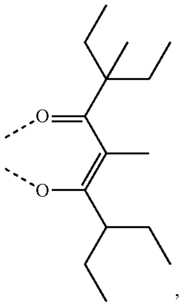
,
$L_{b157}$
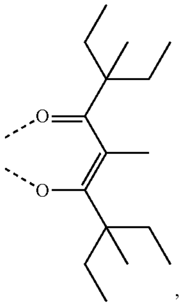
,
$L_{b158}$
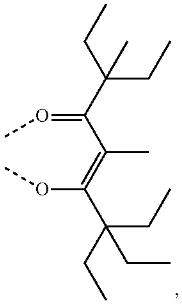
,
$L_{b159}$
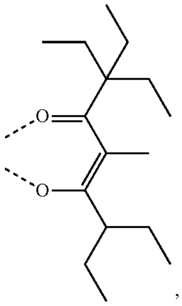
,
$L_{b160}$
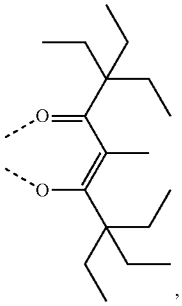
, -continued
$L_{b161}$
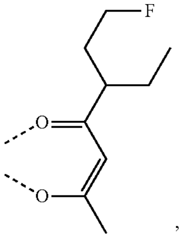
,
$L_{b162}$
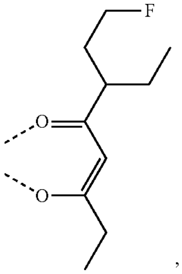
,
$L_{b163}$
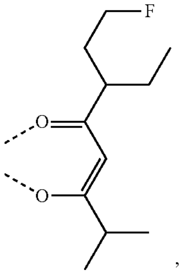
,
$L_{b164}$
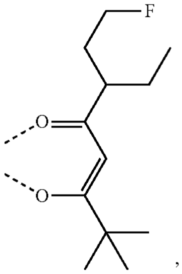
,
$L_{b165}$
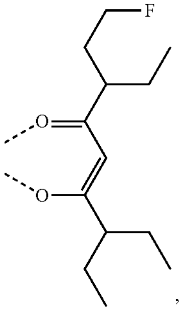
,
-continued
$L_{b166}$
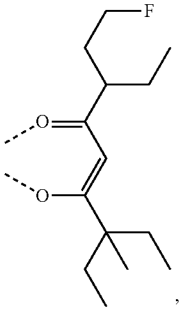
,
$L_{b167}$
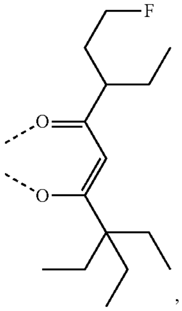
,
$L_{b168}$
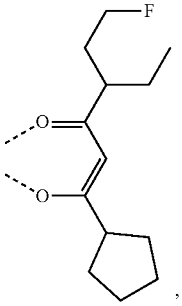
,
$L_{b169}$
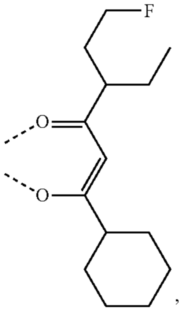
,
$L_{b170}$
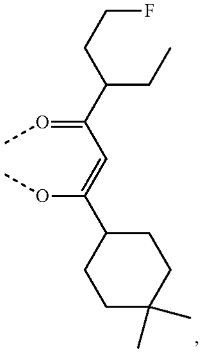
, -continued
$L_{b171}$
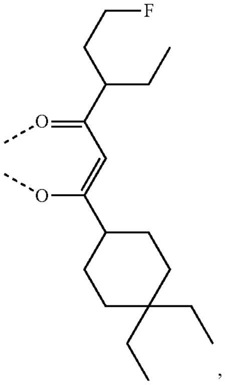
,
$L_{b172}$
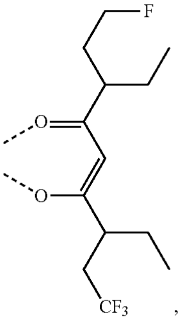
,
$L_{b173}$
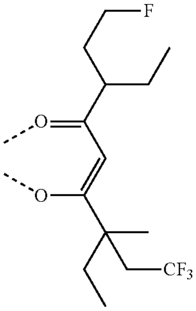
,
$L_{b174}$
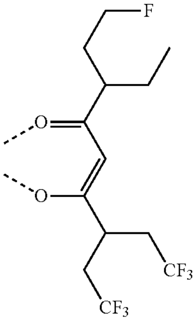
,
-continued
$L_{b175}$
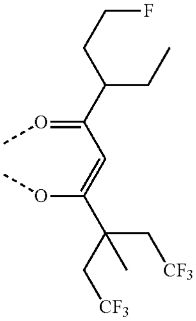
,
$L_{b176}$
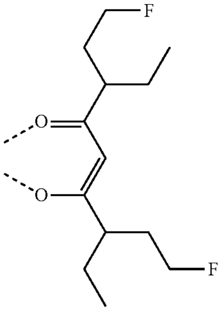
,
$L_{b177}$
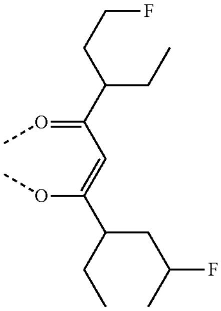
,
$L_{b178}$
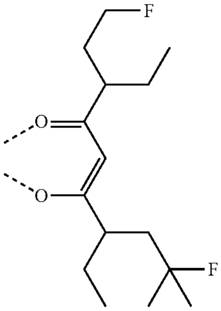
,
$L_{b179}$
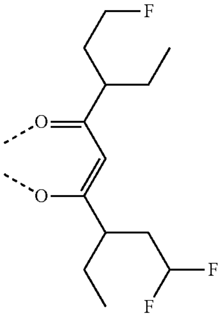
, -continued
$L_{b180}$
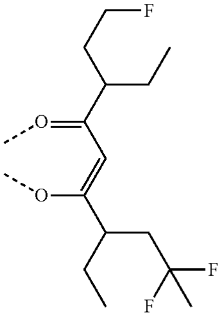
,
$L_{b181}$
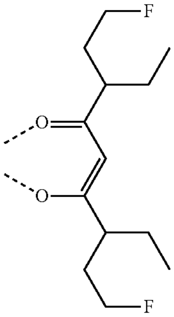
,
$L_{b182}$
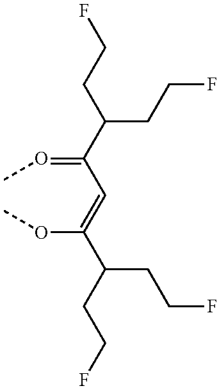
,
$L_{b183}$
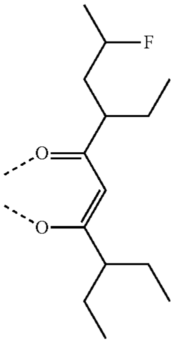
,
-continued
$L_{b184}$
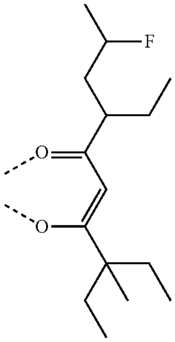
,
$L_{b185}$
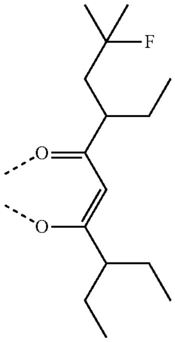
,
$L_{b186}$
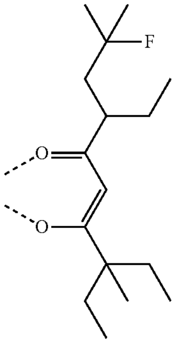
,
$L_{b187}$
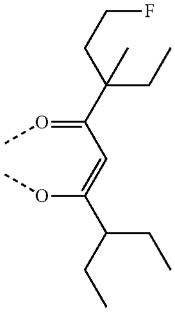
,
$L_{b188}$
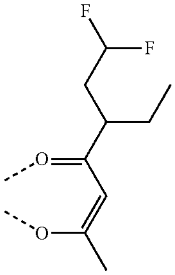
, -continued
$L_{b189}$
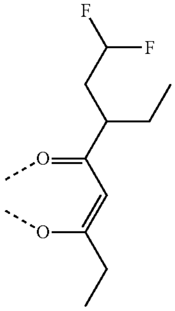
,
$L_{b190}$
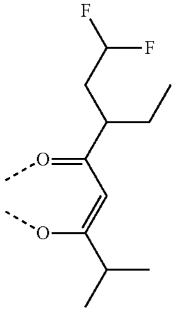
,
$L_{b191}$
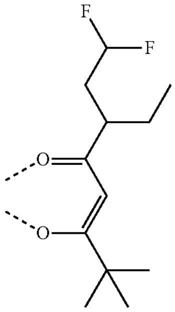
,
$L_{b192}$
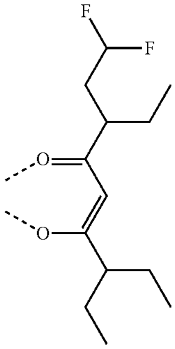
,
-continued
$L_{b193}$
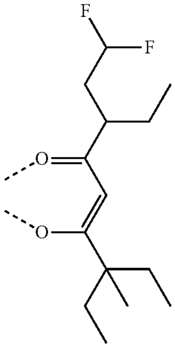
,
$L_{b194}$
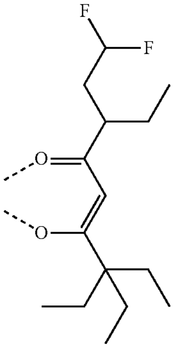
,
$L_{b195}$
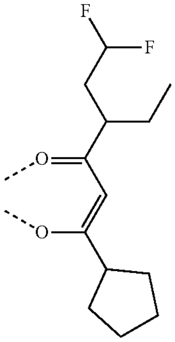
,
$L_{b196}$
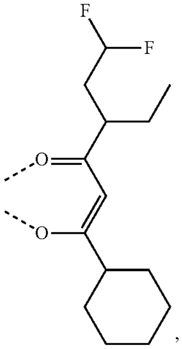
, -continued
L$_{b197}$
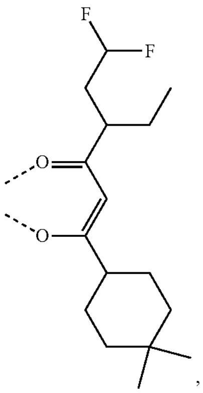
,
L$_{b198}$
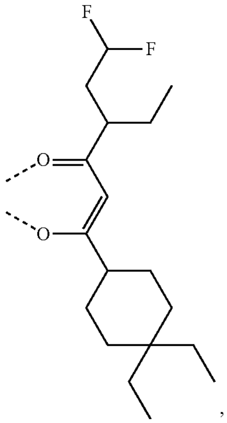
,
L$_{b199}$
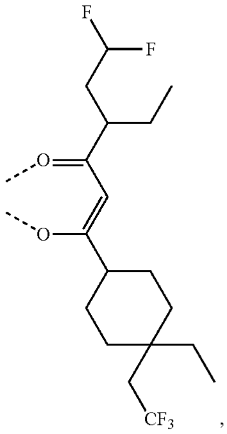
,
L$_{b200}$
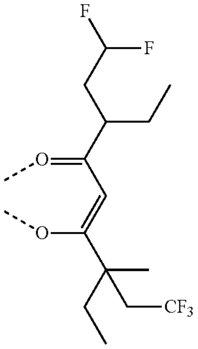
,
-continued
L$_{b201}$
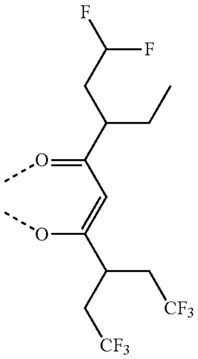
,
L$_{b202}$
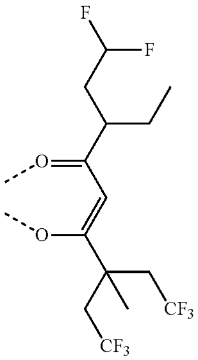
,
L$_{b203}$
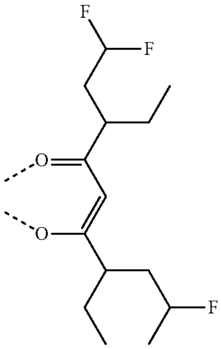
,
L$_{b204}$
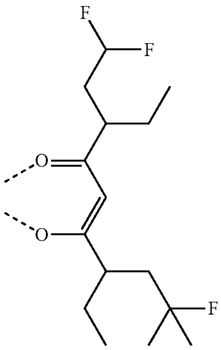
, L$_{b205}$
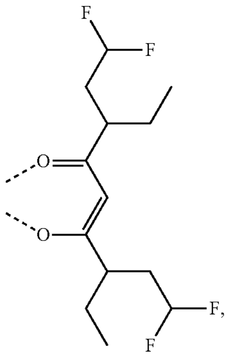
L$_{b206}$
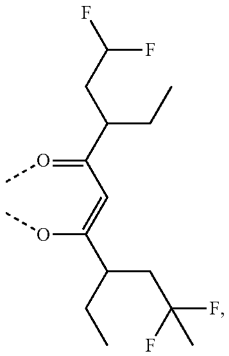
L$_{b207}$
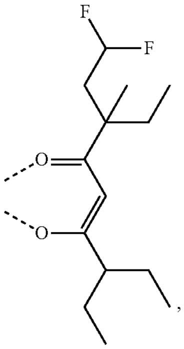
L$_{b208}$
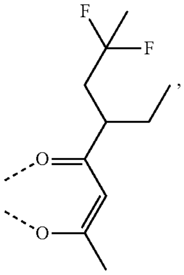
-continued
L$_{b209}$
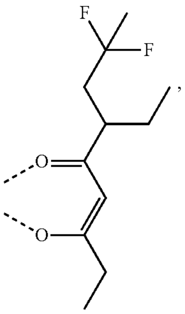
L$_{b210}$
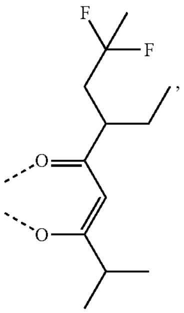
L$_{b211}$
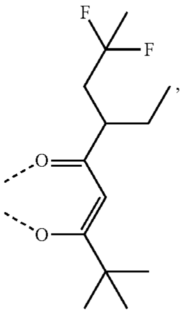
L$_{b212}$
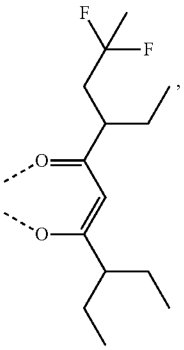

-continued
L$_{b213}$
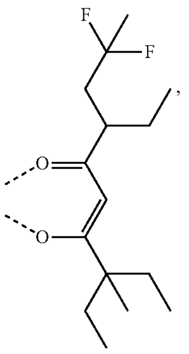
L$_{b214}$
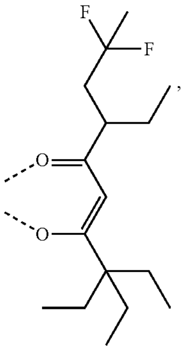
L$_{b215}$
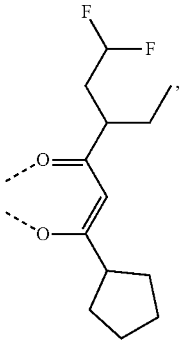
L$_{b216}$
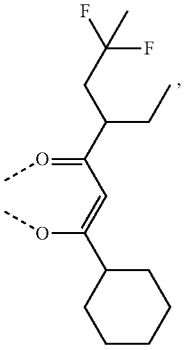
-continued
L$_{b217}$
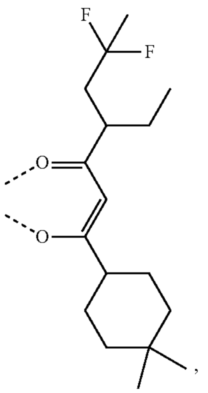
L$_{b218}$
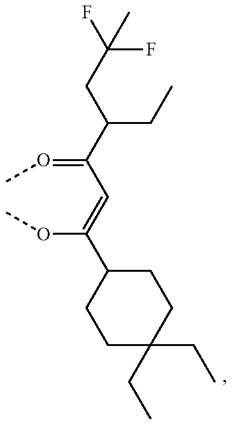
L$_{b219}$
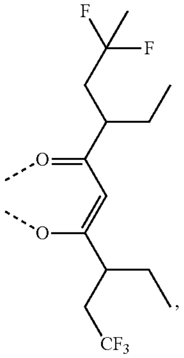
L$_{b220}$
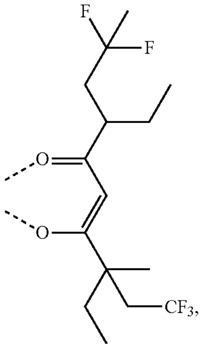

-continued
$L_{b221}$
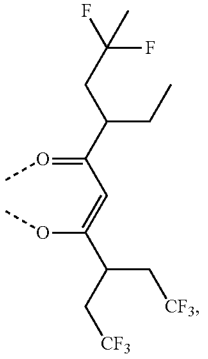
$L_{b222}$
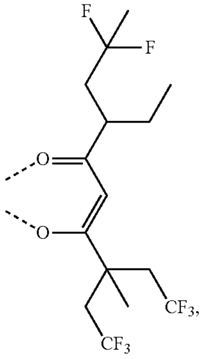
$L_{b223}$
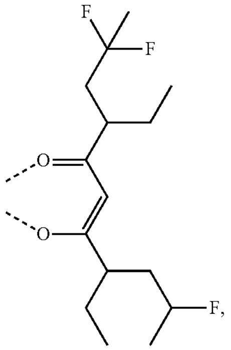
$L_{b224}$
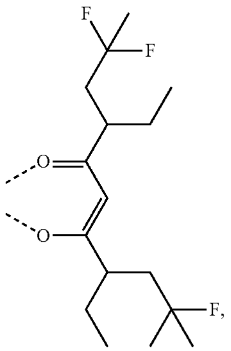
-continued
$L_{b225}$
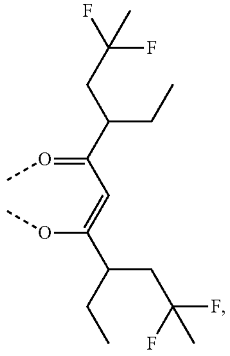
$L_{b226}$
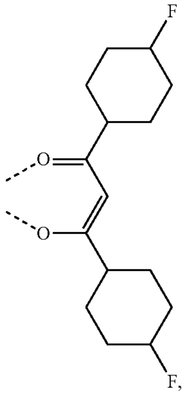
$L_{b227}$
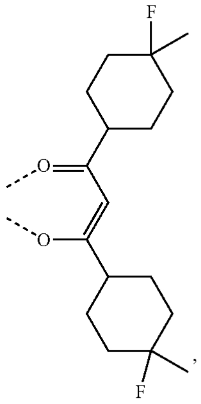
$L_{b228}$
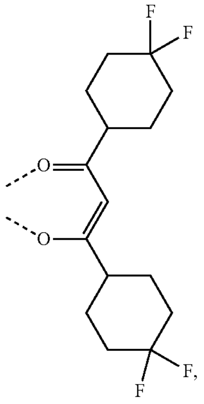

-continued
$L_{b229}$
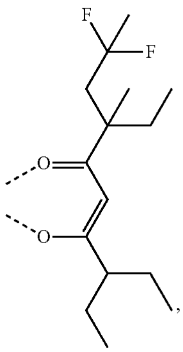
,
$L_{b230}$
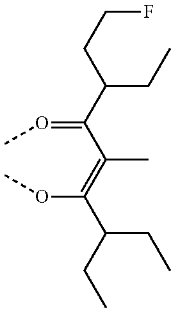
,
$L_{b231}$
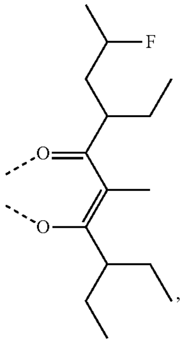
,
$L_{b232}$
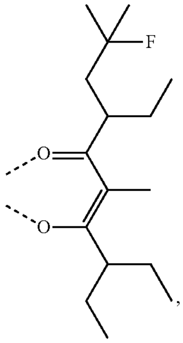
,
-continued
$L_{b233}$
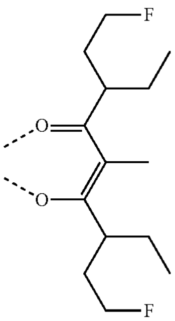
,
$L_{b234}$
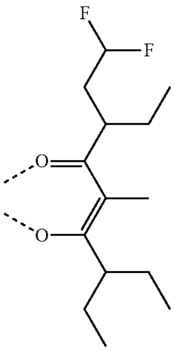
,
$L_{b235}$
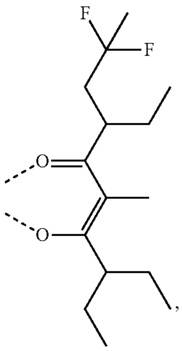
,
$L_{b236}$
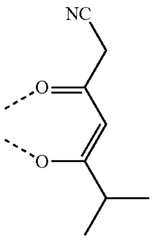
,
$L_{b237}$
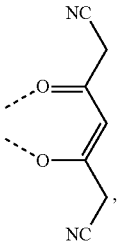
, -continued
$L_{b238}$
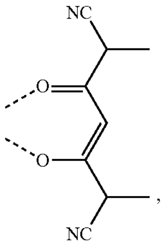
$L_{b239}$
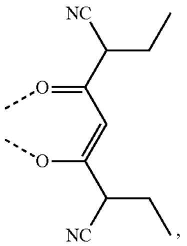
$L_{b240}$
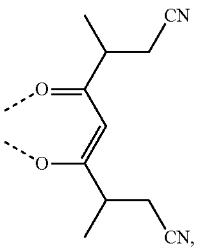
$L_{b241}$
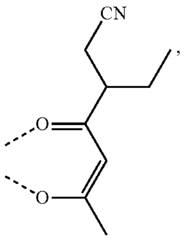
$L_{b242}$
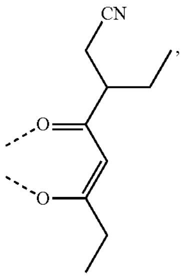
$L_{b243}$
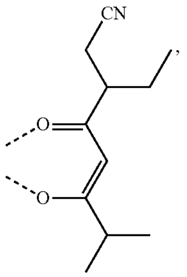
-continued
$L_{b244}$
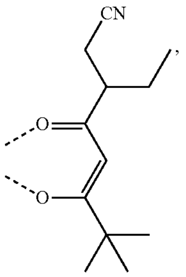
$L_{b245}$
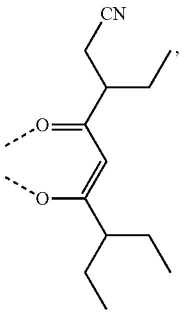
$L_{b246}$
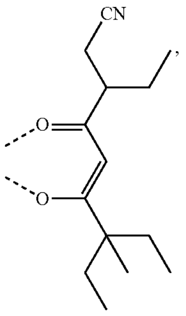
$L_{b247}$
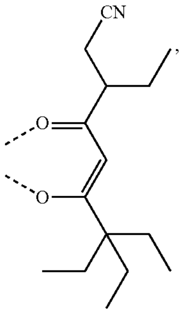
$L_{b248}$
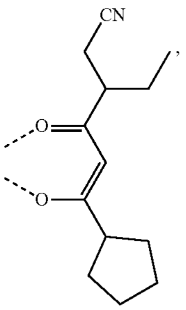

-continued
$L_{b249}$
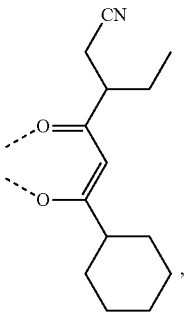
$L_{b250}$
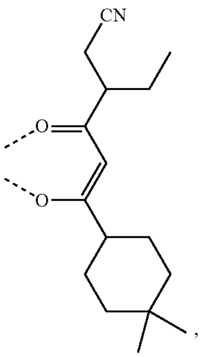
$L_{b251}$
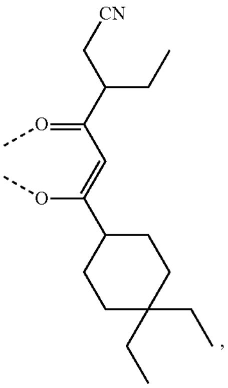
$L_{b252}$
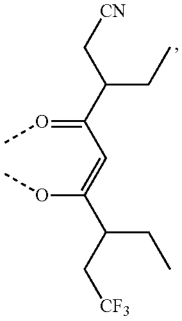
-continued
$L_{b253}$
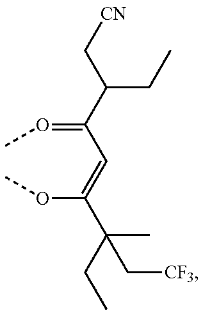
$L_{b254}$
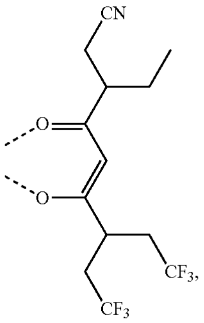
$L_{b255}$
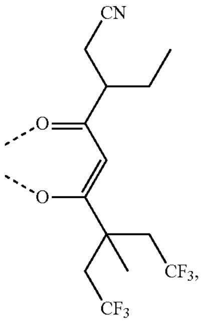
$L_{b256}$
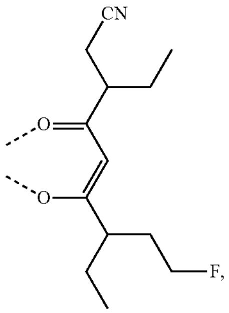
$L_{b257}$
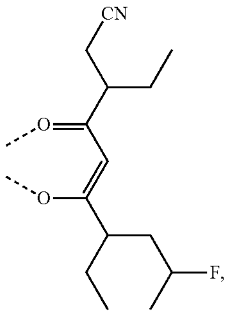

-continued
Lb258
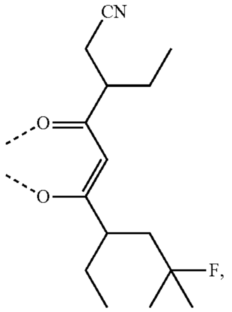
Lb259
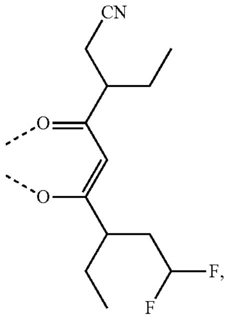
Lb260
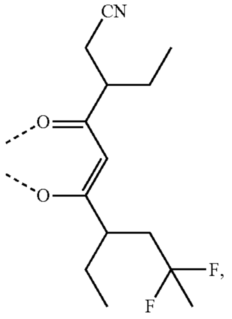
Lb261
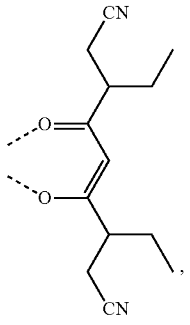
Lb262
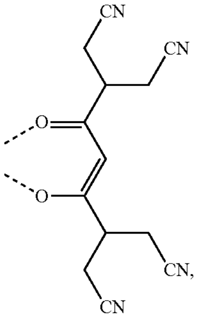
-continued
Lb263
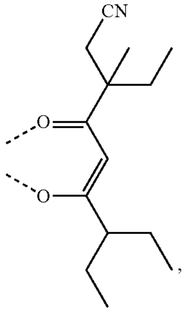
Lb264
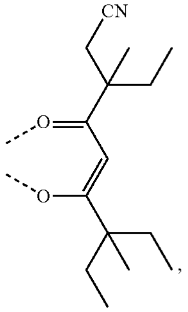
Lb265
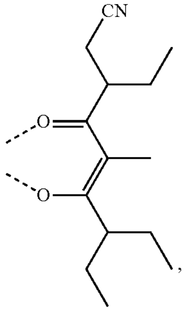
Lb266
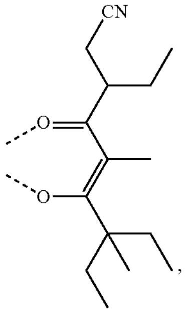
Lb267
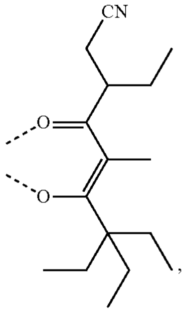

-continued
$L_{b268}$
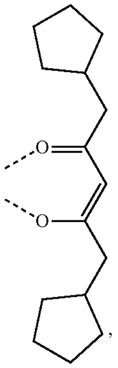
$L_{b269}$
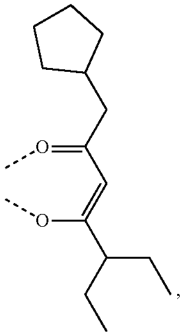
$L_{b270}$
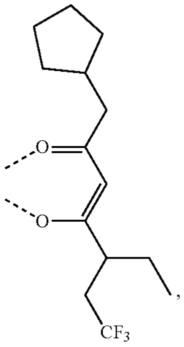
$L_{b271}$
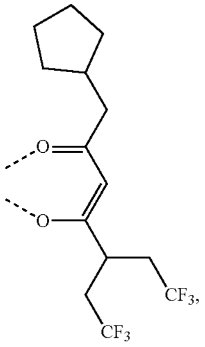
-continued
$L_{b272}$
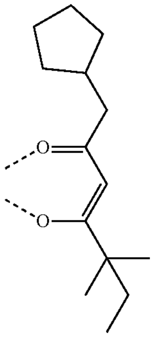
$L_{b273}$
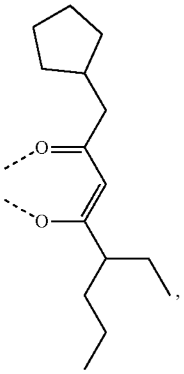
$L_{b274}$
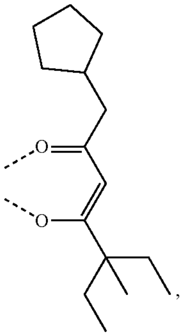
$L_{b275}$
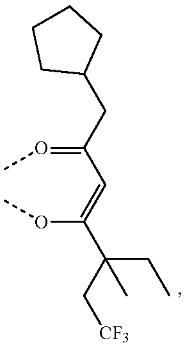

-continued
$L_{b276}$
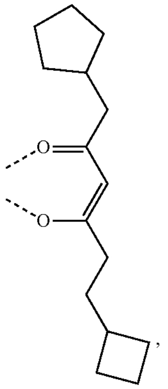
$L_{b277}$
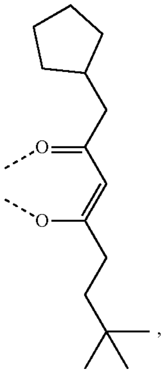
$L_{b278}$
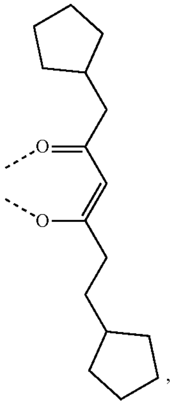
$L_{b279}$
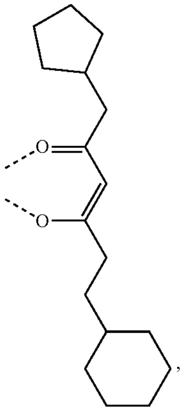
-continued
$L_{b280}$
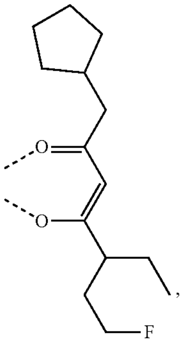
$L_{b281}$
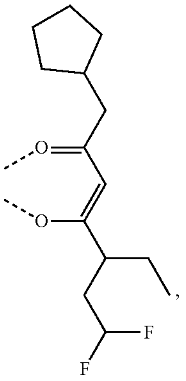
$L_{b282}$
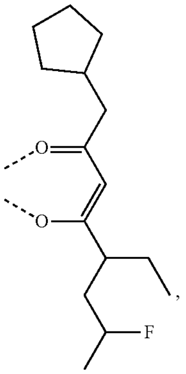
$L_{b283}$
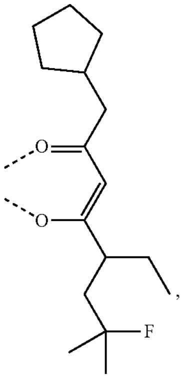

-continued
$L_{b284}$
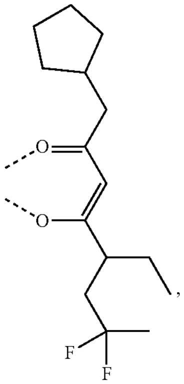
$L_{b285}$
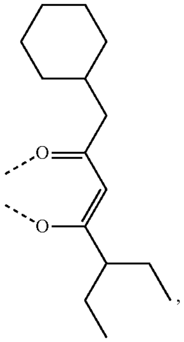
$L_{b286}$
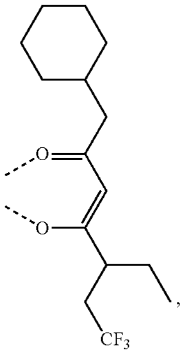
$L_{b287}$
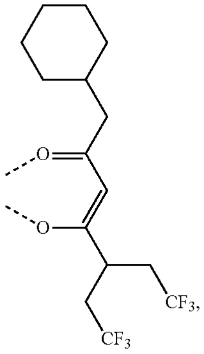
-continued
$L_{b288}$
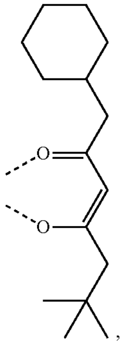
$L_{b289}$
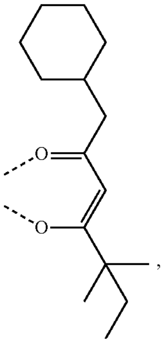
$L_{b290}$
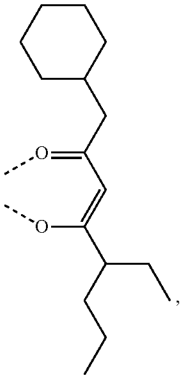
$L_{b291}$
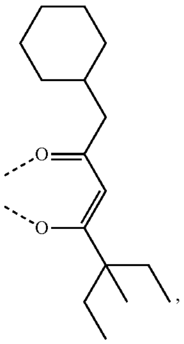

-continued
$L_{b292}$
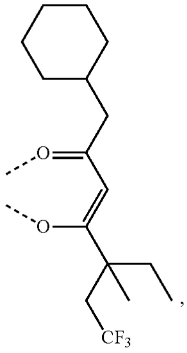
,
$L_{b293}$
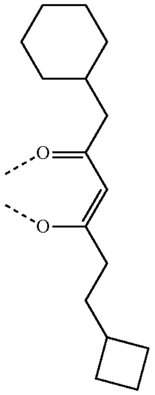
,
$L_{b294}$
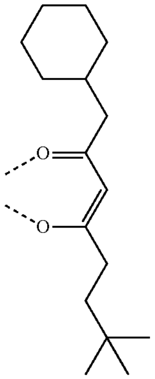
,
$L_{b295}$
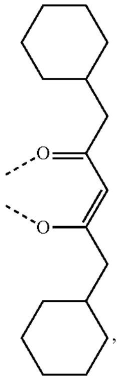
,
-continued
$L_{b296}$
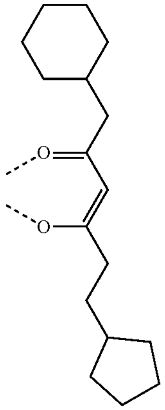
,
$L_{b297}$
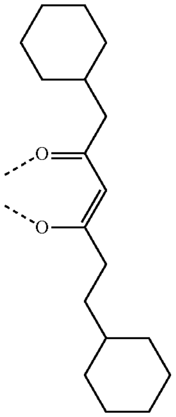
,
$L_{b298}$
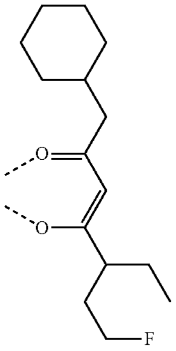
,
$L_{b299}$
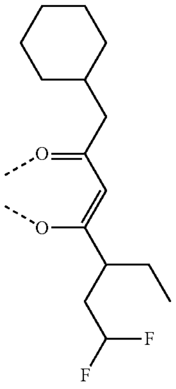
, -continued
$L_{b300}$
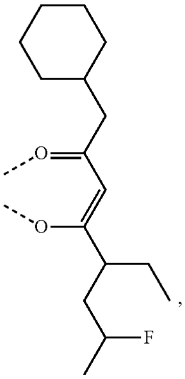
$L_{b301}$
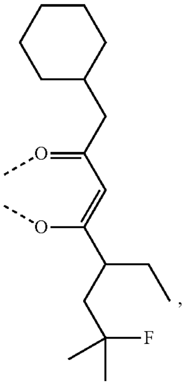
$L_{b302}$
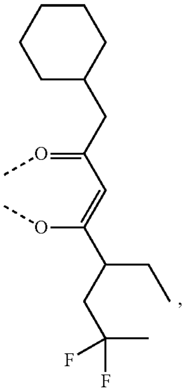
$L_{b303}$
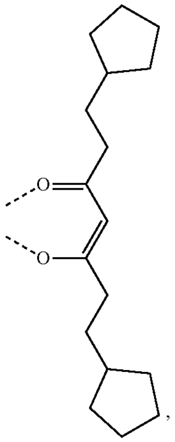
-continued
$L_{b304}$
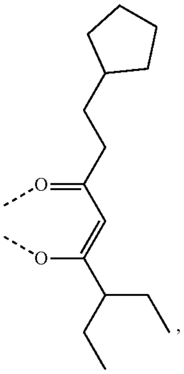
$L_{b305}$
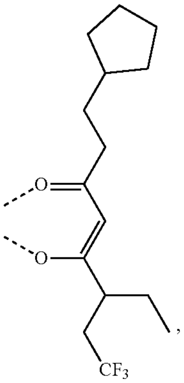
$L_{b306}$
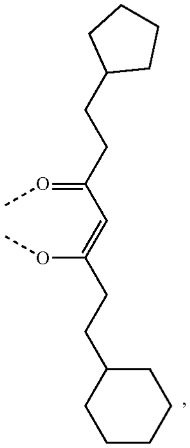
$L_{b307}$
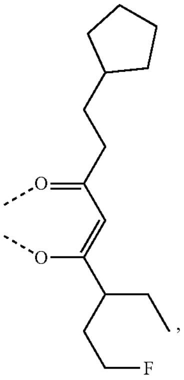

-continued
Lb308
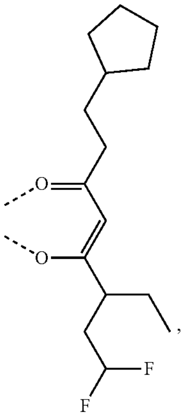
Lb309
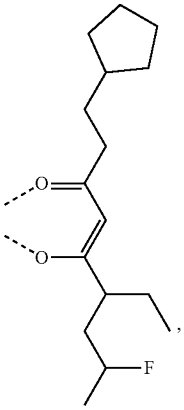
Lb310
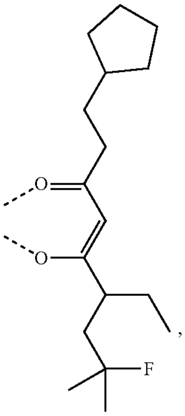
-continued
Lb311
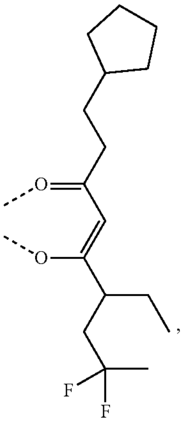
Lb312
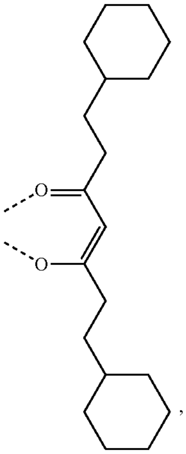
Lb313
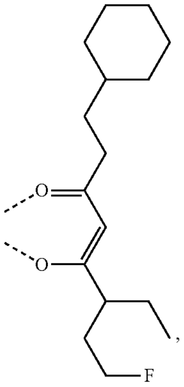

-continued
L$_{b314}$
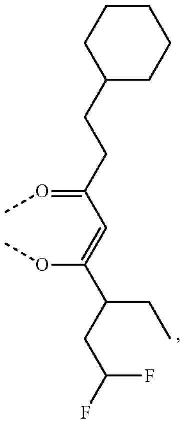
,
L$_{b315}$
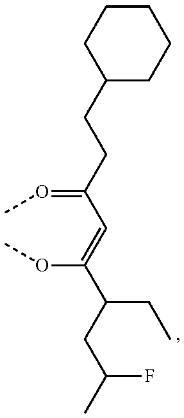
,
L$_{b316}$
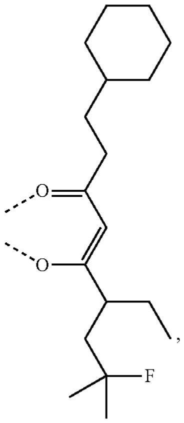
,
-continued
L$_{b317}$
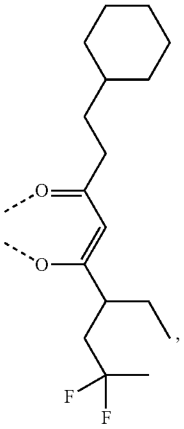
,
L$_{b318}$
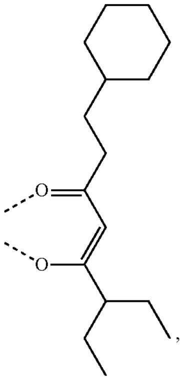
,
L$_{b319}$
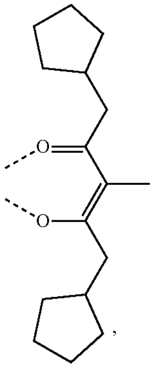
,
L$_{b320}$
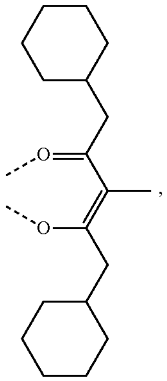
, -continued
$L_{b321}$
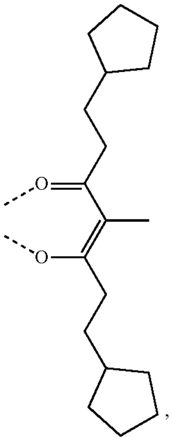
, and
$L_{b322}$
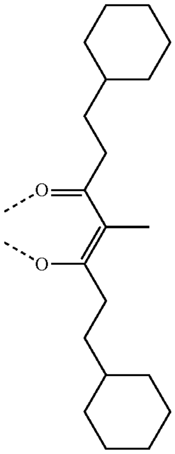
;
wherein, $L_c$ is, at each occurrence identically or differently, selected from the group consisting of the following structures:
$L_{c1}$
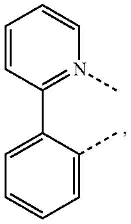
$L_{c2}$
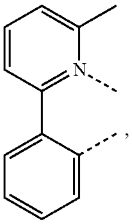
-continued
$L_{c3}$
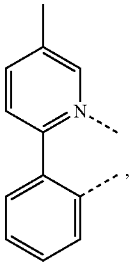
$L_{c4}$
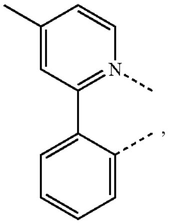
$L_{c5}$
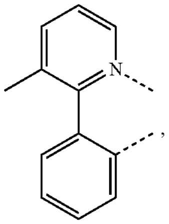
$L_{c6}$
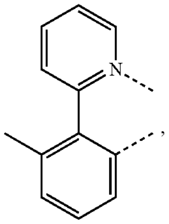
$L_{c7}$
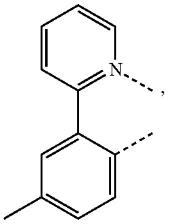
$L_{c8}$
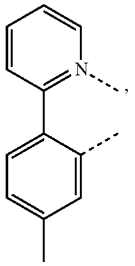

$L_{c9}$
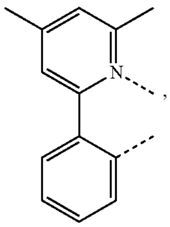
$L_{c10}$
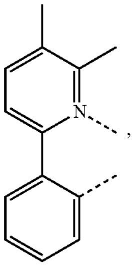
$L_{c11}$
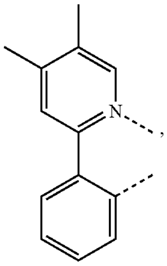
$L_{c12}$
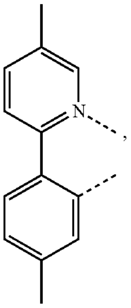
$L_{c13}$
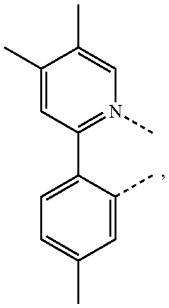
$L_{c14}$
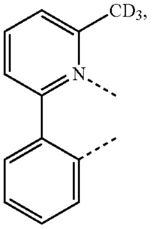
$L_{c15}$
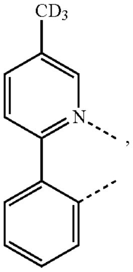
$L_{c16}$
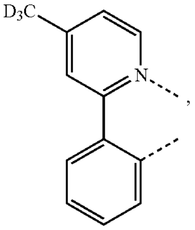
$L_{c17}$
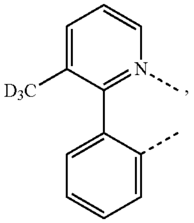
$L_{c18}$
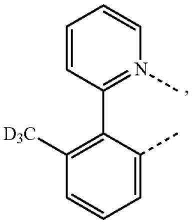
$L_{c19}$
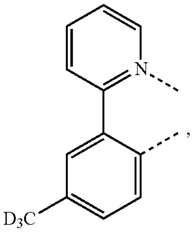

-continued
$L_{c20}$
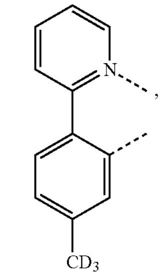
$L_{c21}$
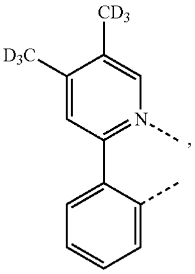
$L_{c22}$
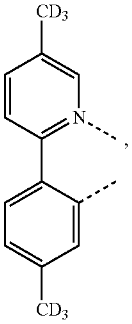
$L_{c23}$
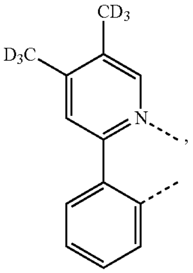
$L_{c24}$
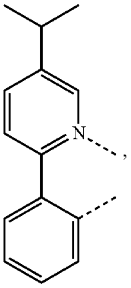
-continued
$L_{c25}$
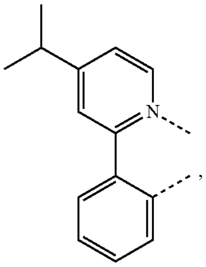
$L_{c26}$
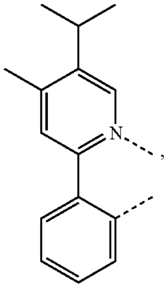
$L_{c27}$
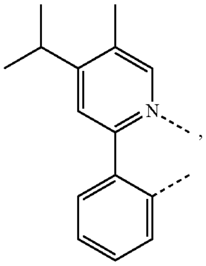
$L_{c28}$
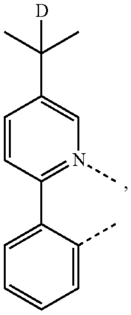
$L_{c29}$
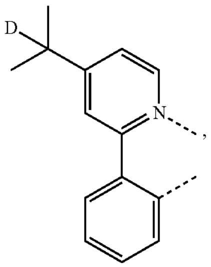

-continued
$L_{c30}$
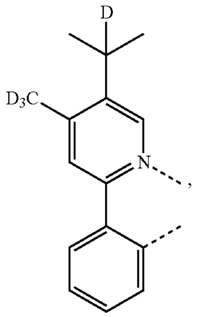
$L_{c31}$
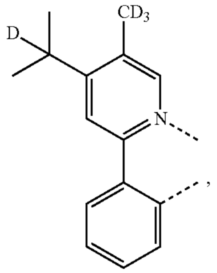
$L_{c32}$
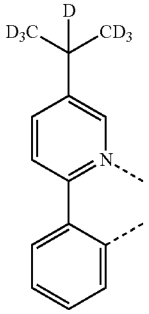
$L_{c33}$
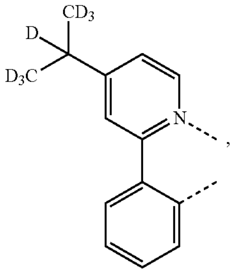
$L_{c34}$
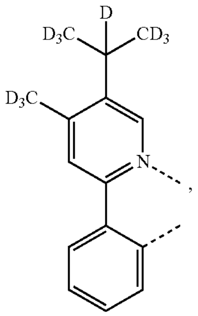
-continued
$L_{c35}$
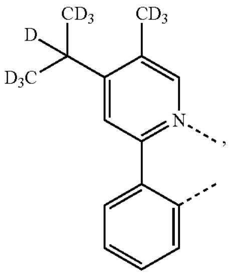
$L_{c36}$
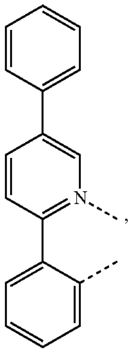
$L_{c37}$
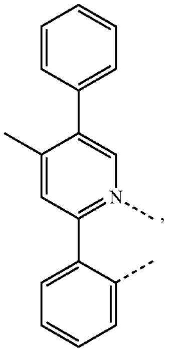
$L_{c38}$
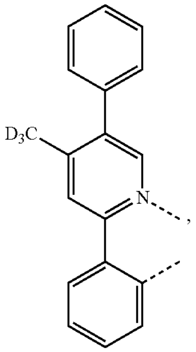
$L_{c39}$
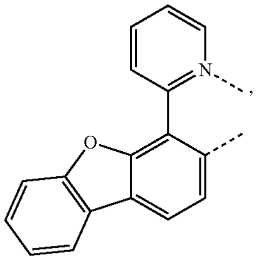

-continued
Lc40
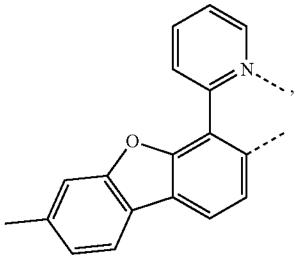
Lc41
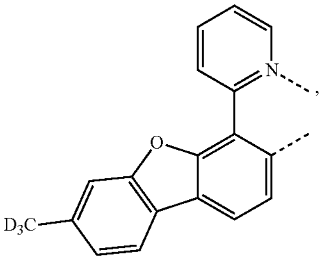
Lc42
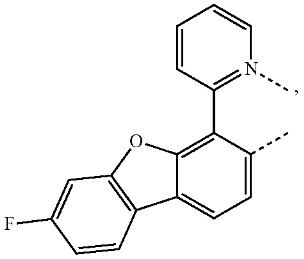
Lc43
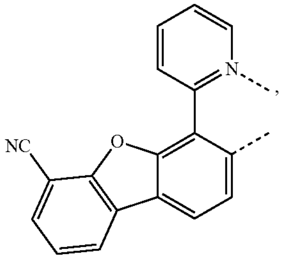
Lc44
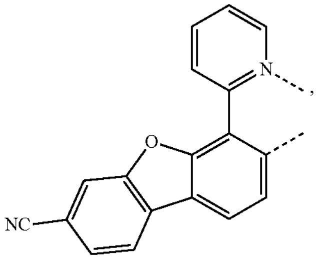
Lc45
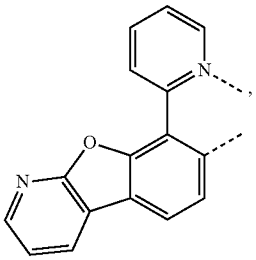
-continued
Lc46
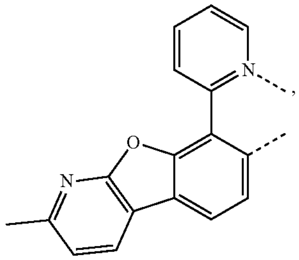
Lc47
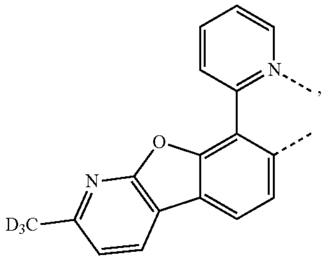
Lc48
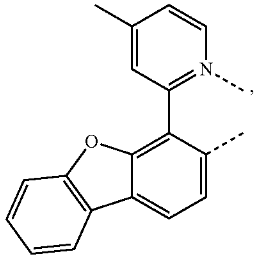
Lc49
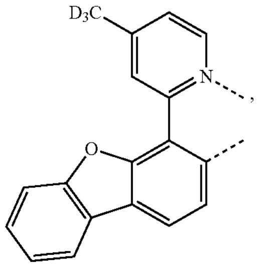
Lc50
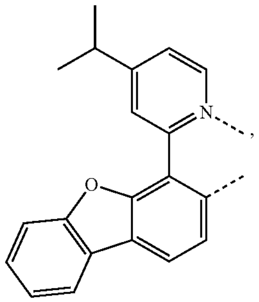

-continued
Lc51
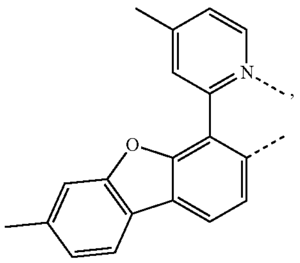
Lc52
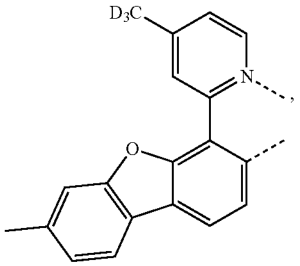
Lc53
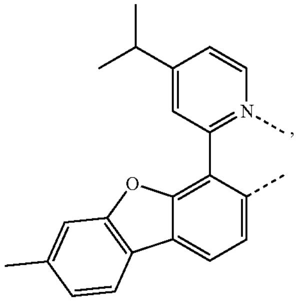
Lc54
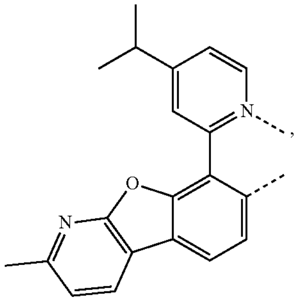
Lc55
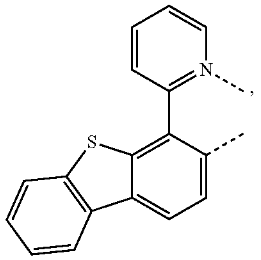
-continued
Lc56
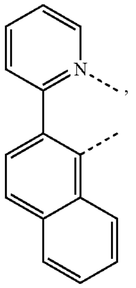
Lc57
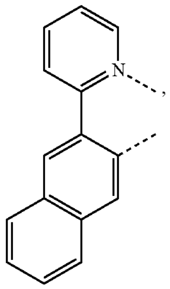
Lc58
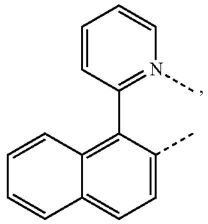
Lc59
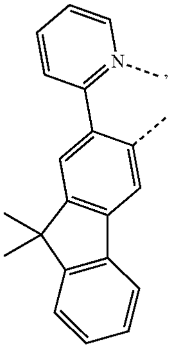
Lc60
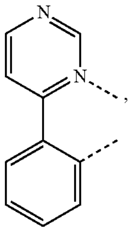

-continued
$L_{c61}$
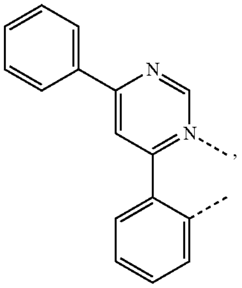
$L_{c62}$
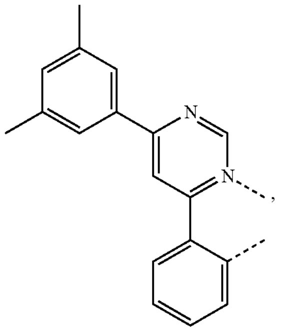
$L_{c63}$
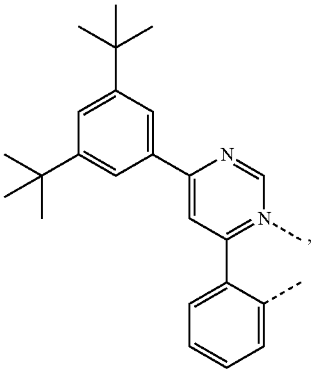
$L_{c64}$
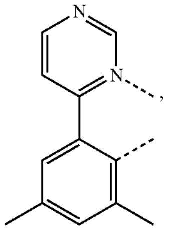
$L_{c65}$
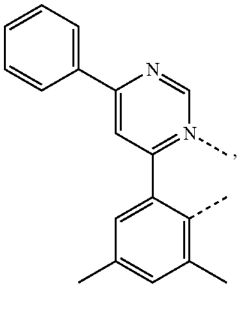
-continued
$L_{c66}$
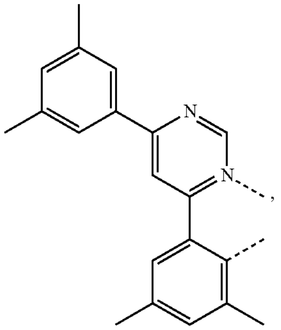
$L_{c67}$
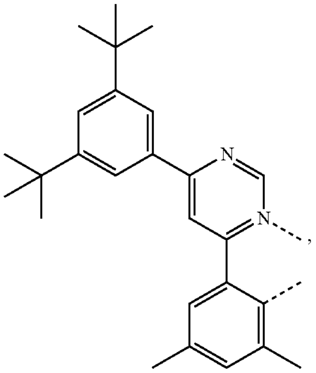
$L_{c68}$
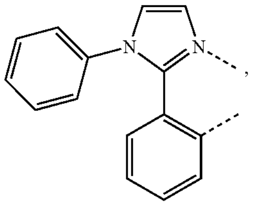
$L_{c69}$
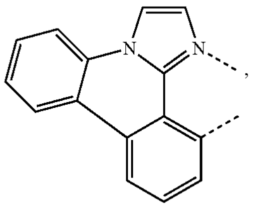
$L_{c70}$
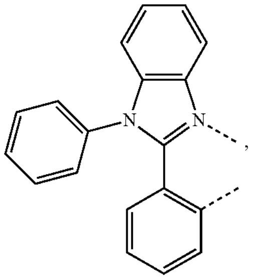

-continued
$L_{c71}$
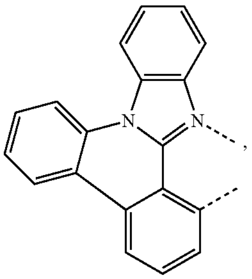
$L_{c72}$
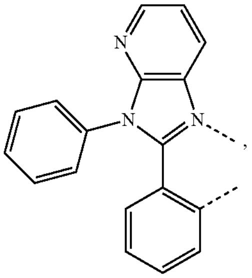
$L_{c73}$
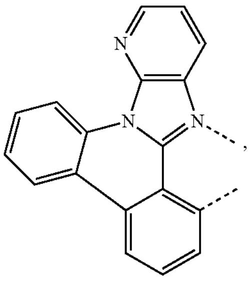
$L_{c74}$
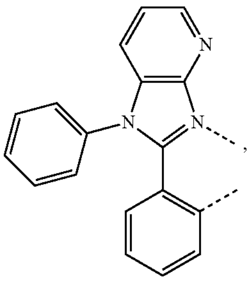
$L_{c75}$
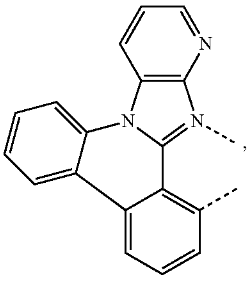
-continued
$L_{c76}$
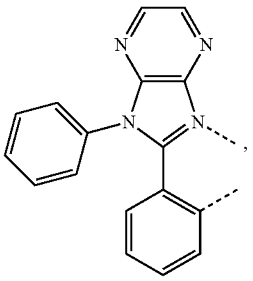
$L_{c77}$
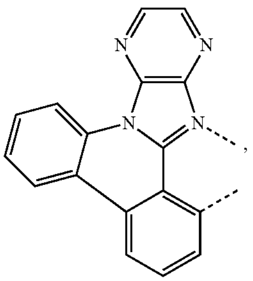
$L_{c78}$
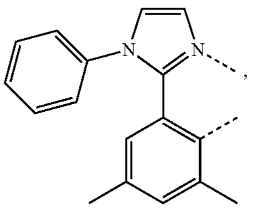
$L_{c79}$
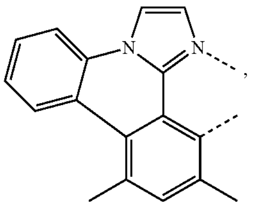
$L_{c80}$
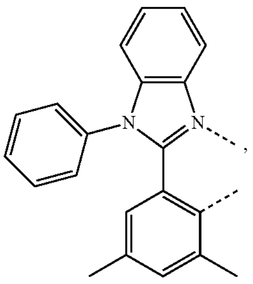
$L_{c81}$
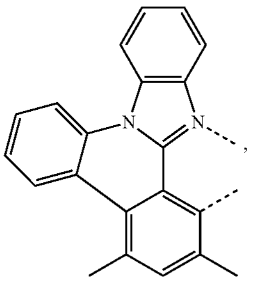

-continued
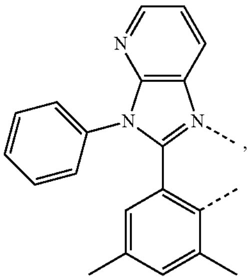
$L_{c82}$
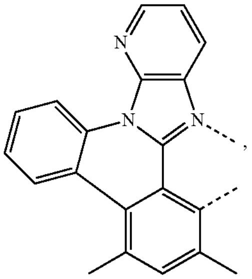
$L_{c83}$
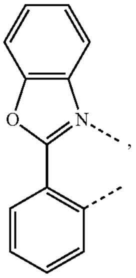
$L_{c84}$
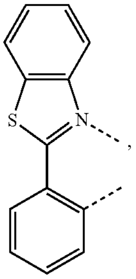
$L_{c85}$
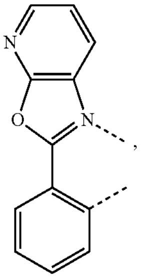
$L_{c86}$
-continued
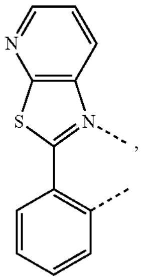
$L_{c87}$
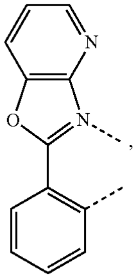
$L_{c88}$
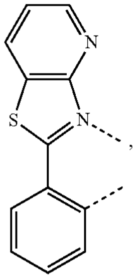
$L_{c89}$
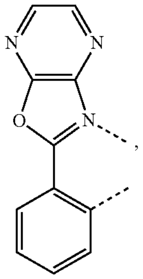
$L_{c90}$
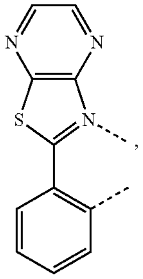
$L_{c91}$ -continued
$L_{c92}$
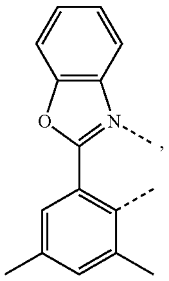
$L_{c93}$
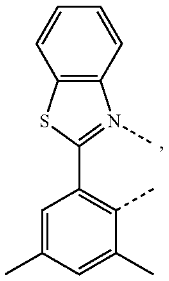
$L_{c94}$
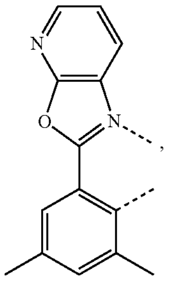
$L_{c95}$
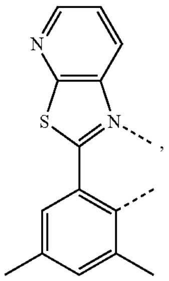
$L_{c96}$
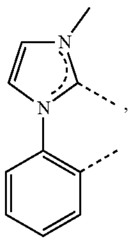
-continued
$L_{c97}$
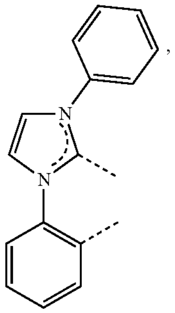
$L_{c98}$
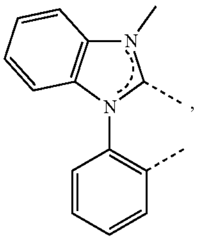
$L_{c99}$
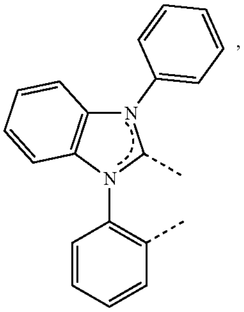
$L_{c100}$
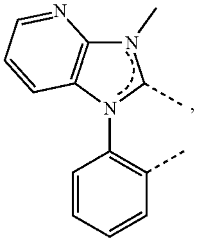
$L_{c101}$
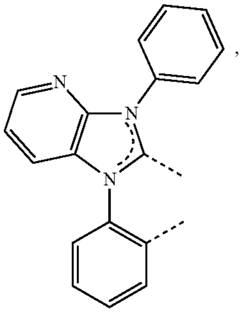

-continued
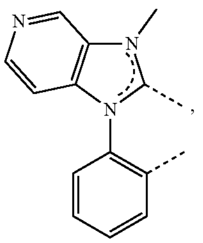
$L_{c102}$
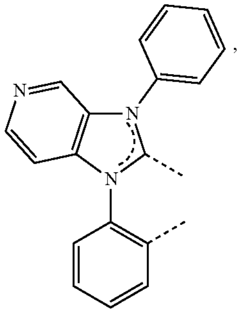
$L_{c103}$
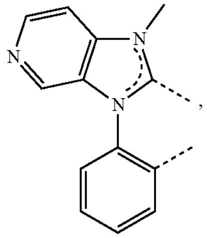
$L_{c104}$
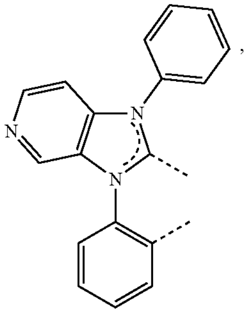
$L_{c105}$
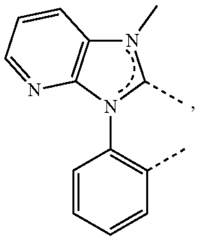
$L_{c106}$
-continued
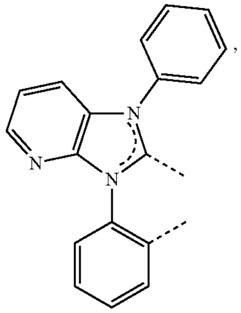
$L_{c107}$
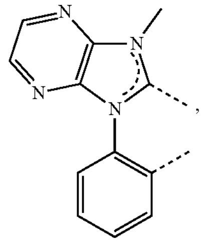
$L_{c108}$
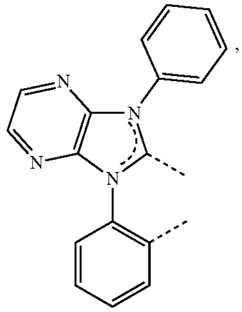
$L_{c109}$
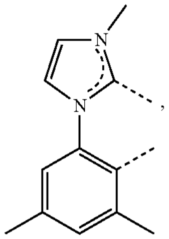
$L_{c110}$
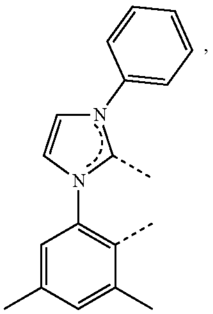
$L_{c111}$ -continued
$L_{c112}$
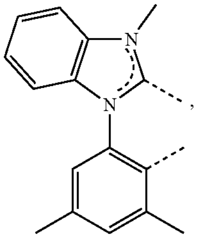
$L_{c113}$
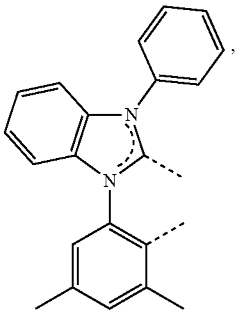
$L_{c114}$
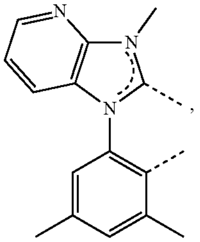
$L_{c115}$
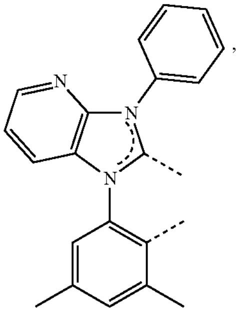
$L_{c116}$
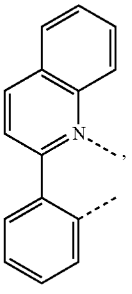
-continued
$L_{c117}$
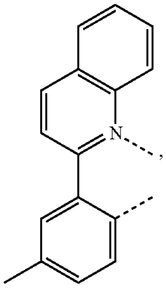
$L_{c118}$
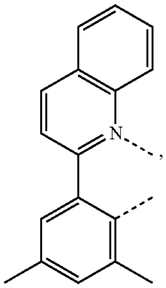
$L_{c119}$
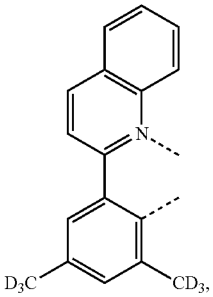
$L_{c120}$
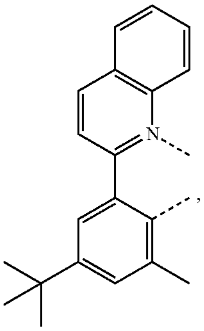
$L_{c121}$
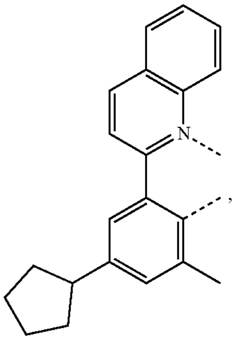

-continued
L$_{c122}$
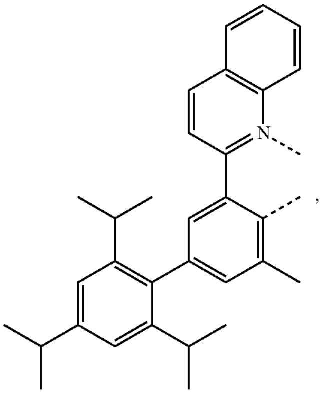
L$_{c123}$
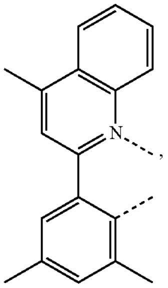
L$_{c124}$
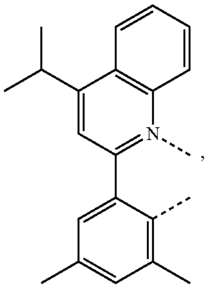
L$_{c125}$
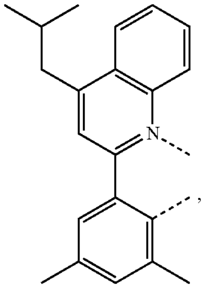
L$_{c126}$
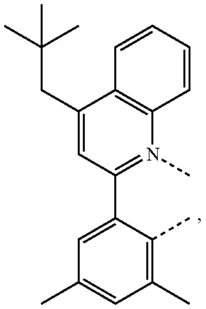
-continued
L$_{c127}$
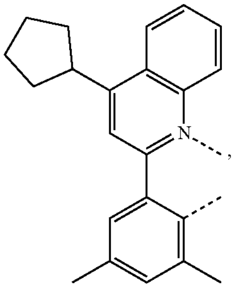
L$_{c128}$
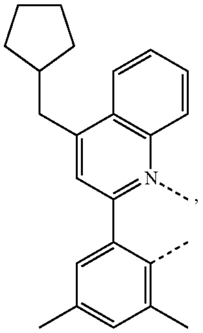
L$_{c129}$
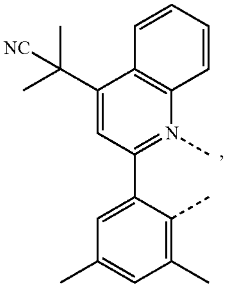
L$_{c130}$
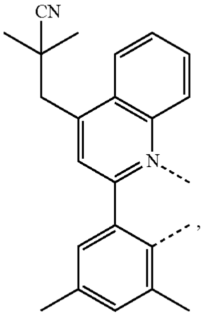
L$_{c131}$
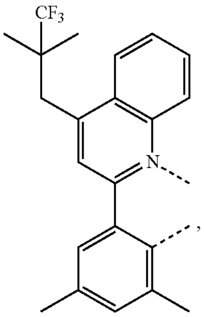

-continued
$L_{c132}$
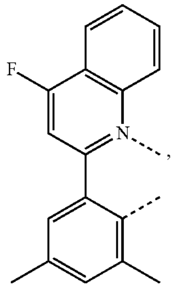
$L_{c133}$
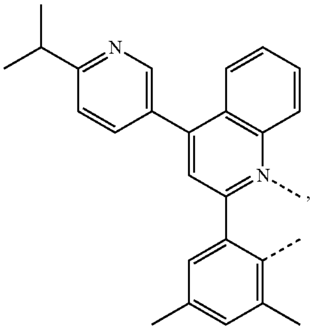
$L_{c134}$
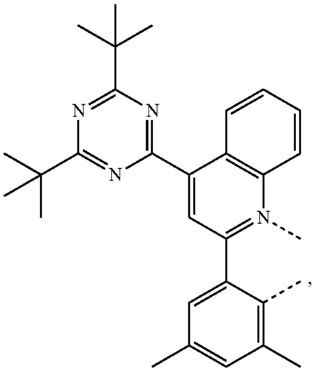
$L_{c135}$
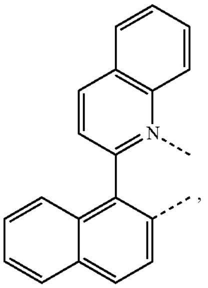
-continued
$L_{c136}$
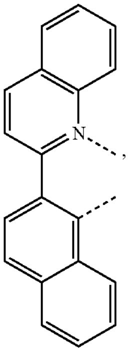
$L_{c137}$
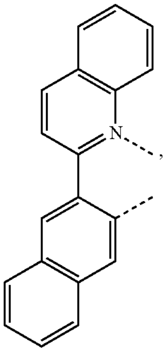
$L_{c138}$
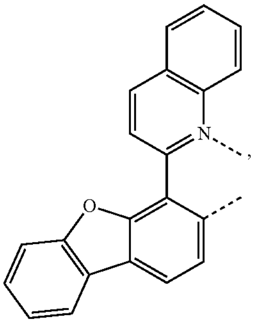
$L_{c139}$
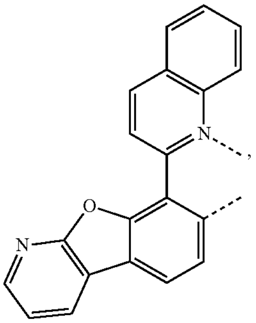

-continued
$L_{c140}$
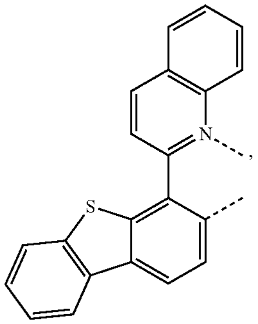
$L_{c141}$
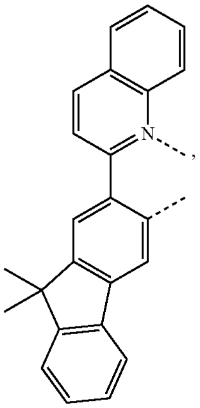
$L_{c142}$
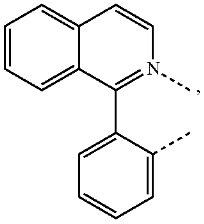
$L_{c143}$
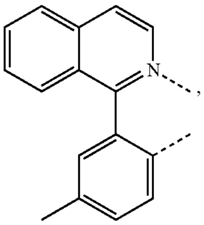
$L_{c144}$
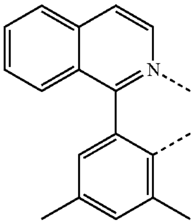
-continued
$L_{c145}$
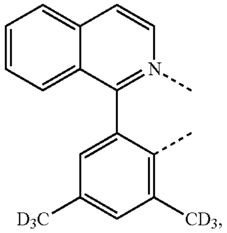
$L_{c146}$
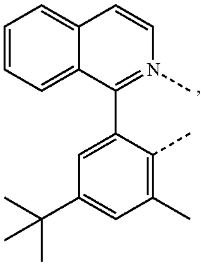
$L_{c147}$
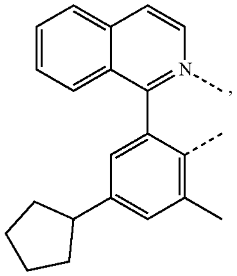
$L_{c148}$
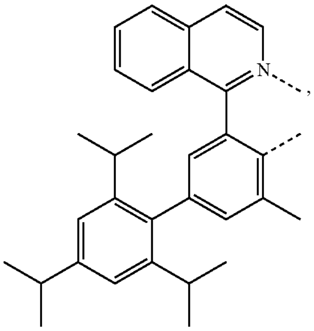
$L_{c149}$
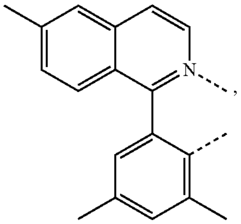

$L_{c150}$
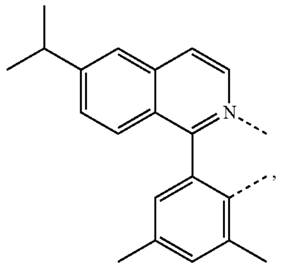
$L_{c151}$
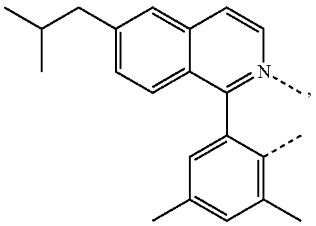
$L_{c152}$
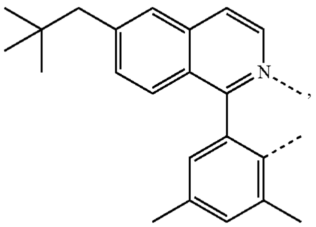
$L_{c153}$
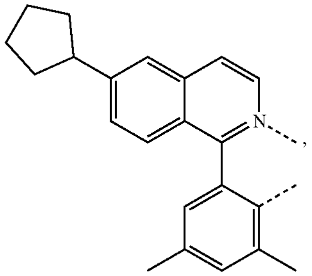
$L_{c154}$
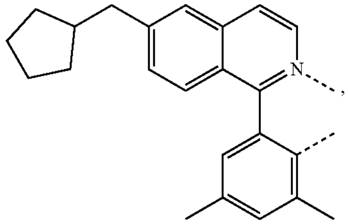
$L_{c155}$
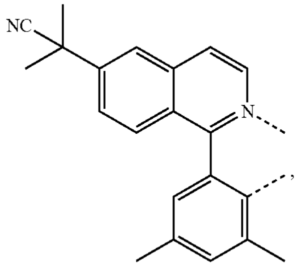
$L_{c156}$
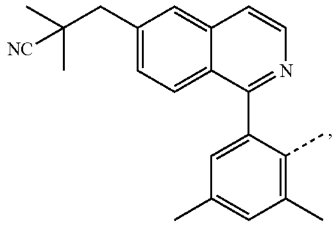
$L_{c157}$
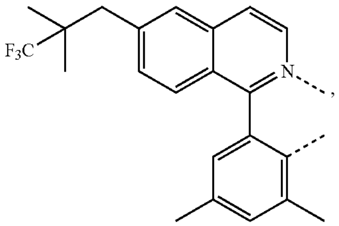
$L_{c161}$
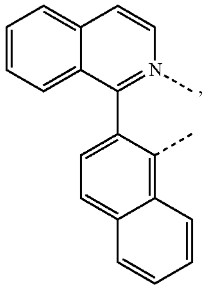
$L_{c162}$
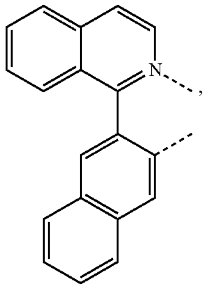
$L_{c163}$
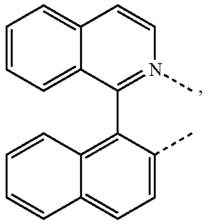
$L_{c164}$
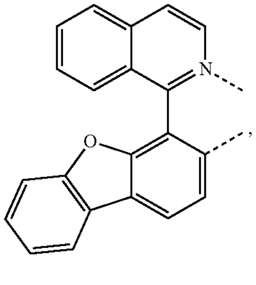

$L_{c165}$
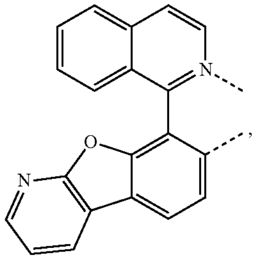
$L_{c166}$
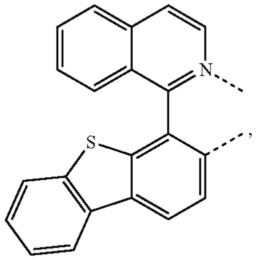
$L_{c167}$
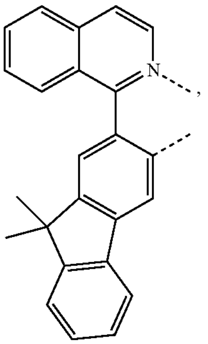
$L_{c168}$
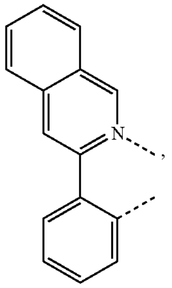
$L_{c169}$
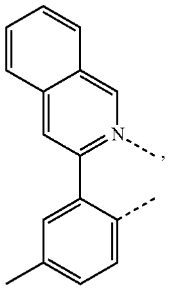
$L_{c170}$
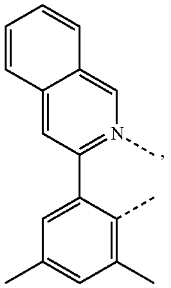
$L_{c171}$
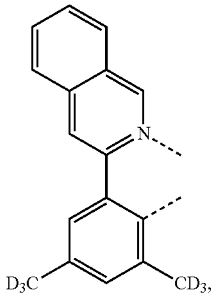
$L_{c172}$
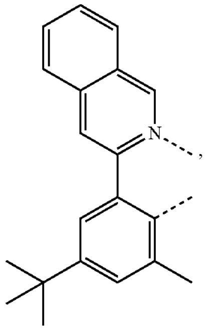
$L_{c173}$
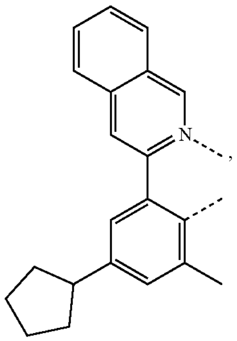

-continued
$L_{c174}$
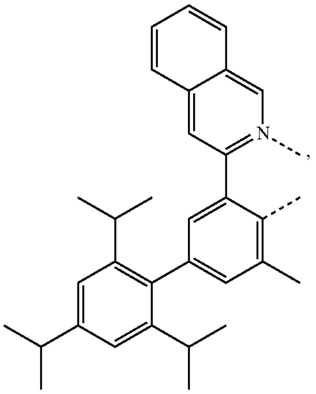
$L_{c175}$
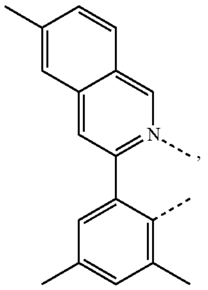
$L_{c176}$
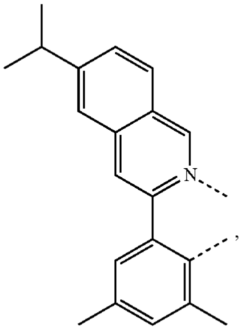
$L_{c177}$
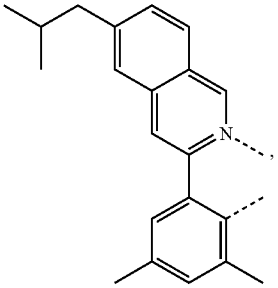
$L_{c178}$
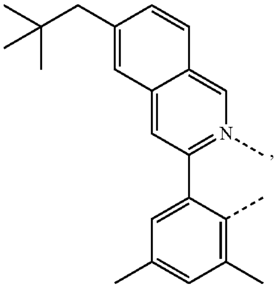
-continued
$L_{c179}$
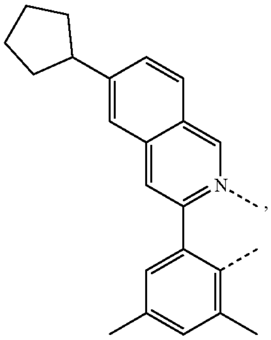
$L_{c180}$
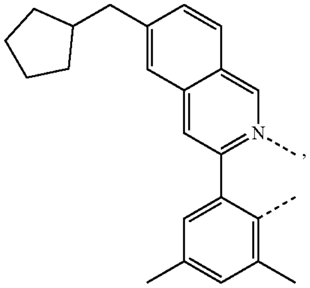
$L_{c181}$
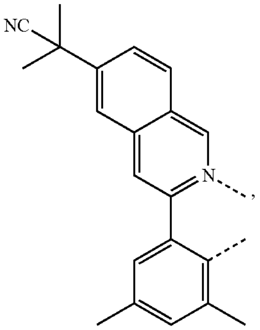
$L_{c182}$
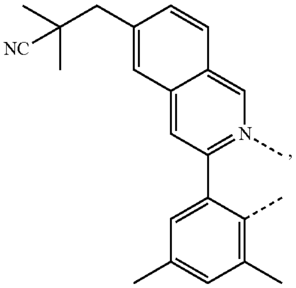
$L_{c183}$
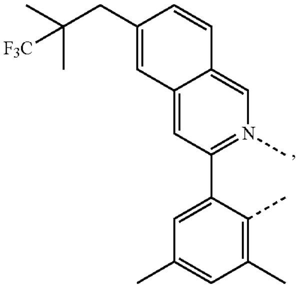

-continued
$L_{c184}$
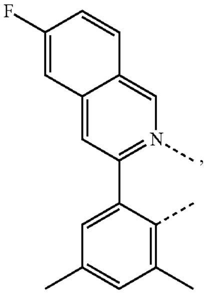
$L_{c185}$
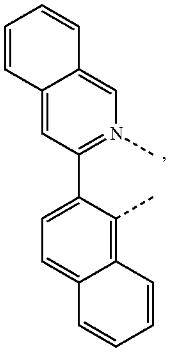
$L_{c186}$
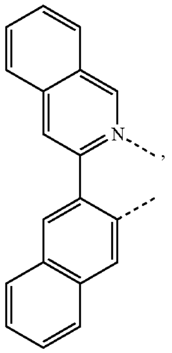
$L_{c187}$
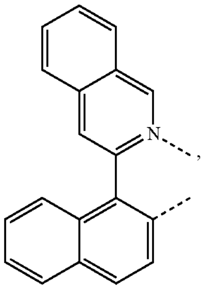
$L_{c188}$
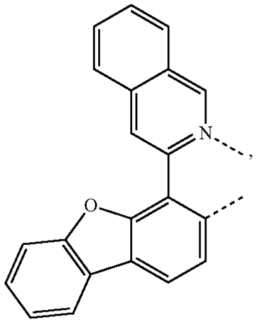
-continued
$L_{c189}$
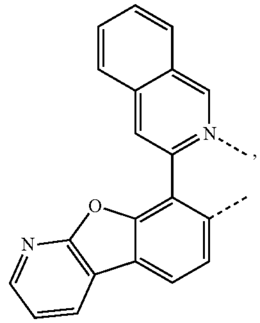
$L_{c190}$
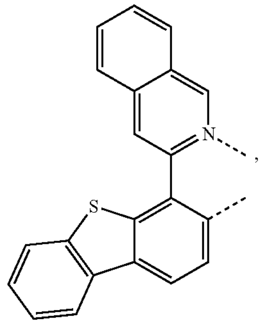
$L_{c191}$
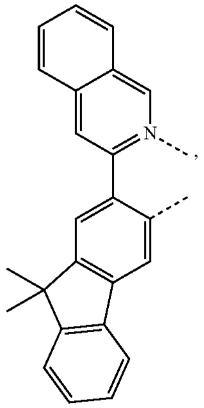
$L_{c192}$
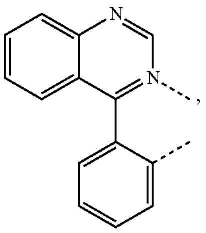
$L_{c193}$
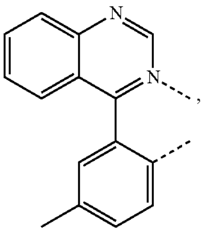

-continued
$L_{c194}$
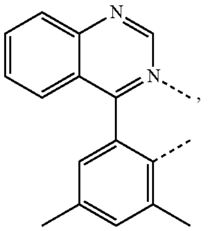
$L_{c195}$
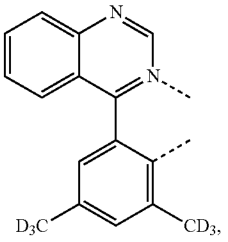
$L_{c196}$
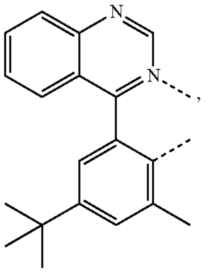
$L_{c197}$
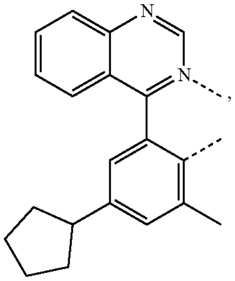
$L_{c198}$
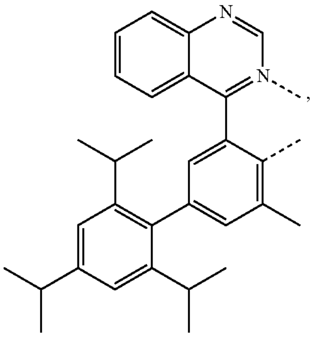
$L_{c199}$
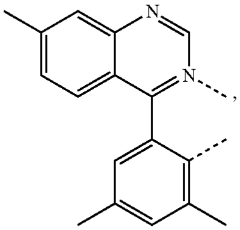
-continued
$L_{c200}$
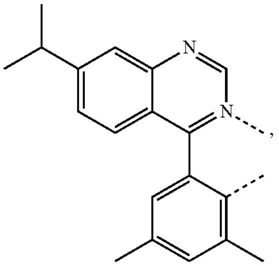
$L_{c201}$
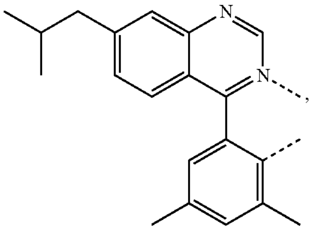
$L_{c202}$
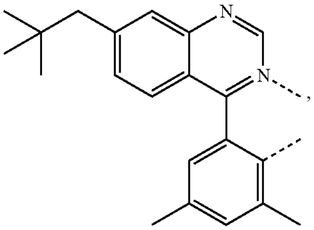
$L_{c203}$
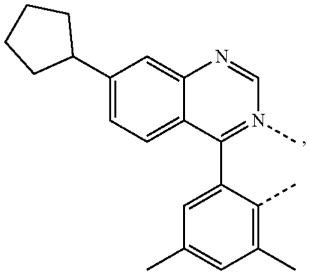
$L_{c204}$
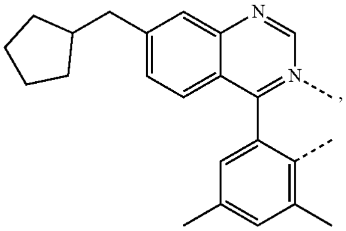
$L_{c205}$
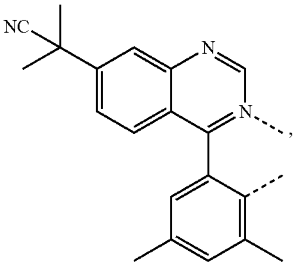

-continued
$L_{c206}$
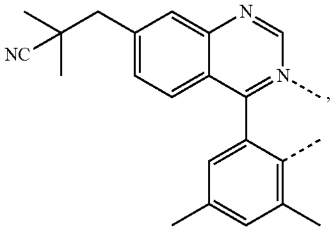
$L_{c207}$
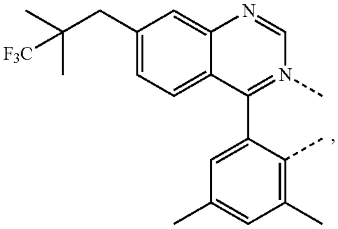
$L_{c208}$
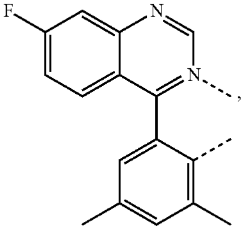
$L_{c209}$
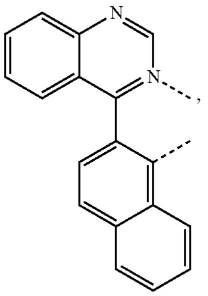
$L_{c210}$
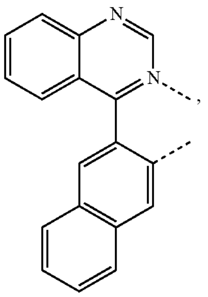
$L_{c211}$
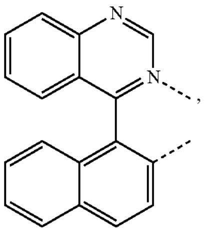
-continued
$L_{c212}$
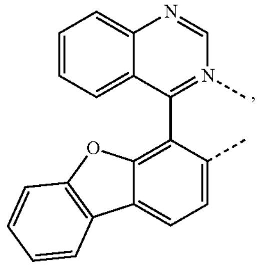
$L_{c213}$
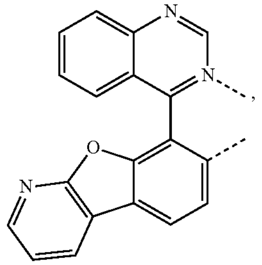
$L_{c214}$
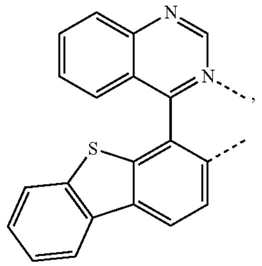
$L_{c215}$
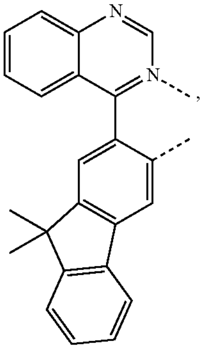
$L_{c216}$
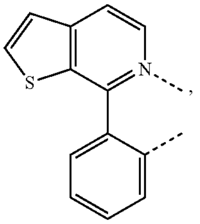

-continued
$L_{c217}$
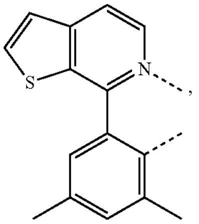
$L_{c218}$
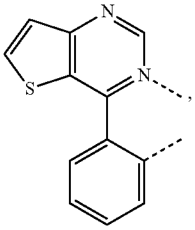
$L_{c219}$
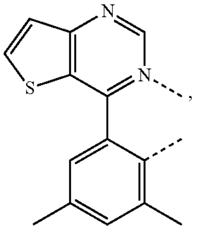
$L_{c220}$
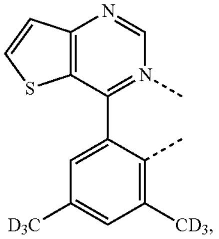
$L_{c221}$
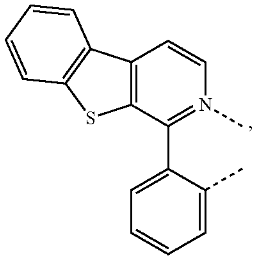
$L_{c222}$
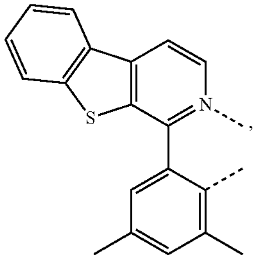
-continued
$L_{c223}$
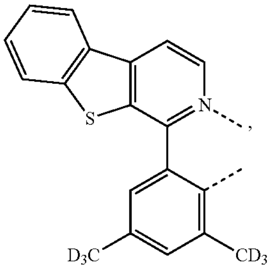
$L_{c224}$
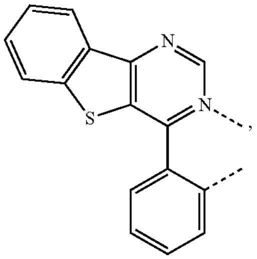
$L_{c225}$
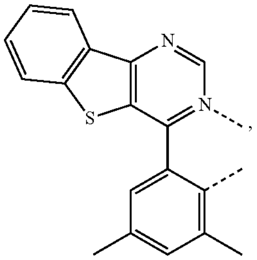
$L_{c226}$
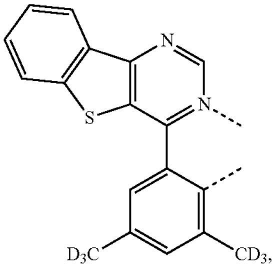
$L_{c227}$
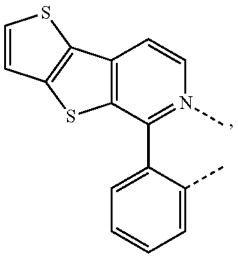
$L_{c228}$
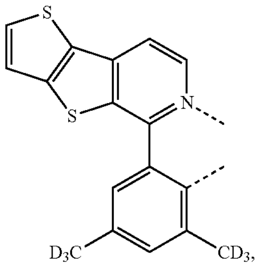

-continued $L_{c229}$

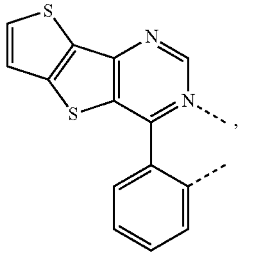

$L_{c230}$

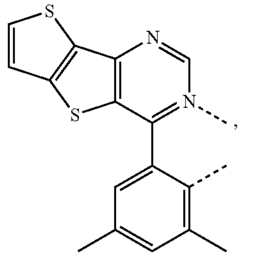

and $L_{c231}$

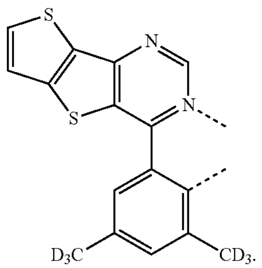

21. The metal complex of claim 20, wherein the metal complex is an Ir complex and has a structure represented by any one of $Ir(L_a)(L_b)(L_c)$, $Ir(L_a)_2(L_b)$, $Ir(L_a)_2(L_c)$ and $Ir(L_a)(L_c)_2$; when the metal complex has a structure of $Ir(L_a)(L_b)(L_c)$, $L_a$ is selected from any one of the group consisting of $L_{a1}$ to $L_{a956}$, $L_{a985}$ to $L_{a1009}$, $L_{a1020}$ to $L_{a1074}$, $L_{a1097}$ to $L_{a1100}$, $L_{a1105}$ to $L_{a1342}$, $L_b$ is selected from any one of the group consisting of $L_{b1}$ to $L_{b322}$, and $L_c$ is selected from any one of the group consisting of $L_{C1}$ to $L_{c231}$; when the metal complex has a structure of $Ir(L_a)_2(L_b)$, $L_a$ is, at each occurrence identically or differently, selected from any one or any two of the group consisting of $L_{a1}$ to $L_{a956}$, $L_{a985}$ to $L_{a1009}$, $L_{a1020}$ to $L_{a1074}$, $L_{a1097}$ to $L_{a1100}$, $L_{a1105}$ to $L_{a1342}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a956}$, $L_{a985}$ to $L_{a1009}$, $L_{a1020}$ to $L_{a1074}$, $L_{a1097}$ to $L_{a1100}$, $L_{a1105}$ to $L_{a1342}$, and $L_c$ is selected from any one of the group consisting of $L_{c1}$ to $L_{c231}$; and when the metal complex has a structure of $Ir(L_a)(L_c)_2$, $L_a$ is selected from any one of the group consisting of $L_{a1}$ to $L_{a956}$, $L_{a985}$ to $L_{a1009}$, $L_{a1020}$ to $L_{a1074}$, $L_{a1097}$ to $L_{a1100}$, $L_{a1105}$ to $L_{a1342}$, and $L_c$ is, at each occurrence identically or differently, selected from any one or any two of the group consisting of $L_{c1}$ to $L_{c231}$.

22. The metal complex of claim 20, wherein the metal complex is selected from the group consisting of Compound 1 to Compound 530, and Compound 1 to Compound 530 have a general formula of $Ir(L_a)_2(L_b)$, wherein two $L_a$ are identical and $L_a$ and $L_b$ are respectively selected from structures listed in the following table:

| Compound No. | $L_a$ | $L_b$ |
|---|---|---|
| 1 | $L_{a27}$ | $L_{b31}$ |
| 2 | $L_{a27}$ | $L_{b57}$ |
| 3 | $L_{a28}$ | $L_{b31}$ |
| 4 | $L_{a28}$ | $L_{b57}$ |
| 5 | $L_{a29}$ | $L_{b31}$ |
| 6 | $L_{a29}$ | $L_{b57}$ |
| 7 | $L_{a30}$ | $L_{b31}$ |
| 8 | $L_{a30}$ | $L_{b57}$ |
| 9 | $L_{a33}$ | $L_{b31}$ |
| 10 | $L_{a33}$ | $L_{b57}$ |
| 11 | $L_{a35}$ | $L_{b31}$ |
| 12 | $L_{a35}$ | $L_{b57}$ |
| 13 | $L_{a37}$ | $L_{b31}$ |
| 14 | $L_{a37}$ | $L_{b57}$ |
| 15 | $L_{a41}$ | $L_{b31}$ |
| 16 | $L_{a41}$ | $L_{b57}$ |
| 17 | $L_{a43}$ | $L_{b31}$ |
| 18 | $L_{a43}$ | $L_{b57}$ |
| 19 | $L_{a27}$ | $L_{b66}$ |
| 20 | $L_{a27}$ | $L_{b88}$ |
| 21 | $L_{a28}$ | $L_{b66}$ |
| 22 | $L_{a28}$ | $L_{b88}$ |
| 23 | $L_{a29}$ | $L_{b66}$ |
| 24 | $L_{a29}$ | $L_{b88}$ |
| 25 | $L_{a30}$ | $L_{b66}$ |
| 26 | $L_{a30}$ | $L_{b88}$ |
| 27 | $L_{a33}$ | $L_{b66}$ |
| 28 | $L_{a33}$ | $L_{b88}$ |
| 29 | $L_{a35}$ | $L_{b66}$ |
| 30 | $L_{a35}$ | $L_{b88}$ |
| 31 | $L_{a37}$ | $L_{b66}$ |
| 32 | $L_{a37}$ | $L_{b88}$ |
| 33 | $L_{a41}$ | $L_{b66}$ |
| 34 | $L_{a41}$ | $L_{b88}$ |
| 35 | $L_{a43}$ | $L_{b66}$ |
| 36 | $L_{a43}$ | $L_{b88}$ |
| 37 | $L_{a27}$ | $L_{b90}$ |
| 38 | $L_{a27}$ | $L_{b122}$ |
| 39 | $L_{a28}$ | $L_{b90}$ |
| 40 | $L_{a28}$ | $L_{b122}$ |
| 41 | $L_{a29}$ | $L_{b90}$ |
| 42 | $L_{a29}$ | $L_{b122}$ |
| 43 | $L_{a30}$ | $L_{b90}$ |
| 44 | $L_{a30}$ | $L_{b122}$ |
| 45 | $L_{a33}$ | $L_{b90}$ |
| 46 | $L_{a33}$ | $L_{b122}$ |
| 47 | $L_{a35}$ | $L_{b90}$ |
| 48 | $L_{a35}$ | $L_{b122}$ |
| 49 | $L_{a37}$ | $L_{b90}$ |
| 50 | $L_{a37}$ | $L_{b122}$ |
| 51 | $L_{a41}$ | $L_{b90}$ |
| 52 | $L_{a41}$ | $L_{b122}$ |
| 53 | $L_{a43}$ | $L_{b90}$ |
| 54 | $L_{a43}$ | $L_{b122}$ |
| 55 | $L_{a27}$ | $L_{b126}$ |
| 56 | $L_{a27}$ | $L_{b139}$ |
| 57 | $L_{a28}$ | $L_{b126}$ |
| 58 | $L_{a28}$ | $L_{b139}$ |
| 59 | $L_{a29}$ | $L_{b126}$ |
| 60 | $L_{a29}$ | $L_{b139}$ |
| 61 | $L_{a30}$ | $L_{b126}$ |
| 62 | $L_{a30}$ | $L_{b139}$ |
| 63 | $L_{a33}$ | $L_{b126}$ |
| 64 | $L_{a33}$ | $L_{b139}$ |
| 65 | $L_{a35}$ | $L_{b126}$ |
| 66 | $L_{a35}$ | $L_{b139}$ |
| 67 | $L_{a37}$ | $L_{b126}$ |
| 68 | $L_{a37}$ | $L_{b139}$ |
| 69 | $L_{a41}$ | $L_{b126}$ |
| 70 | $L_{a41}$ | $L_{b139}$ |
| 71 | $L_{a43}$ | $L_{b126}$ |
| 72 | $L_{a43}$ | $L_{b139}$ |
| 73 | $L_{a27}$ | $L_{b245}$ |
| 74 | $L_{a35}$ | $L_{b245}$ |
| 75 | $L_{a28}$ | $L_{b245}$ |
| 76 | $L_{a37}$ | $L_{b245}$ |
| 77 | $L_{a29}$ | $L_{b245}$ |
| 78 | $L_{a41}$ | $L_{b245}$ |

-continued

| Compound No. | $L_a$ | $L_b$ |
|---|---|---|
| 79 | $L_{a30}$ | $L_{b245}$ |
| 80 | $L_{a43}$ | $L_{b245}$ |
| 81 | $L_{a33}$ | $L_{b245}$ |
| 82 | $L_{a44}$ | $L_{b245}$ |
| 83 | $L_{a51}$ | $L_{b31}$ |
| 84 | $L_{a51}$ | $L_{b57}$ |
| 85 | $L_{a56}$ | $L_{b31}$ |
| 86 | $L_{a56}$ | $L_{b57}$ |
| 87 | $L_{a58}$ | $L_{b31}$ |
| 88 | $L_{a58}$ | $L_{b57}$ |
| 89 | $L_{a74}$ | $L_{b31}$ |
| 90 | $L_{a74}$ | $L_{b57}$ |
| 91 | $L_{a79}$ | $L_{b31}$ |
| 92 | $L_{a79}$ | $L_{b57}$ |
| 93 | $L_{a81}$ | $L_{b31}$ |
| 94 | $L_{a81}$ | $L_{b57}$ |
| 95 | $L_{a97}$ | $L_{b31}$ |
| 96 | $L_{a97}$ | $L_{b57}$ |
| 97 | $L_{a102}$ | $L_{b31}$ |
| 98 | $L_{a102}$ | $L_{b57}$ |
| 99 | $L_{a104}$ | $L_{b31}$ |
| 100 | $L_{a104}$ | $L_{b57}$ |
| 101 | $L_{a120}$ | $L_{b31}$ |
| 102 | $L_{a120}$ | $L_{b57}$ |
| 103 | $L_{a125}$ | $L_{b31}$ |
| 104 | $L_{a125}$ | $L_{b57}$ |
| 105 | $L_{a212}$ | $L_{b31}$ |
| 106 | $L_{a212}$ | $L_{b57}$ |
| 107 | $L_{a214}$ | $L_{b31}$ |
| 108 | $L_{a214}$ | $L_{b57}$ |
| 109 | $L_{a217}$ | $L_{b31}$ |
| 110 | $L_{a217}$ | $L_{b57}$ |
| 111 | $L_{a219}$ | $L_{b31}$ |
| 112 | $L_{a219}$ | $L_{b57}$ |
| 113 | $L_{a226}$ | $L_{b31}$ |
| 114 | $L_{a226}$ | $L_{b57}$ |
| 115 | $L_{a304}$ | $L_{b31}$ |
| 116 | $L_{a304}$ | $L_{b57}$ |
| 117 | $L_{a306}$ | $L_{b31}$ |
| 118 | $L_{a306}$ | $L_{b57}$ |
| 119 | $L_{a309}$ | $L_{b31}$ |
| 120 | $L_{a309}$ | $L_{b57}$ |
| 121 | $L_{a311}$ | $L_{b31}$ |
| 122 | $L_{a311}$ | $L_{b57}$ |
| 123 | $L_{a321}$ | $L_{b31}$ |
| 124 | $L_{a321}$ | $L_{b57}$ |
| 125 | $L_{a323}$ | $L_{b31}$ |
| 126 | $L_{a323}$ | $L_{b57}$ |
| 127 | $L_{a332}$ | $L_{b31}$ |
| 128 | $L_{a332}$ | $L_{b57}$ |
| 129 | $L_{a351}$ | $L_{b31}$ |
| 130 | $L_{a351}$ | $L_{b57}$ |
| 131 | $L_{a356}$ | $L_{b31}$ |
| 132 | $L_{a356}$ | $L_{b57}$ |
| 133 | $L_{a375}$ | $L_{b31}$ |
| 134 | $L_{a375}$ | $L_{b57}$ |
| 135 | $L_{a422}$ | $L_{b31}$ |
| 136 | $L_{a422}$ | $L_{b57}$ |
| 137 | $L_{a427}$ | $L_{b31}$ |
| 138 | $L_{a427}$ | $L_{b57}$ |
| 139 | $L_{a450}$ | $L_{b31}$ |
| 140 | $L_{a450}$ | $L_{b57}$ |
| 141 | $L_{a473}$ | $L_{b31}$ |
| 142 | $L_{a473}$ | $L_{b57}$ |
| 143 | $L_{a496}$ | $L_{b31}$ |
| 144 | $L_{a496}$ | $L_{b57}$ |
| 145 | $L_{a606}$ | $L_{b31}$ |
| 146 | $L_{a606}$ | $L_{b57}$ |
| 147 | $L_{a611}$ | $L_{b31}$ |
| 148 | $L_{a611}$ | $L_{b57}$ |
| 149 | $L_{a634}$ | $L_{b31}$ |
| 150 | $L_{a634}$ | $L_{b57}$ |
| 151 | $L_{a899}$ | $L_{b31}$ |
| 152 | $L_{a899}$ | $L_{b57}$ |
| 153 | $L_{a923}$ | $L_{b31}$ |
| 154 | $L_{a923}$ | $L_{b57}$ |

-continued

| Compound No. | $L_a$ | $L_b$ |
|---|---|---|
| 155 | $L_{a51}$ | $L_{b66}$ |
| 156 | $L_{a51}$ | $L_{b88}$ |
| 157 | $L_{a56}$ | $L_{b66}$ |
| 158 | $L_{a56}$ | $L_{b88}$ |
| 159 | $L_{a58}$ | $L_{b66}$ |
| 160 | $L_{a58}$ | $L_{b88}$ |
| 161 | $L_{a74}$ | $L_{b66}$ |
| 162 | $L_{a74}$ | $L_{b88}$ |
| 163 | $L_{a79}$ | $L_{b66}$ |
| 164 | $L_{a79}$ | $L_{b88}$ |
| 165 | $L_{a81}$ | $L_{b66}$ |
| 166 | $L_{a81}$ | $L_{b88}$ |
| 167 | $L_{a97}$ | $L_{b66}$ |
| 168 | $L_{a97}$ | $L_{b88}$ |
| 169 | $L_{a102}$ | $L_{b66}$ |
| 170 | $L_{a102}$ | $L_{b88}$ |
| 171 | $L_{a104}$ | $L_{b66}$ |
| 172 | $L_{a104}$ | $L_{b88}$ |
| 173 | $L_{a120}$ | $L_{b66}$ |
| 174 | $L_{a120}$ | $L_{b88}$ |
| 175 | $L_{a125}$ | $L_{b66}$ |
| 176 | $L_{a125}$ | $L_{b88}$ |
| 177 | $L_{a212}$ | $L_{b66}$ |
| 178 | $L_{a212}$ | $L_{b88}$ |
| 179 | $L_{a214}$ | $L_{b66}$ |
| 180 | $L_{a214}$ | $L_{b88}$ |
| 181 | $L_{a217}$ | $L_{b66}$ |
| 182 | $L_{a217}$ | $L_{b88}$ |
| 183 | $L_{a219}$ | $L_{b66}$ |
| 184 | $L_{a219}$ | $L_{b88}$ |
| 185 | $L_{a226}$ | $L_{b66}$ |
| 186 | $L_{a226}$ | $L_{b88}$ |
| 187 | $L_{a304}$ | $L_{b66}$ |
| 188 | $L_{a304}$ | $L_{b88}$ |
| 189 | $L_{a306}$ | $L_{b66}$ |
| 190 | $L_{a306}$ | $L_{b88}$ |
| 191 | $L_{a309}$ | $L_{b66}$ |
| 192 | $L_{a309}$ | $L_{b88}$ |
| 193 | $L_{a311}$ | $L_{b66}$ |
| 194 | $L_{a311}$ | $L_{b88}$ |
| 195 | $L_{a321}$ | $L_{b66}$ |
| 196 | $L_{a321}$ | $L_{b88}$ |
| 197 | $L_{a323}$ | $L_{b66}$ |
| 198 | $L_{a323}$ | $L_{b88}$ |
| 199 | $L_{a332}$ | $L_{b66}$ |
| 200 | $L_{a332}$ | $L_{b88}$ |
| 201 | $L_{a351}$ | $L_{b66}$ |
| 202 | $L_{a351}$ | $L_{b88}$ |
| 203 | $L_{a356}$ | $L_{b66}$ |
| 204 | $L_{a356}$ | $L_{b88}$ |
| 205 | $L_{a375}$ | $L_{b66}$ |
| 206 | $L_{a375}$ | $L_{b88}$ |
| 207 | $L_{a422}$ | $L_{b66}$ |
| 208 | $L_{a422}$ | $L_{b88}$ |
| 209 | $L_{a427}$ | $L_{b66}$ |
| 210 | $L_{a427}$ | $L_{b88}$ |
| 211 | $L_{a450}$ | $L_{b66}$ |
| 212 | $L_{a450}$ | $L_{b88}$ |
| 213 | $L_{a473}$ | $L_{b66}$ |
| 214 | $L_{a473}$ | $L_{b88}$ |
| 215 | $L_{a496}$ | $L_{b66}$ |
| 216 | $L_{a496}$ | $L_{b88}$ |
| 217 | $L_{a606}$ | $L_{b66}$ |
| 218 | $L_{a606}$ | $L_{b88}$ |
| 219 | $L_{a611}$ | $L_{b66}$ |
| 220 | $L_{a611}$ | $L_{b88}$ |
| 221 | $L_{a634}$ | $L_{b66}$ |
| 222 | $L_{a634}$ | $L_{b88}$ |
| 223 | $L_{a899}$ | $L_{b66}$ |
| 224 | $L_{a899}$ | $L_{b88}$ |
| 225 | $L_{a923}$ | $L_{b66}$ |
| 226 | $L_{a923}$ | $L_{b88}$ |
| 227 | $L_{a51}$ | $L_{b90}$ |
| 228 | $L_{a51}$ | $L_{b122}$ |
| 229 | $L_{a56}$ | $L_{b90}$ |
| 230 | $L_{a56}$ | $L_{b122}$ |

-continued

| Compound No. | $L_a$ | $L_b$ |
|---|---|---|
| 231 | $L_{a58}$ | $L_{b90}$ |
| 232 | $L_{a58}$ | $L_{b122}$ |
| 233 | $L_{a74}$ | $L_{b90}$ |
| 234 | $L_{a74}$ | $L_{b122}$ |
| 235 | $L_{a79}$ | $L_{b90}$ |
| 236 | $L_{a79}$ | $L_{b122}$ |
| 237 | $L_{a81}$ | $L_{b90}$ |
| 238 | $L_{a81}$ | $L_{b122}$ |
| 239 | $L_{a97}$ | $L_{b90}$ |
| 240 | $L_{a97}$ | $L_{b122}$ |
| 241 | $L_{a102}$ | $L_{b90}$ |
| 242 | $L_{a102}$ | $L_{b122}$ |
| 243 | $L_{a104}$ | $L_{b90}$ |
| 244 | $L_{a104}$ | $L_{b122}$ |
| 245 | $L_{a120}$ | $L_{b90}$ |
| 246 | $L_{a120}$ | $L_{b122}$ |
| 247 | $L_{a125}$ | $L_{b90}$ |
| 248 | $L_{a125}$ | $L_{b122}$ |
| 249 | $L_{a212}$ | $L_{b90}$ |
| 250 | $L_{a212}$ | $L_{b122}$ |
| 251 | $L_{a214}$ | $L_{b90}$ |
| 252 | $L_{a214}$ | $L_{b122}$ |
| 253 | $L_{a217}$ | $L_{b90}$ |
| 254 | $L_{a217}$ | $L_{b122}$ |
| 255 | $L_{a219}$ | $L_{b90}$ |
| 256 | $L_{a219}$ | $L_{b122}$ |
| 257 | $L_{a226}$ | $L_{b90}$ |
| 258 | $L_{a226}$ | $L_{b122}$ |
| 259 | $L_{a304}$ | $L_{b90}$ |
| 260 | $L_{a304}$ | $L_{b122}$ |
| 261 | $L_{a306}$ | $L_{b90}$ |
| 262 | $L_{a306}$ | $L_{b122}$ |
| 263 | $L_{a309}$ | $L_{b90}$ |
| 264 | $L_{a309}$ | $L_{b122}$ |
| 265 | $L_{a311}$ | $L_{b90}$ |
| 266 | $L_{a311}$ | $L_{b122}$ |
| 267 | $L_{a321}$ | $L_{b90}$ |
| 268 | $L_{a321}$ | $L_{b122}$ |
| 269 | $L_{a323}$ | $L_{b90}$ |
| 270 | $L_{a323}$ | $L_{b122}$ |
| 271 | $L_{a332}$ | $L_{b90}$ |
| 272 | $L_{a332}$ | $L_{b122}$ |
| 273 | $L_{a351}$ | $L_{b90}$ |
| 274 | $L_{a351}$ | $L_{b122}$ |
| 275 | $L_{a356}$ | $L_{b90}$ |
| 276 | $L_{a356}$ | $L_{b122}$ |
| 277 | $L_{a375}$ | $L_{b90}$ |
| 278 | $L_{a375}$ | $L_{b122}$ |
| 279 | $L_{a422}$ | $L_{b90}$ |
| 280 | $L_{a422}$ | $L_{b122}$ |
| 281 | $L_{a427}$ | $L_{b90}$ |
| 282 | $L_{a427}$ | $L_{b122}$ |
| 283 | $L_{a450}$ | $L_{b90}$ |
| 284 | $L_{a450}$ | $L_{b122}$ |
| 285 | $L_{a473}$ | $L_{b90}$ |
| 286 | $L_{a473}$ | $L_{b122}$ |
| 287 | $L_{a496}$ | $L_{b90}$ |
| 288 | $L_{a496}$ | $L_{b122}$ |
| 289 | $L_{a606}$ | $L_{b90}$ |
| 290 | $L_{a606}$ | $L_{b122}$ |
| 291 | $L_{a611}$ | $L_{b90}$ |
| 292 | $L_{a611}$ | $L_{b122}$ |
| 293 | $L_{a634}$ | $L_{b90}$ |
| 294 | $L_{a634}$ | $L_{b122}$ |
| 295 | $L_{a899}$ | $L_{b90}$ |
| 296 | $L_{a899}$ | $L_{b122}$ |
| 297 | $L_{a923}$ | $L_{b90}$ |
| 298 | $L_{a923}$ | $L_{b122}$ |
| 299 | $L_{a51}$ | $L_{b126}$ |
| 300 | $L_{a51}$ | $L_{b139}$ |
| 301 | $L_{a56}$ | $L_{b126}$ |
| 302 | $L_{a56}$ | $L_{b139}$ |
| 303 | $L_{a58}$ | $L_{b126}$ |
| 304 | $L_{a58}$ | $L_{b139}$ |
| 305 | $L_{a74}$ | $L_{b126}$ |
| 306 | $L_{a74}$ | $L_{b139}$ |

-continued

| Compound No. | $L_a$ | $L_b$ |
|---|---|---|
| 307 | $L_{a79}$ | $L_{b126}$ |
| 308 | $L_{a79}$ | $L_{b139}$ |
| 309 | $L_{a81}$ | $L_{b126}$ |
| 310 | $L_{a81}$ | $L_{b139}$ |
| 311 | $L_{a97}$ | $L_{b126}$ |
| 312 | $L_{a97}$ | $L_{b139}$ |
| 313 | $L_{a102}$ | $L_{b126}$ |
| 314 | $L_{a102}$ | $L_{b139}$ |
| 315 | $L_{a104}$ | $L_{b126}$ |
| 316 | $L_{a104}$ | $L_{b139}$ |
| 317 | $L_{a120}$ | $L_{b126}$ |
| 318 | $L_{a120}$ | $L_{b139}$ |
| 319 | $L_{a125}$ | $L_{b126}$ |
| 320 | $L_{a125}$ | $L_{b139}$ |
| 321 | $L_{a212}$ | $L_{b126}$ |
| 322 | $L_{a212}$ | $L_{b139}$ |
| 323 | $L_{a214}$ | $L_{b126}$ |
| 324 | $L_{a214}$ | $L_{b139}$ |
| 325 | $L_{a217}$ | $L_{b126}$ |
| 326 | $L_{a217}$ | $L_{b139}$ |
| 327 | $L_{a219}$ | $L_{b126}$ |
| 328 | $L_{a219}$ | $L_{b139}$ |
| 329 | $L_{a226}$ | $L_{b126}$ |
| 330 | $L_{a226}$ | $L_{b139}$ |
| 331 | $L_{a304}$ | $L_{b126}$ |
| 332 | $L_{a304}$ | $L_{b139}$ |
| 333 | $L_{a306}$ | $L_{b126}$ |
| 334 | $L_{a306}$ | $L_{b139}$ |
| 335 | $L_{a309}$ | $L_{b126}$ |
| 336 | $L_{a309}$ | $L_{b139}$ |
| 337 | $L_{a311}$ | $L_{b126}$ |
| 338 | $L_{a311}$ | $L_{b139}$ |
| 339 | $L_{a321}$ | $L_{b126}$ |
| 340 | $L_{a321}$ | $L_{b139}$ |
| 341 | $L_{a323}$ | $L_{b126}$ |
| 342 | $L_{a323}$ | $L_{b139}$ |
| 343 | $L_{a332}$ | $L_{b126}$ |
| 344 | $L_{a332}$ | $L_{b139}$ |
| 345 | $L_{a351}$ | $L_{b126}$ |
| 346 | $L_{a351}$ | $L_{b139}$ |
| 347 | $L_{a356}$ | $L_{b126}$ |
| 348 | $L_{a356}$ | $L_{b139}$ |
| 349 | $L_{a375}$ | $L_{b126}$ |
| 350 | $L_{a375}$ | $L_{b139}$ |
| 351 | $L_{a422}$ | $L_{b126}$ |
| 352 | $L_{a422}$ | $L_{b139}$ |
| 353 | $L_{a427}$ | $L_{b126}$ |
| 354 | $L_{a427}$ | $L_{b139}$ |
| 355 | $L_{a450}$ | $L_{b126}$ |
| 356 | $L_{a450}$ | $L_{b139}$ |
| 357 | $L_{a473}$ | $L_{b126}$ |
| 358 | $L_{a473}$ | $L_{b139}$ |
| 359 | $L_{a496}$ | $L_{b126}$ |
| 360 | $L_{a496}$ | $L_{b139}$ |
| 361 | $L_{a606}$ | $L_{b126}$ |
| 362 | $L_{a606}$ | $L_{b139}$ |
| 363 | $L_{a611}$ | $L_{b126}$ |
| 364 | $L_{a611}$ | $L_{b139}$ |
| 365 | $L_{a634}$ | $L_{b126}$ |
| 366 | $L_{a634}$ | $L_{b139}$ |
| 367 | $L_{a899}$ | $L_{b126}$ |
| 368 | $L_{a899}$ | $L_{b139}$ |
| 369 | $L_{a923}$ | $L_{b126}$ |
| 370 | $L_{a923}$ | $L_{b139}$ |
| 371 | $L_{a51}$ | $L_{b245}$ |
| 372 | $L_{a309}$ | $L_{b245}$ |
| 373 | $L_{a56}$ | $L_{b245}$ |
| 374 | $L_{a311}$ | $L_{b245}$ |
| 375 | $L_{a58}$ | $L_{b245}$ |
| 376 | $L_{a321}$ | $L_{b245}$ |
| 377 | $L_{a74}$ | $L_{b245}$ |
| 378 | $L_{a323}$ | $L_{b245}$ |
| 379 | $L_{a79}$ | $L_{b245}$ |
| 380 | $L_{a332}$ | $L_{b245}$ |
| 381 | $L_{a81}$ | $L_{b245}$ |
| 382 | $L_{a351}$ | $L_{b245}$ |

-continued

| Compound No. | $L_a$ | $L_b$ |
|---|---|---|
| 383 | $L_{a97}$ | $L_{b245}$ |
| 384 | $L_{a356}$ | $L_{b245}$ |
| 385 | $L_{a102}$ | $L_{b245}$ |
| 386 | $L_{a375}$ | $L_{b245}$ |
| 387 | $L_{a104}$ | $L_{b245}$ |
| 388 | $L_{a422}$ | $L_{b245}$ |
| 389 | $L_{a120}$ | $L_{b245}$ |
| 390 | $L_{a427}$ | $L_{b245}$ |
| 391 | $L_{a125}$ | $L_{b245}$ |
| 392 | $L_{a450}$ | $L_{b245}$ |
| 393 | $L_{a212}$ | $L_{b245}$ |
| 394 | $L_{a473}$ | $L_{b245}$ |
| 395 | $L_{a214}$ | $L_{b245}$ |
| 396 | $L_{a496}$ | $L_{b245}$ |
| 397 | $L_{a217}$ | $L_{b245}$ |
| 398 | $L_{a606}$ | $L_{b245}$ |
| 399 | $L_{a219}$ | $L_{b245}$ |
| 400 | $L_{a611}$ | $L_{b245}$ |
| 401 | $L_{a226}$ | $L_{b245}$ |
| 402 | $L_{a634}$ | $L_{b245}$ |
| 403 | $L_{a304}$ | $L_{b245}$ |
| 404 | $L_{a899}$ | $L_{b245}$ |
| 405 | $L_{a306}$ | $L_{b245}$ |
| 406 | $L_{a923}$ | $L_{b245}$ |
| 407 | $L_{a993}$ | $L_{b31}$ |
| 408 | $L_{a993}$ | $L_{b90}$ |
| 409 | $L_{a997}$ | $L_{b31}$ |
| 410 | $L_{a997}$ | $L_{b90}$ |
| 411 | $L_{a1008}$ | $L_{b31}$ |
| 412 | $L_{a1008}$ | $L_{b90}$ |
| 413 | $L_{a995}$ | $L_{b31}$ |
| 414 | $L_{a995}$ | $L_{b90}$ |
| 415 | $L_{a1300}$ | $L_{b31}$ |
| 416 | $L_{a1300}$ | $L_{b88}$ |
| 417 | $L_{a1308}$ | $L_{b31}$ |
| 418 | $L_{a1308}$ | $L_{b88}$ |
| 419 | $L_{a1314}$ | $L_{b31}$ |
| 420 | $L_{a1314}$ | $L_{b88}$ |
| 421 | $L_{a1315}$ | $L_{b31}$ |
| 422 | $L_{a1315}$ | $L_{b88}$ |
| 423 | $L_{a1316}$ | $L_{b31}$ |
| 424 | $L_{a1316}$ | $L_{b88}$ |
| 425 | $L_{a1317}$ | $L_{b31}$ |
| 426 | $L_{a1317}$ | $L_{b88}$ |
| 427 | $L_{a1321}$ | $L_{b31}$ |
| 428 | $L_{a1321}$ | $L_{b88}$ |
| 429 | $L_{a1323}$ | $L_{b31}$ |
| 430 | $L_{a1323}$ | $L_{b88}$ |
| 431 | $L_{a1324}$ | $L_{b31}$ |
| 432 | $L_{a1324}$ | $L_{b88}$ |
| 433 | $L_{a1326}$ | $L_{b31}$ |
| 434 | $L_{a1326}$ | $L_{b88}$ |
| 435 | $L_{a1330}$ | $L_{b31}$ |
| 436 | $L_{a1330}$ | $L_{b88}$ |
| 437 | $L_{a1331}$ | $L_{b31}$ |
| 438 | $L_{a1331}$ | $L_{b88}$ |
| 439 | $L_{a1334}$ | $L_{b31}$ |
| 440 | $L_{a1334}$ | $L_{b88}$ |
| 441 | $L_{a1335}$ | $L_{b31}$ |
| 442 | $L_{a1335}$ | $L_{b88}$ |
| 443 | $L_{a1338}$ | $L_{b31}$ |
| 444 | $L_{a1338}$ | $L_{b88}$ |
| 445 | $L_{a1339}$ | $L_{b31}$ |
| 446 | $L_{a1339}$ | $L_{b88}$ |
| 447 | $L_{a1340}$ | $L_{b31}$ |
| 448 | $L_{a1340}$ | $L_{b88}$ |
| 449 | $L_{a993}$ | $L_{b122}$ |
| 450 | $L_{a993}$ | $L_{b126}$ |
| 451 | $L_{a997}$ | $L_{b122}$ |
| 452 | $L_{a997}$ | $L_{b126}$ |
| 453 | $L_{a1008}$ | $L_{b122}$ |
| 454 | $L_{a1008}$ | $L_{b126}$ |
| 455 | $L_{a995}$ | $L_{b122}$ |
| 456 | $L_{a995}$ | $L_{b126}$ |
| 457 | $L_{a1300}$ | $L_{b122}$ |
| 458 | $L_{a1300}$ | $L_{b126}$ |

-continued

| Compound No. | $L_a$ | $L_b$ |
|---|---|---|
| 459 | $L_{a1308}$ | $L_{b122}$ |
| 460 | $L_{a1308}$ | $L_{b126}$ |
| 461 | $L_{a1314}$ | $L_{b122}$ |
| 462 | $L_{a1314}$ | $L_{b126}$ |
| 463 | $L_{a1315}$ | $L_{b122}$ |
| 464 | $L_{a1315}$ | $L_{b126}$ |
| 465 | $L_{a1316}$ | $L_{b122}$ |
| 466 | $L_{a1316}$ | $L_{b126}$ |
| 467 | $L_{a1317}$ | $L_{b122}$ |
| 468 | $L_{a1317}$ | $L_{b126}$ |
| 469 | $L_{a1321}$ | $L_{b122}$ |
| 470 | $L_{a1321}$ | $L_{b126}$ |
| 471 | $L_{a1323}$ | $L_{b122}$ |
| 472 | $L_{a1323}$ | $L_{b126}$ |
| 473 | $L_{a1324}$ | $L_{b122}$ |
| 474 | $L_{a1324}$ | $L_{b126}$ |
| 475 | $L_{a1326}$ | $L_{b122}$ |
| 476 | $L_{a1326}$ | $L_{b126}$ |
| 477 | $L_{a1330}$ | $L_{b122}$ |
| 478 | $L_{a1330}$ | $L_{b126}$ |
| 479 | $L_{a1331}$ | $L_{b122}$ |
| 480 | $L_{a1331}$ | $L_{b126}$ |
| 481 | $L_{a1334}$ | $L_{b122}$ |
| 482 | $L_{a1334}$ | $L_{b126}$ |
| 483 | $L_{a1335}$ | $L_{b122}$ |
| 484 | $L_{a1335}$ | $L_{b126}$ |
| 485 | $L_{a1338}$ | $L_{b122}$ |
| 486 | $L_{a1338}$ | $L_{b126}$ |
| 487 | $L_{a1339}$ | $L_{b122}$ |
| 488 | $L_{a1339}$ | $L_{b126}$ |
| 489 | $L_{a1340}$ | $L_{b122}$ |
| 490 | $L_{a1340}$ | $L_{b126}$ |
| 491 | $L_{a997}$ | $L_{b139}$ |
| 492 | $L_{a997}$ | $L_{b135}$ |
| 493 | $L_{a1008}$ | $L_{b139}$ |
| 494 | $L_{a1008}$ | $L_{b135}$ |
| 495 | $L_{a995}$ | $L_{b139}$ |
| 496 | $L_{a995}$ | $L_{b135}$ |
| 497 | $L_{a1300}$ | $L_{b139}$ |
| 498 | $L_{a1300}$ | $L_{b135}$ |
| 499 | $L_{a1308}$ | $L_{b139}$ |
| 500 | $L_{a1308}$ | $L_{b135}$ |
| 501 | $L_{a1314}$ | $L_{b139}$ |
| 502 | $L_{a1314}$ | $L_{b135}$ |
| 503 | $L_{a1315}$ | $L_{b139}$ |
| 504 | $L_{a1315}$ | $L_{b135}$ |
| 505 | $L_{a1316}$ | $L_{b139}$ |
| 506 | $L_{a1316}$ | $L_{b135}$ |
| 507 | $L_{a1317}$ | $L_{b139}$ |
| 508 | $L_{a1317}$ | $L_{b135}$ |
| 509 | $L_{a1321}$ | $L_{b139}$ |
| 510 | $L_{a1321}$ | $L_{b135}$ |
| 511 | $L_{a1323}$ | $L_{b139}$ |
| 512 | $L_{a1323}$ | $L_{b135}$ |
| 513 | $L_{a1324}$ | $L_{b139}$ |
| 514 | $L_{a1324}$ | $L_{b135}$ |
| 515 | $L_{a1326}$ | $L_{b139}$ |
| 516 | $L_{a1326}$ | $L_{b135}$ |
| 517 | $L_{a1330}$ | $L_{b139}$ |
| 518 | $L_{a1330}$ | $L_{b135}$ |
| 519 | $L_{a1331}$ | $L_{b139}$ |
| 520 | $L_{a1331}$ | $L_{b135}$ |
| 521 | $L_{a1334}$ | $L_{b139}$ |
| 522 | $L_{a1334}$ | $L_{b135}$ |
| 523 | $L_{a1335}$ | $L_{b139}$ |
| 524 | $L_{a1335}$ | $L_{b135}$ |
| 525 | $L_{a1338}$ | $L_{b139}$ |
| 526 | $L_{a1338}$ | $L_{b135}$ |
| 527 | $L_{a1339}$ | $L_{b139}$ |
| 528 | $L_{a1339}$ | $L_{b135}$ |
| 529 | $L_{a1340}$ | $L_{b139}$ |
| 530 | $L_{a1340}$ | $L_{b135}$. |

23. An electroluminescent device, comprising:

an anode, a cathode, and an organic layer disposed between the anode and the cathode, wherein the organic layer comprises the metal complex of claim 1.

24. The electroluminescent device of claim 23, wherein the organic layer is an emissive layer, and the metal complex is a luminescent material.

25. The electroluminescent device of claim 24, wherein the electroluminescent device emits red light or white light.

26. The electroluminescent device of claim 25, wherein the emissive layer further comprises at least one host material.

27. A compound composition, comprising the metal complex of claim 1.

28. The metal complex of claim 1, wherein in the $L_a$, ring A, ring C are, at each occurrence identically or differently, selected from a benzene ring, a naphthalene ring, a pyridine ring, a pyrimidine ring, a pyrazine ring, an aza-naphthalene ring, a furan ring, a thiophene ring, an isoxazole ring, an isothiazole ring, a pyrrole ring, a pyrazole ring, a benzofuran ring, a benzothiophene ring, an azabenzofuran ring or an azabenzothiophene ring.

* * * * *